(12) United States Patent
Yamazaki et al.

(10) Patent No.: US 6,528,358 B1
(45) Date of Patent: *Mar. 4, 2003

(54) SEMICONDUCTOR DEVICE AND METHOD FOR FABRICATING THE SAME

(75) Inventors: Shunpei Yamazaki, Tokyo (JP); Satoshi Teramoto, Kanagawa (JP); Jun Koyama, Kanagawa (JP); Yasushi Ogata, Kanagawa (JP); Masahiko Hayakawa, Kanagawa (JP); Mitsuaki Osame, Kanagawa (JP); Hisashi Ohtani, Kanagawa (JP); Toshiji Hamatani, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/536,792

(22) Filed: Mar. 28, 2000

Related U.S. Application Data

(62) Division of application No. 08/785,489, filed on Jan. 17, 1997, now Pat. No. 6,077,731.

(30) Foreign Application Priority Data

| Jan. 19, 1996 | (JP) | 8-026210 |
| Jan. 20, 1996 | (JP) | 8-026037 |
| Jan. 26, 1996 | (JP) | 8-032874 |
| Jan. 26, 1996 | (JP) | 8-032875 |
| Jan. 27, 1996 | (JP) | 8-032981 |
| Feb. 20, 1996 | (JP) | 8-058334 |
| Mar. 17, 1996 | (JP) | 8-088759 |
| Nov. 29, 1996 | (JP) | 8-335152 |

(51) Int. Cl.$^7$ .......................... H01L 21/00; H01L 21/44
(52) U.S. Cl. .................. 438/151; 438/152; 438/161; 438/162
(58) Field of Search ................... 438/151, 152, 438/166, 161, 162; 257/64, 65, 66, 75

(56) References Cited

U.S. PATENT DOCUMENTS

| 3,389,024 A | 6/1968 | Schimmer |
| 3,783,049 A | 1/1974 | Sandera |

(List continued on next page.)

FOREIGN PATENT DOCUMENTS

| EP | 0 178 447 | 10/1984 |
| JP | 60-105216 | 6/1985 |

(List continued on next page.)

OTHER PUBLICATIONS

Caune et al., "Combined CW Laser and Furnace Annealing of Amorphous Si and Ge in Contact With Some Metals", Jan. 1, 1989, pp. 597–604, Applied Surface Schience, vol. 36.

(List continued on next page.)

*Primary Examiner*—Michael S. Lebentritt
(74) *Attorney, Agent, or Firm*—Nixon Peabody LLP; Jeffrey L. Costellia

(57) ABSTRACT

A novel and very useful method for forming a crystal silicon film by introducing a metal element which promotes crystallization of silicon to an amorphous silicon film and for eliminating or reducing the metal element existing within the crystal silicon film thus obtained is provided. The method for fabricating a semiconductor device comprises steps of intentionally introducing the metal element which promotes crystallization of silicon to the amorphous silicon film and crystallizing the amorphous silicon film by a first heat treatment to obtain the crystal silicon film; eliminating or reducing the metal element existing within the crystal silicon film by implementing a second heat treatment within an oxidizing atmosphere; eliminating a thermal oxide film formed in the previous step; and forming another thermal oxide film on the surface of the region from which the thermal oxide film has been eliminated by implementing another thermal oxidation.

48 Claims, 56 Drawing Sheets

U.S. PATENT DOCUMENTS

| | | |
|---|---|---|
| RE28,385 E | 4/1975 | Mayer |
| RE28,386 E | 4/1975 | Heiman et al. |
| 3,890,632 A | 6/1975 | Ham et al. |
| 4,059,461 A | 11/1977 | Fan et al. |
| 4,068,020 A | 1/1978 | Reuschel |
| 4,132,571 A | 1/1979 | Cuomo et al. |
| 4,174,217 A | 11/1979 | Flatley |
| 4,226,898 A | 10/1980 | Ovshinsky et al. |
| 4,231,809 A | 11/1980 | Schmidt |
| 4,271,422 A | 6/1981 | Ipri |
| 4,277,884 A | 7/1981 | Hsu |
| 4,300,989 A | 11/1981 | Chang |
| 4,309,224 A | 1/1982 | Shibata |
| 4,330,363 A | 5/1982 | Biegesen et al. |
| 4,331,709 A | 5/1982 | Risch et al. |
| 4,379,020 A | 4/1983 | Glaeser et al. |
| 4,409,724 A | 10/1983 | Tasch, Jr. et al. |
| 4,466,073 A | 8/1984 | Boyan et al. |
| 4,472,458 A | 9/1984 | Sirinyan et al. |
| 4,481,121 A | 11/1984 | Barthel |
| 4,534,820 A | 8/1985 | Mori et al. |
| 4,544,418 A | 10/1985 | Gibbons |
| 4,546,376 A | 10/1985 | Nakata et al. |
| 4,597,160 A | 7/1986 | Ipri |
| 4,634,473 A | 1/1987 | Swartz et al. |
| 4,735,824 A | 4/1988 | Yamabe et al. |
| 4,755,481 A | 7/1988 | Faraone |
| 4,911,781 A | 3/1990 | Fox et al. |
| 4,959,247 A | 9/1990 | Moser et al. |
| 4,959,700 A | 9/1990 | Yamazaki |
| 4,996,077 A | 2/1991 | Moslehi et al. |
| 4,996,523 A | 2/1991 | Bell et al. |
| 5,043,224 A | 8/1991 | Jaccodine et al. |
| 5,075,259 A | 12/1991 | Moran |
| 5,089,441 A | 2/1992 | Moslehi |
| 5,112,764 A | 5/1992 | Mitra et al. |
| 5,145,808 A | 9/1992 | Sameshima et al. |
| 5,147,826 A | 9/1992 | Liu et al. |
| 5,173,446 A | 12/1992 | Asakawa et al. |
| 5,200,630 A | 4/1993 | Nakamura et al. |
| 5,221,423 A | 6/1993 | Sugino et al. |
| 5,225,355 A | 7/1993 | Sugino et al. |
| 5,244,836 A | 9/1993 | Lim |
| 5,254,480 A | 10/1993 | Tran |
| 5,262,350 A | 11/1993 | Yamazaki et al. |
| 5,262,654 A | 11/1993 | Yamazaki |
| 5,275,851 A | 1/1994 | Fonash et al. |
| 5,278,093 A | 1/1994 | Yonehara |
| 5,289,030 A | 2/1994 | Yamazaki et al. |
| 5,296,405 A | 3/1994 | Yamazaki et al. |
| 5,298,075 A | 3/1994 | Lagendijk et al. |
| 5,308,998 A | 5/1994 | Yamazaki et al. |
| 5,313,075 A | 5/1994 | Zhang et al. |
| 5,352,291 A | 10/1994 | Zhang et al. |
| 5,354,697 A | 10/1994 | Oostra et al. |
| 5,358,907 A | 10/1994 | Wong |
| 5,366,926 A | 11/1994 | Mei et al. |
| 5,387,530 A | 2/1995 | Doyle et al. |
| 5,403,772 A | 4/1995 | Zhang et al. |
| 5,424,230 A | 6/1995 | Wakai |
| 5,426,064 A | 6/1995 | Zhang et al. |
| 5,470,763 A | 11/1995 | Hamada |
| 5,480,811 A | 1/1996 | Chiang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,504,019 A | 4/1996 | Miyasaka et al. |
| 5,508,207 A | 4/1996 | Horai et al. |
| 5,508,533 A | 4/1996 | Takemura |
| 5,529,937 A | 6/1996 | Zhang et al. |
| 5,530,266 A | 6/1996 | Yonehara et al. |
| 5,531,182 A | 7/1996 | Yonehara |
| 5,534,716 A | 7/1996 | Takemura |
| 5,543,352 A | 8/1996 | Ohtani et al. |
| 5,543,636 A | 8/1996 | Yamazaki |
| 5,550,070 A | 8/1996 | Funai et al. |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,580,815 A | 12/1996 | Hsu et al. |
| 5,585,291 A | 12/1996 | Ohtani et al. |
| 5,589,694 A | 12/1996 | Takayama et al. |
| 5,591,988 A | 1/1997 | Arai et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,619,044 A | 4/1997 | Makita et al. |
| 5,620,910 A | 4/1997 | Teramoto |
| 5,621,224 A | 4/1997 | Yamazaki et al. |
| 5,621,244 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,661,311 A | 8/1997 | Takemura et al. |
| 5,663,077 A | 9/1997 | Adachi et al. |
| 5,677,549 A | 10/1997 | Takayama et al. |
| 5,684,317 A | 11/1997 | Hwang |
| 5,684,365 A | 11/1997 | Tang et al. |
| 5,686,328 A | 11/1997 | Zhang et al. |
| 5,693,541 A | 12/1997 | Yamazaki et al. |
| 5,693,959 A | 12/1997 | Inoue et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,717,224 A | 2/1998 | Zhang |
| 5,728,259 A | 3/1998 | Suzawa et al. |
| 5,734,179 A | 3/1998 | Chang et al. |
| 5,744,822 A | 4/1998 | Takayama et al. |
| 5,744,824 A | 4/1998 | Kousai et al. |
| 5,756,364 A | 5/1998 | Tanaka et al. |
| 5,763,899 A | 6/1998 | Yamazaki et al. |
| 5,766,977 A | 6/1998 | Yamazaki |
| 5,773,327 A | 6/1998 | Yamazaki et al. |
| 5,773,846 A | 6/1998 | Zhang et al. |
| 5,773,847 A | 6/1998 | Hayakawa |
| 5,782,665 A | 7/1998 | Weisfield et al. |
| 5,786,796 A | 7/1998 | Takayama et al. |
| 5,795,795 A | 8/1998 | Kousai et al. |
| 5,808,321 A | 9/1998 | Mitanaga et al. |
| 5,811,327 A | 9/1998 | Funai et al. |
| 5,818,076 A | 10/1998 | Zhang et al. |
| 5,821,138 A | 10/1998 | Yamazaki et al. |
| 5,821,560 A | 10/1998 | Arai et al. |
| 5,824,574 A | 10/1998 | Yamazaki et al. |
| 5,828,429 A | 10/1998 | Takemura |

| | | |
|---|---|---|
| 5,838,508 A | 11/1998 | Sugawara |
| 5,843,225 A | 12/1998 | Takayama et al. |
| 5,846,857 A | 12/1998 | Ju |
| 5,849,611 A | 12/1998 | Yamazaki et al. |
| 5,882,960 A | 3/1999 | Zhang et al. |
| 5,888,858 A | 3/1999 | Yamazaki et al. |
| 5,895,933 A | 4/1999 | Zhang et al. |
| 5,899,547 A | 5/1999 | Yamazaki et al. |
| 5,922,125 A | 7/1999 | Zhang |
| 5,929,464 A | 7/1999 | Yamazaki et al. |
| 5,929,527 A | 7/1999 | Yamazaki et al. |
| 5,933,205 A | 8/1999 | Yamazaki et al. |
| 5,940,732 A | 8/1999 | Zhang |
| 5,949,107 A | 9/1999 | Zhang |
| 5,953,597 A | 9/1999 | Kusumoto et al. |
| 5,962,869 A | 10/1999 | Yamazaki et al. |
| 5,963,278 A | 10/1999 | Yamazaki et al. |
| 5,985,740 A | 11/1999 | Yamazaki et al. |
| 5,990,491 A | 11/1999 | Zhang |
| 5,990,542 A | 11/1999 | Yamazaki |
| 6,005,648 A | 12/1999 | Zhang et al. |
| 6,011,275 A | 1/2000 | Ohtani et al. |
| 6,011,277 A | 1/2000 | Yamazaki |
| 6,013,929 A | 1/2000 | Ohtani |
| 6,031,249 A | 2/2000 | Yamazaki et al. |
| 6,048,758 A | 4/2000 | Yamazaki et al. |
| 6,063,654 A | 5/2000 | Ohtani |
| 6,077,731 A * | 6/2000 | Yamazaki et al. .......... 438/150 |
| 6,083,801 A | 7/2000 | Ohtani |
| 6,093,934 A | 7/2000 | Yamazaki et al. |
| 6,100,562 A | 8/2000 | Yamazaki et al. |
| 6,121,683 A | 9/2000 | Yamazaki et al. |
| 6,140,165 A | 10/2000 | Zhang et al. |
| 6,147,667 A | 11/2000 | Yamazaki et al. |
| 6,175,348 B1 | 1/2001 | Zhang et al. |
| 6,180,439 B1 | 1/2001 | Yamazaki et al. |
| 6,207,969 B1 | 3/2001 | Yamazaki |
| 6,278,132 B1 | 8/2001 | Yamazaki et al. |
| 6,331,718 B1 | 12/2001 | Yamazaki et al. |

FOREIGN PATENT DOCUMENTS

| | | |
|---|---|---|
| JP | 61-063017 | 4/1986 |
| JP | 61-063107 | 4/1986 |
| JP | 62-169356 | 7/1987 |
| JP | 1-187814 | 7/1989 |
| JP | 1-187874 | 7/1989 |
| JP | 1-187875 | 7/1989 |
| JP | 1-206632 | 8/1989 |
| JP | 2-140915 | 5/1990 |
| JP | 2-148687 | 6/1990 |
| JP | 2-275641 | 11/1990 |
| JP | 3-280418 | 12/1991 |
| JP | 3-280420 | 12/1991 |
| JP | 5-082442 | 4/1993 |
| JP | 5-107561 | 4/1993 |
| JP | 5-299348 | 11/1993 |
| JP | 6-232059 | 8/1994 |
| JP | 6-314785 | 11/1994 |
| JP | 6-314787 | 11/1994 |
| JP | 7-161634 | 6/1995 |
| JP | 7-321339 | 12/1995 |
| JP | 7-335900 | 12/1995 |
| JP | 8-129358 | 5/1996 |
| JP | 8-129359 | 5/1996 |
| JP | 8-129360 | 5/1996 |
| JP | 8-234683 | 9/1996 |
| JP | 8-241047 | 9/1996 |
| JP | 8-241048 | 9/1996 |
| JP | 8-241057 | 9/1996 |
| JP | 8-241997 | 9/1996 |
| JP | 64-081324 | 3/1999 |

OTHER PUBLICATIONS

Stoemnos et al., "Crystallization of Amorphous Silicon by Reconstructive Transformation Utilizing Gold", Mar. 18, 1991, pp. 1196–1198, Appl. Phys. Lett. 58(11).

Kakkad et al., "Crystallized Si–Films By Low–Temperature Rapid Thermal Annealing of Amorphous Silicon", Mar. 1, 1989, pp. 2069–2072, J. Appl. Phys. 65(5).

Oki et al., "Effect of Deposited Metals On the Crystallization Temperature of Amorphous Germanium Film", 1969, pp. 1056, Jpn. J. Appl. Phys. 8, No month.

Kuznetsov et al., "Enhanced Solid Phase Epitaxial Recrystallization of Amorphous Silicon Due to Nickel Silicide Precipitation Resulting From Ion Implantation and Annealing", 1993, pp. 990–993, Nucl. Instruments Methods Physics Research, 880/881 No month.

Hayashi et al., "Fabrication of Low–Temperature Bottom Gate Poly–Si TFT's on Large Area Substrate by Linear–Beam Excimer Laser Crystallization and Ion Doping Method", Jan. 1, 1995, pp. 829–832, IEEE IEDM.

Takenaka et al., "High Mobility Poly–Si Thin Film Transistors Using Solid Phase Crystallized a–Si Films Deposited by Plasma Enhanced Chemical Vapor Deposition", Dec. 1990, pp. L2380–L2383, Jpn. J. Appl. Phys. vol. 29, No. 12.

Hatalis et al., "High Performance Thin–Film Transistors in Low Temperature Crystallized LPCVD Amorphous Silicon Films", Aug. 1987, pp. 361–364, Elec. Dev. Letters vol. EDL 8, No. 8.

Zorabedian et al., "Lateral Seeding of Silicon–on–Insulator Using an Ellipitical Laser Beam: A Comparison of Scanning Methods", 1984, pp. 81–86, Mat. Res. Soc. Symp. Proc. vol. 33, No month.

Spaepen et al., "Metal–Enhanced Growth of Silicon", 1992, pp. 483–499, Crucial Issues in Semiconductor Materials & Processing Technologies, No month.

Green et al., "Method To Purify Semiconductor Wafers", Oct. 1973, pp. 1612–1613, IBM Tech. Discl. Bulletin vol. 16, No. 5.

Boyd et al., "Oxidation of Silicon Surfaces by CO2 Lasers", Jul. 15, 1982, pp. 162–164, Applied Phys. Letters, vol. 41, No. 2.

Wolf et al., "Silicon Processing for the VLSI Era vol. 1: Process Technology", 1986, pp. 215–216, Lattice Press, No month.

Lau et al., "Solid Phase Epitaxy in Silicide Forming System", 1977, pp. 313–322, Thin Solid Films, 47, No month.

Kawazu et al., "Low–Temperature Crystallization of Hydrogenated Amorphous Silicon Induced by Nickel Silicide Formation", Dec. 1990, pp. 2698–2704, Inst. of Appl. Phys. vol. 29, No. 12.

Wolf et al., "Silicon Processing for the VLSI Era vol. 1—Process Technology", 1986, pp. 550–551, Lattice Press, No month.

Bruines et al., "Between Explosive Crystallization and Amorphous Regrowth: Inhomogenous Solidification Upon Pulsed Laser Annealing of Amorphous Silicon", Mar. 1, 1987, pp. 507–509, Applied Physics Letter, vol. 50.

Kawazu et al., "Initial Stage of the Interfacial Reaction between Nickel and Hydrogenated Amorphous Silicon", Apr. 1, 1990, pp. 729–738, Japanese Journal of Appl Phys., vol. 29.

Kakkad et al., "Low Temperature Selective Crystallization of Amorphous Silicon", 1989, pp. 66–68, Journal of Non–Crystaline Solids, 115.

Suresh et al., "Electroless Plated Nickel Contacts to Hydrogenated Amorphous Silicon", Jan. 1, 1994, pp. 78–81, Thin Solid Films, vol. 252.

Sakaguchi et al., "Current Progress in Epitaxial Layer Transfer", Mar. 1, 1997, pp. 378–387, IEICE Trans. Electron, vol. E80 C/No. 3.

Kouvatsos et al., "Fluorine–enhanced Oxidation of Polycrystalline Silicon and Application to Thin–Film Transistor Fabrication", Aug. 24, 1992, pp. 937–939, Appl. Phys. Letter, vol. 61, No. 8.

Sze, "VLSI Technology", Jan. 1, 1988, pp. 397–400, McGraw–Hill Publishing Copmpany, Second Edition.

Ghandhi, "VLSI Fabrication Principles", Jan. 1, 1983, pp. 419–429, Wiley and Sons.

Kuper et al., "Effects of Fluorine Implantation on the Kinetics of Dry Oxidation of Silicon", Aug. 1, 1986, pp. 985–990, J. Applied Physics.

Thompson et al., "Silicide Formation in Pd–a–Si: H Schottky Barriers", Aug. 1981, pp. 274–276, Appl Phys Lett., vol. 39, No. 3.

Nemanich et al., "Initial Phase Formation at the Interface of Ni, Pd, or Pt and Si", 1984, pp. unknown, Mat. Res. Soc. Symp. Proc., vol. 25.

Nemanich et al., "Structure and Growth of the Interface of Pd on a–SiH", Jun. 15, 1981, pp. 6828–6831, The American Physical Society Physical Review, vol. 22, No. 12.

Hemple et al., "Needle–Like Crystallization of Ni Doped Amorphous Silicon Thin Films", 1993, pp. 921–924, Solid State Communications, vol. 85, No. 11, No month.

Kuo, "Thin Film Transistor Technologies", vol. 94–35, pp. 116–122, The Electrochenical Society Proceedings, No date.

Author Unknown, "Thermo Auto–chrome Full Color Recording Technology", May 31, 1995, pp. Unknown, Technology Information Association.

Wolf et al., "Thermal Oxidation of Single Crystal Silicon", 1986, pp. 207–211, Silicon Processing for the VLSI Era, No month.

Erokhin et al., "Spatially Confined Nickel Disilicide Formation at 400c on Ion Implantation Preamorphized Silicon", Dec. 6, 1993, pp. 3173–3175, Appl. Phys. Lett. 63 (23).

Dvurechenskii et al., "Transport Phenomena in Amorphous Silicon Doped by Ion Implantation of 3d Metals", 1986, pp. 635–640, Akademikian Lavrentev Prospekt 13, 630090 Novosibirsk 90, USSR, No month.

Batstone et al., "Microscopic Processes in Crystallisation", Jan. 1, 1994, pp. 257–268, Solid State Phenomena, vol. 37–38.

Cammarata et al., "Silicide Precipitation and Silicon Crystallization in Nickel Implanted Amorphous Silicon Thin Films", Oct. 10, 1990, pp. 2133–2138, J. Mater. Res. vol. 5, No. 10.

Hayzelden et al., "Silicide Formation and Silicide Mediated Crystallization of Nickel–Implanted Amorphous Silicon Thin Films", May 15, 1993, pp. 8279–8289, J. Appl. Phys. 73(12).

Kuznetsov et al., "Silicide Precipitate Formation and Solid Phase Re–Growth of Ni–Implanted Amorphous Silicon", Apr. 5–8, 1993, pp. 191–194, Inst. Phys. Conf. Ser. No. 134.4: Proceedings of Royal Microscopical Society Conf.

Liu et al., "Polycrystalline Silicon Thin Film Transistors on Corning 7059 Glass Substates Using Short Time, Low–Temperature Processing", May 17, 1993, pp. 2554–2556, Appl. Phys. Lett. 62(20).

Liu et al., "Selective Area Crystallization of Amorphous Silicon Films by Low–Temperature Rapid Thermal Annealing", Aug. 14, 1989, pp. 660–662, Appl. Phys. Lett 55(7).

Wolf, Stanley "Silicon Processing for the VLSI Era Volume 1: Process Technology", Lattice Press, pp. 198–207, 1986.

Baker et al., "Field Effect Transistor", pp. 849, Dec. 1968, IBM Technical Disclosure Bulletin.

* cited by examiner

FIG. 6A  CRYSTAL SILICON FILM
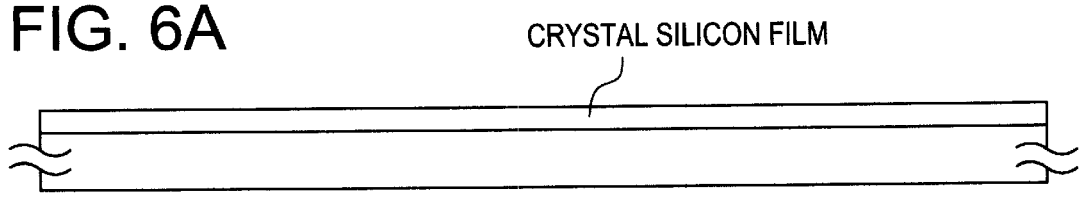
FIG. 6B  PATTERNED CRYSTAL SILICON FILM
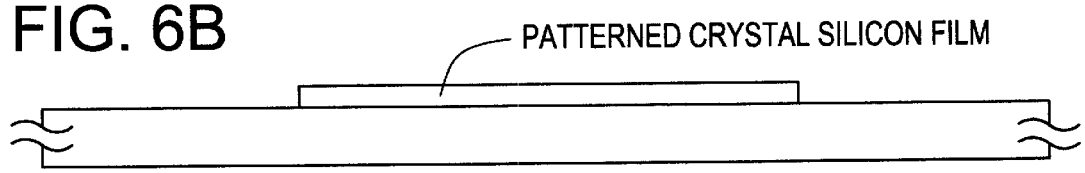
FIG. 6C  SILICON OXIDE FILM WHICH BECOME GI FILM (GATE INSULATING FILM)
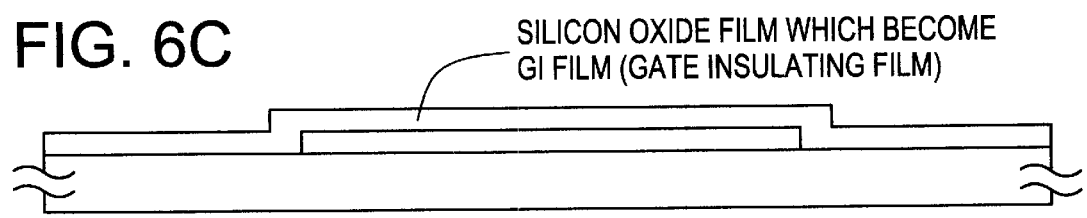
FIG. 6D  GI FILM    THERMAL OXIDE FILM    ACTIVE LAYER
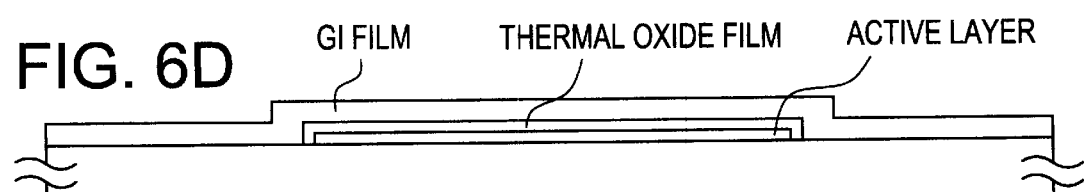
FIG. 6E  ALUMINUM FILM    ANODIC OXIDE FILM
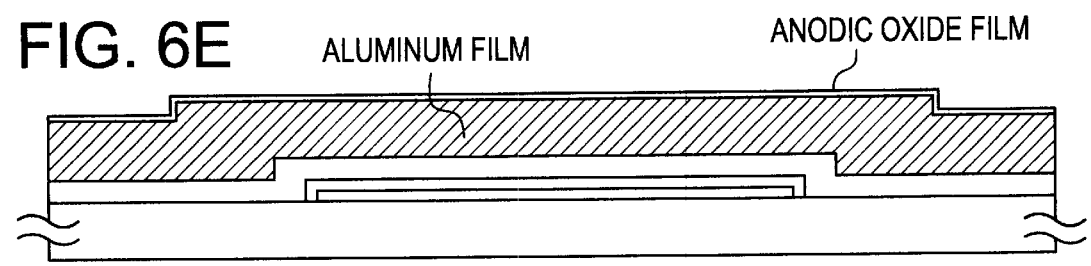
FIG. 6F  RESIST MASK
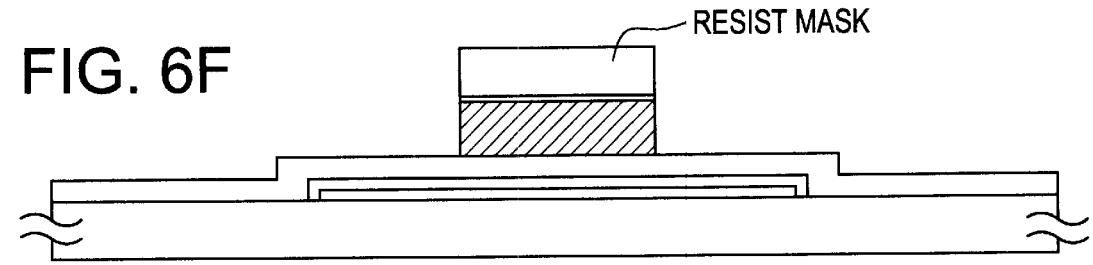

Ni DOPED REGION

IRRADIATION OF LASER LIGHT 257  258

260  259  257

TABLE 1

N-CHANNEL TYPE TFT

| MEASURED POINTS | Ion_1[uA] (VD=1 V) (VG=5 V) | Ion_2[uA] (VD=5 V) (VG=5 V) | Ioff_1[pA] (VD=1 V) (VG=-6 V) | Ioff_2[pA] (VD=5 V) (VG=-1 V) | Ion/Ioff_1 | Ion/Ioff_2 | Vth[V] (VD=5 V) | S-value [mV/dec] (VD=1 V) | μFE[cm2/Vs] (VD=1 V) (VG=5 V) | μFE[cm2/Vs] (VD=1 V) (max) |
|---|---|---|---|---|---|---|---|---|---|---|
| 1 | 82.474 | 258.800 | 0.250 | 0.700 | 8.518 | 8.568 | -0.40 | 81.03 | 157.9 | 259.7 |
| 2 | 115.200 | 346.710 | 0.250 | 0.750 | 8.664 | 8.665 | -0.47 | 83.46 | 213.2 | 367.3 |
| 3 | 87.440 | 283.150 | 0.400 | 2.600 | 8.340 | 8.037 | -0.52 | 88.21 | 159.6 | 272.4 |
| 4 | 92.343 | 288.860 | 3.400 | 4.950 | 7.434 | 7.766 | -0.43 | 96.64 | 186.7 | 280.8 |
| 5 | 87.488 | 275.050 | 0.250 | 0.900 | 8.544 | 8.485 | -0.40 | 82.73 | 175.1 | 275.2 |
| 6 | 89.910 | 275.510 | 0.200 | 0.500 | 8.653 | 8.741 | -0.37 | 77.36 | 174.2 | 286.3 |
| 7 | 73.921 | 240.100 | 0.500 | 1.200 | 8.170 | 8.301 | -0.49 | 84.32 | 146.0 | 222.6 |
| 8 | 89.153 | 281.300 | 0.400 | 1.300 | 8.348 | 8.335 | -0.50 | 80.93 | 163.4 | 280.8 |
| 9 | 91.303 | 295.450 | 0.300 | 3.000 | 8.483 | 7.993 | -0.59 | 75.32 | 158.9 | 284.9 |
| 10 | 119.650 | 353.200 | 0.300 | 0.650 | 8.601 | 8.735 | -0.33 | 74.29 | 225.9 | 387.6 |
| 11 | 106.000 | 338.300 | 0.200 | 202.950 | 8.724 | 6.222 | -0.68 | 78.04 | 173.1 | 307.6 |
| 12 | 88.304 | 281.940 | 0.300 | 0.950 | 8.469 | 8.472 | -0.47 | 85.94 | 154.8 | 262.5 |
| 13 | 125.000 | 406.760 | 0.250 | 119900.000 | 8.699 | 3.531 | -0.96 | 72.53 | 169.3 | 383.5 |
| 14 | 82.169 | 268.950 | 0.150 | 326.000 | 8.739 | 5.916 | -0.67 | 80.80 | 143.6 | 227.5 |
| 15 | 92.950 | 311.850 | 0.300 | 1895.500 | 8.491 | 5.216 | -0.79 | 77.16 | 142.9 | 268.7 |
| 16 | 101.370 | 320.300 | 0.250 | 2.550 | 8.608 | 8.099 | -0.58 | 74.04 | 161.6 | 307.3 |
| 17 | 80.820 | 262.500 | 0.250 | 6.000 | 8.510 | 7.641 | -0.57 | 80.38 | 141.3 | 235.1 |
| 18 | 104.650 | 339.110 | 0.350 | 67.199 | 8.476 | 6.703 | -0.61 | 90.97 | 175.5 | 309.0 |
| 19 | 94.875 | 305.850 | 0.300 | 0.750 | 8.500 | 8.610 | -0.37 | 72.99 | 167.5 | 290.2 |
| 20 | 72.710 | 236.550 | 0.250 | 1.000 | 8.464 | 8.374 | -0.39 | 93.90 | 134.8 | 213.7 |

TABLE 2

P-CHANNEL TYPE TFT

| MEASURED POINTS | Ion_1[uA] (VD=-1 V) (VG=-5 V) | Ion_2[uA] (VD=-5 V) (VG=-5 V) | Ioff_1[pA] (VD=-1 V) (VG=6 V) | Ioff_2[pA] (VD=-5 V) (VG=1 V) | Ion/Ioff_1 | Ion/Ioff_2 | Vth[V] (VD=-5 V) | S-value [mV/dec] (VD=-1 V) | μFE[cm2/Vs] (VD=-1 V) (VG=-5 V) | μFE[cm2/Vs] (VD=-1 V) (max) |
|---|---|---|---|---|---|---|---|---|---|---|
| 1 | 33.624 | 68.959 | 19.300 | 114.950 | 6.241 | 5.778 | -1.54 | 101.72 | 153.1 | 153.3 |
| 2 | 35.515 | 73.284 | 1.850 | 48.750 | 7.283 | 6.177 | -1.47 | 80.49 | 156.4 | 157.8 |
| 3 | 36.074 | 77.680 | 1.300 | 28.250 | 7.443 | 6.439 | -1.36 | 78.24 | 145.9 | 152.6 |
| 4 | 36.575 | 82.783 | 1.850 | 19.800 | 7.296 | 6.621 | -1.20 | 72.41 | 134.6 | 149.0 |
| 5 | 33.969 | 69.093 | 3.550 | 27.700 | 6.981 | 6.397 | -1.58 | 93.42 | 159.6 | 160.2 |
| 6 | 30.304 | 63.490 | 1.750 | 59.149 | 7.238 | 6.031 | -1.43 | 126.33 | 130.4 | 133.5 |
| 7 | 34.084 | 72.148 | 1.800 | 40.300 | 7.277 | 6.253 | -1.44 | 91.27 | 147.5 | 149.0 |
| 8 | 35.519 | 76.968 | 1.450 | 33.150 | 7.389 | 6.366 | -1.42 | 86.21 | 149.7 | 153.6 |
| 9 | 31.970 | 65.543 | 1.450 | 22.100 | 7.343 | 6.472 | -1.59 | 85.42 | 143.4 | 146.7 |
| 10 | 38.149 | 82.813 | 1.000 | 20.050 | 7.581 | 6.616 | -1.33 | 102.60 | 153.0 | 159.7 |
| 11 | 36.690 | 82.061 | 1.450 | 40.300 | 7.403 | 6.309 | -1.27 | 68.85 | 133.8 | 141.8 |
| 12 | 32.414 | 67.774 | 1.300 | 33.550 | 7.397 | 6.305 | -1.48 | 98.81 | 133.3 | 135.7 |
| 13 | 40.974 | 89.958 | 1.350 | 20.900 | 7.482 | 6.634 | -1.29 | 77.82 | 144.9 | 162.4 |
| 14 | 36.970 | 76.551 | 1.150 | 27.150 | 7.507 | 6.450 | -1.48 | 102.67 | 154.6 | 155.0 |
| 15 | 37.035 | 76.234 | 1.150 | 16.050 | 7.508 | 6.677 | -1.45 | 95.96 | 147.7 | 156.9 |
| 16 | 29.054 | 60.005 | 1.250 | 32.200 | 7.366 | 6.270 | -1.60 | 76.28 | 126.1 | 127.1 |
| 17 | 34.820 | 74.960 | 2.850 | 18.900 | 7.087 | 6.598 | -1.35 | 78.89 | 135.0 | 140.6 |
| 18 | 41.619 | 87.679 | 2.600 | 44.199 | 7.204 | 6.297 | -1.37 | 111.21 | 162.6 | 166.5 |
| 19 | 41.740 | 85.656 | 1.150 | 24.649 | 7.560 | 6.541 | -1.51 | 70.01 | 166.0 | 175.7 |
| 20 | 38.784 | 82.258 | 1.400 | 21.050 | 7.443 | 6.592 | -1.37 | 95.85 | 144.5 | 157.4 |

SEMICONDUCTOR DEVICE AND METHOD FOR FABRICATING THE SAME

This application is a Divisional of application Ser. No. 08/785,489 filed Jan. 17, 1997 now U.S. Pat. No. 6,077,731.

BACKGROUND OF THE INVENTION

1. Field of the Invention

The present invention relates to a semiconductor device typified by a thin film transistor and to a fabrication method thereof. The present invention also relates to a semiconductor device using a crystal silicon thin film formed on a substrate such as a glass substrate and quartz substrate and to a fabrication method thereof. Further, the present invention relates to an insulated gate type semiconductor device such as a thin film transistor and to a fabrication method thereof.

2. Description of Related Art

Hitherto, there has been known a thin film transistor using a silicon film, i.e. a technology for forming the thin film transistor by using the silicon film formed on a glass substrate or quartz substrate. The glass substrate or quartz substrate is used as the substrate because the thin film transistor is used for an active matrix liquid crystal display. While a thin film transistor has been formed by using an amorphous silicon film (a-Si) in the past, it is being tried to fabricate the thin film transistor by utilizing a silicon film having a crystallinity (referred to as "crystal silicon film" hereinbelow in the present specification as necessary) in order to enhance its performance.

The thin film transistor using the crystal silicon film allows to operate at a high speed by more than two digits as compared to one using the amorphous silicon film. Accordingly, while peripheral driving circuits of an active matrix liquid crystal display have been composed of external IC circuits, the crystal silicon film allows them to be built on the glass substrate or quartz substrate similarly to the active matrix circuit. Such structure is very advantageous in miniaturizing the whole apparatus and in simplifying the fabrication process, thus leading to the reduction of the fabrication cost.

Hitherto, a crystal silicon film has been obtained by forming an amorphous silicon film by means of plasma CVD or low pressure thermal CVD and then by crystallizing it by implementing a heat treatment or by irradiating laser light. However, it has been the fact that it is difficult to obtain a required crystallinity across the wide area through the heat treatment because it may cause nonuniformity in the crystallization. Further, although it is possible to obtain the high crystallinity partly by irradiating laser light, it is difficult to obtain a good annealing effect across the wide area. In this case, the irradiation of the laser light is apt to become unstable under the condition for obtaining specifically a good crystallinity.

By the way, the inventors et. al. have developed a technology for obtaining the crystal silicon film through a heat treatment at a lower temperature than that of the prior art by introducing a metal element (e.g. nickel) which promotes the crystallization of silicon to the amorphous silicon film (Japanese Patent Laid-Open Nos. Hei. 6-232059 and Hei. 7-321339). These methods allow not only the crystallization speed to be increased and the crystallization to be achieved in a shorter time, but also a high crystallinity to be obtained uniformly across the wide area, thus having a crystallinity which fits for practical use, as compared to the prior art crystallization of amorphous silicon film implemented only by way of heating or by way of the irradiation of laser light.

However, because the metal element is contained within or on the surface of the crystal silicon film, the amount thereof to be introduced has to be controlled very carefully, thus posing a problem in its reproducibility and stability (electrical stability of a device obtained). Specifically, there is a problem that an elapsed change of the characteristics of a semiconductor device to be obtained is large or an OFF value, in case of a thin film transistor, is large, due to the influence of the remaining metal element. That is, although the metal element which promotes the crystallization of silicon plays the valuable and useful role in obtaining the crystal silicon film, its existence becomes a minus factor which causes various problems after obtaining the crystal silicon film once.

Then, after conducting a large number of experiments and discussions from various aspects in order to solve the problem in forming the crystal silicon film by introducing the metal element (e.g. nickel) which promotes the crystallization of silicon to the amorphous silicon film and by treating by heat as described above, the inventors et. al. have found that the metal element contained and remaining in the crystal silicon film may be eliminated or reduced by the specific method described later, thus reaching to the present invention.

By the way, because an active matrix liquid crystal display is small, is light and is able to display fine motion pictures at high speed, it is being expected to become the mainstream of displays of the future. However, because it has a limit that a substrate composing the liquid crystal display needs to be translucent, its type is limited. A glass substrate, a quartz substrate or a plastic substrate may be cited as an example thereof.

However, among them, the plastic substrate has a problem that it lacks in heat resistance and the quartz substrate has a problem that it is very expensive and its cost is more than 10 times of the glass substrate especially when it is widened, thus lacking in cost performance, though it can withstand a high temperature of about 1000° C. or 1100° C. Accordingly, the glass substrate is widely used general from the reasons of heat resistance and economy.

Currently, the performance required for the liquid crystal displays is getting higher and higher and the performance and characteristics required for a thin film transistor (hereinafter referred to as a TFT as necessary) used as a switching element of the liquid crystal displays is also getting higher. Due to that, while the research and development for forming the crystal silicon film having the crystallinity on the glass substrate are being actively conducted, the crystal silicon film is formed on the glass substrate by adopting the method of forming the amorphous silicon film and of crystallizing it by treating by heat or by irradiating laser light at the present.

That is, because the heat resistant temperature of the glass substrate is normally about 600° C., though it depends on a type thereof, a process which exceeds the heat resistant temperature of the glass substrate cannot be adopted in the step for forming the crystal silicon film. Therefore, a method for forming the amorphous silicon film by means of plasma CVD or low pressure CVD and crystallizing it by heating at a temperature below that heat resistant temperature has been adopted in forming the crystal silicon film on the glass substrate. The method of crystallizing the silicon film by irradiating laser light also allows the crystal silicon film having an excellent crystallinity to be formed on the glass substrate and has an advantage that the laser light will not damage the glass substrate thermally.

However, the crystal silicon film crystallized from the amorphous silicon film by the above-mentioned technologies has had a large number of defects caused by dangling bond and the like. Because these defects are the factor of degrading characteristics of the TFT, it is necessary to passivate the defects at the interface between an active layer and a gate insulating film and the defects within and at the boundary of the crystal grains of the silicon of the active layer in fabricating the TFT by utilizing such crystal silicon film. The defects at the grain boundary in particular are the greatest factor of scattering charge, but it is very difficult to passivate the defects at the grain boundary.

Meanwhile, it is possible to compensate the defects at the grain boundary of the crystal silicon film by Si in fabricating a TFT on the quartz substrate because it is possible to implement a heat treatment at a high temperature of about 1000° C. or 1100° C. for example. In contrary to that, it is difficult to implement the heat treatment in high temperatures in fabricating the TFT on the glass substrate, so that the defects of the grain boundary of the crystal silicon film are passivated by hydrogen by implementing a hydrogen plasma treatment in an atmosphere of about 300 to 400° C. normally in the final stage of the process.

An n-channel type TFT presents a practical field-effect mobility by implementing the hydrogen plasma treatment. On the other hand, the effect of the hydrogen plasma treatment is not so remarkable in a p-channel type TFT. It is construed to happen because a level caused by the defect of the crystal is formed in a relatively shallow domain under a conduction electron zone. Although it is possible to compensate the defect of the grain boundary of the crystal silicon film by implementing the hydrogen plasma treatment, an elapsed reliability of the TFT or the n-channel type TFT in particular which has been treated by the hydrogen plasma is not stable because the hydrogen compensating the defect is apt to be desorbed. For instance, if the n-channel type TFT is energized for 48 hours in an atmosphere of 90° C., its mobility is reduced to a half.

Further, although the quality of the crystal silicon film obtained by irradiating laser light is good, ridges (irregularity) are formed on the surface of the crystal silicon film if the thickness of the film is less than 1000 angstrom. when laser light is irradiated to the silicon film, the silicon film is melt instantly and expands locally. The ridges are formed on the surface of the crystal silicon film to relax internal stress caused by this expansion. A difference of elevation of this ridge is about ½ to 1 time of the thickness of the film. For instance, when laser annealing is implemented after crystallizing an amorphous silicon film whose thickness is about 700 angstrom by way of heating, ridges of 100 to 300 angstrom in height are formed on the surface thereof.

Because a potential barrier and a trap level caused by the dangling bond, distortion of lattice and the like are formed at the ridges on the surface of the crystal silicon film in an insulated gate type semiconductor device, the level of the interface between the active layer and the gate insulating film becomes high. Further, because the peak of the ridge is sharp and thus an electric field is apt to concentrate there, it may become a source of leak current, causing dielectric breakdown in the end. Further, because the ridge on the surface of the crystal silicon film damages a coating quality of the gate insulating film deposited by way of sputtering or CVD, it degrades the reliability of insulation by causing defective insulation.

SUMMARY OF THE INVENTION

Accordingly, it is an object of the present invention to provide a novel and very useful method for forming a crystal silicon film by introducing a metal element which promotes crystallization of silicon to an amorphous silicon film and for eliminating the metal element or for reducing the concentration of the metal element within the crystal silicon film thus obtained.

It is another object of the present invention to provide a semiconductor device having excellent characteristics, and a fabrication method thereof, fabricated by using a crystal silicon film having a high crystallinity and obtained by introducing a metal element which promotes crystallization of silicon to an amorphous silicon film and by eliminating the metal element or by reducing the concentration of the metal element in the crystal silicon film.

It is a further object of the present invention to provide a semiconductor device, and a fabrication method thereof, which allows the characteristics and reliability of the semiconductor device thus obtained to be enhanced.

It is still another object of the present invention to solve the aforementioned problem by providing a method for fabricating a semiconductor device which allows the defects at the crystal boundary of the silicon film crystallized from the amorphous silicon film to be passivated without using the hydrogen plasma treatment.

It is another object of the present invention to provide a method for fabricating a semiconductor device having a high reliability and high mobility and more particularly to provide a semiconductor device, and a fabrication method thereof, which has a gate insulating film composed of deposited films, which is formed on a glass substrate and whose reliability and characteristics are enhanced.

While the present invention has objects, beside those described above, which correspond to the structures described below, these will be explained as necessary complementarily in the description which follows.

In order to solve the aforementioned problems, the present invention possesses the following aspects:

(1) The present invention provides a method for fabricating a semiconductor device, comprising steps of intentionally introducing a metal element which promotes crystallization of silicon to an amorphous silicon film and crystallizing the amorphous silicon film by a first heat treatment to obtain a crystal silicon film; eliminating or reducing the metal element existing within the crystal silicon film by implementing a second heat treatment within an oxidizing atmosphere; eliminating a thermal oxide film formed in the previous step; and forming a thermal oxide film on the surface of the domain from which the thermal oxide film has been eliminated by implementing another thermal oxidation.

(2) The present invention provides a method for fabricating a semiconductor device, comprising-steps of intentionally introducing a metal element which promotes crystallization of silicon to an amorphous silicon film and crystallizing the amorphous silicon film by a first heat treatment to obtain a crystal silicon film; eliminating or reducing the metal element existing within the crystal silicon film by implementing a second heat treatment within an oxidizing atmosphere to form a thermal oxide film on the surface of the crystal silicon film and by causing the thermal oxide film to getter the metal element; eliminating the thermal oxide film formed in the previous step; and forming a thermal oxide film on the surface of the domain from which the thermal oxide film has been eliminated by implementing another thermal oxidation.

(3) The present invention provides a method for fabricating a semiconductor device, comprising steps of intentionally introducing a metal element which promotes crystallization of silicon to an amorphous silicon film and crystallizing the amorphous silicon film by a first heat treatment to obtain a crystal silicon film; eliminating or reducing the metal element existing within the crystal silicon film by implementing a second oxidation heat treatment within an oxidizing atmosphere; eliminating a thermal oxide film formed in the steps; forming an active layer of a thin film transistor by implementing patterning; and forming a thermal oxide film which composes at least a part of a gate insulating film on the surface of the active layer by means of thermal oxidation.

(4) The present invention provides a method for fabricating a semiconductor device, comprising steps of selectively introducing a metal element which promotes crystallization of silicon to an amorphous silicon film; growing crystal by a first heat treatment in a direction parallel to the film from the domain to which the metal element has been selectively introduced; forming a thermal oxide film on the surface of the domain where the crystal has been grown by implementing a second heat treatment within an oxidizing atmosphere; eliminating the thermal oxide film; and forming an active layer of the semiconductor device by using the domain from which the thermal oxide film has been eliminated.

(5) The present invention provides a semiconductor device, characterized in that the semiconductor device has a crystal silicon film interposed between first and second oxide films; the crystal silicon film contains a metal element which promotes crystallization of silicon; and the metal element is distributed in high concentration near the interfaces with the first and/or second oxide film within the crystal silicon film.

(6) The present invention provides a semiconductor device comprising an underlying layer made from an oxide film; a crystal silicon film formed on the underlying layer; and a thermal oxide film formed on the crystal silicon film; wherein the crystal silicon film contains a metal element which promotes crystallization of silicon; the metal element which promotes the crystallization of silicon is distributed in high concentration near the interface with the underlying layer and/or the thermal oxide film; and the thermal oxide film composes at least a part of a gate insulating film of a thin film transistor.

(7) The present invention provides a method for fabricating a semiconductor device, comprising steps of intentionally introducing a metal element which promotes crystallization of silicon to an amorphous silicon film and crystallizing the amorphous silicon film by a first heat treatment to obtain a crystal silicon film; eliminating or reducing the metal element existing within the crystal silicon film by implementing a second heat treatment within an oxidizing atmosphere containing a halogen element; eliminating a thermal oxide film formed in the previous step; and forming another thermal oxide film on the surface of the domain from which the thermal oxide film has been eliminated by implementing another thermal oxidation.

(8) The present invention provides a method for fabricating a semiconductor device, comprising steps of intentionally introducing a metal element which promotes crystallization of silicon to an amorphous silicon film and crystallizing the amorphous silicon film by a first heat treatment to obtain a crystal silicon film; eliminating or reducing the metal element existing within the crystal silicon film by implementing a second heat treatment within an oxidizing atmosphere containing a halogen element to form a thermal oxide film on the surface of the crystal silicon film and by causing the thermal oxide film to getter the metal element; eliminating the thermal oxide film formed in the previous step; and forming another thermal oxide film on the surface of the domain from which the thermal oxide film has been eliminated by implementing another thermal oxidation.

(9) The present invention provides a method for fabricating a semiconductor device, comprising steps of intentionally introducing a metal element which promotes crystallization of silicon to an amorphous silicon film and crystallizing the amorphous silicon film by a first heat treatment to obtain a crystal silicon film; eliminating or reducing the metal element existing within the crystal silicon film by implementing a second heat treatment within an oxidizing atmosphere containing a halogen element; eliminating a thermal oxide film formed in the previous step; forming an active layer of a thin film transistor by implementing patterning; and forming another thermal oxide film which composes at least a part of a gate insulating film on the surface of the active layer by means of thermal oxidation.

(10) The present invention provides a method for fabricating a semiconductor device, comprising steps of selectively introducing a metal element which promotes crystallization of silicon to an amorphous silicon film growing crystal by a first heat treatment in a direction parallel to the film from the domain to which the metal element has been selectively introduced; forming a thermal oxide film on the surface of the domain where the crystal has been grown by implementing a second heat treatment within an oxidizing atmosphere containing a halogen element; eliminating the thermal oxide film; and forming an active layer of the semiconductor device by using the domain from which the thermal oxide film has been eliminated.

(11) The present invention provides a semiconductor device, characterized in that the semiconductor device has a crystal silicon film interposed between a first and second oxide films; the crystal silicon film contains hydrogen and a halogen element as well as a metal element which promotes crystallization of silicon; and the metal element is distributed in high concentration near the interfaces with the first and/or second oxide film within the crystal silicon film.

(12) The present invention provides a semiconductor device, comprising an underlying layer made from an oxide film; a crystal silicon film formed on the underlying layer; and a thermal oxide film formed on the crystal silicon film; wherein the crystal silicon film contains a metal element which promotes crystallization of silicon, hydrogen and a halogen element; the metal element which promotes the crystallization of silicon is distributed in high concentration near the interface with the underlying layer and/or the thermal oxide film; the halogen element is distributed in high concentration near the interface with the underlying layer and/or the thermal oxide film; and the thermal oxide film composes at least part of a gate insulating film of a chin film transistor

(13) The present invention provides a method for fabricating a semiconductor device, comprising steps of intentionally introducing a metal element which promotes crystallization of silicon to an amorphous silicon film and crystallizing the amorphous silicon film by a first heat treatment to obtain a crystal silicon film; irradiating laser light or intense light to the crystal silicon film; eliminating or reducing the metal element existing within the crystal silicon film by implementing a second heat treatment within an oxidizing atmosphere containing a halogen element; eliminating a thermal oxide film formed in the previous step; and forming another thermal oxide film on the surface of the domain from which the thermal oxide film has been eliminated by implementing another thermal oxidation.

(14) The present invention provides a method for fabricating a semiconductor device, comprising steps of intentionally introducing a metal element which promotes crystallization of silicon to an amorphous silicon film and crystallizing the amorphous silicon film by a first heat treatment to obtain a crystal silicon film; irradiating laser light or intense light to the crystal silicon film to diffuse the metal element, existing within the crystal silicon film, in the crystal silicon film; implementing a second heat treatment within an oxidizing atmosphere containing a halogen element to cause the metal element existing within the crystal silicon film to be gettered to a thermal oxide film to be formed; eliminating the thermal oxide film formed in the previous step; and forming another thermal oxide film on the surface of the domain from which the thermal oxide film has been eliminated by implementing another thermal oxidation.

(15) The present invention provides a method for fabricating a semiconductor device, comprising steps of intentionally and selectively introducing a metal element which promotes crystallization of silicon to an amorphous silicon film; implementing a first heat treatment to the amorphous silicon film to grow crystal in a direction parallel to the film from a domain of the amorphous silicon film into which the metal element has been intentionally and selectively introduced; irradiating laser light or intense light to diffuse the metal element existing within the domain where the crystal has grown; implementing a second heat treatment within an oxidizing atmosphere containing a halogen element to cause the metal element existing within the domain where the crystal has grown to be gettered to a thermal oxide film to be formed; eliminating the thermal oxide film formed in the previous step; and forming another thermal oxide film on the surface of the domain from which the thermal oxide film has been eliminated by implementing another thermal oxidation.

(16) The present invention provides a method for fabricating a semiconductor device, comprising steps of intentionally introducing a metal element which promotes crystallization of silicon to an amorphous silicon film and crystallizing the amorphous silicon film by a first heat treatment to obtain a crystal silicon film; forming an active layer of the semiconductor device by patterning the crystal silicon film; irradiating laser light or intense light to the active layer; implementing a second heat treatment within an oxidizing atmosphere containing a halogen element to eliminate or reduce the metal element existing within the active layer; eliminating a thermal oxide film formed in the previous step; and forming another thermal oxide film on the surface of the active layer by implementing another thermal oxidation.

(17) The present invention provides a method for fabricating a semiconductor device, comprising steps of intentionally introducing a metal element which promotes crystallization of silicon to an amorphous silicon film and crystallizing the amorphous silicon film by a first heat treatment to obtain a crystal silicon film; forming an active layer of the semiconductor device by patterning the crystal silicon film; irradiating laser light or intense light to the active layer; implementing a second heat treatment within an oxidizing atmosphere containing a halogen element to eliminate or reduce the metal element existing within the active layer; eliminating a thermal oxide film formed in the previous step; and forming another thermal oxide film on the surface of the active layer by implementing another thermal oxidation, wherein the active layer has an inclined shape in which an angle formed between a side face and an underlying face is 20° to 50°.

(18) The present invention provides a method for fabricating a semiconductor device, comprising steps of intentionally introducing a metal element which promotes crystallization of silicon to an amorphous silicon film and crystallizing the amorphous silicon film by a first heat treatment to obtain a crystal silicon film; irradiating laser light or intense light to the crystal silicon film; eliminating or reducing the metal element existing within the crystal silicon film by implementing a second heat treatment within an oxidizing atmosphere; eliminating a thermal oxide film formed in the previous step; and forming another thermal oxide film on the surface of the domain from which the thermal oxide film has been eliminated by implementing another thermal oxidation.

(19) The present invention provides a method for fabricating a semiconductor device, comprising steps of intentionally introducing a metal element which promotes crystallization of silicon to an amorphous silicon film and crystallizing the amorphous silicon film by a first heat treatment to obtain a crystal silicon film; irradiating laser light or intense light to the crystal silicon film to diffuse the metal element, existing within the crystal silicon film, in the crystal silicon film; implementing a second heat treatment within an oxidizing atmosphere to cause the metal element existing within the crystal silicon film to be gettered to a thermal oxide film to be formed; eliminating the thermal oxide film formed in the previous step; and forming another thermal oxide film on the surface of the domain from which the thermal oxide film has been eliminated by implementing another thermal oxidation.

(20) The present invention provides a method for fabricating a semiconductor device, comprising steps of intentionally and selectively introducing a metal element which promotes crystallization of silicon to an amorphous silicon film; implementing a first heat treatment to the amorphous silicon film to grow crystal in a direction parallel to the film from a domain of the amorphous silicon film into which the metal element has been intentionally and selectively introduced; irradiating laser light or intense light to diffuse the metal element existing within the domain where the crystal has grown; implementing a second heat treatment within an oxidizing atmosphere to cause the metal element existing within the domain where the crystal has grown to be gettered to a thermal oxide film to be formed; eliminating the thermal oxide film formed in the previous step; and forming another thermal oxide film on the surface of the domain from which the thermal oxide film has been eliminated by implementing another thermal oxidation.

(21) The present invention provides a method for fabricating a semiconductor device, comprising steps of intentionally introducing a metal element which promotes crystallization of silicon to an amorphous silicon film and crystallizing the amorphous silicon film by a first heat treatment to obtain a crystal silicon film; forming an active layer of the semiconductor device by patterning the crystal silicon film; irradiating laser light or intense light to the active layer; implementing a second heat treatment within an oxidizing atmosphere to eliminate or reduce the metal element existing within the active layer; eliminating a thermal oxide film formed in the previous step; and forming another thermal oxide film on the surface of the active layer by implementing another thermal oxidation.

(22) The present invention provides a method for fabricating a semiconductor device, comprising steps of intentionally introducing a metal element which promotes crystallization of silicon to an amorphous silicon film and crystallizing the amorphous silicon film by a first heat treatment to obtain a crystal silicon film; forming an active layer of the semiconductor device by patterning the crystal silicon film; irradiating laser light or intense light to the active layer; implementing a second heat treatment within an oxidizing atmosphere to eliminate or reduce the metal element existing within the active layer; eliminating a thermal oxide film formed in the previous step; and forming another thermal oxide film on the surface of the active layer by implementing another thermal oxidation, wherein the active layer has an inclined shape in which an angle formed between a side face and an underlying face is 20° to 50°.

(23) The present invention provides a method for fabricating a semiconductor device, comprising steps of forming an amorphous silicon film on a substrate having an insulating surface; intentionally introducing a metal element which promotes crystallization of silicon to the amorphous silicon film; obtaining a crystal silicon film by crystallizing the amorphous silicon film by a first heat treatment in the temperature range of 750° C. to 1100° C.; forming an active layer of the semiconductor device by patterning the crystal silicon film; eliminating or reducing the metal element existing within the crystal silicon film by implementing a second heat treatment within an oxidizing atmosphere containing a halogen element; eliminating a thermal oxide film formed in the previous step; and forming another thermal oxide film after eliminating the thermal oxide film by implementing another thermal oxidation; wherein a temperature of the second heat treatment is higher than that of the first heat treatment.

(24) The present invention provides a method for fabricating a semiconductor device, comprising steps of forming an amorphous silicon film on a substrate having an insulating surface; intentionally introducing a metal element which promotes crystallization of silicon to the amorphous silicon film; obtaining a crystal silicon film by crystallizing the amorphous silicon film by a first heat treatment in the temperature range of 750° C. to 1100° C.; forming an active layer of the semiconductor device by patterning the crystal silicon film; implementing a second heat treatment within an oxidizing atmosphere containing a halogen element to cause the metal element existing within the crystal silicon film to be gettered to a thermal oxide film to be formed; eliminating the thermal oxide film formed in the previous step; and forming another thermal oxide film after eliminating the thermal oxide film by implementing another thermal oxidation; wherein a temperature of the second heat treatment is higher than that of the first heat treatment.

(25) The present invention provides a method for fabricating a semiconductor device, comprising steps of forming an amorphous silicon film on a substrate having an insulating surface; intentionally and selectively introducing a metal element which promotes crystallization of silicon to the amorphous silicon film; growing crystal in a direction parallel to the film from a domain of the amorphous silicon film into which the metal element has been intentionally and selectively introduced by a first heat treatment in the temperature range of 750° C. to 1100° C.; forming an active layer of the semiconductor device by using the domain in which the crystal has been grown in the direction parallel to the film by patterning; implementing a second heat treatment within an oxidizing atmosphere containing a halogen element to cause the metal element existing within the active layer to be gettered to a thermal oxide film to be formed; eliminating the thermal oxide film formed in the previous step; and forming another thermal oxide film after eliminating the thermal oxide film by implementing another thermal oxidation; wherein a temperature of the second heat treatment is higher than that of the first heat treatment.

(26) The present invention provides a method for fabricating a semiconductor device, comprising steps of forming an amorphous silicon film; holding a metal element which promotes crystallization of silicon in contact on the surface of the amorphous silicon film; crystallizing the amorphous silicon film by a first heat treatment to obtain a crystal silicon film; forming a thermal oxide film on the surface of the crystal silicon film by implementing a second heat treatment in the temperature range of 500° C. to 700° C. within an atmosphere containing oxygen, hydrogen and fluorine; and eliminating the thermal oxide film.

(27) The present invention provides a method for fabricating a semiconductor device, comprising steps of forming an amorphous silicon film; holding a metal element which promotes crystallization of silicon in contact on the surface of the amorphous silicon film; crystallizing the amorphous silicon film by a first heat treatment to obtain a crystal silicon film; forming a thermal oxide film on the surface of the crystal silicon film by implementing a second heat treatment in the temperature range of 500° C. to 700° C. within an atmosphere containing oxygen, hydrogen, fluorine and chlorine; and eliminating the thermal oxide film.

(28) The present invention provides a method for fabricating a semiconductor device, comprising steps of forming an amorphous silicon film; holding a metal element which promotes crystallization of silicon in contact on the surface of the amorphous silicon film; obtaining a crystal silicon film by crystallizing the amorphous silicon film by a heat treatment; forming a wet oxide film on the surface of the crystal silicon film within an atmosphere containing fluorine/chlorine; and eliminating the oxide film.

(29) The present invention provides a semiconductor device having a silicon film having a crystallinity, characterized in that the silicon film contains a metal element which promotes crystallization of silicon in concentration of $1\times10^{16}$ cm$^{-3}$ to $5\times10^{18}$ cm$^{-3}$, fluorine atoms in concentration of $1\times10^{15}$ cm$^{-3}$ to $1\times10^{20}$ cm$^{-3}$, and hydrogen atoms in concentration of $1\times10^{17}$ cm$^{-3}$ to $1\times10^{21}$ cm$^{-3}$. It is noted that the unit of concentration " . . . cm$^{-3}$" means the number of atoms (atoms/cm$^3$) per 1 cc and the same applies throughout the present specification.

(30) The present invention provides a method for fabricating a semiconductor device, comprising steps of forming an amorphous silicon film; crystallizing the amorphous silicon film to form a crystal silicon film; growing a thermal oxide film on the surface of the crystal silicon film by heating in an oxidizing atmosphere to which fluorine compound gas is added; eliminating the thermal oxide film on the surface of the crystal silicon film; and depositing an insulating film on the surface of the crystal silicon film.

(31) The present invention provides a method for fabricating a semiconductor device, comprising steps of forming an amorphous silicon film; irradiating laser light to crystallize the amorphous silicon film to form a crystal silicon film; growing a thermal oxide film on the surface of the crystal silicon film by heating in an oxidizing atmosphere to which fluorine compound gas is added; eliminating the thermal oxide film on the surface of the crystal silicon film; and depositing an insulating film on the surface of the crystal silicon film.

(32) The present invention provides a method for fabricating a semiconductor device in fabricating a thin film transistor on a substrate having an insulating surface, comprising steps of forming an amorphous silicon film; crystallizing the amorphous silicon film to form a crystal silicon film; growing a thermal oxide film on the surface of the crystal silicon film by heating in an oxidizing atmosphere to which fluorine compound gas is added; eliminating the thermal oxide film on the surface of the crystal silicon film; forming an active layer of the thin film transistor by shaping the crystal silicon film; depositing an insulating film on the surface of the active layer to form a gate insulating film at least on the surface of a channel region; forming a gate electrode on the surface of the gate insulating film; and forming a source and a drain in a manner of self-alignment by injecting impurity ions which give a conductive type to the active layer by using the gate electrode as a mask.

(33) The present invention provides a method for fabricating a semiconductor device in fabricating a thin film transistor on a substrate having an insulating surface, comprising steps of forming an amorphous silicon film; forming a crystal silicon film by crystallizing the amorphous silicon film; irradiating laser light to the crystal silicon film; growing a thermal oxide film on the surface of the crystal silicon film by heating in an oxidizing atmosphere to which fluorine compound gas is added; eliminating the thermal oxide film on the surface of the crystal silicon film; forming an active layer of the thin film transistor by shaping the crystal silicon film; depositing an insulating film on the surface of the active layer to form a gate insulating film at least on the surface of a channel region; forming a gate electrode on the surface of the gate insulating film; and forming a source and a drain in a manner of self-alignment by injecting impurity ions which give a conductive type to the active layer by using the gate electrode as a mask.

According to one typical aspect of the present invention, a metal element which promotes crystallization of silicon is introduced to the surface of an amorphous silicon film formed in advance to form a crystal silicon film. Next, a thermal oxide film is formed on the surface of the crystal silicon film to cause the metal element to move or to be gettered to the thermal oxide film to reduce the concentration of the metal element or to eliminate the metal element within the crystal silicon film.

The amorphous silicon film may be formed by means of normal methods such as plasma CVD. The amorphous silicon film is formed on a surface of adequate solid body or on a substrate when it is used in constructing a semiconductor device. For the substrate, a ceramic substrate or the like, beside a glass substrate and a quartz substrate, may be used. While the amorphous silicon film is formed also on a film such as a silicon oxide film formed on the surface of such substrate, the substrate which is referred in the present specification means to include such aspects.

Next, the metal element which promotes the crystallization of silicon is introduced to the surface of the amorphous silicon film formed in advance as described above. As the metal element which promotes the crystallization of silicon, one or a plurality of types of metal elements selected from iron (Fe), nickel (Ni), cobalt (Co), ruthenium (Ru), rhodium (Rh), paradium (Pd), osnium (Os), iridium (Ir), platinum (Pt), copper (Cu), and gold (Au) is used. These metal elements are used as the metal elements which promote the crystallization of silicon in any of the inventions described in the present specification and are referred in the present specification as "metal elements which promote the crystallization of silicon typified by nickel" as necessary.

While these metal elements may be introduced: 1) on the whole surface of the amorphous silicon film, 2) at end portions of the amorphous silicon film (if the face of the amorphous silicon film is rectangular, at the end of one side, ends of two sides, ends of three sides or ends of four sides: if the face of the amorphous silicon film is circular, at its peripheral portion), 3) to the center of the face of the amorphous silicon film, 4) in dots (that is, in dots leaving predetermined spaces therebetween on the surface of the amorphous silicon film) and the like and there is no specific limitation, it is preferred to introduce on the whole surface or to the end portions of the amorphous silicon film. Further, although it is possible to adopt an aspect of introducing the metal element on the back face of the amorphous silicon film, it is preferable to apply it on the front surface from the aspect of fabrication of the semiconductor device.

Further, there is no specific limit on the method how to introduce those metal elements to the amorphous silicon film so long as it is a method which allows the metal elements to be introduced to the surface or the inside of the amorphous silicon film, and such methods as sputtering, CVD, plasma treatment (including plasma CVD), adsorption and a method of applying solution of metallic salt may be used for example. Among them, the method of using solution is useful from the aspects that it is simple and that the concentration of the metal element may be readily adjusted. Various salts may be used for the metallic salt and organic solvents such as alcoholic, aldehyde, ether solvents or a mixed solvent of water and organic solvent may be used beside water as the solvent. Further, the solution needs not be what such metallic salt is dissolved completely and may be what part or whole of the metallic salt exists in suspended state.

Any type of the metallic salt can be used regardless whether it is organic salt or non-organic salt so long as it is salt which can exists as the solution or suspended solution as described above. For example, such ferrous salt as ferrous bromide, ferric bromide, ferric acetate, ferrous chloride, ferric chloride, ferric fluoride chloride, ferric nitrate, ferrous phosphate, ferric phosphate and the like and such cobalt salt as cobalt bromide, cobalt acetate, cobalt chloride, cobalt fluoride, cobalt nitrate and the like may be used.

Further, such nickel salt as nickel bromide, nickel acetate, nickel oxalate, nickel carbonate, nickel chloride, nickel iodide, nickel nitrate, nickel sulfate, nickel formate, nickel oxide, nickel hydroxide, nickel acetylacetate, nickel 4-cyclohexylbutyrate, nickel etylhexanoic acid and the like may be used. Ruthenium chloride may be cited as an example of ruthenium salt, rhodium chloride as an example of rhodium salt, paradium chloride as an example of paradium salt, osnium chloride as an example of osmium salt, iridium trichloride or iridium tetrachloride as examples of iridium salt, platinic chloride as an example of platinum salt, cupric acetate, cupric chloride and cupric nitrate as examples of copper salt, and gold trichloride and gold chloride as gold salt.

After thus introducing the metal element to the amorphous silicon film, the crystal silicon film is formed by using the metal element. While this crystallization may be carried out by implementing a heat treatment (Solid Phase Crystallization) or by irradiating laser light or intense light such as ultraviolet ray or infrared ray, it is preferable to use the heat treatment. While this solid phase crystallization proceeds even in an atmosphere containing hydrogen or oxygen, preferably an inactive atmosphere such as nitrogen or argon is used. It is noted chat this heat treatment or the heat treatment temperature will be referred to as the "first heat treatment" or "temperature of the first heat treatment" as necessary throughout the present specification.

The first heat treatment may be carried out in the temperature range of 400 to 1100° C. or preferably about 550 to 1050° C. Although the crystallization proceeds even at a temperature of about 400° C., the crystallization speed is slow and it takes a long time in this case. Accordingly, the temperature is preferable to be above 550° C. or more preferably above 700° C. The higher heat treatment temperature allows a better quality crystal to be obtained and the crystallization speed to be increased.

While the first heating temperature is limited to about 600 to 650° C. from the aspect of distortion point when a glass substrate whose distortion point is 667° C. for example is used as the substrate, it is needless to say that the temperature may be increased further if a glass substrate having a high heat resistance is used. While a temperature of about 1100° C. may be applied when the substrate is a quartz substrate, it is preferred to be less than about 1050° C. Further, the irradiation of laser light or intense light may be carried out after the heat treatment.

Then, the thermal oxide film is formed on the surface of the crystal silicon film. Thereby, the concentration of the metal element within the crystal silicon film may be reduced or the metal element may be eliminated by causing the metal element to move into or to be gettered to the thermal oxide film according to the present invention. While an oxidizing atmosphere is used in forming the thermal oxide film, it is preferably 1) an oxygen atmosphere, 2) an atmosphere containing oxygen, 3) an atmosphere containing a compound which releases oxygen at the temperature in forming the thermal oxide film, or 4) an atmosphere containing oxygen in 1), 2) and 3) above and halogen.

The thermal oxide film may be formed in the same temperature range with that of the solid phase crystallization described above, i.e. in the range of about 400 to 1100° C., or preferably about 700 to 1050° C. While this temperature may be about the same with that applied to the solid phase crystallization (temperature of the first heat treatment), it is preferable to be higher than that applied to the solid phase crystallization. Thereby, the thermal oxide film may be formed and the solid phase crystallization may be advanced further as compared to the case when the same temperature with that of the first heat treatment is applied.

While the thermal oxide film is thus formed on the surface of the crystal silicon film, the effect of oxygen or oxygen and halogen within the oxidizing atmosphere causes the metal element to be gettered to the thermal oxide film and the concentration of the metal element within the crystal silicon film is reduced or the metal element is eliminated. It is noted that the heat treatment for forming the thermal oxide film and its temperature are referred to "second heat treatment" and "temperature of the second heat treatment" as necessary throughout the present specification.

Next, the thermal oxide film which has gettered the metal element is eliminated. Although there is no limit on the method for eliminating the thermal oxide film so long as it is a method which can eliminate the thermal oxide film, it may be carried out by using a hydrofluoric acid type etchant such as buffer hydrofluoric acid. Thus, the crystal silicon film having a high crystallinity and from which the metal element has been eliminated or the concentration of the metal element has been reduced can be obtained. This crystal silicon film has excellent characteristics as an element (e.g. active layer) within a semiconductor device.

FIGS. 1 through 4 show microphotographs of several examples of the crystal silicon film. Among the figures, FIG. 1 shows a case in which nickel element has been applied to one end of a rectangular amorphous silicon film to crystallize it and FIG. 2 shows a case in which nickel element has been applied to the whole surface of an amorphous silicon film to crystallize it. As it is apparent from FIG. 1, the crystal has grown from one end to the other end in parallel or almost in parallel. In the example in FIG. 2 in which nickel element has been applied to the whole surface of the amorphous silicon film to grow crystal, star-like light and shades can be seen and it can be seen that crystals have grown radially centering on a number of points.

FIGS. 3 and 4 are photographs taken by a transmission type electron microscope. The crystal silicon film shown in the photographs is what has been obtained approximately through the process of (A) through (G) in FIGS. 5A through 5G which show the process diagrammatically (the process similar to those in embodiments described later).

(A) A quartz substrate having a fully smooth surface is cleaned and an amorphous silicon film is formed thereon in a thickness of 500 angstrom by means of low pressure thermal CVD (LPCVD).

(B) Next, a silicon oxide film is formed in a thickness of 700 angstrom by means of CVD using TEOS (tetraethoxisilane) and an opening is formed by patterning it. The amorphous silicon is exposed at the bottom of the opening.

(C) Nickel acetate solution containing nickel in concentration (weight conversion) of 100 ppm is applied as shown in FIG. 5C by a spin-coater.

(D) A heat treatment is implemented within a nitrogen atmosphere at 600° C. for eight hours in the state while adhering the nickel acetate solution.

(E) A mask of the silicon oxide film is removed to obtain a crystal silicon film having a region where crystal has grown laterally.

(F) A heat treatment is implemented within an oxygen atmosphere (atmospheric pressure) containing 3 volume % of HCl at 950° C. for 20 minutes. As a result, an oxide film of 200 angstrom is formed and the thickness of the silicon film is reduced to 400 angstrom. It is noted that while the reason why the thickness of the crystal silicon film is reduced is unknown in detail and we would have to wait for the study of the future, it is assumed-to have happened because silicon in non-crystallized state or not crystallized completely is consumed in the formation of the thermal oxide film.

(G) The oxide film formed in step (F) is eliminated by using buffer hydrofluoric acid.

As it is apparent from FIGS. 3 and 4, the crystal in the crystal silicon film has grown 1) such that a structure of crystal lattices lies continuously in a row, 2) so as to be thin cylindrical crystal or thin flat cylindrical crystal, and 3) so as to be a plurality of thin cylindrical crystals or thin flat cylindrical crystals in parallel or almost in parallel leaving a space therebetween. Further, seeing the photograph of FIG. 4, it can be seen that a cylindrical crystal of 0.15 $\mu$m in width extends diagonally from the lower right corner to the upper left corner and that there is a clear boundary (grain boundary) at the edges of the both ends.

FIGS. 7a and 7b show the form of crystal growth in the crystal silicon film obtained by the present invention and assumed from the result observed from a number of photographs of the electron microscope typified by FIGS. 1 through 4. FIG. 7a shows one exemplary case when the crystal has been grown by introducing the metal element which promotes the crystallization of silicon into one end of the surface of the amorphous silicon film. In this case, the crystals of silicon grow linearly from the region where the metal has been added in parallel or almost in parallel.

FIG. 7b shows a case when the crystal has been grown by applying the metal element which promotes the crystallization of silicon on the whole surface of the amorphous silicon film. In this case, the crystals of silicon grow radially centering from a numerous points on the whole surface of the amorphous silicon film. Seeing from the mutual relationship of position of adjacent radial crystal cylinders which extend centering from respective points, each crystal grows linearly and in parallel or almost in parallel.

By the way, it is effective to shorten a channel length in order to increase an operating speed of a TFT for example (while the same applies to a MOS type transistor in general, this point will be described centering on TFT here) However, if the channel length is shortened below 1 µm for example, a trouble called a short-channel effect is brought about. In concrete, problems such as the degradation of sub-threshold characteristic and the decrease of threshold value occur.

Here, the sub-threshold characteristic (referred also as S value) means a build-up characteristic when a switch of the TFT is turned on as shown diagrammatically in FIG. 8. In concrete, if the build-up is sharp, the sub-threshold characteristic is good and the TFT may be operated at high speed. On the other hand, a TFT having a bad sub-threshold characteristic has a build-up curve whose inclination is small (i.e. the curve is lying) and it is not suited to high-speed operation.

The degradation of the sub-threshold characteristic in the short-channel effect may be explained from the present technological knowledge (=present technological knowledge or prior art theory) as follows. Firstly, what the channel is shortened means that a distance between a source region and a drain region is shortened. Generally, a channel is intrinsic (I type semiconductor) and a source/drain region is N- or P-type semiconductor. If an intrinsic semiconductor contacts with an N-type semiconductor for example, the quality of the N-type semiconductor as the semiconductor exerts influence to the inside of the intrinsic semiconductor.

In the case of the TFT, the above-mentioned influence is exerted to the inside of the channel. That is, the influence of N-type or P-type is exerted from the source region or drain region to the inside of the channel. The degree of this influence, i.e. a range in which the influence is exerted, does not change even if the channel is shortened.

If the channel length is shortened further, the influence exerted from the source/drain region to the channel with. respect to the size of the channel length becomes significant. In an extreme case, the range of the influence exerted from the source/drain region to the inside of the channel may become longer than the channel length. in such a state, a trouble occurs in the operation of the TFT (the same applies also to MOS type transistors) that the change of conductive type of the channel is controlled by the application of electric field from a gate electrode and electric conductivity between the source and the drain changes, thus degrading the sub-threshold characteristic as a result.

A TFT using the crystal silicon film obtained by the present invention has a channel length of less than about 1 µm. Accordingly, it is presumed that the short-channel effect appears naturally from the technological knowledge as described above.

However, it has. been found that in the crystal of the crystal silicon film obtained by the present invention, i.e. the crystal which have grown 1) such that a structure of crystal lattices lies continuously in a row, 2) so as to be thin cylindrical crystal or thin flat cylindrical crystal, and 3) so as to be a plurality of thin cylindrical crystals or thin flat cylindrical crystals in parallel or almost in parallel leaving a space therebetween, not only no short-channel effect is seen, but also a very good sub-threshold characteristic which cannot be explained by the prior art technological knowledge is seen and that it operates at high speed corresponding to such characteristic.

Tables 1 and 2 and FIG. 9 show one example thereof. The semiconductor device used here is what has been fabricated in the process of (H) through (L) in FIGS. 6H through 6L below which continue from the process shown in FIGS. 5A through 5G described above. It is noted that Step G in FIG. 6G corresponds to Step G in the process shown in FIG. 5G.

(H) The crystal silicon film formed in the process from (A) through (F) is patterned to form an active layer of a thin film transistor.

(I) Next, a silicon oxide film is formed as a GI film (gate insulating film) by using mixed gas of $SiH_4+N_2O$ as film forming gas by means of plasma CVD.

(J) A heat treatment is implemented in an oxygen atmosphere (atmospheric pressure) containing 3 volume % of HCl at 950° C. for 28 minutes. As a result, a thermal oxide film of 300 angstrom in thickness is formed and the thickness. of the crystal silicon film is reduced to 250 angstrom. It is noted that while the reason why the thickness of the crystal silicon film is reduced is unknown similarly to the aforementioned case in forming the thermal oxide film and we would have to wait for the research of the future, it is assumed to have happened because silicon in non-crystallized state or not crystallized completely is consumed in the formation of the thermal oxide film. It is also noted here that the thermal oxide film is formed on the surface of the active layer in connection with the fact that activated oxygen molecules infiltrate into the GI film.

(K) An aluminum film of 4000 angstrom thickness is formed by sputtering. It is noted that 0.18 weight % of scandium is contained in the aluminum. Then, an anodic oxide film is formed further on the surface of the aluminum film.

(L) Next, a resist mask is placed and the aluminum film is patterned to fabricate a prototype of a gate electrode.

Table 1 shows characteristics of an N-channel type TFT and Table 2 shows that of a P-channel. type TFT constructed by using the crystal silicon film of the present invention. In Tables 1 and 2, measurement points 1 through 20 mean that they are measured by using each spot on the surface of one batch of the crystal silicon film fabricated as described above. As it is apparent from Table 1, when the crystal silicon film is constructed as the N-channel type TFT, S-value is very small in particular among the characteristics. it is around 80 mV/decade and is within a range of 70 to 90 mV/decade as a whole. It is so small as 72.53 mV/decade especially at the measurement point 13.

The S-value (sub-threshold coefficient) is defined as an inverse number of a maximum inclination at the build-up portion of the curve of ID-VG as shown in FIG. 8. In other words, it is understood as an increment of gate voltage necessary for increasing drain current by one digit. That is, the smaller the S-value, the sharper the inclination at the build-up portion. Then, it excels in responsibility as a switching element and can be operated at high speed.

An ideal value derived from a theoretical formula is 60 mV/decade. Although a value close to that is obtained in a transistor using a mono-crystal wafer, a conventional TFT using low temperature poly-silicon is limited to 300 to 500 mV/decade. In view of this fact, the S-value of around 80 mV/decade of the TFT using the crystal silicon film of the present invention can be said as an astonishing value.

In Table 2 showing the P-channel type TFT constructed by using the crystal silicon film of the present invention, the S-value is also very small in this case similarly to the case of the N-channel type TFT. It is around 80 mV/decade and is within a range of 70 to 100 mV/decade as a whole. It is so small as 72.41 mV/decade especially at the measurement point 4. These values mean that it is the same with the case of the N-channel type TFT, except only of that plus (+) and minus (−) are opposite.

Beside the above, each of the characteristics (codes or signs) means as follows. As it is apparent from Tables 1 and 2, any of these characteristics shows values which can fully sustain in practical use. $I_{on}$ is drain current which flows when the TFT is ON and it is set as $I_{on}$-1 when VD=1 V (1 volt) and $I_{on}$-2 when VD=5V. A TFT having a larger Ion value can flow more current in a short time.

$I_{off}$ is drain current which flows when the TFT is OFF and it is set as $I_{off}$-1 when VD=1 V (1 volt) and $I_{off}$-2 when VD=5V. If current flows when the TFT is OFF, electric power is consumed that much, so that it is very important to minimize $I_{off}$. If $I_{off}$ is large, there arises a problem that charge held in a liquid crystal flows out by $I_{off}$. $I_{on}/I_{off}$-1 (or $I_{on}/I_{off}$-2) is a ratio between $I_{on}$-1 and $I_{off}$-1 and represents how many digits the ON current differs from the OFF current. The greater the $I_{on}/I_{off}$, the better the switching characteristic is. It is important also in increasing contrast on a display panel.

Vth is a parameter generally called as a threshold voltage and is defined as voltage when a TFT is switched to ON for example. Values within the table are those obtained by means of root ID extrapolation by setting as the objects of evaluation when VD=5. If Vth is large, voltage applied to a gate electrode has to be set high, so that driving voltage as well as power consumption increase. $\mu$FE represents a mobility of field effect. It is a parameter indicating the mobility of carriers. A TFT having a large $\mu$FE can be said to be suitable for high-speed operation. As it is apparent from Tables 1 and 2, any of these characteristics show values which can fully sustain in practical use.

FIGS. 9a and 9b are graphs of the $I_D$-$V_G$ characteristic drawn by selecting typical values from the above-mentioned actually measured data. FIG. 9a shows the case of the N-channel type TFT and FIG. 9b shows the case of the P-channel type TFT. In the both cases, VD=1V. The horizontal axis within FIGS. 9a and 9b represents gate voltage (V) and the vertical axis represents drain current (A). The scale unit of the vertical axis is "1E-13" through "1E-01", i.e. within a range of $1\times10^{-13}$ through $1\times10^{-1}$ A (Ampere).

Seeing the case of the N-channel type TFT in FIG. 9a at first, it can be seen that the inclination of the build-up portion of the ID-VG curve, i.e. the curve at the linear region, is very sharp. It shows the characteristic corresponding to that the S-value described above is small as it is and indicates that the TFT has an excellent responsibility as a switching element and can be operated at high speed. Further, while the range between −6 V to −0.5 V of gate voltage in FIG. 9a corresponds to $I_{off}$ within Table 1 described above, it can be seen that the drain current flowing when the TFT is OFF is very small and that the TFT has another excellent quality also in this aspect.

Next, seeing FIG. 9b, the curve at the linear region is very sharp and the drain current flowing when the TFT is OFF is very small also in the case of the P-channel type TFT. It also has an excellent characteristics similarly to the N-channel type TFT described above. It is noted that as for such technological significance, only the codes (signs 9 of plus (+) and minus (−) are different as compared to the case of the N-channel type TFT.

FIGS. 11a and 11b show oscillograms obtained by constructing a ring oscillator by building a circuit in which the N-channel type TFT and the P-channel type TFT described above are combined and by operating it. This circuit works such that the N-channel type TFT and the P-channel type TFT compensate their operation each other in the same time, i.e. such that when one TFT discharges electric charge, the other TFT sucks the electric charge.

FIG. 10 is a diagrammatic view for explaining FIGS. 11a and 11b. When FIG. 10 is seen as a whole, the waveform on the + side of the oscillating waveform is related mainly with the operation of the N-channel type TFT and the waveform on the − side is related mainly with the operation of the P-channel type TFT. Accordingly, when it )is oscillated in 152.0 MHz, 252.9 MHz or the like and if the oscillating waveform keeps symmetry on the + and − sides, it means that the N-channel type TFT and the P-channel type TFT operate symmetrically with respect to the frequency and operate normally with the similar characteristics.

Then, seeing the oscillograms in FIGS. 11a and 11b, the oscillating waveform is a sine wave, no distortion is seen in the linearity and they are symmetrical both vertically and horizontally. Thus, it can be seen that the inventive crystal silicon film shows the excellent characteristics even when it is applied as the N-channel type or P-channel type and that substantially there is no difference in the characteristics between the both.

A model which can explain the above-mentioned phenomena and characteristics may be considered as follows. At first, as seen in the photographs of the electron microscope shown in FIGS. 3 and 4, the silicon semiconductor thin film composing the TFT composed of the crystal silicon film obtained by the present invention has a structure in which the crystal continues in the specific direction. According to detailed observation by means of the electron microscope, it has been confirmed that the lattice structures are continuing in the specific direction.

From the above-mentioned observation result, this state is construed as a state in which mono-crystals are continuing in the specific direction leaving a predetermined space therebetween. It is then understood, naturally, that carries can readily move in the direction to which the lattice structures continue. That. is, it is assumed that the channel region is composed of countless thin and long channels in the TFT using the crystal silicon film obtained by the present invention.

Here, while linear grain boundaries observed in the photographs in FIGS. 3 and 4 partition very small channels, no state in which impurities segregate specifically at the grain boundary is seen.

Such grain boundary contains mismatch and distortion of crystal structures and an energy level there is considered to be higher than the other regions. Accordingly, it is assumed to have a function of restricting the move of the carriers in the direction to which the crystal structures are continuing. If such narrow and small channels are formed, a range of osmosis of influence from the source and drain regions exerted to the inside of the small channels are considered to become small corresponding to the narrowness.

As it is analogized how electromagnetic wave expands in a space where there is no obstacle for example, the electrical influence is assumed to expand, ideally, isotropically in two- or three-dimension. In view of such fact, because the countless small and narrow channels are formed in the TFT using the crystal silicon film obtained by the present invention, it can be understood that the influence from the source and drain regions to the channel is suppressed in each individual small channel and that it suppresses the short-channel effect as a whole.

FIGS. 12 and 13 are graphs of measured values of gate current of a planar type thin film transistor which the inventors et. al. have made in trial by using the crystal silicon film in which the concentration of the metal element which promotes the crystallization of silicon is reduced in the processes of numerous studies and tests conducted until reaching to the present invention. FIG. 12 is different from FIG. 13 in that whether thermal oxidation is used or plasma CVD is used in forming a gate insulating film.

That is, FIG. 12 shows measured values obtained when the gate insulating film has been formed by the thermal oxidation and FIG. 13 shows measured values obtained when the gate insulating film has. been formed by the plasma CVD. in FIGS. 12 and 13, the horizontal axis represents the gate current and the vertical axis represents a number of measured samples. A quartz substrate is used as the substrate here. Further, an active layer is formed by holding nickel element in contact on the surface of the amorphous silicon film and by crystallizing by a heat treatment of four hours at 640° C. The thermal oxide film is formed within an oxygen atmosphere at 950° C.

It can be seen from FIG. 12 that the values of gate current vary largely depending on the samples. It shows that there is dispersion in the quality of the gate insulating film. Meanwhile, as shown in FIG. 13, there is less dispersion of the gate currents and its value is extremely small in the thin film transistor in which the gate insulating film has been formed by the plasma CVD. The reason why the difference of the measured values shown in FIGS. 12 and 13 appears may be explained as follows.

That is, nickel element is sucked from the active layer to the thermal oxide film during when the thermal oxide film is formed in the samples in which the gate insulating film is formed by the thermal oxide film. As a result, nickel element which hampers the insulation comes to exist within the thermal oxide film. The existence of the nickel element increases a value of current leaked within the gate insulating film and varies that value.

This fact is supported by SIMS (secondary ion mass spectrometry) and by measuring the concentration of nickel element within the gate insulating film of the samples whose measured values have been obtained in FIGS. 12 and 13. That is, it was confirmed that while nickel element of more than the level of $10^{17}$ cm$^{-3}$ is measured within the gate insulating film formed by the thermal oxidation, the concentration of nickel element within the gate insulating film formed by the plasma CVD is less than the level of $10^{16}$ cm$^{-3}$. It is noted that the concentration of impurity described in the present specification is defined as the minimum value of the measured values measured by the SIMS.

The point described above is one example of findings which the inventors et. al. have obtained in the process of numerous studies and experiments conducted until reaching to the present invention and the present invention is based on such findings. That is, the thermal oxide film is formed on the surface of the crystal silicon film obtained by utilizing the metal element which promotes the crystallization of silicon to getter the metal element within the thermal oxide film and to reduce the concentration of the metal element or to eliminate the metal element within the crystal silicon film as a result.

Regardless whether it is the amorphous silicon film or the crystal silicon film, the metal element is normally a harmful substance within a semiconductor device composed of a thin film transistor (TFT and the like) using the silicon film, so that the metal element needs to be eliminated from the silicon film as much as possible. According to the present invention, such metal element which promotes the crystallization of silicon may be eliminated or reduced very effectively after using it in the formation of the crystal silicon film. Thereby, the present invention allows a semiconductor device having such excellent characteristics to be obtained.

The main aspects of the present invention described above in (1) through (6) are as follows.

According to one aspect of the invention described above in (1) and (2), an amorphous silicon film is formed at first. Then, the amorphous silicon film is crystallized by the effect of the metal element typified by nickel which promotes the crystallization of silicon to obtain a crystal silicon film. This crystallization is carried out by heat treatment. In the state after the heat treatment, the metal element which has been intentionally introduced is contained in certain high concentration within the crystal silicon film.

Another heat treatment is implemented to the crystal silicon film in the above-mentioned state in the oxidizing atmosphere to form a thermal oxide film on the surface of the crystal silicon film. At this time, the metal element is gettered to the thermal oxide film, thus reducing the concentration of the metal element or eliminating the metal element within the crystal silicon film. Then, the thermal oxide film which has gettered the metal element is eliminated.

The crystal silicon film which has a high crystallinity and from which the metal element has been eliminated or in which the concentration of the metal element is low can be obtained through those steps. The thermal oxide film described above may be eliminated by using buffer hydrofluoric acid or other hydrofluoric etchant. This process for eliminating the thermal oxide film is implemented in the same manner in the process for eliminating the thermal oxide film in each aspect of the invention described below.

According to one aspect of the invention described above in (3), an active layer of a thin film transistor is formed by implementing patterning after the above-mentioned steps. That is, this active layer is formed by the crystal silicon film from which the metal element has been eliminated or in which the concentration of the metal element is low. Then, a thermal oxide film which composes at least a part of a gate insulating film is formed on the surface of the active layer by means of thermal oxidation to compose a semiconductor device.

According to one aspect of the invention described above in (4), an amorphous silicon film is formed at first and a metal element which promotes crystallization of silicon is selectively introduced to the amorphous silicon film. There is no particular limit how to selectively introduce the metal element to the amorphous silicon film and various methods may be adopted, such as 1) introducing to one end portion of the amorphous silicon film, 2) introducing to one end portion of the amorphous silicon film leaving a space, and 3) introducing in dots on the whole surface of the amorphous silicon film leaving spaces therebetween. Thereby, the crystal is grown by a first heat treatment in a direction parallel to the film from the region to which the metal element has been selectively introduced.

Next, a thermal oxide film is formed on the surface of the region where the crystal has been grown by implementing a second heat treatment within an oxidizing atmosphere. At this time, the metal element is gettered to the thermal oxide film by the action of oxygen within the oxidizing atmosphere and the concentration of the metal element within the crystal silicon film is reduced or the metal element is eliminated therefrom. Further, the thermal oxide film is eliminated and an active layer of the semiconductor device is formed by using the region from which the thermal oxide film has been eliminated. FIG. 6 is a process flowchart schematically showing the main point of the arrangement described above.

In any of these aspects, the temperature of the second heat treatment is preferable to be higher than that of the first heat treatment and it is preferable to anneal in a plasma atmosphere containing oxygen and hydrogen after eliminating the thermal oxide film. Further, the concentration of oxygen contained in the amorphous silicon film is preferable to be $5 \times 10^{17}$ cm$^{-3}$ to $2 \times 10^{19}$ cm$^{-3}$.

Thus, according to one aspect of the present invention, there is provided a semiconductor device having the crystal silicon film interposed between first and second oxide films and containing a metal element which promotes crystallization of silicon and which is distributed in high concentration near the interfaces with the first and/or second oxide film within the crystal silicon film. According to one aspect of this semiconductor device, the first oxide film is a silicon oxide film or silicon oxynitride film formed on a glass substrate or quartz substrate, the crystal silicon film composes an active layer of a thin film transistor and the second oxide film may be composed of a silicon oxide film or silicon oxynitride film which forms a gate insulating film.

Similarly to the case described above, according to one aspect of the present invention, there is provided a semiconductor device comprising an underlying layer made from an oxide film; a crystal silicon film formed on the underlying layer; and a thermal oxide film formed on the crystal silicon film; wherein the crystal silicon film contains a metal element which promotes crystallization of silicon; the metal element which promotes the crystallization of silicon is distributed in high concentration near the interface with the underlying layer and/or thermal oxide film; and the thermal oxide film composes at least a part of a gate insulating film of a thin film transistor.

The main aspects of the present invention described above in (7) through (12) are as follows.

According to one aspect of the invention described above in (7), an amorphous silicon film is formed at first. Then, a metal element which promotes crystallization of silicon is intentionally introduced to the amorphous silicon film and the amorphous silicon film is crystallized by a first heat treatment to obtain a crystal silicon film. The metal element is contained in the crystal silicon film in the state after the heat treatment. Then, the metal element existing within the crystal silicon film is eliminated or reduced by implementing a second heat treatment within an oxidizing atmosphere containing a halogen element.

At this time, the. metal element is gettered to the thermal oxide film by the actions of oxygen, halogen and halogen and oxygen, thus reducing the concentration of the metal element within the crystal silicon film or eliminating the metal element. Then, after eliminating the thermal oxide film formed there, another thermal oxide film is formed on the surface of the region from which the thermal oxide film has been eliminated by implementing another thermal oxidation.

According to one aspect of the invention described above in (8), an amorphous silicon film is formed at first. Then, a metal element which promotes crystallization of silicon is intentionally introduced to the amorphous silicon film and the amorphous silicon film is crystallized by a first heat treatment to obtain a crystal silicon film. Next, the metal element existing within the crystal silicon film is eliminated or reduced by implementing a second heat treatment within an oxidizing atmosphere containing a halogen element to form a thermal oxide film on the surface of the crystal silicon film and by causing the thermal oxide film to getter the metal element. Then, after eliminating the thermal oxide film formed there, another thermal oxide film is formed on the surface of the domain from which the thermal oxide film has been eliminated by implementing another thermal oxidation.

According to one aspect of the invention described above in (9), an amorphous silicon film is formed at first. Then, a metal element which promotes crystallization or silicon is intentionally introduced to the amorphous silicon film and the amorphous silicon film is crystallized by a first heat treatment to obtain a crystal silicon film. Next, the metal element existing within the crystal silicon film is eliminated or reduced by implementing a second heat treatment within an oxidizing atmosphere containing a halogen element. After eliminating a thermal oxide film formed there, an active layer of a thin film transistor is formed by implementing patterning and another thermal oxide film which composes at least a part of a gate insulating film is formed on the surface of the active layer by means of thermal oxidation. FIG. 6 is a process flow chart schematically showing the main part of the arrangement described above.

According to one aspect of the invention described above in (10), an amorphous silicon film is formed at first. Then, a metal element which promotes crystallization of silicon is selectively introduced to the amorphous silicon film. As modes for selectively introducing the metal element to the amorphous silicon film, various methods may be adopted, such as 1) introducing to one end portion of the amorphous silicon film, 2) introducing to one end portion of the amorphous silicon film leaving a space, and 3) introducing in dots on the whole surface of the amorphous silicon film leaving spaces therebetween. Thereby, the crystal is grown by a first heat treatment in a direction parallel to the film from the region to which the metal element has been selectively introduced.

Next, a thermal oxide film is formed on the surface of the region where the crystal has been grown by implementing a second heat treatment within an oxidizing atmosphere containing halogen element. The thermal oxide film is eliminated and an active layer of the semiconductor device is formed by using the region from which the thermal oxide film has been eliminated. This active layer is formed of the crystal silicon film from which the metal element has been eliminated or the crystal silicon film in which the concentration of the metal element is low.

In the methods for fabricating the semiconductor device described above, an atmosphere in which one or a plurality of types of gases selected from HCl, HF, HBr, Cl$_2$, F$_2$ and Br$_2$ is added to O$_2$ atmosphere may be used as the oxidizing atmosphere containing the halogen element.

Further, the temperature of the second heat treatment is preferable to be higher than that of the first heat treatment and it is preferable to anneal in the plasma atmosphere containing oxygen and hydrogen after eliminating the thermal oxide film. Further, the concentration of oxygen contained within the amorphous silicon film is preferable to be $5 \times 10^{17}$ cm$^{-3}$ to $2 \times 10^{19}$ cm$^{-3}$.

By the fabrication method described above, there is provided the semiconductor device in (11), i.e. the semiconductor device having a crystal silicon film interposed between first and second oxide films, wherein the crystal silicon film contains hydrogen and a halogen element as well as a metal element which promotes crystallization of silicon and the metal element is distributed in high concentration near the interfaces with the first and/or second oxide film within the crystal silicon film.

In the semiconductor device, the halogen element is contained in high concentration in the first oxide film and/or near the interface between the first oxide film and the crystal silicon film and the halogen element is contained in high concentration near the interface in the crystal silicon film with the second oxide film. Further, the first oxide film is a silicon oxide film or silicon oxynitride film formed on a glass substrate or quartz substrate, the crystal silicon film composes an active layer of a thin film transistor and the second oxide film may be composed of a silicon oxide film or silicon oxynitride film which forms a gate insulating film.

Similarly to the case described above, according to one aspect of the present invention described above in (12) there is provided a semiconductor device comprising an underlying layer made from an oxide film; a crystal silicon film formed or the underlying layer; and a thermal oxide film formed on the crystal silicon film; wherein the crystal silicon film contains a metal element which promotes crystallization of silicon and hydrogen and halogen element; the metal element which promotes the crystallization of silicon is distributed in high concentration near the interface with the underlying layer and/or thermal oxide film; and the halogen element is distributed in high concentration near the interface with the underlying layer and/or thermal oxide film; and the thermal oxide film composes at least a part of a gate insulating film of a thin film transistor.

The main aspects of the present invention described above in (13) through (17) are as follows.

According to one aspect of the invention described above in (13), an amorphous silicon film is formed at first. Then, a metal element which promotes crystallization of silicon is intentionally introduced to the amorphous silicon film and the amorphous silicon film is crystallized by a first heat treatment to obtain a crystal silicon film. After that, laser light or intense light is irradiated to the crystal silicon film. Next, a second heat treatment is implemented in an oxidizing atmosphere containing a halogen element to eliminate or reduce the metal element existing within the crystal silicon film. Then, a thermal oxide film formed there is eliminated and another thermal oxide film is formed on the surface of the region from which the thermal oxide film has been eliminated by implementing another thermal oxidation.

According to one aspect of the invention described above in (14), an amorphous silicon film is formed at first. Then, a metal element which promotes crystallization of silicon is intentionally introduced to the amorphous silicon film and the amorphous silicon film is crystallized by a first heat treatment to obtain a crystal silicon film. After that, laser light or intense light is irradiated to the crystal silicon film to diffuse the metal element existing within the crystal silicon film.

Next, a second heat treatment is implemented in an oxidizing atmosphere containing a halogen element to getter the metal element existing within the crystal silicon film to a thermal oxide film to be formed. Then, the thermal oxide film formed there is eliminated and another thermal oxide film is formed on the surface of the region from which the thermal oxide film has been eliminated by implementing another thermal oxidation.

According to one aspect of the invention described above in (15), an amorphous silicon film is formed at first. Then, a metal element which promotes crystallization of silicon is intentionally introduced to the amorphous silicon film. As modes for selectively introducing the metal element to the amorphous silicon film, various methods may be adopted, such as 1) introducing to one end portion of the amorphous silicon film, 2) introducing to one end portion of the amorphous silicon film leaving a space, and 3) introducing in dots on the whole surface of the amorphous silicon film leaving spaces therebetween. Thereby, the crystal is grown by a first heat treatment described below in a direction parallel to the film from the region to which the metal element has been selectively introduced.

The first heat treatment is implemented to the amorphous silicon film to grow crystal in a direction parallel to the film from a region of the amorphous silicon film into which the metal element has been intentionally and selectively introduced. After that, laser light or intense light is irradiated to diffuse the metal element existing within the region where the crystal has grown. A second heat treatment is implemented within an oxidizing atmosphere containing a halogen element to cause the metal element existing within the region where the crystal has grown to be gettered to a thermal oxide film to be formed. Then, the thermal oxide film formed here is eliminated and another thermal oxide film is formed on the surface of the region from which the thermal oxide film has been eliminated by implementing another thermal oxidation.

In the aspects of the invention described above in (13) through (15), it is preferable to conduct the second heat treatment in temperature above 600° C. and below 750° C. and it is preferable to form the gate insulating film by using said another thermal oxide film. Further, in those aspects of the invention, the atmosphere in which one or a plurality of types of gases selected from HCl, HF, HBr, $Cl_2$, $F_2$ and $Br_2$ is added to $O_2$ atmosphere is used as the oxidizing atmosphere containing the halogen element. In these inventions, the temperature of the second heat treatment is preferable to be higher than that of the first heat treatment.

Further, it is possible to anneal in the plasma atmosphere containing oxygen and hydrogen after eliminating the thermal oxide film in these inventions. Further, the concentration of oxygen contained within the amorphous silicon film is $5 \times 10^{17}$ $cm^{-3}$ to $2 \times 10^{19}$ $cm^{-3}$.

According to one aspect of the invention described above in (16), an amorphous silicon film is formed at first. Then, a metal element which promotes crystallization of silicon is intentionally introduced to the amorphous silicon film and the amorphous silicon film is crystallized by a first heat treatment to obtain a crystal silicon film. Next, an active layer of the semiconductor device is formed by patterning the crystal silicon film and laser light or intense light is irradiated to the active layer. After that, a second heat treatment is implemented within an oxidizing atmosphere containing a halogen element to eliminate or reduce the metal element existing within the active layer. Then, a thermal oxide film formed here is eliminated and another thermal oxide film is formed on the surface of the active layer by implementing another thermal oxidation.

According to one aspect of the invention described above in (17), an amorphous silicon film is formed at first. Then, a metal element which promotes crystallization of silicon is intentionally introduced to the amorphous silicon film and the amorphous silicon film is crystallized by a first heat treatment to obtain a crystal silicon film. Next, an active layer of the semiconductor device is formed by patterning the crystal silicon film and laser light or intense light is irradiated to the active layer. After that, a second heat treatment is implemented within an oxidizing atmosphere containing a halogen element to eliminate or reduce the metal element existing within the active layer. Then, a thermal oxide film formed here is eliminated and another thermal oxide film is formed on the surface of of active layer by implementing another thermal oxidation. At this time, the active layer is formed so as to have an inclined shape in which an angle formed between a side face and an underlying face is 20° to 50°.

In the aspects of the invention described above in (16) and (17), the gate insulating film may be formed by utilizing said another thermal oxide film. Further, it is preferable that the temperature of the first and second heat treatments is below 750° C. Preferably, the atmosphere in which one or a plurality of types of gases selected from HCl, HF, HBr, $Cl_2$, $F_2$ and $Br_2$ is added to $O_2$ atmosphere is used as the oxidizing atmosphere containing the halogen element.

In these inventions, the temperature of the second heat treatment is preferable to be higher than that of the first heat treatment. Further, it is possible to anneal in the plasma atmosphere containing oxygen and hydrogen after eliminating the thermal oxide film in these inventions. Still more, the concentration of oxygen contained within the amorphous silicon film is $5\times10^{17}$ $cm^{-3}$ to $2\times10^{19}$ $cm^{-3}$.

The main aspects of the present invention described above in (18) through (22) are as follows.

According to one aspect of the invention described above in (18), an amorphous silicon film is formed at first. Then, a metal element which promotes crystallization of silicon is intentionally introduced to the amorphous silicon film and the amorphous silicon film is crystallized by a first heat treatment to obtain a crystal silicon film. Next, laser light or intense light is irradiated to the crystal silicon film and a second heat treatment is implemented within an oxidizing atmosphere to eliminate or reduce the metal element existing within the crystal silicon film. Then, a thermal oxide film formed in that step is eliminated and another thermal oxide film is formed on the surface of the region from which the thermal oxide film has been eliminated by implementing another thermal oxidation.

According to one aspect of the invention described above in (19), an amorphous silicon film is formed at first. Then, a metal element which promotes crystallization of silicon is intentionally introduced to the amorphous silicon film and the amorphous silicon film is crystallized by a first heat treatment to obtain a crystal silicon film. Next, laser light or intense light is irradiated to the crystal silicon film to diffuse the metal element existing within the crystal silicon film. After that, a second heat treatment is implemented within an oxidizing atmosphere to getter the metal element existing within the crystal silicon film to a thermal oxide film to be formed. Then, the thermal oxide film formed in that step is eliminated and another thermal oxide film is formed on the surface of the region from which the thermal oxide film has been eliminated by implementing another thermal oxidation.

According to one aspect of the invention described above in (20), an amorphous silicon film is formed at first. Then, a metal element which promotes crystallization of silicon is intentionally and selectively introduced to the amorphous silicon film. As modes for selectively introducing the metal element to the amorphous silicon film, various methods may be adopted, such as 1) introducing to one end portion of the amorphous silicon film, 2) introducing to one end portion of the amorphous silicon film leaving a space, and 3) introducing in dots on the whole surface of the amorphous silicon film leaving spaces therebetween. Thereby, the crystal is grown by the following first heat treatment in a direction parallel to the film from the region to which the metal element has been selectively introduced.

That is, the first heat treatment is implemented to the amorphous silicon film to grow the crystal in the direction parallel to the film from the region to which the metal element has been intentionally and selectively introduced. Next, laser light or intense light is irradiated to the crystal silicon film to diffuse the metal element existing within the crystal silicon film. After that, a second heat treatment is implemented within an oxidizing atmosphere to getter the metal element existing within the crystal silicon film to a thermal oxide film to be formed. Then, the thermal oxide film formed in that step is eliminated and another thermal oxide film is formed on the surface of the region from which the thermal oxide film has been eliminated by implementing another thermal oxidation.

In the aspects of the invention described above in (19) and (20), the second heat treatment is preferably conducted in temperature above 600° C. and below 750° C. The gate insulating film may be formed by utilizing said another thermal oxide film. Further, it is preferable that the temperature of the second heat treatment is higher than that of the first heat treatment. still more, in these inventions, it is possible to anneal in the plasma atmosphere containing oxygen and hydrogen after eliminating the thermal oxide film. Further, preferably, the concentration of oxygen contained within the amorphous silicon film is $5\times10^{17}$ $cm^{-3}$ to $2\times10^{19}$ $cm^{-3}$.

According to one aspect of the invention described above in (21), an amorphous silicon film is formed at first. Then, a metal element which promotes crystallization of silicon is introduced intentionally to the amorphous silicon film and the amorphous silicon film is crystallized by a first heat treatment to obtain a crystal silicon film. Next, the crystal silicon film is patterned to form an active layer of the semiconductor device and laser light or intense light is irradiated to the active layer. After that, a second heat treatment is implemented within an oxidizing atmosphere to eliminate or reduce the metal element existing within the active layer. A thermal oxide film formed in that step is eliminated and another thermal oxide film is formed on the surface of the active layer by implementing another thermal oxidation.

According to one aspect of the invention described above in (22), an amorphous silicon film is formed at first. Then, a metal element which promotes crystallization of silicon is introduced intentionally to the amorphous silicon film and the amorphous silicon film is crystallized by a first heat treatment to obtain a crystal silicon film. Next, the crystal silicon film is patterned to form an active layer of the semiconductor device and laser light or intense light is irradiated to the active layer. After that, a second heat treatment is implemented within an oxidizing atmosphere to eliminate or reduce the metal element existing within the active layer. A thermal oxide film formed in that step is eliminated and another thermal oxide film is formed on the surface of the active layer by implementing another thermal oxidation. At this time, the active layer is formed so as to have an inclined shape in which an angle formed between a side face and an underlying face thereof is 20° to 50°.

In the aspects of the invention described above in (21) and (22), the gate insulating film may be formed by utilizing said another thermal oxide film. The second heat treatment is preferably conducted in temperature above 600° C. and below 750° C. Further, it is preferable that the temperature of the second heat treatment is higher than that of the first heat treatment. Still more, in these inventions, it is preferable to anneal in the plasma atmosphere containing oxygen and hydrogen after eliminating the thermal oxide film. Preferably, the concentration of oxygen contained within the amorphous silicon film is $5\times10^{17}$ cm$^{-3}$ to $2\times10^{19}$ cm$^{-3}$.

The main aspects of the inventions described above in (23) through (25) are as follows.

According to one aspect of the invention described above in (23), an amorphous silicon film is formed on a substrate having an insulating surface and a metal element which promotes crystallization of silicon is intentionally introduced to the amorphous silicon film. Then, the amorphous silicon film is crystallized by a first heat treatment in the temperature range of 750° C. to 1100° C. to obtain a crystal silicon film. The crystal silicon film is patterned to form an active layer of the semiconductor device.

After that, a second heat treatment is implemented within an oxidizing atmosphere containing a halogen element to eliminate or reduce the metal element existing within the crystal silicon film. A thermal oxide film formed in the previous step is eliminated and another thermal oxide film is formed after eliminating the thermal oxide film by implementing another thermal oxidation. At this time, the heat treatments are implemented such that a temperature of the second heat treatment is higher than that of the first heat treatment.

According to one aspect of the invention described above in (24), an amorphous silicon film is formed on a substrate having an insulating surface and a metal element which promotes crystallization of silicon is intentionally introduced to the amorphous silicon film. Then, the amorphous silicon film is crystallized by a first heat treatment in the temperature range of 750° C. to 1100° C. to obtain a crystal silicon film. The crystal silicon film is patterned to form an active layer of the semiconductor device. After that, a second heat treatment is implemented within an oxidizing atmosphere containing a halogen element to getter the metal element existing within the active layer to a thermal oxide film to be formed. The thermal oxide film formed in the previous step is then eliminated and another thermal oxide film is formed after eliminating the thermal oxide film by implementing another thermal oxidation. At this time, the heat treatments are implemented under the condition that a temperature of the second heat treatment is higher than that of the first heat treatment.

According to one aspect of the invention described above in (25), an amorphous silicon film is formed on a substrate having an insulating surface and a metal element which promotes crystallization of silicon is intentionally introduced to the amorphous silicon film. As modes for selectively introducing the metal element to the amorphous silicon film, various methods may be adopted, such as 1) introducing to one end portion of the amorphous silicon film, 2) introducing to one end portion of the amorphous silicon film leaving a space, and 3) introducing in dots on the whole surface of the amorphous silicon film leaving spaces therebetween. Thereby, the crystal is grown by the following first heat treatment in a direction parallel to the film from the region to which the metal element has been selectively introduced.

That is, the crystal is grown by the first heat treatment in the temperature range of 750° C. to 1100° C. in a direction parallel to the film from the region to which the metal element has been intentionally and selectively introduced. Then, the crystal silicon film is patterned to form an active layer of the semiconductor device by using the region in which the crystal has grown in the direction parallel to the film. After that, a second heat treatment is implemented within an oxidizing atmosphere containing a halogen element to getter the metal element existing within the active layer to a thermal oxide film to be formed. The thermal oxide film formed in the previous step is then eliminated and another thermal oxide film is formed after eliminating the thermal oxide film by implementing another thermal oxidation. At this time, the heat treatments are implemented under the condition that a temperature of the second heat treatment is higher than that of the first heat treatment.

In the aspects of the invention described above in (23) through (25), preferably, a quartz substrate is used as the substrate for forming the amorphous silicon film and the gate insulating film is formed by utilizing said another thermal oxide film. Further, in these inventions, it is possible to anneal in the plasma atmosphere containing oxygen and hydrogen after eliminating the thermal oxide film. Still more, preferably, the concentration of oxygen contained within the amorphous silicon film is $5\times10^{17}$ cm$^{-3}$ to $2\times10^{19}$ cm$^{-3}$.

The main aspects of the present invention described above in (26) through (29) are as follows.

According to one aspect of the invention described above in (26), an amorphous silicon film is formed at first. Then, a metal element which promotes crystallization of silicon is held in contact on the surface of the amorphous silicon film and the amorphous silicon film is crystallized by a first heat treatment to obtain a crystal silicon film. Next, a second heat treatment is implemented in the temperature range of 500° C. to 700° C. within an atmosphere containing oxygen, hydrogen and fluorine to form a thermal oxide film on the surface of the crystal silicon film. Then, the thermal oxide film is eliminated.

According to one aspect of the invention described above in (27), an amorphous silicon film is formed at first. Then, a metal element which promotes crystallization of silicon is held in contact on the surface of the the amorpnous silicon film and the amorphous silicon film is crystallized. by a first heat treatment to obtain a crystal silicon film. Next, a second. heat treatment is implemented in the temperature range of 500° C. to 700° C. within an atmosphere containing oxygen, hydrogen, fluorine and chlorine to form a thermal oxide film on the surface of the crystal silicon film. Then, the thermal oxide film is eliminated.

According to one aspect of the invention described above in (28), an amorphous silicon film is formed at first. Then, a metal element which promotes crystallization of silicon is held in contact on the surface of the amorphous silicon film and the amorphous silicon film is crystallized by a first heat treatment to obtain a crystal silicon film. Next, a second heat treatment is implemented within an atmosphere containing fluorine and/or chlorine to form a wet oxide film on the surface of the crystal silicon film. Then, the oxide film is eliminated.

In the aspects of the invention described above in (26) through (28) above, preferably the concentration of the metal element within the oxide film is higher than that of the metal element within the crystal silicon film. Further, it is preferable to contain more than 1% and below an explosion limit of hydrogen in the atmosphere in which the second heat treatment is implemented. Further, it is preferable to implement the first heat treatment in a reducing atmosphere. Laser light may be irradiated to the crystal silicon film after the first heat treatment.

According to one aspect of the invention described above in (29), there is provided a semiconductor device having a silicon film having a crystallinity, characterized in that the silicon film contains a metal element which promotes crystallization of silicon in concentration of $1 \times 10^{16}$ cm$^{-3}$ to $5 \times 10^{18}$ cm$^{-3}$, fluorine atoms in concentration of $1 \times 10^{15}$ cm$^{-3}$ to $1 \times 10^{20}$ cm$^{-3}$, and hydrogen atoms in concentration of $1 \times 10^{17}$ cm$^{-3}$ to $1 \times 10^{21}$ cm$^{-3}$. In this invention, preferably, the silicon film is formed on the insulating film and fluorine atoms exist in high concentration near the interface between the insulating film and the silicon film.

The main aspects of the invention described above in (30) through (33) are as follows.

According to one aspect of the invention described above in (30), an amorphous silicon film is formed at first and the amorphous silicon film is crystallized to form a crystal silicon film. Next, this crystal silicon film is heated within an oxidizing atmosphere to which fluorine compound gas is added to grow a thermal oxide film on the surface of the crystal silicon film. Then, the thermal oxide film on the surface of the crystal silicon film is eliminated. After that, an insulating film is deposited on the surface of the crystal silicon film to complete the fabrication of the semiconductor device.

According to one aspect of the invention described above in (31), there is provided a method for fabricating a thin film transistor on a substrate having an insulating surface. An amorphous silicon film is formed at first and the amorphous silicon film is crystallized to form a crystal silicon film. Next, this crystal silicon film is heated within an oxidizing atmosphere to which fluorine compound gas is added to grow a thermal oxide film on the surface of the crystal silicon film. Then, the thermal oxide film on the surface of the crystal silicon film is eliminated. After that, the crystal silicon film is shaped to form an active layer of the thin film transistor and an insulating film is deposited on the surface of the active layer to form a gate insulating film at least on the surface of a channel region. Further, a gate electrode is formed on the surface of the gate insulating film and impurity ions which give a conductive type are injected into the active layer by using the gate electrode as a mask to form a source and a drain in a manner of self-alignment.

According to one aspect of the invention described above in (32), an amorphous silicon film is formed and the amorphous silicon film is crystallized by irradiating laser light to form a crystal silicon film. Next, this crystal silicon film is heated within an oxidizing atmosphere to which fluorine compound gas is added to grow a thermal oxide film on the surface of the crystal silicon film. Then, the thermal oxide film on the surface of the crystal silicon film is eliminated. After that, an insulating film is deposited on the surface of the crystal silicon film to complete the fabrication of the semiconductor device.

According to one aspect of the invention described above in (33), there is provided a method for fabricating a thin film transistor on a substrate having an insulating surface. An amorphous silicon film is formed at first and the amorphous silicon film is crystallized to form a crystal silicon film. Next, laser light is irradiated to the crystal silicon film and the is heated within an oxidizing atmosphere to which fluorine compound gas is added to grow a thermal oxide film on the surface of the crystal silicon film. Then, the thermal oxide film on the surface of the crystal silicon film is eliminated.

Next, the crystal silicon film is shaped to form an active layer of the thin film transistor, an insulating film is deposited on the surface of the active layer to form a gate insulating film at least on the surface of a channel region and a gate electrode is formed on the surface of the gate insulating film. Further, a source and a drain are formed in a manner of self-alignment by injecting impurity ions which give a conductive type to the active layer by using the gate electrode as a mask. Thus, the semiconductor device is fabricated.

In the aspects of the invention described above in (30) through (33), preferably, the thickness of the thermal oxide film is 200 to 500 angstrom and the metal element is doped to the amorphous silicon film after forming the amorphous silicon film in concentration of $1 \times 10^{16}$ to $5 \times 10^{19}$ atoms/cm$^3$. Further, while a metal element is preferable to use in forming the crystal silicon film, at least one or more types of elements selected from Fe, To, Ni, Ru, Rh, Pd, Os, Ir, Cu and Au may be used as the metal element similarly to the aspects of the invention described above.

The specific nature of the invention, as well as other objects, uses and advantages thereof, will clearly appear from the following description of the preferred embodiments and the accompanying drawings.

BRIEF DESCRIPTION OF DRAWINGS

FIGS. 6A through 6F are schematic diagrams showing one example of typical modes of manufacturing steps of a semiconductor device using the crystal silicon film of the present invention;

Table 1 and Table 2, show various characteristics of the N-Channel Type TFT and P-Channel Type TFT devices according to the present invention.

DESCRIPTION OF PREFERRED EMBODIMENTS

While the present invention will be explained below in detail based on the preferred embodiments thereof, it is to be understood that the present invention will not be confined to those embodiments. At first, embodiments of effects of eliminating or reducing a metal element within a crystal silicon film which has been crystallized by an action of the metal element will be described. After that, embodiments which correspond to the aspects of the invention described above in (1) through (33) will be described.

[First Embodiment]

Figure 1:
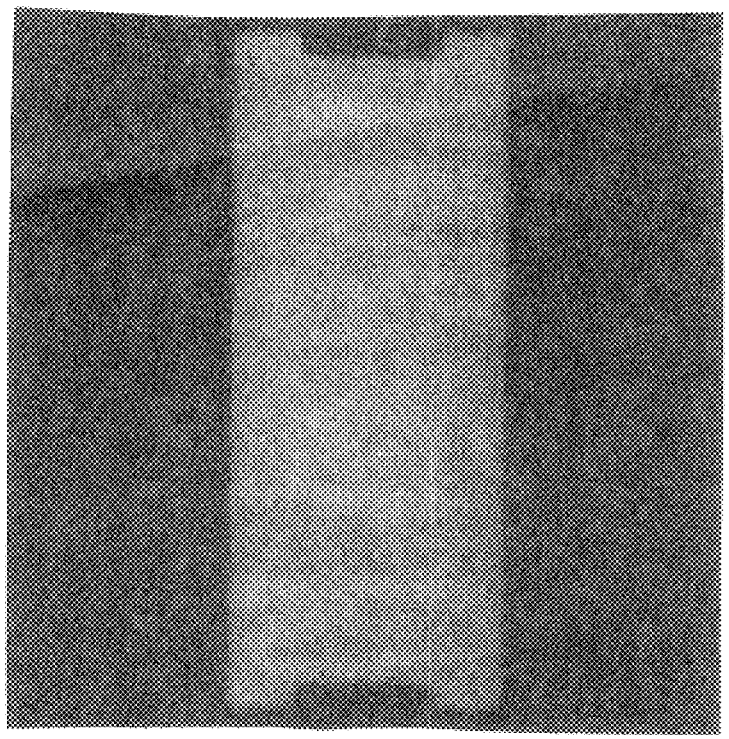
FIG. 1 is a picture (optical microphotograph: 450 times) showing a micro-structure of a crystal silicon film obtained by the present invention.
Figure 2:
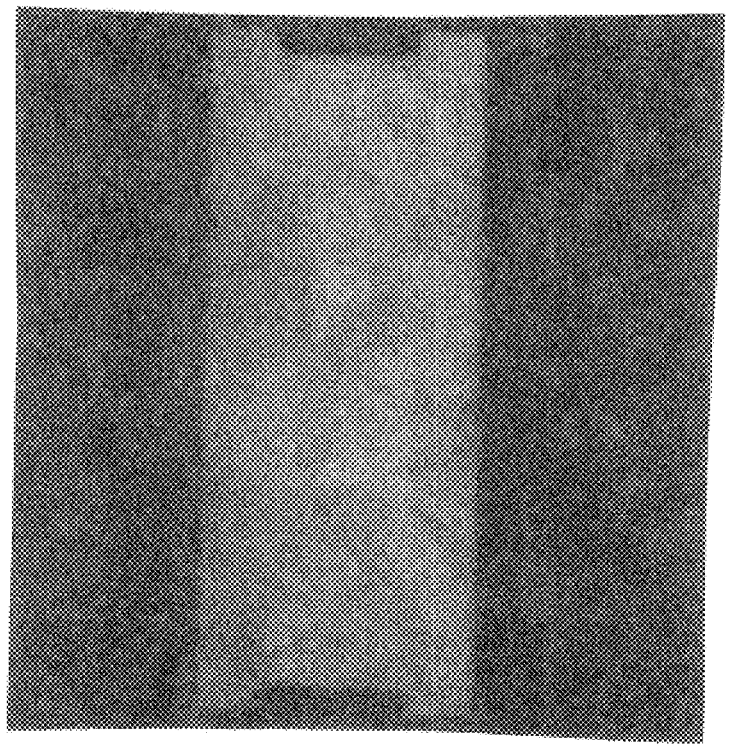
FIG. 2 is a picture (optical microphotograph: 450 times) showing a microstructure of the crystal silicon film obtained by the present invention.
Figure 3:
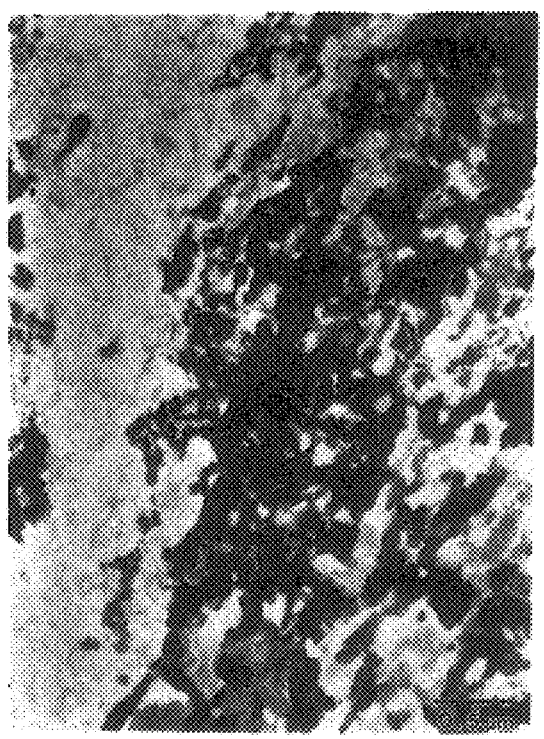
FIG. 3 is a picture (TEM: 50,000 times) showing the micro-structure of the crystal silicon film obtained by the present invention.
Figure 4:
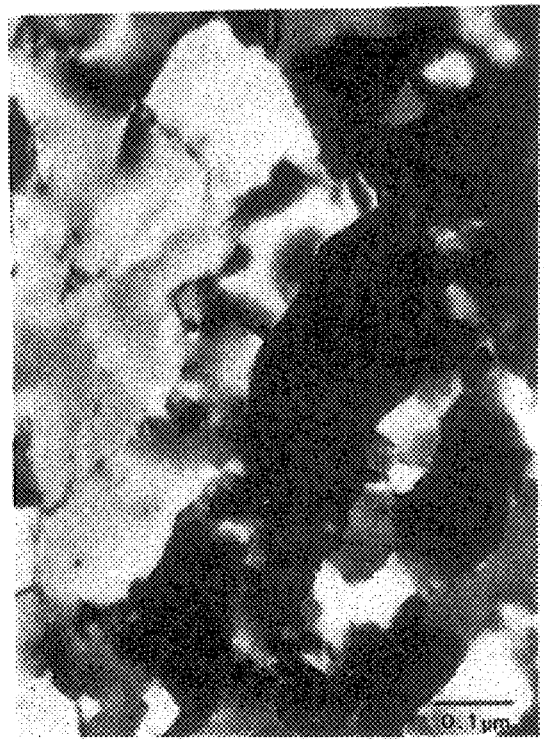
FIG. 4 is a picture (TEM: 250,000 times) showing the micro-structure of the crystal silicon film obtained by the present invention.
Figure 5A:
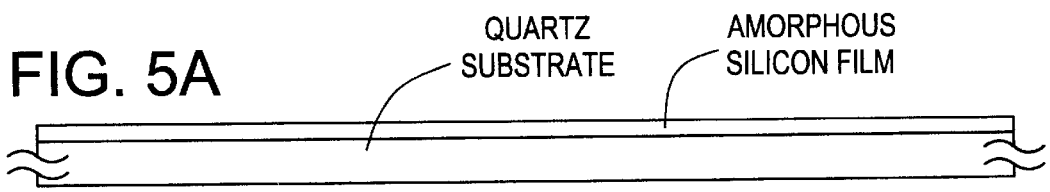
FIGS. 5A though 5G are schematic diagrams showing one example of typical modes of manufacturing steps of the crystal silicon film of the present invention.
Figure 5B:
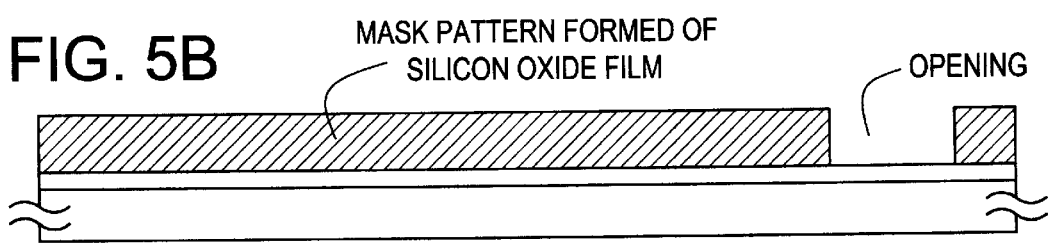
Figure 5C:
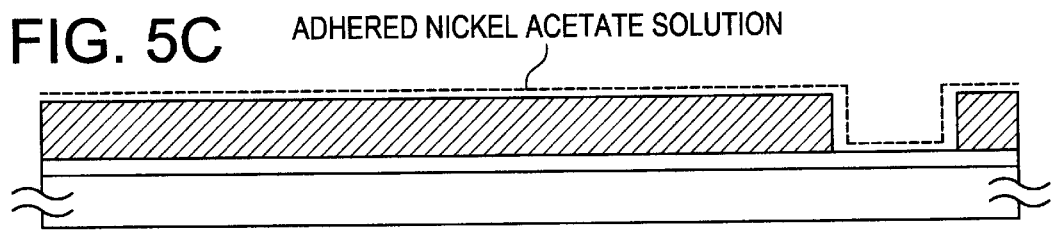
Figure 5D:
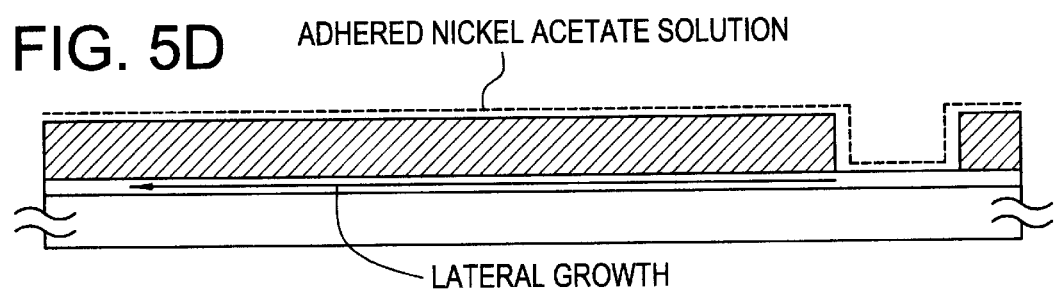
Figure 5E:
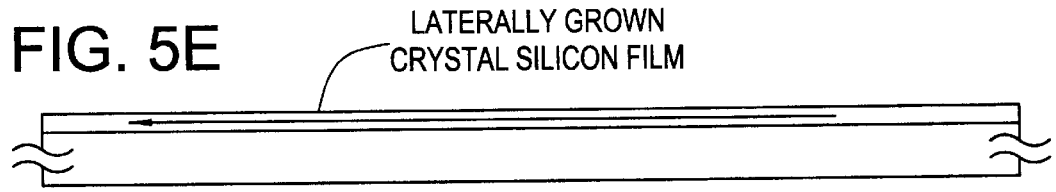
Figure 5F:
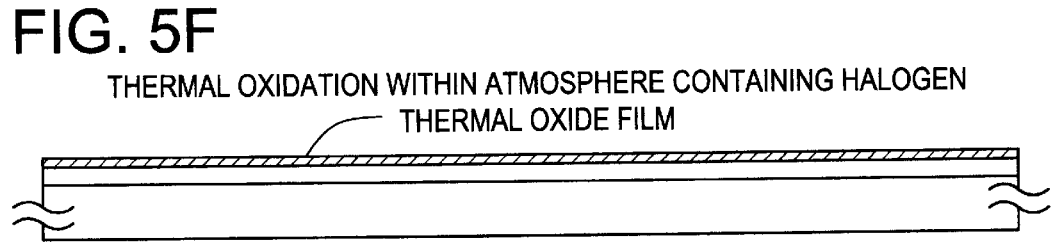
Figure 5G:
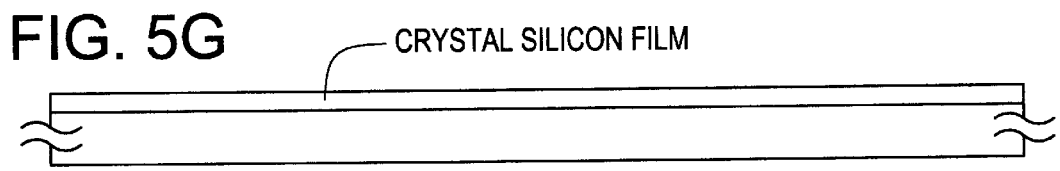
Figure 7A:
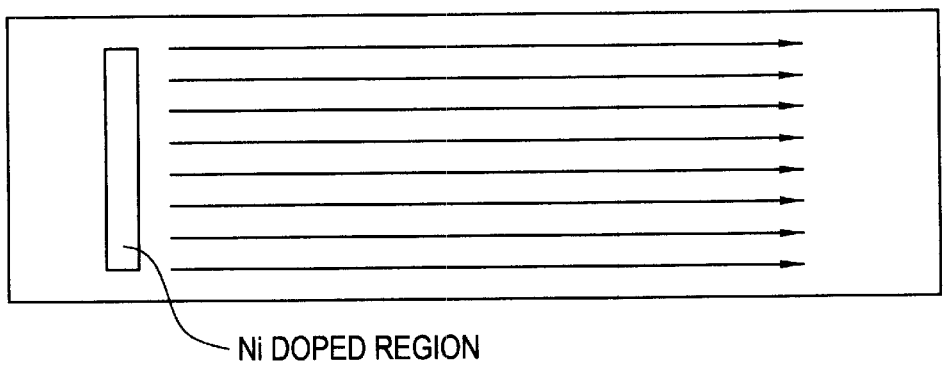
FIGS. 7*a* and 7*b* are diagrammatic views showing the form of crystal growth supposed from the result observed from a number of microphotographs of the crystal silicon film of the present invention.
Figure 7B:
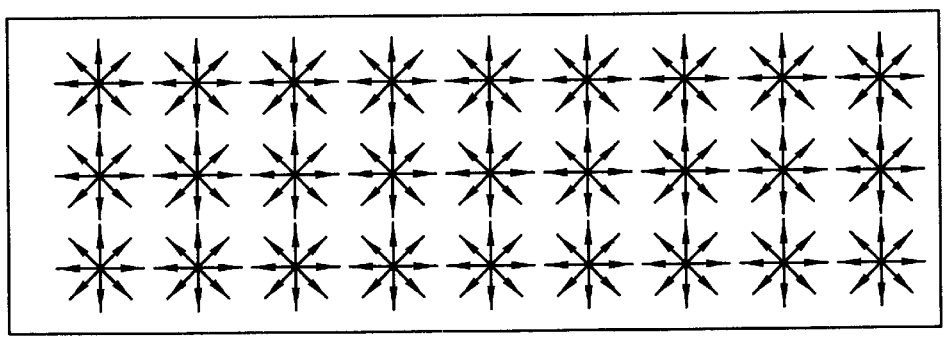
Figure 8:
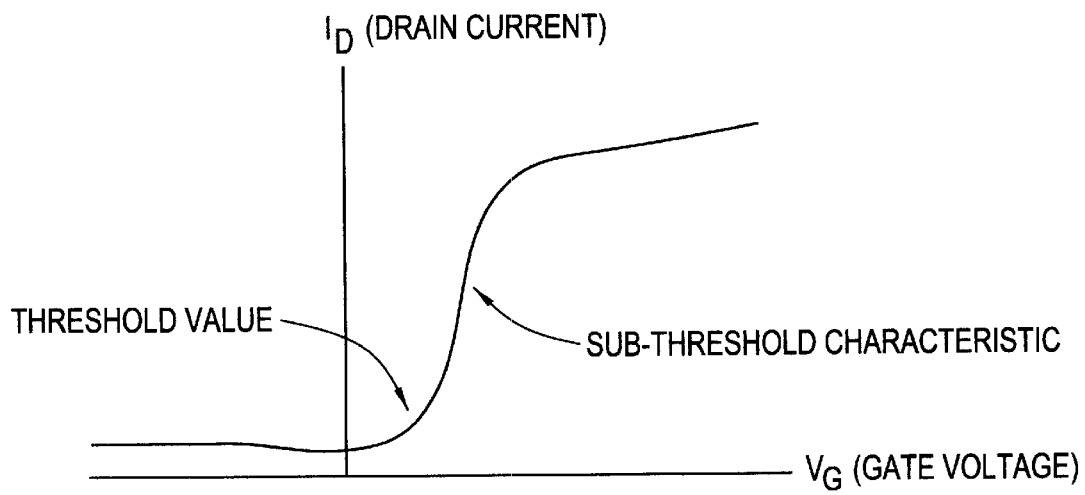
FIG. 8 is a schematic graph for explaining a sub-threshold value (S-value) and others of the semiconductor device.
Figure 9A:
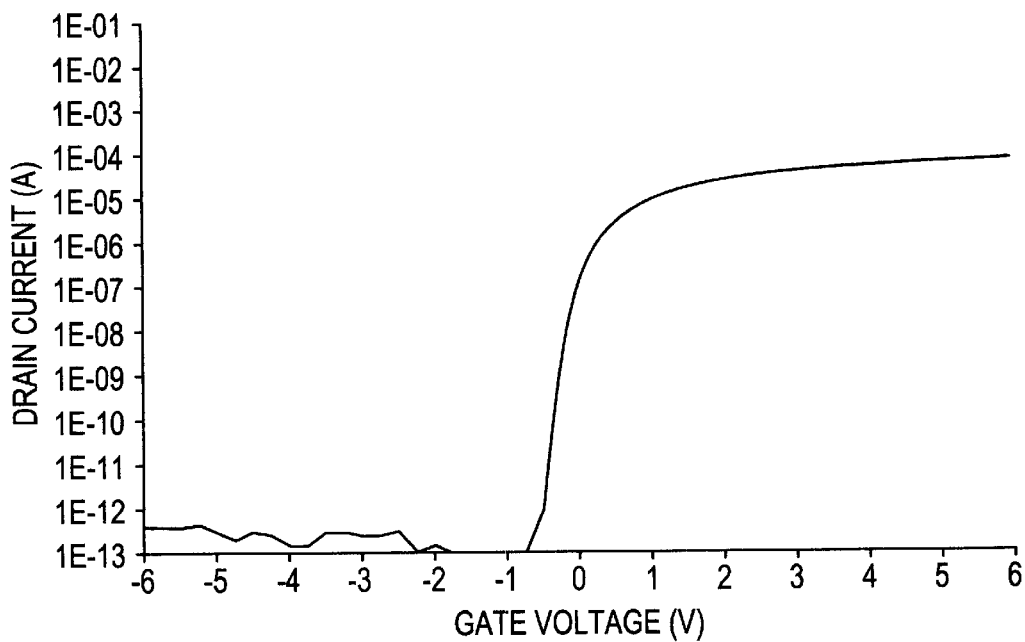
FIGS. 9*a* and 9*b* are graphs showing various characteristics such as the sub-threshold characteristic (S value) of the semiconductor device using the crystal silicon film of the present invention.
Figure 9B:
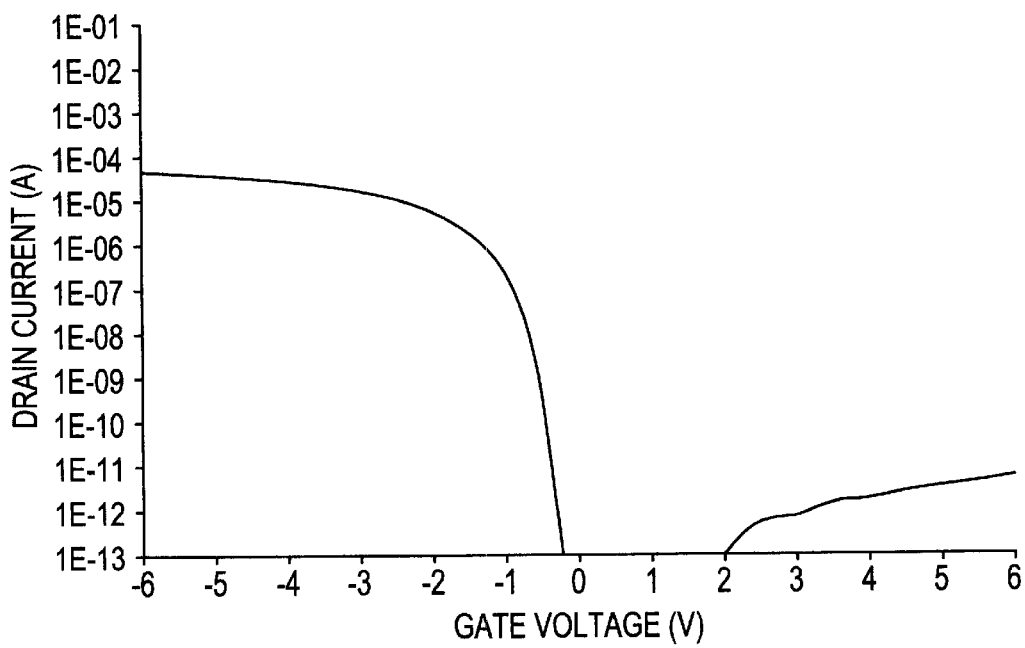
Figure 10:
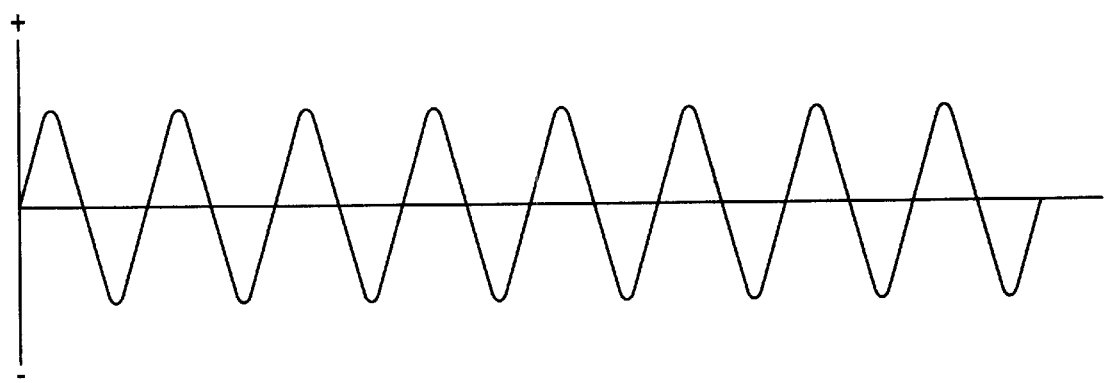
FIG. 10 is a schematic chart for explaining a characteristic of a ring oscillator into which a circuit in which an N-channel type TFT and a P-channel type TFT are combined is built.
Figure 11A:
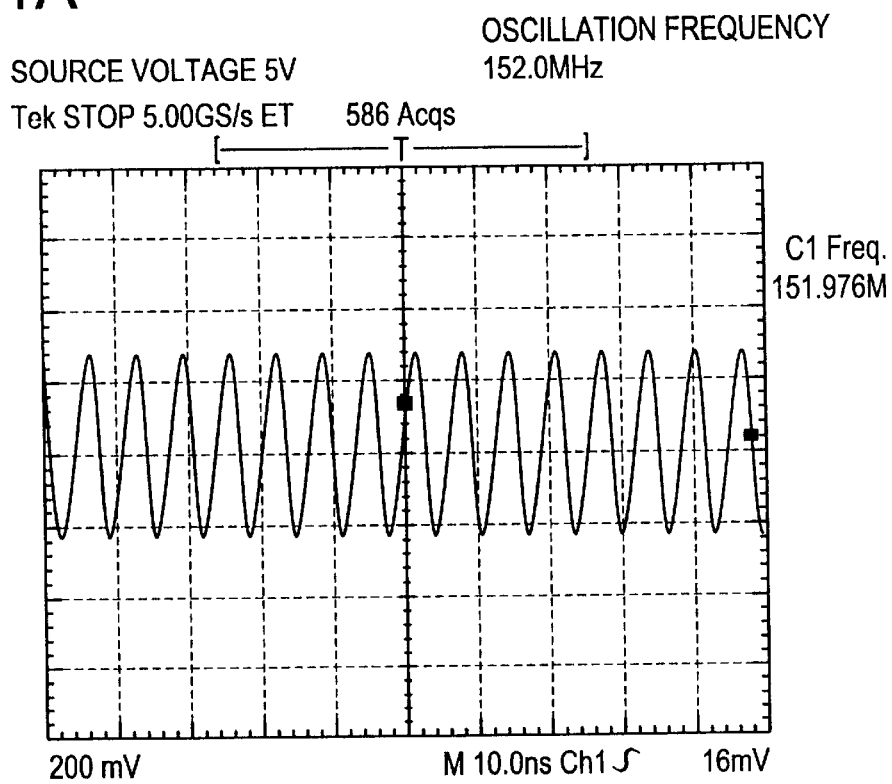
FIGS. 11*a* and 11*b* are charts showing oscilloscopes (oscillating waveforms) by the ring oscillator into which the circuit in which the N-channel type TFT and the P-channel type TFT are combined by using the crystal silicon film of the present invention is built.
Figure 11B:
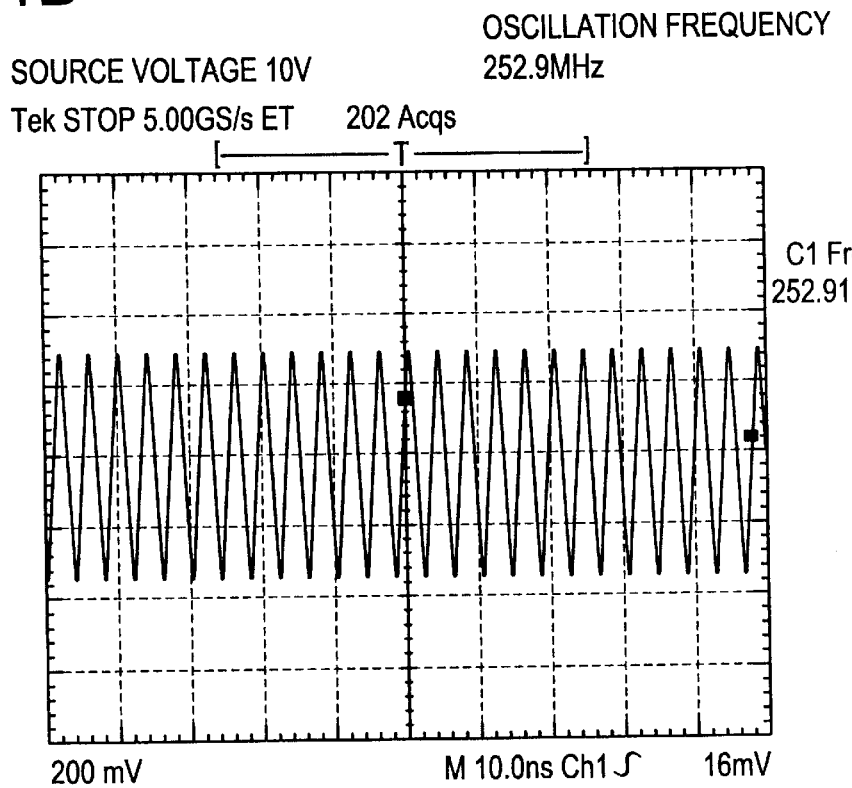
Figure 12:
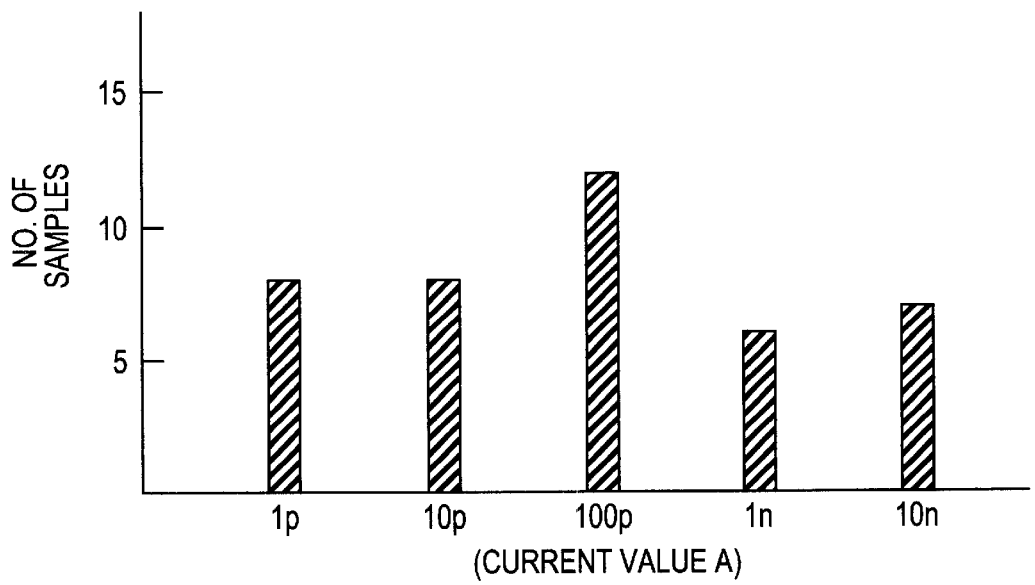
FIG. 12 is a graph showing measured values of gate current of a planar type thin film transistor using the crystal silicon film of the present invention.
Figure 13:
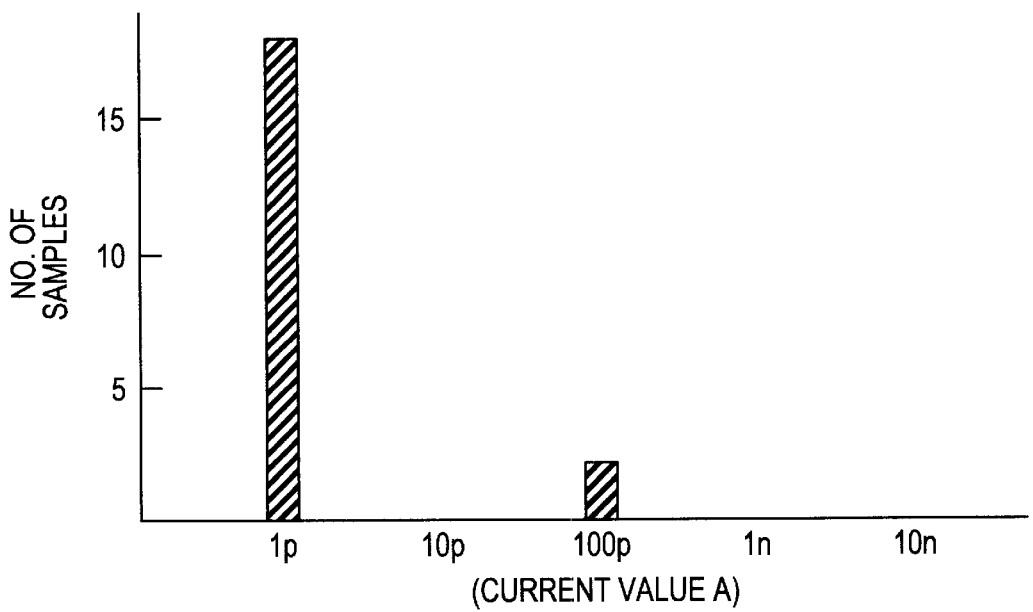
FIG. 13 is a graph showing measured values of gate current of the planar type thin film transistor using the crystal silicon film of the present invention.
Figure 14:
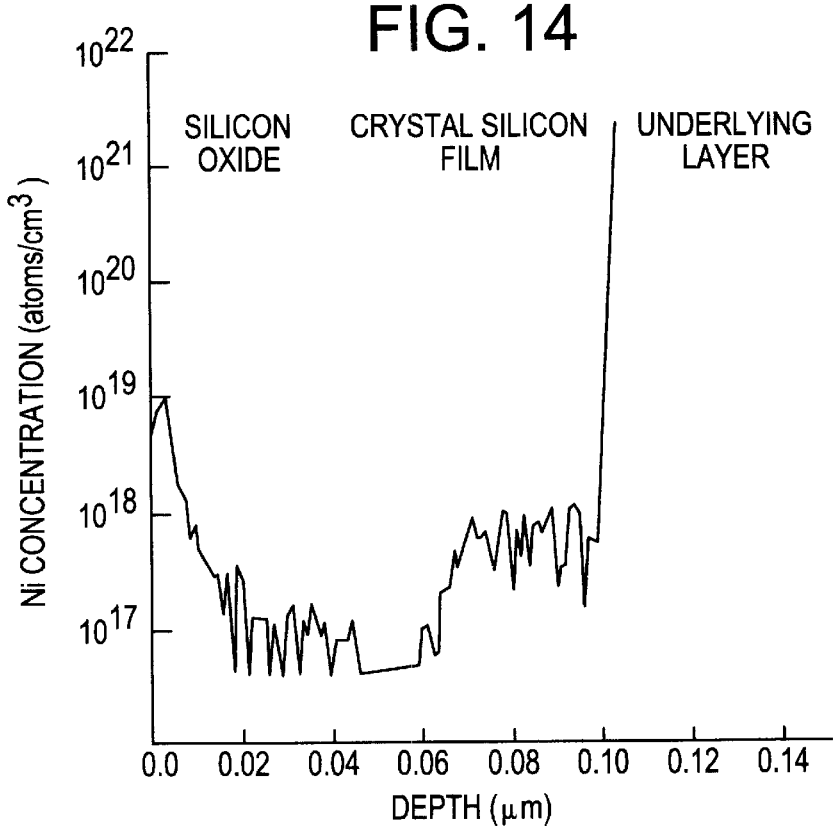
FIG. 14 is a graph showing a measured result of concentration distribution of Ni element in a direction of section of the film at the moment when a thermal oxide film is formed after crystallizing an amorphous silicon film by using Ni.

FIG. 14 shows a measured result of the distribution of concentration of nickel element in a direction of section of a crystal silicon film obtained by utilizing nickel as the metal element. This measurement was carried out by SIMS (secondary ion mass spectrometry). Steps for fabricating the sample from which these measured values have been obtained will be explained below briefly.

A silicon oxide film is formed as an underlying film in a thickness of 4000 angstrom on a quartz substrate and then an amorphous silicon film is formed in a thickness of 500 angstrom by low pressure thermal CVD. Next, nickel element is introduced to the amorphous silicon film by using nickel acetate aqueous solution. Further, the amorphous silicon film is crystallized by a heat treatment at 650° C. for four hours to obtain a crystal silicon film. After that, another heat treatment is implemented within an oxidizing atmosphere at 950° C. to form a thermal oxide film 500 angstrom thick.

As it is apparent from FIG. 14, the nickel element has moved from the crystal silicon film (poly-Si film) to the thermal oxide film and is contained in the thermal oxide film. Yet, it exists within the crystal silicon film (poly-Si film) relatively in high concentration. It is noted that the reason why the concentration of nickel element is high on the surface of the thermal oxide film is considered to be measurement errors caused by the state of the surface such as irregularities and adsorbed substances on the surface, so that it is not significant. Data near the interface also contains errors more or less by the same reason.

[Second Embodiment]

Figure 15:
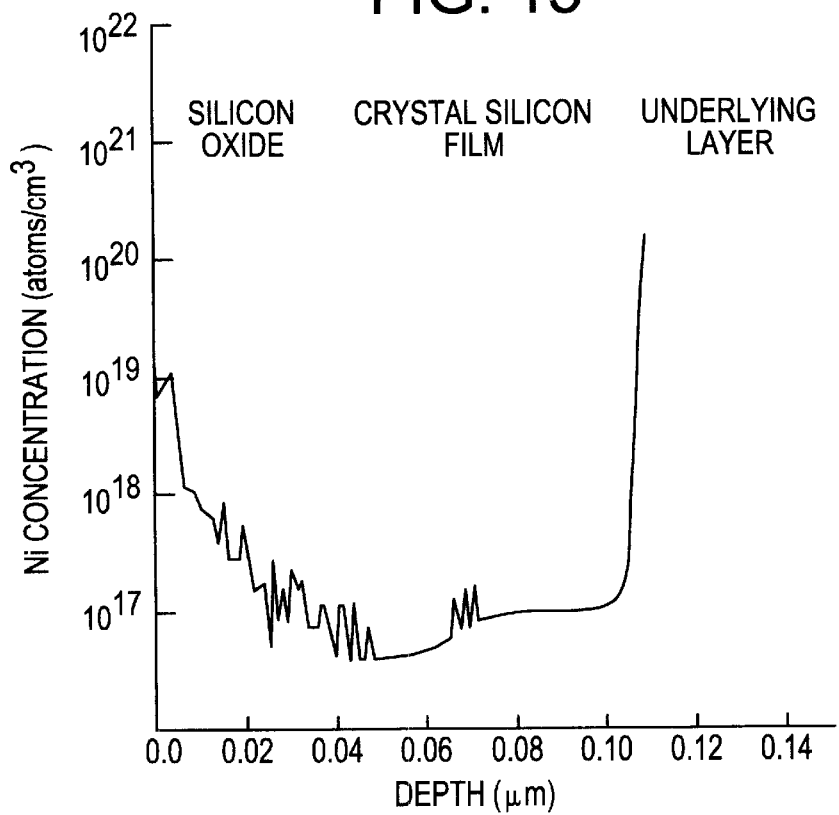
FIG. 15 is a graph showing a measured result of concentration distribution of Ni element in the direction of section of the film at the moment when the thermal oxide film is formed after crystallizing the amorphous silicon film by using Ni.

Next, as another method for forming the thermal oxide film, a heat treatment is implemented within an oxidizing (e.g. oxygen) atmosphere containing 3 volume % of HCl to form the thermal oxide film 500 angstrom thick. FIG. 15 shows measured data of this sample. As it is apparent from FIG. 15, the concentration of nickel within the crystal silicon film (poly-Si) is reduced further and instead of that, the concentration of nickel within the thermal oxide film is increased. This means that the nickel element has been sucked out (i.e. gettered) to the thermal oxide film.

The difference between FIG. 14 and FIG. 15 is only whether HCl has been contained within the atmosphere in forming the thermal oxide film. Accordingly, it can be concluded that HCl is related significantly with the above-mentioned effect of gettering, beside oxygen. Further, because no gettering effect is confirmed by H (hydrogen) which is a component of HCl, it can be seen that, more accurately, the gettering effect as indicated by the difference between FIG. 14 and FIG. 15 can be obtained by action of Cl (chlorine).

Figure 16:
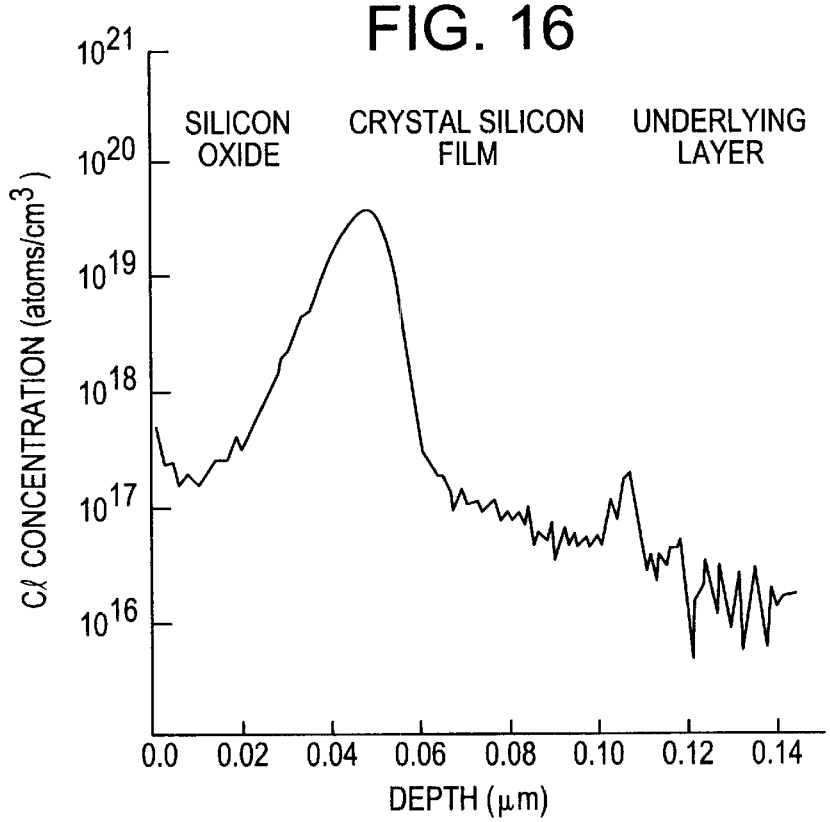
FIG. 16 is a graph showing a measured result of concentration distribution of Cl in the direction of section of the film at she moment when the thermal oxide film is formed after crystallizing the amorphous silicon film by using Ni.

The crystal silicon film in which the nickel concentration has been reduced can be obtained by eliminating the thermal oxide film which has gettered the nickel element. FIG. 16 is a graph showing the distribution of concentration of Cl element in a sample fabricated under the same condition with that of the sample from which the data in FIG. 15 has been obtained. As it is apparent from FIG. 16, the Cl element is concentrated near the interface between the crystal silicon film and the thermal oxide film.

[Third Embodiment]

A third embodiment relates to a case when an amorphous silicon film formed by plasma CVD is utilized instead of the amorphous silicon film which is the starting film of the crystal silicon film from which the data described in the first and second embodiments have been obtained. The other fabrication conditions are the same with those in the first embodiment. Because the quality of the amorphous silicon film formed by the plasma CVD is different from that of the amorphous silicon film formed by the low pressure thermal CVD, the action of gettering exerted after forming the crystal silicon film is also different.

Figure 17:
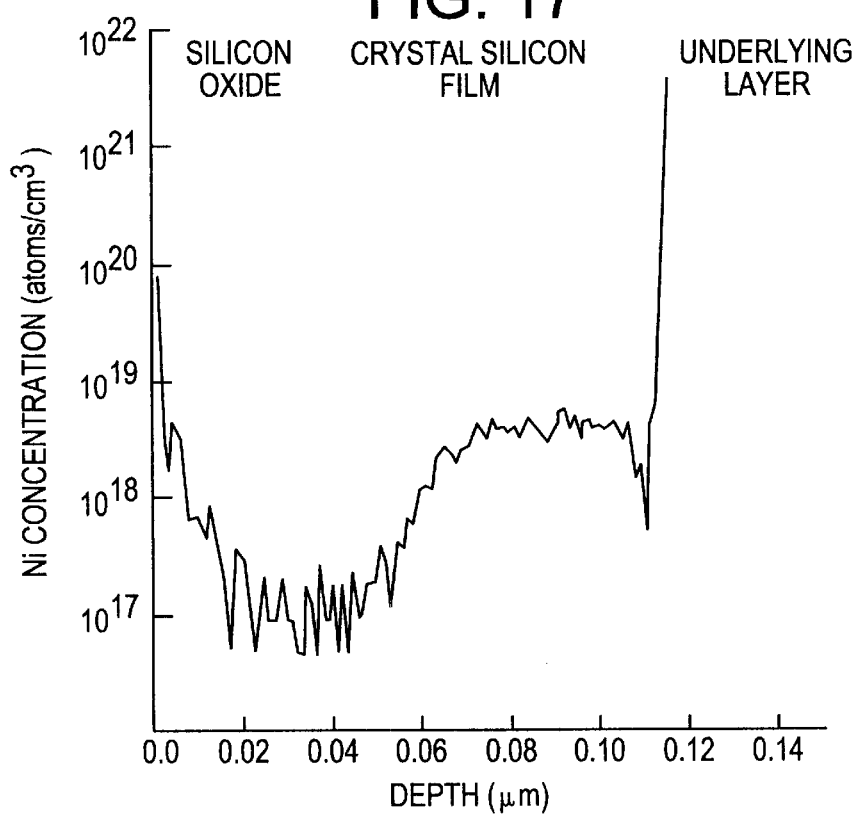
FIG. 17 is a graph showing a measured result of concentration distribution of Ni element in the direction of section of the film at the moment when the thermal oxide film is formed after crystallizing the amorphous silicon film by using Ni.

FIG. 17 shows measured data of a sample in which the thermal oxide film has been formed in an oxygen atmosphere at 950° C. As it is apparent from FIG. 17, although the nickel element has moved to the thermal oxide film, the nickel element exists relatively in high concentration within the crystal silicon film (poly-Si). It is noted that although the condition for introducing nickel is the same, the nickel concentration is high within the crystal silicon film (poly-Si) as compared to that in FIG. 14. It is assumed to have happened because the nickel element can readily diffuse within the film because the quality of the amorphous silicon film formed by the plasma CVD is not dense and has many defects.

The above-mentioned fact may be seen from another point of view as follows. That is, while a very thin oxide film has been formed on the surface of the amorphous silicon film by means of UV oxidation before applying the nickel acetate aqueous solution, there is a possibility that the thickness of the oxide film have become different by receiving an influence of difference of the quality of the underlying amorphous silicon film. It can be-understood that because the amount of nickel element which diffuses within the silicon film is different depending on the difference of the thickness in this case, its effect has appeared as the difference between FIG. 14 and FIG. 17.

Figure 18:
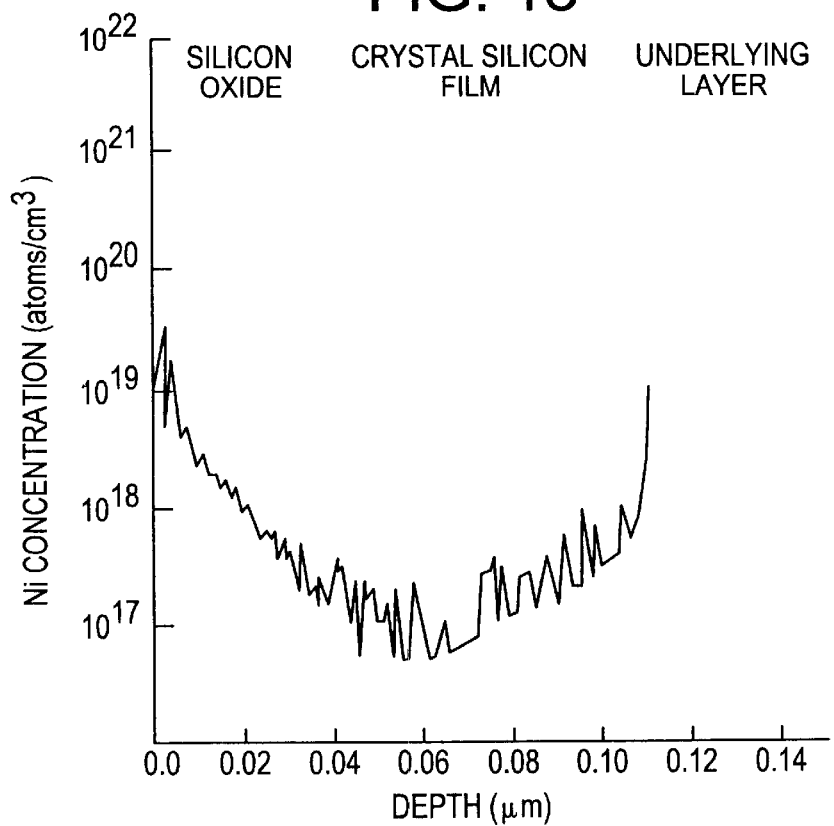
FIG. 18 is a graph showing a measured result of concentration distribution of Ni element in the direction of section of the film at the moment when the thermal oxide film is formed after crystallizing the amorphous silicon film by using Ni.

FIG. 18 shows data when 1 volume % of HCl is contained in oxygen as the atmosphere in which the thermal oxide film is formed. As it is apparent from FIG. 18, the nickel concentration within the crystal silicon film drops further as compared to the data shown in FIG. 17. In contrary to that, the nickel concentration within the thermal oxide film has increased.

This fact means that the nickel element has been gettered to the thermal oxide film by the action of chlorine. Thus, the nickel element existing within the silicon film may be gettered effectively to the thermal oxide film by forming the thermal oxide film within the oxidizing atmosphere containing chlorine. Accordingly, the crystal silicon film in which the nickel concentration is reduced may be obtained by eliminating the thermal oxide film which has gettered the nickel element.

Figure 19:
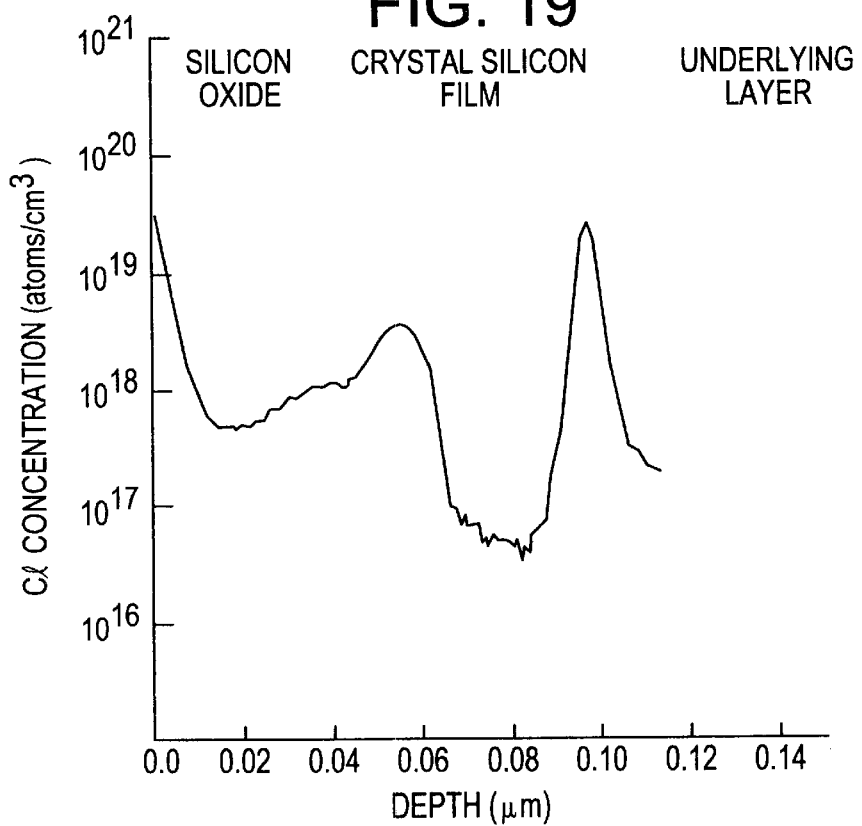
FIG. 19 is a graph showing a measured result of concentration distribution of Cl in the direction of section of the film at the moment when the thermal oxide film is formed after crystallizing the amorphous silicon film by using Ni.

A graph shown in FIG. 19 show a result obtained by studying the concentration of chlorine within a sample obtained under the same fabrication condition with that of the sample from which the data shown in FIG. 18 has been obtained. As it is apparent from FIG. 19, chlorine exists in high concentration near the interfaces between the underlying film and the crystal silicon film and between the crystal silicon film and the thermal oxide film. While FIG. 19 corresponds to FIG. 16, the reason why the chlorine concentration is distributed as shown in FIG. 19 is considered to. happen because the amorphous silicon film which is the starting film has been formed by the plasma CVD and the quality thereof is not dense.

As it is also apparent from FIG. 19, the nickel concentration is apt to be high near the interface between the underlying film and the crystal silicon film. It is understood to happen as a result that nickel has been gettered to the underlying film by the action of chlorine existing near the interface with the underlying film (or within the underlying film). Such phenomenon is considered to be obtained also when a halogen element is added to the underlying film.

[Fourth embodiment]

A fourth embodiment relates to a case when a crystal silicon film is obtained on a glass substrate by utilizing nickel element. At first, the crystal silicon film having a high crystallinity is obtained by the action of nickel element. Next, a thermal oxide film is formed on the crystal silicon film by thermal oxidation. At this time, the nickel element remaining in the crystal silicon film is gettered to the thermal oxide film. Then, the thermal oxide film containing the nickel element in high concentration as a result of the gettering is eliminated. Thereby, the crystal silicon film which has the high crystallinity and in which the concentration of nickel element is low is obtained on the glass substrate.

FIGS. 20A through 20E are diagrams showing the fabrication process in the fourth embodiment. At first, a silicon oxynitride film 2 is formed as an underlying film in a thickness of 3000 angstrom on the glass substrate of Corning 1737 (distortion point: 667° C). While the silicon oxynitride film is formed by using plasma CVD using silane, $N_2O$ gas and oxygen as original gases or plasma CVD using TEOS gas and $N_2O$ gas, the former is used in the present embodiment.

The silicon oxynitride film has a function of suppressing the diffusion of impurities from the glass substrate in the later steps (seeing from the level of fabrication of a semiconductor, a glass substrate contains a large amount of impurities). A silicon oxide film may be used as the underlying film instead of the silicon oxynitride film. It is noted that although the silicon nitride film is the most suitable to obtain the function for suppressing the diffusion of the impurities in maximum, the silicon nitride film is not practical because it is peeled off from the glass substrate due to the influence of stress.

It is also important to increase the hardness of the underlying film 2 as much as possible. It is concluded from the fact that the harder the hardness of the underlying film (i.e. the smaller the etching rate thereof), the higher the reliability is in an endurance test of the thin film transistor obtained in the end. Although the reason thereof is unknown in detail, it is assumed to be caused by the effect of blocking the impurities from the glass substrate in the fabrication process of the thin film transistor.

It is also effective to contain a small amount of halogen element typified by chlorine in the underlying film 2. Thereby, the metal element which promotes crystallization of silicon which exists within the semiconductor layer may be gettered by the halogen element in the later step. It is also effective to add a hydrogen plasma treatment after forming the underlying film and it is effective to implement a plasma treatment in an atmosphere in which oxygen and hydrogen are mixed. These treatments are effective in eliminating carbon component which is adsorbed on the surface of the underlying film and in enhancing the characteristic of interface with a semiconductor film formed later.

Next, an amorphous silicon film 3, which turns out to be a crystal silicon film later, is formed in a thickness of 500 angstrom by the low pressure thermal CVD. The reason why the low pressure thermal CVD is used is because thereby, the quality of the crystal silicon film obtained later is better, i.e. the film quality is denser in concrete. Beside the low pressure thermal CVD, the plasma CVD or the like may be used. The amorphous silicon film fabricated here is desirable to have $5 \times 10^{17}$ cm$^{-3}$ to $2 \times 10^{19}$ cm$^{-3}$ of concentration of oxygen within the film. It is because oxygen plays an important role in the later step of gettering the metal element which promotes crystallization of silicon.

However, it must be careful here because the crystallization of the amorphous silicon film is hampered if the oxygen concentration is higher than the above-mentioned range of concentration. The concentration of other impurities such as those of nitrogen and carbon is preferred to be low to the utmost. In concrete, the concentration must be below $2 \times 10^{19}$ cm$^{-3}$. The thickness of the amorphous silicon film 3 is 1600 angstrom. The thickness of the amorphous silicon film must be thicker than a thickness which is required in the end as described later.

Figure 20A:
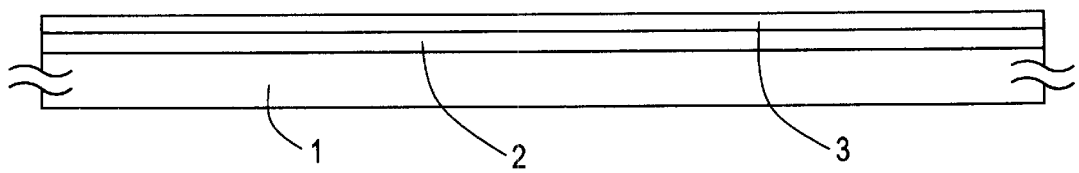
FIGS. 20A through 20E are diagrams showing fabrication steps according to a fourth embodiment.
Figure 20B:
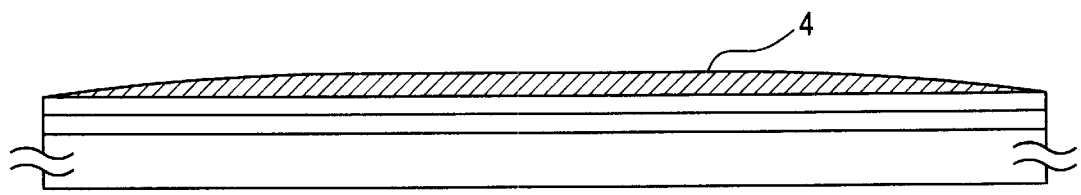

When the amorphous silicon film 3 is crystallized by means of only heating, the thickness of the starting film (amorphous silicon film) 3 is set at 800 angstrom to 5000 µm or preferably, 1500 to 3000 angstrom. It is uneconomical from the aspect of production cost if the thickness is thicker than the above-mentioned thickness range because it takes more time in forming the film. When the thickness is thinner than the above-mentioned thickness range on the other hand, the crystal may be grown non-uniformly or the reproducibility of the process may become bad. Thus, the state shown in FIG. 20A is obtained. Next, nickel element is introduced to the amorphous silicon film 3 to crystallize it. Here, the nickel element is introduced by applying nickel acetate solution containing 10 ppm (weight conversion) of nickel on the surface of the amorphous silicon film 3.

Beside the method of using the nickel salt solution as described above, sputtering, CVD, plasma treatment or adsorption may be used as the method for introducing the nickel element. Among them, the method of using the solution is useful in that it is simple and that the concentration of the metal element may be readily adjusted. Various nickel salts may be used as the nickel salt and organic solvents such as alcoholic solvents and others or mixed solvent of organic water and organic solvent may be used beside water as the solvent.

In the present embodiment, the nickel acetate solution is applied as described above to form a water film 4 as shown in FIG. 20B. In this state, extra solution is blown out by using a spin coater not shown. Thus, the nickel element is held in contact on the surface of the amorphous silicon film 3. It is noted that it is preferable to use solution containing no carbon and containing nickel salt, e.g. nickel sulfate solution, instead of using the nickel acetate solution, if the remained impurities in the later heating process is taken into consideration. It is because the nickel acetate solution contains carbon and it might be carbonized in the later heating process, thus remaining within the film. An amount of the nickel element to be introduced may be controlled by adjusting the concentration of nickel salt within the solution.

Figure 20C:

Next, a heat treatment is implemented in the temperature range from 450° C. to 650° C. in the state shown in FIG. 20C to crystallize the amorphous silicon film 3 and to obtain a crystal silicon film 5. This heat treatment is implemented in a reducing atmosphere. Here, the heat treatment is implemented for four hours at 620° C. within a nitrogen atmosphere containing 3 volume % of hydrogen. The reason why the reducing atmosphere is adopted in the crystallization step in a way of the heat treatment is to prevent oxides from being created in the step of the heat treatment and more concretely, to suppress nickel from reacting with oxygen and NiOx from being created on the surface of the film or within the film.

By the way, oxygen couples with nickel and contributes a lot in gettering nickel in the later gettering step. However, it has been found that if oxygen couples with nickel in the above-mentioned stage of the crystallization, it hampers the crystallization. Accordingly, it is important to suppress the oxides from being created to the utmost in the crystallization step in a way of heating. The concentration of oxygen within the atmosphere for implementing the heat treatment for the crystallization has to be in an order of ppm, or preferably, less than 1 ppm.

While inert gases such as nitrogen and argon or their mixed gas may be used as the gas which occupies the most of the atmosphere for implementing the heat treatment for the crystallization, nitrogen is used in the present embodiment. The lower limit of the heating temperature for the crystallization is preferred to be more than 450° C. from the aspects of its effectiveness and reproducibility. On the other hand, the upper limit thereof is preferred to be less than the distortion point of the used glass substrate. Because the Corning 1737 glass substrate whose distortion point is 667° C. is used in the present embodiment, its upper limit is set at 650° C., leaving some margin.

In this regard, the heating temperature may be increased up to about 900° C. or more if a quartz substrate is used as the substrate. In this case, a crystal silicon film having a higher crystallinity may be obtained in a shorter time. Thus, the crystal silicon film 5 is obtained as shown in FIG. 20C. Another heat treatment is implemented after obtaining the crystal silicon film 5 to form a thermal oxide film containing nickel element. This heat treatment is implemented within an atmosphere of 100% of oxygen.

Figure 20D:
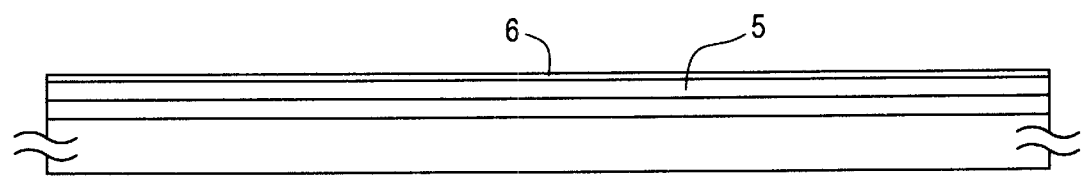

FIG. 20D is a diagram for explaining this heat treatment step. This step is carried out to eliminate the nickel element (or another metal element which promotes the crystallization of silicon) which has been introduced intentionally for the crystallization in the initial stage from the crystal silicon film 5. This heat treatment is implemented at a temperature higher than that of the heat treatment implemented for the crystallization described above. It is an important condition for effectively implementing the gettering of nickel element.

This heat treatment is implemented in the temperature range from 550° C. to 1050° C. or preferably from 600° C. to 980° C. upon meeting the above-mentioned condition. It is because no effect is obtained if the temperature is below 600° C. and a fixture formed by quartz distorts or a burden is placed upon equipments if it exceeds 1050° C. (in this sense, it is preferable to be less than 980° C.). Further, the upper limit of the heating temperature is limited by the distortion point of the glass substrate to be used. It must be careful not to implement the heat treatment in a temperature above the distortion point of the glass substrate to be used because, otherwise, it is deformed. Also, the lower limit depends upon a pressure at which the annealing is performed and a vapor pressure of the halogen compound of the material to be gettered. That is, when the vapor pressure of the halogen compound is smaller than the pressure of the annealing atmosphere, the gettering efficiency is not so high. For example, the vapor pressure of nickel chloride is 38.9 mmHg at 541° C. and 820.6 mmHg at 994° C. Accordingly, when the annealing is performed at the atmospheric pressure (760 mmHg), the effect of the gettering is significantly increased when the temperature is 994° C.

Because the Corning 1737 glass substrate whose distortion point is 667° C. is used in the present embodiment, the heating temperature is set at 640° C. Then, a thermal oxide film 6 as shown in FIG. 20D is formed by implementing the heat treatment under such condition. Here, the thermal oxide film 6 is formed in a thickness of 200 angstrom by implementing the heat treatment for 12 hours. Because the thermal oxide film 6 is formed, the thickness of the crystal silicon film 3 reaches to about 1500 angstrom. When the heating temperature is 600° C. to 750° C. in the heat treatment, the treatment time (heating time) is set at 10 hours to 48 hours or typically at 24 hours. It is noted that if the heating temperature is 750° C. to 900° C., the treatment time is set at 5 hours to 24 hours or typically at 12 hours Further, when the heating temperature is 900° C. to 1050° C., the treatment time is set at 1 hour to 12 hours or typically at 6 hours. These treatment times are set adequately depending on the thickness of the oxide film to be obtained as a matter of course. In this step, nickel element is gettered to the thermal oxide film 6 to be formed. In the gettering, oxygen existing within the crystal silicon film, beside that existing within the oxygen atmosphere, plays an important role. That is, oxygen couples with nickel, thus producing nickel oxide, and the nickel element is gettered to the thermal oxide film 6 in this form.

If the concentration of oxygen is too much, it becomes the factor of hampering the crystallization of the amorphous silicon film 3 in the crystallization step shown in FIG. 20C as described above. However, the existence thereof plays an important role in the process of gettering nickel as described above. Accordingly, it is important to control the concentration of oxygen existing within the amorphous silicon film, the starting film. Through this step, the nickel element within the crystal silicon film 5 may be eliminated or its concentration may be reduced as compared to its initial concentration.

Because the nickel element is gettered to the oxide film to be formed in the above-mentioned step, naturally the nickel concentration within the oxide film becomes high as compared to other domains. Further, it has been observed that the concentration of nickel element is apt to be high near the interface of the crystal silicon film 5 with the oxide film 6. It is considered to happen because the domain where the gettering mainly takes place is on the side of the oxide film near the interface between the silicon film and the oxide film. The gettering proceeding near the interface is considered to be caused by the existence of stress and defects or organic substances near the interface.

Figure 20E:
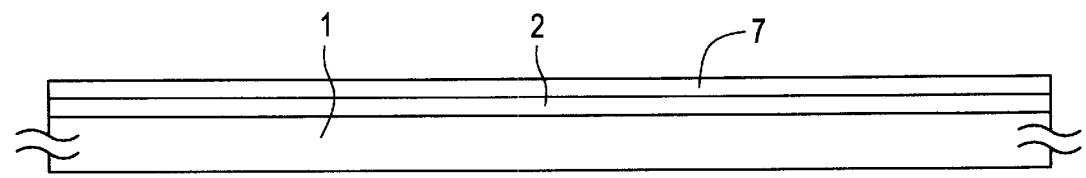

After forming the thermal oxide film 6 containing nickel in high concentration, it is eliminated. While the thermal oxide film 6 may be eliminated by means of wet etching or dry etching using buffer hydrofluoric acid (or other hydrofluorite (hydrofluoric) etchant), the former is used in the present embodiment. Thus, a crystal silicon film 7 in which the concentration of nickel has been reduced or from which nickel has been eliminated is obtained as shown in FIG. 20E. Because nickel element is contained near the surface of the obtained crystal silicon film 7 relatively in high concentration, it is effective to advance the above-mentioned etching of the thermal oxide film 6 to over-etch, more or less, the surface of the crystal silicon film 7.

[Fifth Embodiment]

A fifth embodiment relates to a case when laser light is irradiated further after obtaining the crystal silicon film by the heat treatment shown in FIG. 20C in the arrangement shown in the fourth embodiment to promote the crystallization thereof. When the temperature of the heat treatment shown in FIG. 20C is low or when the treatment time is short, i.e. when the heating temperature or the heating time is restricted by the reason of the fabrication process, there is a possibility that the required crystallinity cannot not be obtained. In such a case, the required high crystallinity may be obtained by implementing annealing by irradiating laser light. The irradiation of laser light allows the width of permissible laser irradiation condition to be widened and the reproducibility thereof to be increased as compared to the case of crystallizing the amorphous silicon film directly.

The irradiation of laser light may be implemented after the step shown in FIG. 20C. It is also important to form the amorphous silicon film 3 which is formed in FIG. 20A as the starting film in a thickness of 200 to 2000 angstrom. It is because the annealing effect exerted by the irradiation of laser light becomes high when the thickness of the amorphous silicon film is thin. Although there is no specific limit on the laser light to be used, preferably laser light in the ultraviolet region, e.g. excimer laser in the ultraviolet region is used. In concrete, while KrF excimer laser (wavelength: 248 nm), XeCl excimer laser (wavelength: 308 nm) and the like may be used, the KrF excimer laser (wavelength: 248 nm) is used in the present embodiment. Beside laser light, the annealing may be implemented by irradiating intense light by using an ultraviolet lamp or an infrared lamp.

[Sixth Embodiment]

A sixth embodiment relates to a case when the infrared lamp is used instead of the laser light in the fifth embodiment. The use of infrared ray allows the silicon film to be heated selectively without heating the glass substrate so much. Accordingly, an effective heat treatment may be implemented without giving thermal damage to the glass substrate.

[Seventh Embodiment]

A seventh embodiment relates to a case when Cu is used as the metal element which promotes crystallization of silicon in the arrangement shown in the fourth embodiment. In case of copper element, while solutions such as cupric acetate [$Cu(CH_3 COO)_2$] and cupric chloride ($CuCl_2 2H_2O$) may be used as the solution for introducing Cu, an aqueous solution of the cupric acetate [$Cu(CH_3 COO)_2$] is used in the present embodiment.

[Eighth Embodiment]

An eighth embodiment relates to a case when a quartz substrate is used as the substrate 1 in the arrangement shown in the fourth embodiment. In the present embodiment, the amorphous silicon film 3, i.e. the starting film, is formed in a thickness of 2000 angstrom. Further, the heating temperature in forming the thermal oxide film in the heat treatment shown in FIG. 20C is set at 950° C. In this case, the oxide film is formed quickly and the gettering effect cannot be fully obtained, so that the concentration of oxygen within the atmosphere is lowered. In concrete, the oxygen concentration within the nitrogen atmosphere is set at 10 volume %. In this case, the treatment time is set at 300 minutes. Under such conditions, the thermal oxide film having about 500 angstrom of thickness may be obtained. In the same time, the time necessary for gettering may be earned.

It is noted that if the heat treatment is implemented at 950° C. within the atmosphere of 100% oxygen, the thermal oxide film having a thickness of more than 500 angstrom is obtained in about 30 minutes. In this case, nickel cannot be fully gettered, so that nickel element remains relatively in high concentration within the crystal silicon film 7. Accordingly, it is preferable to form the thermal oxide film by adjusting the oxygen concentration as described in the present embodiment to earn an enough time for the gettering effect. The utilization of this method allows the time necessary for the gettering to be set by adjusting the oxygen concentration in the atmosphere when the thickness and forming temperature of the thermal oxide film are changed.

[Ninth Embodiment]

A ninth embodiment relates to a case of growing crystal in the form different from that in the fourth embodiment. That is, the present embodiment relates to a method of growing the crystal in a direction parallel to the substrate, i.e. a method called lateral growth, by utilizing the metal element which promotes crystallization of silicon. FIGS. 21A through 21E show the fabrication process according to the ninth embodiment. At first, a silicon oxynitride film is formed as an underlying film 9 in a thickness of 3000 angstrom on the Corning 1737 glass substrate 8. A quartz substrate may be used of course instead of the glass substrate.

Next, an amorphous silicon film 10 which is the starting film of a crystal silicon film is formed in a thickness of 2000 angstrom by low pressure thermal CVD. The thickness of the amorphous silicon film is preferable to be less than 2000 angstrom as described before. It is noted that plasma CVD may be used instead of the low pressure thermal CVD. Next, a silicon oxide film not shown is formed in a thickness of 1500 angstrom and is patterned to form a mask 11. An opening is created on the mask in a domain 12. The amorphous silicon film 10 is exposed at the domain where the opening 12 is created.

The opening 12 has a thin and long rectangular shape in the longitudinal direction from the depth to the front side of the figure. Preferably, the width of the opening 12 is 20 μm or more. The length thereof in the longitudinal direction may be determined arbitrarily. Then, the nickel acetate aqueous solution containing 10 ppm of nickel element in terms of weight is applied as described in the fourth embodiment and the extra solution is removed by implementing spin drying by using a spinner not shown. Thus, the solution is held in contact on the exposed surface of the amorphous silicon film 10 as indicated by a dot line 13 in FIG. 21A.

Next, a heat treatment is implemented at 640° C. for four hours in a nitrogen atmosphere containing 3 volume % of hydrogen and in which oxygen is minimized. Then, crystal grows in the direction parallel to the substrate as indicated by the reference numeral 14 in FIG. 21B. This crystal growth advances from the domain of the opening 12 to which nickel element has been introduced to the surrounding part. This crystal growth in the direction parallel to the substrate will be referred to as lateral growth throughout the present specification.

Figure 21A:
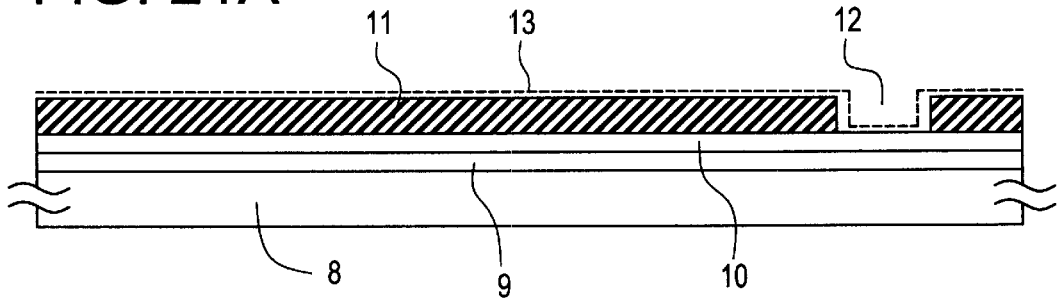
FIGS. 21A through 21E are diagrams showing fabrication steps according to a ninth embodiment.
Figure 21B:
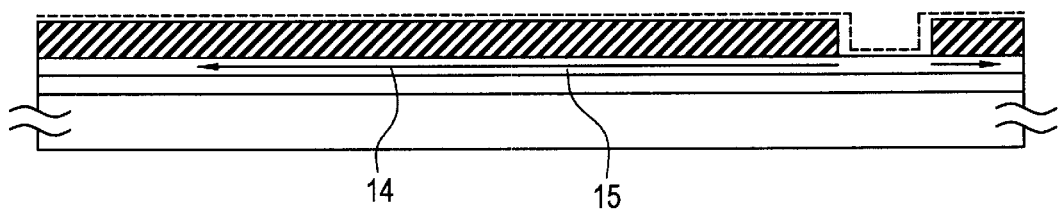
Figure 21C:
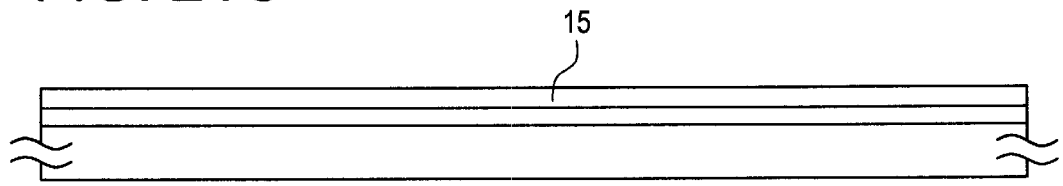
Figure 21D:
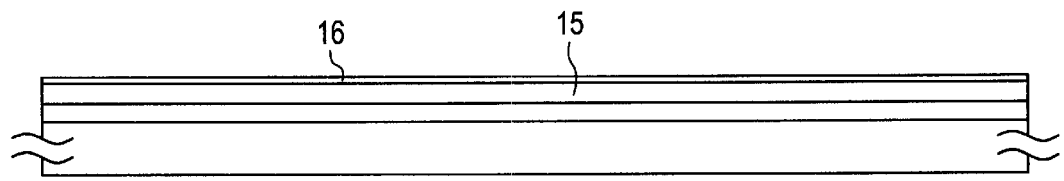

It is possible to advance this lateral. growth across more than 100 μm under the conditions of the ninth embodiment. Then, a crystal silicon film 15 having the domain in which the crystal has thus grown laterally is obtained. It is noted that crystal growth in the vertical direction called vertical growth advances from the surface of the silicon film to the underlying interface in the domain where the opening 12 is formed. Then, the mask 11 made from the silicon oxide film for selectively introducing nickel element is eliminated. Thus, the state shown in FIG. 21C is obtained. In this state, the vertically grown domain, the laterally grown domain and a domain in which no crystal has grown (having amorphous state) exist within the silicon film 15.

In this state, a heat treatment is implemented at 640° C. for four hours within an oxygen atmosphere. In this step, an oxide film 16 containing nickel element in high concentration is formed. In the same time, the concentration of nickel element within the silicon film 15 may be reduced relatively. Here, the thermal oxide film 16 is formed in a thickness of 200 angstrom. The thermal oxide film contains the gettered nickel element in high concentration. Further, because the thermal oxide film 16 is formed, the thickness of the crystal silicon film 15 is reduced to about 1900 angstrom.

Next, the thermal oxide film 16 containing nickel element in high concentration is eliminated in the same manner with the fourth embodiment. In the crystal silicon film of this state, the nickel element has a distribution of concentration such that it exists in high concentration toward the surface of the crystal silicon film. Accordingly, it is useful to etch the surface of the crystal silicon film to eliminate the domain in which the nickel element exists in high concentration after eliminating the thermal oxide film 16. That is, the crystal silicon film in which the nickel element concentration is reduced further may be obtained by etching the surface of the crystal silicon film in which the nickel element exists in high concentration.

Next, patterning is implemented to form a pattern 17 formed of the laterally grown domain. Here, it is important to form the pattern 17 such that no vertically grown domain, amorphous domain nor an edge portion of the laterally grown domain is included there, because the concentration of nickel element is relatively high in the vertically grown domain and the edge portion of the laterally grown domain and the amorphous domain in which no crystal has grown has inferior electrical characteristics. The concentration of nickel element which remains within the pattern 17 made from the laterally grown domain thus obtained may be reduced further as compared to the case shown in the fourth embodiment.

This is caused by the fact that the concentration of the metal element contained within the laterally grown domain is low originally. In concrete, the concentration of nickel element within the pattern 17 made from the laterally grown domain may be readily reduced to the order of $10^{17}$ cm$^{-3}$ or less. When a thin film transistor is formed by utilizing the laterally grown domain, a semiconductor device having a higher mobility may be obtained as compared to the case when the vertically grown domain as shown in the fourth embodiment (crystal grows vertically on the whole surface in the case of the fourth embodiment) is utilized.

Figure 21E:
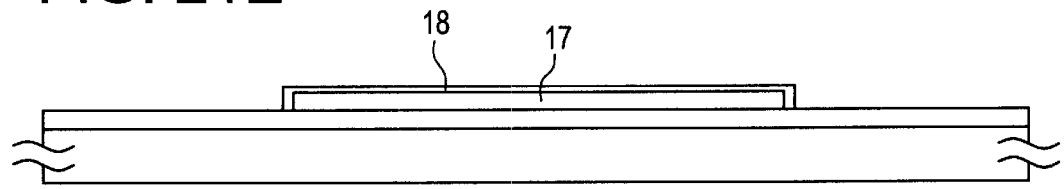

It is noted that it is useful to implement the etching process further after forming the pattern shown in FIG. 21E to eliminate the nickel element existing on the surface of the pattern. It is not effective to form a thermal oxide film for gettering after forming the pattern 17 because in this arrangement, the etching advances so as to scoop out even the under side of the crystal silicon film formed in an island shape because the etching of the underlying film advances when the thermal oxide film is eliminated, though the gettering effect is certainly obtained by the thermal oxide film.

Such a condition may cause breaking of wires and defective operation of elements later. According to the present embodiment, a thermal oxide film 18 is formed after forming the pattern 17. This thermal oxide film 18 is what becomes a part of a gate insulating film later in constructing a thin film transistor and is not eliminated, though it has the gettering effect.

[Tenth Embodiment]

A tenth embodiment relates to a case of fabricating a thin film transistor disposed in a pixel region of an active matrix type liquid crystal display or an active matrix type EL display by utilizing the inventive crystal silicon film.

Figure 22A:
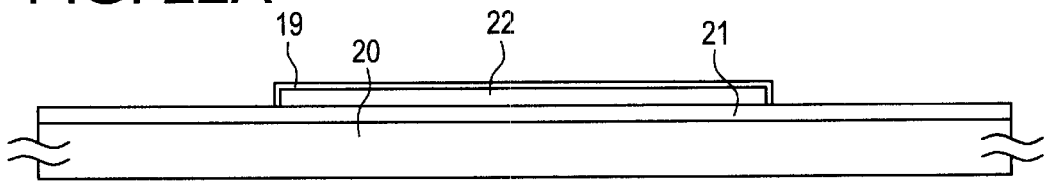
FIGS. 22A through 22E are diagrams showing fabrication steps according to a tenth embodiment.

FIGS. 22A through 22E show the fabrication process according to the tenth embodiment. At first, while the crystal silicon film may be formed on the glass substrate through the process shown in the fourth or ninth embodiment, the method of the fourth embodiment is used in the present embodiment. When the crystal silicon film has been obtained in the arrangement shown in the fourth embodiment, the state shown in FIG. 22A is obtained by patterning the crystal silicon film. In FIG. 22A, the reference numeral (20) denotes a glass substrate, (21) an underlying film, and (22) an active layer formed of the crystal silicon film. After obtaining the state shown in FIG. 22A, a plasma treatment is implemented within a reduced pressure atmosphere in which oxygen an a hydrogen are mixed. The plasma is formed by high-frequency discharge.

Organic substances existing on the surface of the exposed active layer 22 is removed by the above-mentioned plasma treatment. Specifically, the organic substances adsorbing on the surface of the active layer are oxidized by oxygen plasma and the oxidized organic substances are reduced and vaporized by hydrogen plasma. Thus the organic substances existing on the surface of the exposed active layer 22 are removed. The removal of the organic substances is very effective in suppressing fixed charge from existing on the surface of the active layer 22. That is, because the fixed charge caused by the existence of organic substances hampers the operation of the device and renders the characteristics thereof instable, it is very useful to remove it.

After removing the organic substances, thermal oxidation is implemented within an oxygen atmosphere at 640° C. to form a thermal oxide film 19 of 100 angstrom thick. This thermal oxide film has a high interfacial characteristic with a semiconductor layer and composes a part of a gate insulating film later. Thus, the state shown in FIG. 22A is obtained. After that, a silicon oxynitride film 23 which composes the gate insulating film is formed in a thickness of 1000 angstrom. While the film may be formed by using plasma CVD using mixed gas of oxygen, silane and N$_2$O or plasma CVD using mixed gas of TEOS and N$_2$O, the former is used in the present embodiment. The silicon oxynitride film 23 functions as the gate insulating film together with the thermal oxide film 19.

It is also effective to contain halogen element within the silicon oxynitride film 23. That is, it is possible to prevent the function of the gate insulating film as an insulating film from dropping by the influence of the nickel element (or another metal element which promotes crystallization of silicon) existing within the active layer 22 by fixing the nickel element by the action of the halogen element. It is significant to use the silicon oxynitride film in that nickel element hardly infiltrates to the gate insulating. film from its dense film quality. If nickel element infiltrates into the gate insulating film, its function as an insulating film drops, thus causing instability and dispersion of characteristics of the thin film transistor. It is noted that a silicon oxide film which is normally used may be also used for the gate insulating film.

After forming the silicon oxynitride film 23 which functions as the gate insulating film, an aluminum film (not shown) which functions as a gate electrode later is formed by sputtering. 0.2 weight % of scandium is included within the aluminum film to suppress hillock and whisker from being produced in the later process. The hillock and whisker mean that abnormal growth of aluminum occurs by heating, thus forming needle or prickle-like projections.

After forming the aluminum film, a dense anodic oxide film not shown is formed. The anodic oxide film is formed by using ethylene glycol solution containing 3 weight % of tartaric acid as electrolyte. That is, the anodic oxide film having the dense film quality is formed on the surface of the aluminum film by setting the aluminum film as the anode and platinum as the cathode and by anodizing within this electrolyte. The thickness of the anodic oxide film not shown having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization.

Figure 22B:
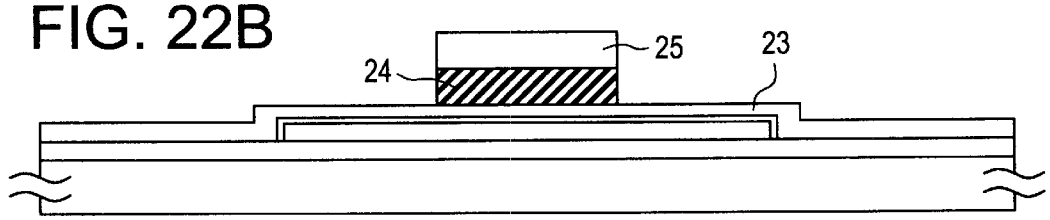
Figure 22C:
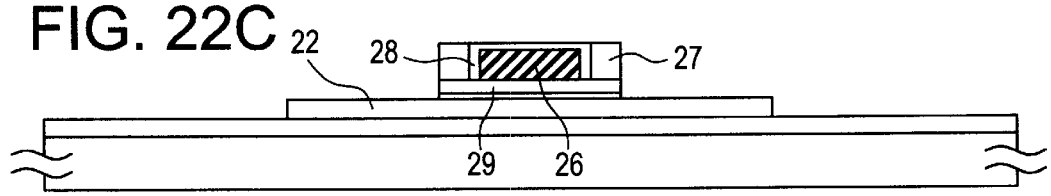

Next, the resist mask 25 is formed and the aluminum film is patterned so as to have a pattern 24. The state shown in FIG. 22B is thus obtained. Here, another anodization is implemented. In this case, 3 weight % of oxalate aqueous solution is used as electrolyte. A porous anodic oxide film 27 is formed by anodizing within this electrolyte by setting the aluminum pattern 26 as the anode. In this step, the anodic oxide film 27 is formed selectively on the sides of the aluminum pattern because the resist mask 25 having the high adhesiveness exists thereabove.

The anodic oxide film may be grown up to several μm thick. The thickness is 6000 angstrom in the present embodiment. It is noted that the range of growth may be controlled by adjusting an anodizing time. Next, the resist mask 25 is removed. Then, a dense anodic oxide film is formed again. That is, the anodization is implemented again by using the ethylene glycol solution containing 3 weight % of tartaric acid as electrolyte. Then, an anodic oxide film 28 having a dense film quality is formed because the electrolyte infiltrates into the porous anodic oxide film 27.

This dense anodic oxide film 28 is 1000 angstrom thick. The thickness is controlled by adjusting applied voltage. Here, the exposed silicon oxynitride film 23 and the thermal oxide film 19 are etched by utilizing dry etching. Then, the porous anodic oxide film 27 is eliminated by using mixed A acid in which acetic acid, nitric acid and phosphoric acid are mixed. Thus, the state shown in FIG. 22D is obtained.

Figure 22D:
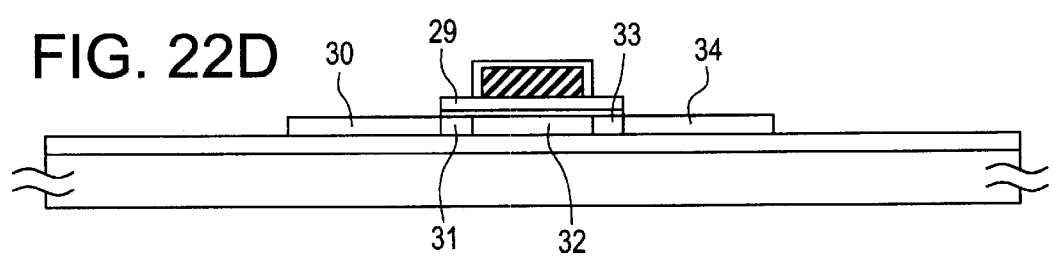
Figure 22E:
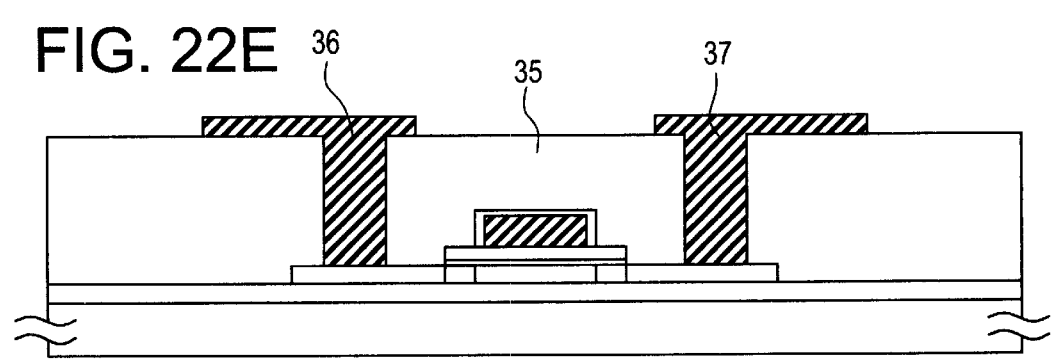

After obtaining the state shown in FIG. 22D, impurity ions are injected. Here, P (phosphorus) ions are injected by plasma doping in order to fabricate an N-channel type thin film transistor. In this step, heavily doped regions (30 and 34) and lightly doped regions (31 and 33) are formed because part of the remaining silicon oxide film 29 functions as a semi-permeable mask, thus blocking part of the injected ions.

Next, laser light is irradiated to activate the regions into which the impurity ions have been injected. Intense light may be irradiated instead of laser light. Thus, a source region 30, a channel forming region 32, a drain region 34 and low concentration impurity regions 31 and 33 are formed in a manner of self-alignment. The one designated by the reference numeral 33 in FIG. 22D is the region called the LDD (lightly doped drain). It is noted that when the dense anodic oxide film 28 is formed as thick as 2000 angstrom or more, an offset gate region may be formed on the outside of the channel forming region 32 by its thickness.

Although the offset gate region is formed also in the present embodiment, it is not shown in FIG. 22 because its size is small, its contribution due to the existence thereof is small and the figure might otherwise become complicated. Next, a silicon oxide film or a silicon nitride film or their laminated film is formed as an interlayer insulating film 35. The silicon oxide film is used in the present embodiment. It is noted that the interlayer insulating film may be constructed by forming a layer made from a resin material on the silicon oxide film or the silicon nitride film. Next, contact holes are created to form a source electrode 36 and a drain electrode 37. Thus, the thin film transistor shown in FIG. 22E is completed.

[Eleventh Embodiment]

An eleventh embodiment is related to a method for forming the gate insulating film 23 in the arrangement shown in the tenth embodiment. Thermal oxidation may be used as a method for forming the gate insulating film when a quartz substrate or a glass substrate having a high heat resistance is used as the substrate. The thermal oxidation allows the film quality to be densified and is useful in obtaining a thin film transistor having stable characteristics. That is, because an oxide film formed by the thermal oxidation is dense as an insulating film and movable electric charge existing therein can be reduced, it is one of the most suitable films as a gate insulating film.

In the present embodiment, a heat treatment is implemented in an oxidizing atmosphere at 950° C. in forming the thermal oxide film. At this time, it is effective to mix HCl or the like into the oxidizing atmosphere because, thereby, metal element existing in the active layer may be fixed in the same time with the formation of the thermal oxide film. It is also effective to mix $N_2O$ gas into the oxidizing atmosphere to form a thermal oxide film containing nitrogen component. Here, it is also possible to obtain a silicon oxynitride film by the thermal oxidation if the mixed ratio of $N_2O$ gas is optimized. It is noted that the thermal oxide film 19 needs not be formed in the case like the present embodiment and is not formed actually in the present embodiment.

[Twelfth Embodiment]

A twelfth embodiment relates to a case of fabricating a thin film transistor through a process different from that shown in the tenth and eleventh embodiments (FIG. 22). FIGS. 23A through 23E show the fabrication process according to the present embodiment. At first, while the crystal silicon film can be formed on the glass substrate through the process shown in the fourth or fifth embodiment, it is formed in accordance to the process in the fourth embodiment. It is then patterned, thus obtaining the state shown in FIG. 23A.

Figure 23A:
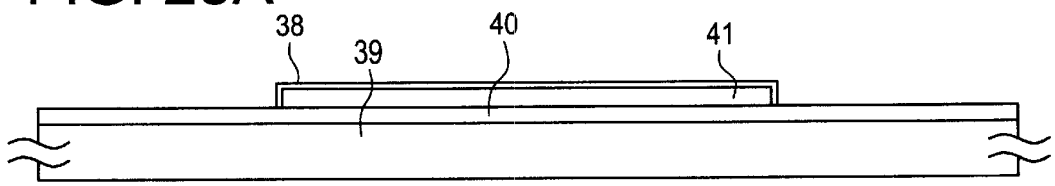
FIGS. 23A through 23E are diagrams showing fabrication steps according to a twelfth embodiment.
Figure 23B:
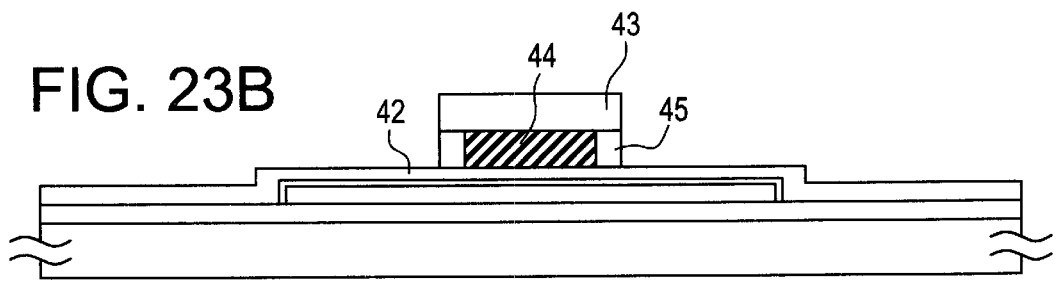

After obtaining the state shown in FIG. 23A, a plasma treatment is implemented within a reduced pressure atmosphere in which oxygen and hydrogen are mixed. In the state shown in FIG. 23A, the reference numeral (39) denotes a glass substrate, (40) an underlying film, (41) an active layer formed of the crystal silicon film and (38) a thermal oxide film formed again after eliminating the thermal oxide film for gettering. After obtaining the state shown in FIG. 23A, a silicon oxynitride film 42 which composes a gate insulating film is formed in a thickness of 1000 angstrom.

While the film may be formed by using plasma CVD using mixed gas of oxygen, silane and $N_2O$ or plasma CVD using mixed gas of TEOS and $N_2O$, the latter is used in the present embodiment. The silicon oxynitride film 42 composes the gate insulating film together with the thermal oxide film 38. It is noted that a silicon oxide film may be used beside the silicon oxynitride film. After forming the silicon oxynitride film 42 which functions as the gate insulating film, an aluminum film (not shown) which functions as a gate electrode later is formed by sputtering. 0.2 weight % of scandium is included within the aluminum film.

After forming the aluminum film, a dense anodic oxide film not shown is formed. The anodic oxide film is formed by using ethylene glycol solution containing 3 weight % of tartaric acid as electrolyte. That is, the anodic oxide film having the dense film quality is formed on the surface of the aluminum film by setting the aluminum film as the anode and platinum as the cathode and by anodizing within this electrolyte. The thickness of the anodic oxide film having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization.

Next, the resist mask 43 is formed and the aluminum film is patterned so as to have a pattern 44. Here, another anodization is implemented. In this case, 3 weight % of oxalate aqueous solution is used as electrolyte. A porous anodic oxide film 45 is formed by anodizing within this electrolyte by setting the aluminum pattern 44 as the anode.

In this step, the anodic oxide film 45 is formed selectively on the sides of the aluminum pattern because the resist mask 45 having the high adhesiveness exists thereabove. The anodic oxide film may be grown up to several μm thick. The thickness is 6000 angstrom in the present embodiment. It is noted that the range of growth may be controlled by adjusting an anodizing time.

Figure 23C:
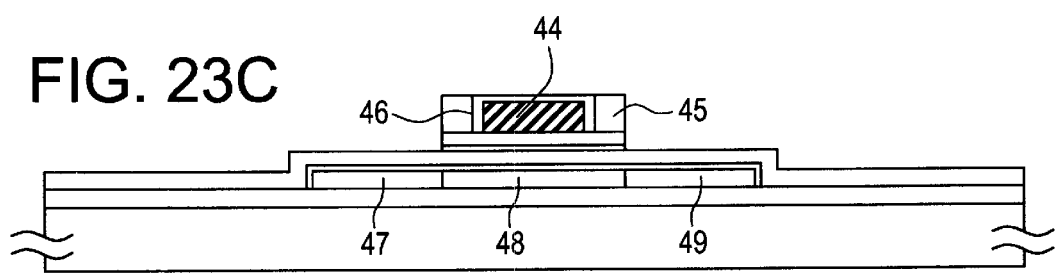

Next, after removing the resist mask 43, a dense anodic oxide film is formed again. That is, the anodization is implemented again by using the ethylene glycol solution containing 3 weight % of tartaric acid as electrolyte. Then, an anodic oxide film 46 having a dense film quality as shown in FIG. 23C is formed because the electrolyte infiltrates into the porous anodic oxide film 45. Here, the initial injection of impurity ions is implemented. It is noted that this step may be implemented after removing the resist mask 43. A source region 47 and a drain region 49 are formed by injecting the impurity ions. No impurity ion is injected to a region 48. Then, the porous anodic oxide film 45 is eliminated by using mixed acid in which acetic acid, nitric acid and phosphoric acid are mixed. Thus, the state shown in FIG. 23D is obtained.

Figure 23D:
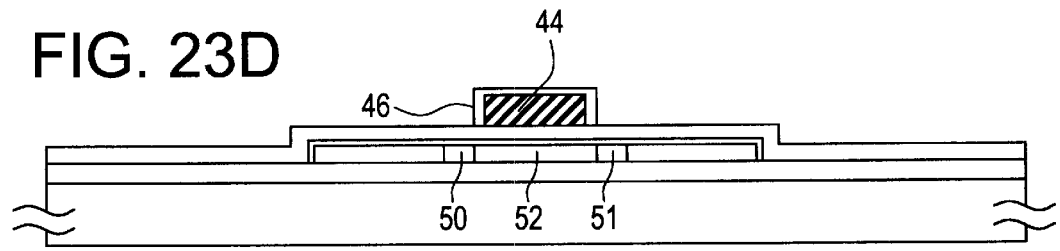

After obtaining the state shown in FIG. 23D, impurity ions are injected again. The impurity ions are injected under the doping condition lighter than that of the first injection. In this step, lightly doped regions (50 and 51) are formed and a region 52 turns out to be a channel forming region in FIG. 23D. Then, intense light is irradiated by an ultraviolet lamp to activate the regions into which the impurity ions have been injected. Laser light may be used instead of the intense light. Thus, the source region 47, the channel forming region 52, the drain region 49 and low concentration impurity regions 50 and 51 are formed in a manner of self-alignment.

Figure 23E:
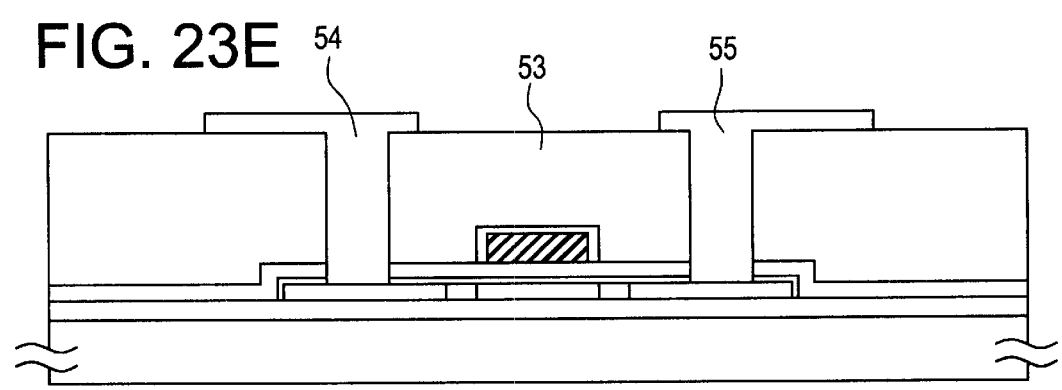

Here, the one designated by the reference numeral 51 in FIG. 23D is the region called the LDD (lightly doped drain). Next, a silicon oxide film or a silicon nitride film or their laminated film is formed as an interlayer insulating film 53. The silicon nitride film is used in the present embodiment. It is noted that the interlayer insulating film may be constructed by forming a layer made from a resin material on the silicon oxide film or the silicon nitride film. After that, contact holes are created to form a source electrode 54 and a drain electrode 55. Thus, the thin film transistor shown in FIG. 23E is completed.

[Thirteenth Embodiment]

A thirteenth embodiment relates to a case when an N-channel type thin film transistor and a P-channel type thin film transistor are formed in a complementary manner. The formation shown in the present embodiment may be utilized for various thin film integrated circuits integrated on an insulating surface as well as for peripheral driving circuits of an active matrix type liquid crystal display for example.

Figure 24A:
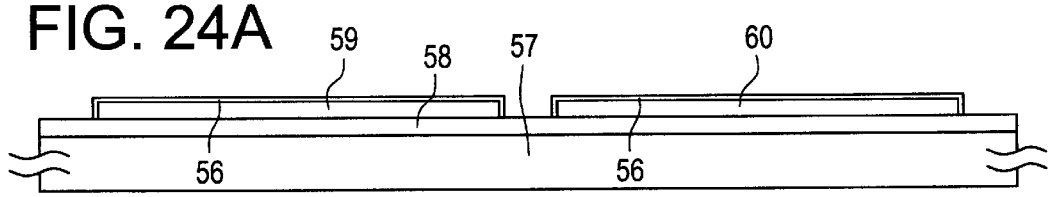
FIGS. 24A through 24F are diagrams showing fabrication steps according to a thirteenth embodiment.
Figure 24B:
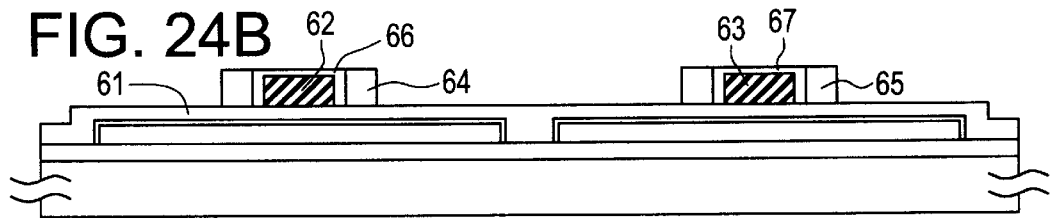

FIGS. 24A through 24F are diagrams showing a fabrication process according to the present embodiment. At first, a silicon oxide film or a silicon oxynitride film is formed as an underlying film 58 on a glass substrate 57 as shown in FIG. 24A. It is preferable to use the silicon oxynitride film and it is used in the present embodiment. Next, an amorphous silicon film not shown is formed by the plasma CVD or low pressure thermal CVD.

Then, after transforming the amorphous silicon film into a crystal silicon film by the same method as shown in the fourth embodiment, nickel element is gettered by forming a thermal oxide film. Next, after implementing a plasma treatment within an atmosphere in which oxygen and hydrogen are mixed, the obtained crystal silicon film is patterned to obtain active layers 59 and 60. Further, thermal oxide films 56 which composes gate insulating films are formed.

After thus obtaining the state shown in FIG. 24A, a silicon oxynitride film 61 is formed. It is noted that when quartz is used as the substrate, it is desirable to compose the gate insulating film only by the thermal oxide film formed by using the above-mentioned thermal oxidation. Next, an aluminum film not shown which composes a gate electrode is formed in a thickness of 4000 angstrom. Beside the aluminum film, a metal which can be anodized, such as tantalum, may be used. After forming the aluminum film, a very thin and dense anodic oxide film is formed on the surface thereof by the method described before.

Next, a resist mask not shown is placed on the aluminum film to pattern the aluminum film. Then, anodization is implemented by setting the obtained aluminum pattern as the anode to form porous anodic oxide films 64 and 65. The thickness of the porous anodic oxide films is 5000 angstrom. Then, another anodization is implemented under the condition of forming dense anodic oxide films 66 and 67. The thickness of the dense anodic oxide films 66 and 67 is 800 angstrom. Thus, the state shown in FIG. 243 is obtained.

Figure 24C:
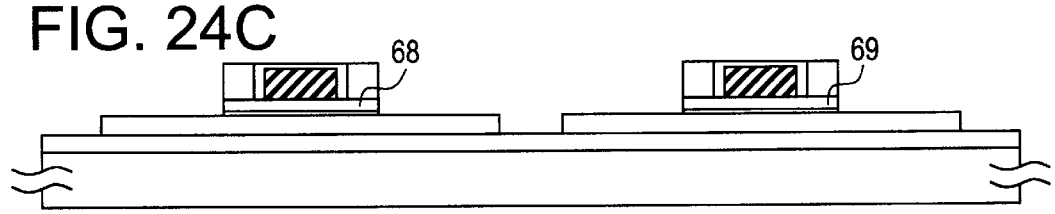
Figure 24D:
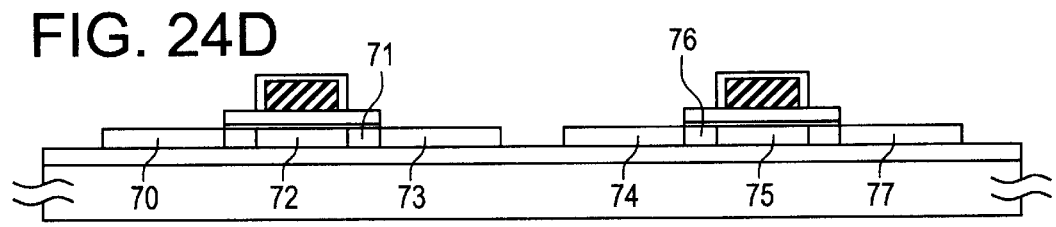

Then, the exposed silicon oxide film 61 and the thermal oxide film 56 are eliminated by dry etching, thus obtaining the state shown in FIG. 24C as a result. Next, the porous anodic oxide films 64 and 65 are eliminated by using mixed acid in which acetic acid, nitric acid and phosphoric acid are mixed. Thus, the state shown in FIG. 24D is obtained. Here, resist masks are disposed alternately to inject P (phosphorus) ions to the thin film transistor on the left side and B (boron) ions to the thin film transistor on the right side.

By injecting those impurity ions, a source region 70 and a drain region 73 to which P ions are doped in high concentration, thus having N-type, are formed in a manner of self-alignment. Further, a region 71 to which P ions are doped in low concentration, thus having weak N-type, as well as a channel forming region 72 are formed in the same time. The reason why the region 71 having the weak N-type is formed is because the remaining gate insulating film 68 exists. That is, part of P ions transmitting through the gate insulating film 68 is blocked by the gate insulating film 68.

By the same principle, a source region 77 and a drain region 74 having strong P-type are formed in a manner of self-alignment and a low concentration impurity domain 76 is formed in the same time. Further, a channel forming region 75 is formed in the same time. It is noted that when the thickness of the dense anodic oxide films 66 and 67 is as thick as 2000 angstrom, an offset gate region may be formed in contact with the channel forming region by that thickness.

Figure 24E:
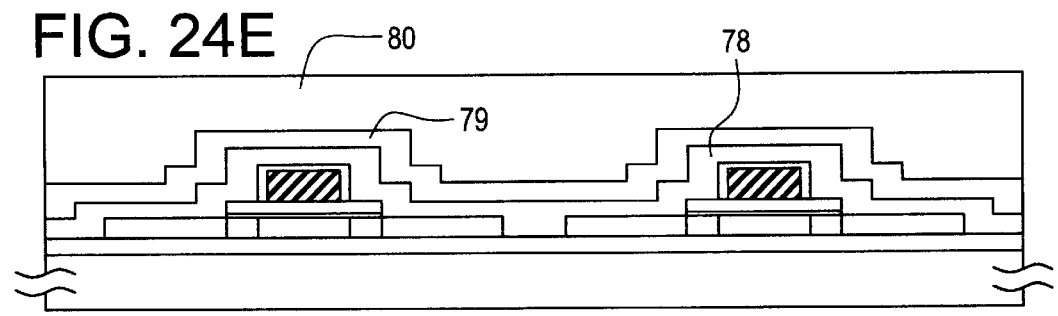
Figure 24F:
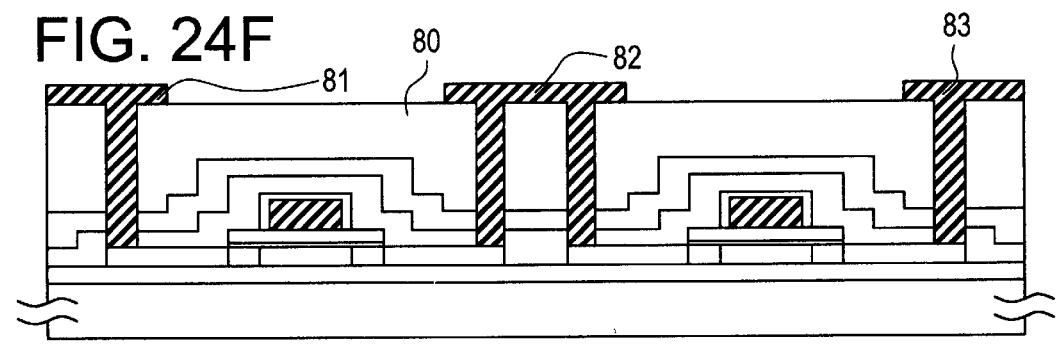

It may be ignored in the case of the present embodiment because the dense anodic oxide films 66 and 67 are so thin as less than 1000 angstrom. Then, laser light or intense light is irradiated to anneal the region into which the impurity ions have been injected. Then, a silicon nitride film 78 and a silicon oxide film 79 are formed as interlayer insulating films as shown in FIG. 24E. Their thickness is 1000 angstrom, respectively. It is noted that the silicon oxide film 79 needs not be formed in this case.

Here, the thin film transistor is covered by the silicon nitride film. The reliability of the thin film transistor may be enhanced by arranging as described above because the silicon nitride film is dense and has an excellent interfacial characteristic. Further, an interlayer insulating film 80 made from a resin material is formed by means of spin coating. Here, the thickness of the interlayer insulating film 80 is 1 μm. Then, contact holes are created to form a source electrode 81 and a drain electrode 82 of the N-channel type thin film transistor on the left side. In the same time, a source electrode 83 and the drain electrode 82 of the thin film transistor on the right side are formed. Here, the electrode 82 is disposed in common.

Thus, the thin film transistor circuit having a CMOS structure constructed in a complementary manner may be formed. In the formation shown in the present embodiment, the thin film transistor is covered by the nitride film as well as the resin material. This formation allows to enhance the durability of the thin film transistor, so that movable ions nor moisture hardly infiltrate. Further, it allows to prevent capacitance from being generated between the thin film transistor and a wire when a multi-layered wire is formed.

[Fourteenth Embodiment]

A fourteenth embodiment relates to a case related to the arrangement of forming a mono-crystal domain or a domain which can be substantially considered as a mono-crystal domain by irradiating laser light to the crystal silicon film obtained in the fourth or fifth embodiment.

At first, the crystal silicon film is obtained by utilizing the action of nickel element as shown in the fourth embodiment. Next, KrF excimer laser is irradiated to the film to promote crystallization thereof further. At this time, the mono-crystal domain or the domain which can be substantially considered as a mono-crystal domain is formed by using a heat treatment in the temperature range of more than 450° C. and by optimizing the condition for irradiating laser light.

The film whose crystallization has been greatly promoted by such method has a domain which can be considered as a mono-crystal in which an electron spin density measured by ESR is less than $3 \times 10^{17}$ cm$^{-3}$ and the concentration of nickel element as the minimum value measured by SIMS (secondary ion mass spectrometry) is less than $3 \times 10^{17}$ cm$^{-3}$. Substantially, no grain boundary exists in this domain and high electrical characteristics equivalent to a mono-crystal silicon wafer can be obtained.

Further, the domain which can be considered as a mono-crystal contains hydrogen by less than 5 atom % to $1 \times 10^{15}$ cm$^{-3}$. This value is clarified by the measurement carried out by the SIMS (secondary ion mass spectrometry). By fabricating a thin film transistor by utilizing the mono-crystal or the domain which can be substantially considered as a mono-crystal, one which is equivalent to a MOS type transistor fabricated by using a mono-crystal wafer may be obtained.

[Fifteenth Embodiment]

A fifteenth embodiment relates to a case when nickel element is introduced directly to the surface of the underlying film in the process shown in the fourth embodiment. In this case, the nickel element is held in contact on the lower surface of the amorphous silicon film. In the present embodiment, the nickel element is introduced after forming the underlying film such that the nickel element (metal element) is held in contact on the surface of the underlying film. It is noted that beside the method of using a solution, sputtering, CVD or adsorption may be used as the method for introducing nickel element.

[Sixteenth Embodiment]

A sixteenth embodiment relates to a case when a crystal silicon film is obtained on a glass substrate by utilizing nickel element. At first, the crystal silicon film having a high crystallinity is obtained by the action of nickel element. Next, a thermal oxide film containing a halogen element is formed on the crystal silicon film by thermal oxidation. At this time, the nickel element remaining in the crystal silicon film is gettered to the thermal oxide film by the action of oxygen and halogen element.

Then, the thermal oxide film containing the nickel element in high concentration as a result of the gettering is eliminated. Thereby, the crystal silicon film which has the high crystallinity and in which the concentration of nickel element is low is obtained on the glass substrate. FIGS. 25A through 25E are diagrams showing the fabrication process according to present embodiment.

At first, a silicon oxynitride film 85 is formed as an underlying film in a thickness of 3000 angstrom on the glass substrate 84 of Corning 1737 (distortion point: 667° C.). The silicon oxynitride film is formed by using plasma CVD using silane, N$_2$O gas and oxygen as original gases in the present embodiment. It is noted that this film may be formed by using plasma CVD using TEOS gas and N$_2$O gas.

The silicon oxynitride film has a function of suppressing the diffusion of impurities from the glass substrate in the later steps (seeing from the level of fabrication of a semiconductor, a glass substrate contains a large amount of impurities). It is noted that although the silicon nitride film is the most suitable to obtain the function for suppressing the diffusion of the impurities in maximum, the silicon nitride film is not practical because it is peeled off from the glass substrate due to the influence of stress. A silicon oxide film may be used as the underlying film instead of the silicon oxynitride film.

It is also important to increase the hardness of the underlying film 85 as much as possible. It is concluded from the fact that the harder the hardness of the underlying film (i.e. the smaller the etching rate thereof), the higher the reliability is in an endurance test of the thin film transistor obtained in the end. It is assumed to be caused by the effect of blocking the impurities from the glass substrate in the fabrication process of the thin film transistor.

It is also effective to contain a small amount of halogen element typified by chlorine in the underlying film 85. Thereby, the metal element which promotes crystallization of silicon and exists within the semiconductor layer may be gettered by the halogen element in the later step. It is also effective to add a hydrogen plasma treatment after forming the underlying film. It is also effective to implement a plasma treatment in an atmosphere in which oxygen and hydrogen are mixed. These treatments are effective in eliminating carbon component which is adsorbed on the surface of the underlying film and in enhancing the characteristic of interface with a semiconductor film formed later.

Next, an amorphous silicon film 86, which turns out to be a crystal silicon film later, is formed by the low pressure thermal CVD. The reason why the low pressure thermal CVD is used is because thereby, the quality of the crystal silicon film obtained later is better, i.e. the film quality is denser in concrete. Beside the low pressure thermal CVD, the plasma CVD or the like may be used.

The amorphous silicon film fabricated here is desirable to have $5 \times 10^{17}$ cm$^{-3}$ to $2 \times 10^{19}$ cm$^{-3}$ of concentration of oxygen within the film. It is because oxygen plays an important role in the later step of gettering the metal element which promotes crystallization of silicon. However, it must be careful here because the crystallization of the amorphous silicon film is hampered if the oxygen concentration Is higher than the above-mentioned range of concentration. The concentration of other impurities such as those of nitrogen and carbon is preferred to be low to the utmost. In concrete, the concentration must be below $2 \times 10^{19}$ cm$^{-3}$.

Figure 25A:
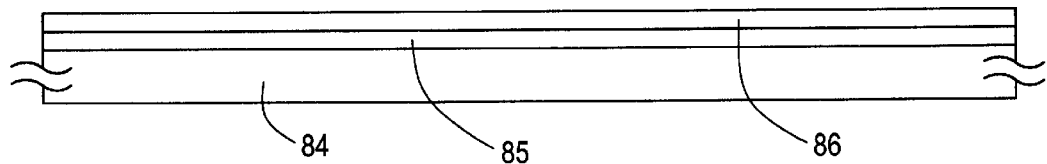
FIGS. 25A through 25E are diagrams showing fabrication steps according to a sixteenth embodiment.

The thickness of the amorphous silicon film 86 is 1600 angstrom. The thickness of the amorphous silicon film must be thicker than a thickness which is required in the end as described later. When the amorphous silicon film 86 is crystallized by means of only heating, the thickness of the starting film (amorphous silicon film) 86 is set at 800 angstrom to 5000 μm or preferably, 1500 to 3000 angstrom. It is uneconomical from the aspect of production cost if the thickness is thicker than the above-mentioned thickness range because it takes more time in forming the film. When the thickness is thinner than the above-mentioned thickness range on the other hand, the crystal may be grown non-uniformly or the reproducibility of the process may become bad. Thus, the state shown in FIG. 25A is obtained.

Next, nickel element is introduced to the amorphous silicon film 86 to crystallize it. Here, the nickel element is introduced by applying nickel acetate solution containing 10 ppm (weight conversion) of nickel on the surface of the amorphous silicon film 86.

Beside the method of using the above-mentioned solution, sputtering, CVD, plasma treatment or adsorption may be used as the method for introducing the nickel element. Among them, the method of using the solution is useful in that it is simple and that the concentration of the metal element may be readily adjusted.

Figure 25B:
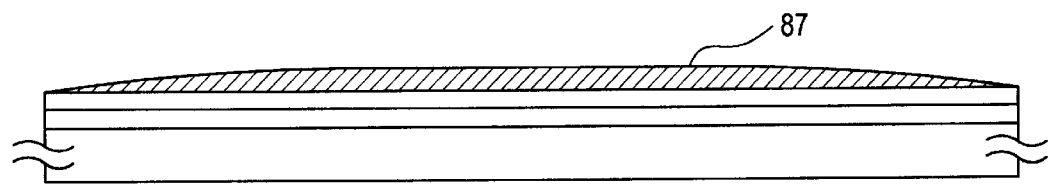

The nickel acetate solution is applied as described above to form a water film (liquid film) 87 as shown in FIG. 25B. In this state, extra solution is blown out by using a spin coater not shown. Thus, the nickel element is held in contact on the surface of the amorphous silicon film 86. It is noted that it is preferable to use nickel sulfate solution or example, instead of using the nickel acetate, if the remained impurities in the later heating process is taken into consideration. It is because the nickel acetate contains carbon and it might be carbonized in the later heating process, thus remaining within the film. An amount of the nickel element to be introduced may be controlled by adjusting the concentration of nickel salt within the solution.

Figure 25C:
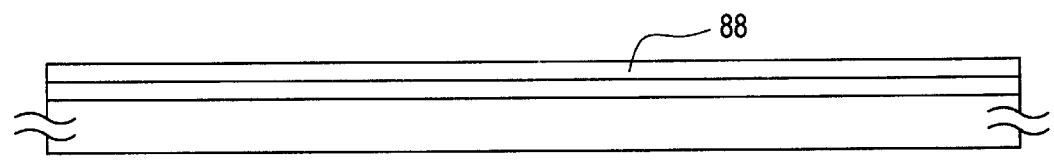

Next, a heat treatment is implemented in the temperature range from 450° C. to 650° C. in the state shown in FIG. 25C to crystallize the amorphous silicon film 86 and to obtain a crystal silicon film 88. It is implemented at 640° C. in the present embodiment. This heat treatment is implemented in a reducing atmosphere. Here, the heat treatment is implemented for four hours at 620° C. within a nitrogen atmosphere containing 3 volume % of hydrogen.

The reason why the reducing atmosphere is adopted in the crystallization step in a way of the heat treatment is to prevent oxides from being created in the step of the heat treatment and more concretely, to suppress nickel from reacting with oxygen and NiOx from being created on the surface of the film or within the film. Oxygen couples with nickel and contributes a lot in gettering nickel in the later gettering step. However, it has been found that if oxygen couples with nickel in the above-mentioned stage of the crystallization, it hampers the crystallization. Accordingly, it is important to suppress the oxides from being created to the utmost in the crystallization step in a way of heating.

The concentration of oxygen within the atmosphere for implementing the heat treatment for the crystallization has to be in an order of ppm, or preferably, less than 1 ppm. Inert gases such as argon, beside nitrogen, or their mixed gas may be used as the gas which occupies the most of the atmosphere for implementing the heat treatment for the crystallization. The lower limit of the heating temperature for the crystallization is preferred to be more than 450° C. from the aspects of its effectiveness and reproducibility. On the other hand, the upper limit thereof is preferred to be less than the distortion point of the used glass substrate. When the Corning 1737 glass substrate whose distortion point is 667° C. is used like the present embodiment, its upper limit is set at 650° C., leaving some margin.

In this regard, the heating temperature may be increased up to about 1100° C. in maximum (preferably up to about 1050° C.) if a material having a high heat resistance such as quartz substrate is used as the substrate. In this case, a crystal silicon film having a higher crystallinity may be obtained in a shorter time. Thus, the crystal silicon film 88 is obtained as shown in FIG. 25C.

Another heat treatment is implemented after obtaining the crystal silicon film 88 to form a thermal oxide film containing halogen element. This heat treatment is implemented within an atmosphere containing halogen element. This step is carried out to eliminate the nickel element which has been introduced intentionally for the crystallization in the initial stage from the crystal silicon film 88. This heat treatment is implemented at a temperature higher than that of the heat treatment implemented for the crystallization described above. It is an important condition for effectively implementing the gettering of nickel element. It is noted that although this heat treatment may be implemented in about the same temperature in the heat treatment implemented for the crystallization, it is more effective to be higher.

This heat treatment is implemented in the temperature range from 550° C. to 1050° C. or preferably from 600° C. to 980° C. upon meeting the above-mentioned condition. It is because no effect is obtained if the temperature is below 600° C. and a fixture formed by quartz distorts or a burden is placed upon equipments if it exceeds 1050° C. (in this sense, while it is preferable to be less than 980° C., it may be implemented in about 1100° C. if a high heat resistant fixture is used). Further, the upper limit of the heating temperature is limited by the distortion point of the glass substrate to be used. It must be careful not to implement the heat treatment in a temperature above the distortion point of the glass substrate to be used because, otherwise, it is deformed.

Because the Corning 1737 glass substrate whose distortion point is 667° C. is used in the present embodiment, the heating temperature is set at 650° C. The second heat treatment is implemented in an atmosphere in which 5 volume % of HCl is mixed into oxygen. It is preferable to mix HCl with a ratio of 0.5% to 10% (volume %) to oxygen. It must be careful not to mix above this concentration because, otherwise, the surface of the film becomes rough with the same or more degree of irregularity with the thickness of the film.

Figure 25D:
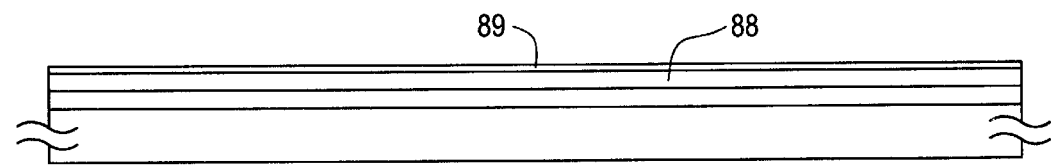

A thermal oxide film 89 containing chlorine as shown in FIG. 25D is formed by implementing the heat treatment under such condition. Here, the thermal oxide film 89 is formed in a thickness of 200 angstrom by implementing the heat treatment for 12 hours. Because the thermal oxide film 89 is formed, the thickness of the crystal silicon film 88 reaches to about 1500 angstrom.

When the heating temperature is 600° C. to 750° C. in the heat treatment, the treatment time (heating time) is set at 10 hours to 48 hours or typically at 24 hours. It is noted that if the heating temperature is 750° C. to 900° C., the treatment time is set at 5 hours to 24 hours or typically at 12 hours. Further, when the heating temperature is 900° C. to 1050° C., the treatment time is set at 1 hour to 12 hours or typically at 6 hours. These treatment times are set adequately depending on the thickness of the oxide film to be obtained as a matter of course.

In this step, nickel element is gettered out of the silicon film by the action of oxygen and the halogen element. Here, the nickel element is gettered to the thermal oxide film 89 to be formed by the action of chlorine. In the gettering, oxygen existing within the crystal silicon film plays an important role. That is, the gettering of nickel element proceeds effectively because the gettering effect caused by chlorine acts on nickel oxide formed when oxygen couples with nickel.

If the concentration of oxygen is too much, it becomes the factor of hampering the crystallization of the amorphous silicon film 86 in the crystallization step shown in FIG. 25C as described above. However, the existence thereof plays an important role in the process of gettering nickel as described above. Accordingly, it is important to control the concentration of oxygen existing within the amorphous silicon film, the starting film. Here, Cl has been selected as the halogen element and the case of using HCl has been shown as a method for introducing it. Beside HCl, one type or a plurality of types of mixed gas selected from HF, HBr, $Cl_2$, $F_2$, $Br_2$ may be used. Beside them, halogen hydride may be used in general.

It is preferable to set the content (volume content) of those gases within the atmosphere to 0.25 to 5% if it is HF, 1 to 15% if it is HBr, 0.25 to 5% if it is $Cl_2$, 0.125 to 2.5% if it is $F_2$ and 0.5 to 10% if it is $Br_2$. If the concentration is below the above-mentioned range, no significant effect is obtained. Further, if the concentration exceeds the upper limit of the above-mentioned range, the surface of the crystal silicon film is roughened.

Through this step, the concentration of nickel element may be reduced to 1/10 from the initial stage. It means that the nickel element may be reduced to 1/10 by the halogen element as compared to the case when no gettering is conducted by the halogen element. This effect may be obtained in the same manner even when another metal element which promotes crystallization of silicon is used. Because the nickel element is gettered to the oxide film to be formed in the above-mentioned step, naturally the nickel concentration within the oxide film becomes high as compared to other regions.

Further, it has been observed that the concentration of nickel element is apt to be high near the interface between the crystal silicon film 88 and the oxide film 89. It is considered to happen because the region where the gettering mainly takes place is on the side of the oxide film near the interface between the silicon film and the oxide film. The gettering proceeding near the interface is considered to be caused by the existence of stress and defects near the interface.

Next, the thermal oxide film 89 containing nickel in high concentration is eliminated. While the thermal oxide film 89 may be eliminated by means of dry etching or wet etching using buffer hydrofluoric acid or other hydrofluorite (hydrofluoric) etchant, the buffer hydrofluoric acid is used in the present embodiment.

Figure 25E:
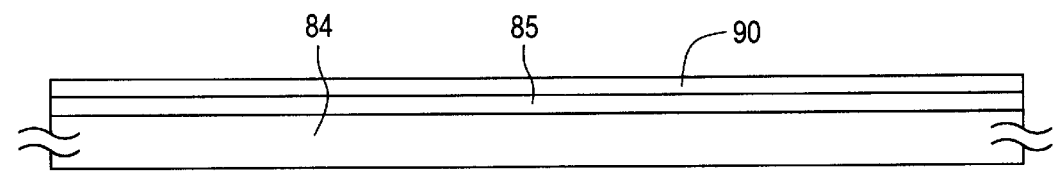

Thus, a crystal silicon film 90 in which the concentration of nickel has been reduced is obtained as shown in FIG. 25E. Because nickel element is contained near the surface of the obtained crystal silicon film 90 relatively in high concentration, it is effective to advance the above-mentioned etching to over-etch, more or less, the surface of the crystal silicon film 90.

[Seventeenth Embodiment]

A seventeenth embodiment relates to a case when laser light is irradiated by KrF excimer laser (wavelength: 248 nm) further after obtaining the crystal silicon film by the heat treatment shown in FIG. 25C in the arrangement shown in the sixteenth embodiment to promote the crystallization thereof. That is, in the present embodiment, the crystal silicon film 90 in which the nickel concentration has been reduced is obtained as shown in FIG. 25E by irradiating laser light after the heat treatment in FIG. 25C to implement annealing and implementing other steps in the same manner as shown in the sixteenth embodiment.

When the temperature of the heat treatment shown in FIGS. 25B and 25C is low or when the treatment time is short, i.e. when the heating temperature or the heating time is restricted by the reason of the fabrication process, there is a possibility that the required crystallinity cannot be obtained. In such a case, the required high crystallinity may be obtained by implementing annealing by irradiating laser light. The irradiation of laser light in this case allows the width of permissible laser irradiation condition to be widened and the reproducibility thereof to be increased as compared to the case of crystallizing the amorphous silicon film directly by a laser irradiation.

The irradiation of laser light is implemented after the step shown in FIG. 25C. It is also important to form the amorphous silicon film 86 which is formed in FIG. 25A as the starting film in a thickness of 200 to 2000 angstrom. It is because the annealing effect exerted by the irradiation of laser light becomes high when the thickness of the amorphous silicon film is thin. It is preferable to use excimer laser in the ultraviolet region as the laser light to be used. In concrete, KrF excimer laser (wavelength: 248 nm), XeCl excimer laser (wavelength: 308 nm) and the like may be used. Beside laser light, the annealing may be implemented by irradiating intense light by using an ultraviolet lamp for example.

[Eighteenth Embodiment]

An eighteenth embodiment relates to a case when an infrared lamp is used instead of the laser light in the seventeenth embodiment. That is, in the present embodiment, the crystal silicon film 90 in which the nickel concentration has been reduced is obtained as shown in FIG. 25E by irradiating infrared ray after the heat treatment in FIG. 25C to implement annealing and by implementing other steps in the same manner as shown in the sixteenth embodiment. The use of infrared ray allows the silicon film to be heated selectively without heating the glass substrate so much. Accordingly, an effective heat treatment may be implemented without giving thermal damage to the glass substrate.

[Nineteenth Embodiment]

A nineteenth embodiment relates to a case when Cu is used as the metal element which promotes crystallization of silicon in the arrangement shown in the sixteenth embodiment. In this case, while solutions such as cupric acetate $[Cu(CH_3 COO)_2]$ and cupric chloride $(CuCl_2\ 2H_2O)$ may be used as the solution for introducing Cu, the former is used in the present embodiment. The crystal silicon film 90 in which the nickel concentration has been reduced is obtained as shown in FIG. 25E by implementing other steps in the same manner as shown in the sixteenth embodiment.

[20-th Embodiment]

A 20-th embodiment relates to a case when a quartz substrate is used as the substrate 84 in the arrangement shown in the sixteenth embodiment. In the present embodiment, the amorphous silicon film 86, i.e. the starting film, is formed in a thickness of 2000 angstrom. Further, the heating temperature in forming the thermal oxide film in the heat treatment shown in FIG. 25C is set at 950° C. In this case, the oxide film is formed quickly and the gettering effect cannot be fully obtained, so that the concentration of oxygen within the atmosphere is lowered. In concrete, the oxygen concentration within the nitrogen atmosphere is set at 10 volume %. Further, the heat treatment is implemented in the atmosphere in which the concentration of HCl (volume concentration) to oxygen is set at 3%

In this case, the treatment time is set at 300 minutes. Under such conditions, the thermal oxide film having about 500 angstrom of thickness may be obtained. In the same time, the time necessary for gettering may be earned. It is noted that if the heat treatment is implemented at 950° C. within the atmosphere of 97% of oxygen and 3 volume % of HCl, the thermal oxide film having a thickness of 500 angstrom is obtained in about 30 minutes. In this case, nickel cannot be fully gettered, so that nickel element remains relatively in high concentration within the crystal silicon film 90. Accordingly, it is preferable to form the thermal oxide film by adjusting the oxygen concentration as described in the present embodiment to earn an enough time for the gettering effect. The utilization of this method allows the time necessary for the gettering to be set by adjusting the oxygen concentration in the atmosphere when the thickness and forming temperature of the thermal oxide film are changed.

[21-st Embodiment]

A 21-st embodiment relates to a case of growing crystal in the form different from that in the sixteenth embodiment. That is, the present embodiment relates to a method of growing the crystal in a direction parallel to the substrate, i.e. a method called lateral growth, by utilizing the metal element which promotes crystallization of silicon. FIGS. 26A through 26E show the fabrication process according to the 21-st embodiment.

At first, a silicon oxynitride film is formed as an underlying film 92 in a thickness of 3000 angstrom on the Corning 1737 glass substrate 91. Next, an amorphous silicon film 93 which is the starting film of a crystal silicon film is formed in a thickness of 2000 angstrom by low pressure thermal CVD. The thickness of the amorphous silicon film is preferable to be less than 2000 angstrom as described before. It is noted that plasma CVD may be used instead of the low pressure thermal CVD.

Next, a silicon oxide film not shown is formed in a thickness of 1500 angstrom and is patterned to form a mask 94. An opening is created on the mask in a region 95. The amorphous silicon film 93 is exposed at the region where the opening 95 is created. The opening 95 has a thin and long rectangular shape in the longitudinal direction from the depth to the front side of the figure. Preferably, the width of the opening 95 is 20 $\mu$m or more. The length thereof in the longitudinal direction may be determined arbitrarily.

Then, the nickel acetate aqueous solution containing 10 ppm of nickel element in terms of weight is applied in the same manner with the sixteenth embodiment and the extra solution is removed by implementing spin drying by using a spinner not shown. Thus, the solution is held in contact on the exposed surface of the amorphous silicon film 93 as indicated by a dot line 96 in FIG. 26A.

Next, a heat treatment is implemented at 640° C. for four hours in a nitrogen atmosphere containing 3 volume % of hydrogen and in which oxygen is minimized. Then, crystal grows in the direction parallel to the substrate as indicated by the reference numeral 97 in FIG. 26B. This crystal growth advances from the region of the opening 95 to which nickel element has been introduced to the surrounding part. This crystal growth in the direction parallel to the substrate will be referred to as lateral growth throughout the present specification.

Figure 26A:
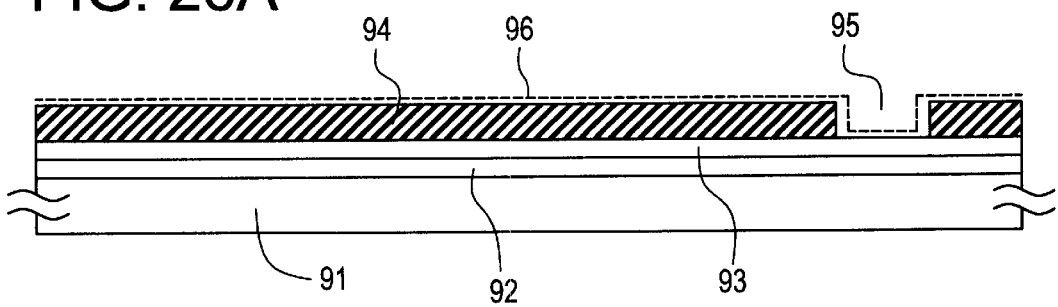
FIGS. 26A through 26E are diagrams show-ng fabrication steps according to a 21-st embodiment.
Figure 26B:
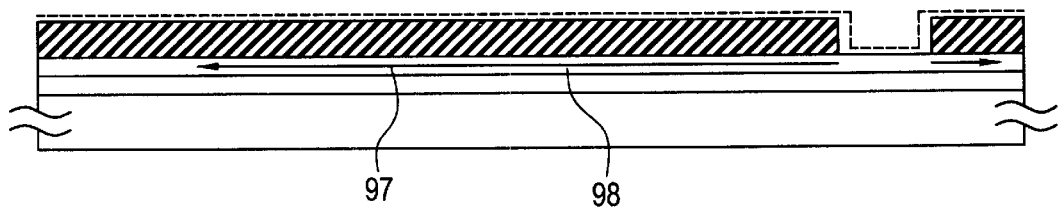
Figure 26C:
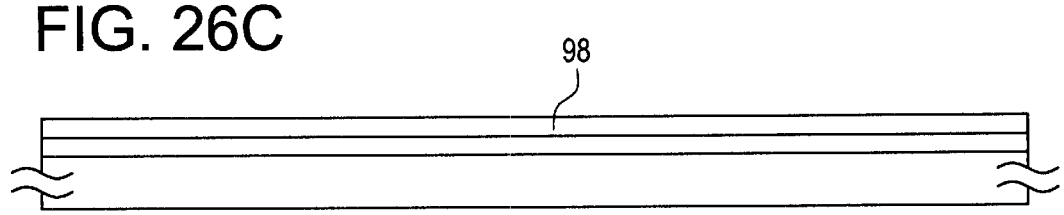
Figure 26D:
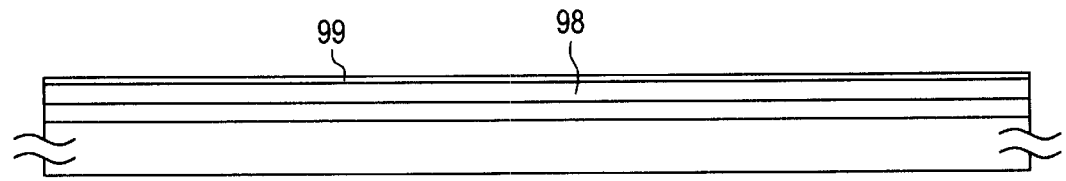
Figure 26E:
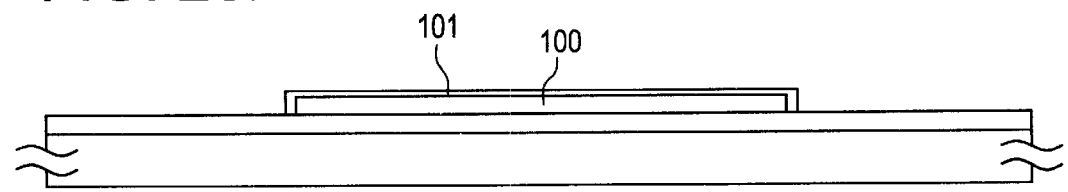

It is possible to advance this lateral growth across more than 100 $\mu$m. under the conditions shown in the present embodiment. Then, a crystal silicon film 98 having the region in which the crystal has thus grown laterally is obtained. It is noted that crystal growth in the vertical direction called vertical growth advances from the surface of the silicon film to the underlying interface in the region where the opening 95 is formed. Then, the mask 94 made from the silicon oxide film for selectively introducing nickel element is eliminated. Thus, the state shown in FIG. 26C is obtained. In this state, the vertically grown region, the laterally grown region and a region in which no crystal has grown (having amorphous state) exist within the silicon film 98.

In this state, a heat treatment is implemented at 650° C. for four hours within an oxygen atmosphere. In this step, an oxide film 99 containing nickel element in high concentration is formed. In the same time, the concentration of nickel element within the silicon film 98 may be reduced relatively. Here, the thermal oxide film 99 is formed in a thickness of 200 angstrom. The thermal oxide film contains the nickel element gettered by the action of chlorine in high concentration. Further, because the thermal oxide film 99 is formed, the thickness of the crystal silicon film 98 is reduced to about 1900 angstrom.

Next, the thermal oxide film 99 containing nickel element in high concentration is eliminated. In the crystal silicone film of this state, the nickel element has a distribution of concentration such that it exists in high concentration toward the surface of the crystal silicon film. Accordingly, it is useful to etch the surface of the crystal silicon film to eliminate the region in which the nickel element exists in high concentration after eliminating the thermal oxide film 99. That is, the crystal silicon film in which the nickel element concentration is reduced further may be obtained by etching the surface of the crystal silicon film in which the nickel element exists in high concentration.

Next, patterning is implemented to form a pattern 100 formed of the laterally grown region. Here, it is important to form the pattern 100 such that no vertically grown region, amorphous region nor an edge portion of the laterally grown region is included there, because the concentration of nickel element is relatively high in the vertically grown region and the edge portion of the laterally grown region and the amorphous region in which no crystal has grown has inferior electrical characteristics.

The concentration of nickel element which remains within the pattern 100 made from the laterally grown region thus obtained may be reduced further as compared to the case shown in the sixteenth embodiment. This is caused by the fact that the concentration of the metal element contained within the laterally grown region is low originally. In concrete, the concentration of nickel element within the pattern 100 made from the laterally grown region may be readily reduced to the order of $10^{17}$ cm$^{-3}$ or less.

When a thin film transistor is formed by utilizing the laterally grown region, a semiconductor device having a higher mobility may be obtained as compared to the case when the vertically grown region as shown in the sixteenth embodiment (crystal grows vertically on the whole surface in the case of the sixteenth embodiment) is utilized. It is noted that it is useful to implement the etching process further after forming the pattern shown in FIG. 26E to eliminate the nickel element existing on the surface of the pattern.

On the other hand, it is not effective to implement thermal oxidation within the oxidizing atmosphere containing halogen element after patterning the crystal silicon film in a shape of island and to eliminate the thermal oxide film. It is because in this arrangement, the etching advances so as to scoop out even the under side of the crystal silicon film formed in an island shape because the etching of the underlying film advances when the thermal oxide film is eliminated, though the gettering effect is certainly obtained by the thermal oxide film.

Such a condition may cause breaking of wires and defective operation of elements later. Next, a thermal oxide film 101 is formed after thus forming the pattern 100. This thermal oxide film 101 is what becomes a part of a gate insulating film later in constructing a thin film transistor.

[22-nd Embodiment]

A 22-nd embodiment relates to a case of fabricating a thin film transistor disposed in a pixel region of an active matrix type liquid crystal display or an active matrix type EL display by utilizing the inventive crystal silicon film. FIGS. 27A through 27E show the fabrication process according to the 22-nd embodiment.

Figure 27A:
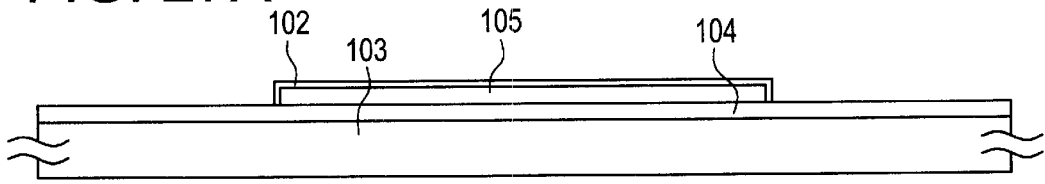
FIGS. 27A through 27E are diagrams showing fabrication steps according to a 22-nd embodiment.

At first, the crystal silicon film is formed on the glass substrate through the process shown in the sixteenth or the 21-st embodiment. Also a thin film transistor is fabricated in the same manner. While the case of using the crystal silicon film obtained by the arrangement shown in the sixteenth embodiment will be described below, the same applies to the case of using the crystal silicon film obtained by the arrangement shown in the 21-st embodiment. The state shown in FIG. 27A is obtained by patterning the crystal silicon film. In FIG. 27A, the reference numeral (103) denotes a glass substrate, (104) an underlying film, and (105) an active layer formed of the crystal silicon film.

After obtaining the state shown in FIG. 27A, a plasma treatment is implemented within a reduced pressure atmosphere in which oxygen and hydrogen are mixed. The plasma is generated by high-frequency discharge. Organic substances existing on the surface of the exposed active layer 105 may be removed by the above-mentioned plasma treatment. Specifically, the organic substances adsorbing on the surface of the active layer are oxidized by oxygen plasma and the oxidized organic substances are reduced and vaporized by hydrogen plasma. Thus the organic substances existing on the surface of the exposed active layer 105 are removed. The removal of the organic substances is very effective in suppressing fixed charge from existing on the surface of the active layer 105.

That is, because the fixed charge caused by the existence of organic substances hampers the operation of the device and renders the characteristics thereof instable, it is very useful to remove it. After removing the organic substances, thermal oxidation is implemented within an oxygen atmosphere at 640° C. to form a thermal oxide film 102 of 100 angstrom thick. This thermal oxide film has a high interfacial characteristic with a semiconductor layer and composes a part of a gate insulating film later. Thus, the state shown in FIG. 27A is obtained.

After that, a silicon oxynitride film 106 which composes the gate insulating film is formed in a thickness of 1000 angstrom. While the film may be formed by using plasma CVD using mixed gas of silane and $N_2O$ or plasma CVD using mixed gas of TEOS and $N_2O$, the latter is used in the present embodiment. The silicon oxynitride film 106 functions as the gate insulating film together with the thermal oxide film 102.

It is also effective to contain halogen element within the silicon oxynitride film. That is, it is possible to prevent the function of the gate insulating film as an insulating film from dropping by the influence of the nickel element (or another metal element which promotes crystallization of silicon) existing within the active layer by fixing the nickel element by the action of the halogen element.

It is significant to use the silicon oxynitride film in that metal element hardly infiltrates to the gate insulating film from its dense film quality. If metal element infiltrates into the gate insulating film, its function as an insulating film drops, thus causing Instability and dispersion of characteristics of the thin film transistor. It is noted that a silicon oxide film which is normally used may be also used for the gate insulating film.

After forming the silicon oxynitride film 106 which functions as the gate insulating film, an aluminum film (not shown) which functions as a gate electrode later is formed by sputtering. 0.2 weight % of scandium is included within the aluminum film to suppress hillock and whisker from being produced in the later process. The hillock and whisker mean that abnormal growth of aluminum occurs by heating, thus forming needle or prickle-like projections.

After forming the aluminum film, a dense anodic oxide film not shown is formed. The anodic oxide film is formed by using ethylene glycol solution containing 3 weight % of tartaric acid as electrolyte. That is, the anodic oxide film having the dense film quality is formed on the surface of the aluminum film by setting the aluminum film as the anode and platinum as the cathode and by anodizing within this electrolyte. The thickness of the anodic oxide film not shown having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization.

Figure 27B:
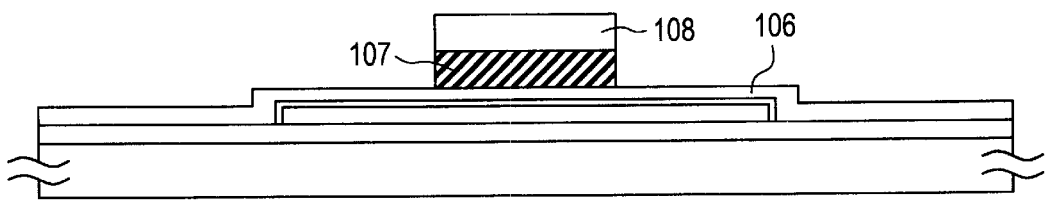
Figure 27C:
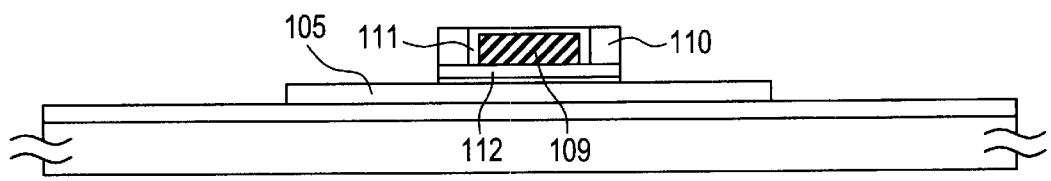

Next, the resist mask 108 is formed and the aluminum film is patterned so as to have a pattern 107. The state shown in FIG. 27B is thus obtained. Here, another anodization is implemented. In this case, 3 weight % of oxalate aqueous solution is used as electrolyte. A porous anodic oxide film 110 is formed by anodizing within this electrolyte by setting the aluminum pattern 107 as the anode.

In this step, the anodic oxide film 110 is formed selectively-on the sides of the aluminum pattern because the resist mask 108 having the high adhesiveness exists thereabove. The anodic oxide film may be grown up to several $\mu$m thick. The thickness is 6000 angstrom in the present embodiment. It is noted that the range of growth may be controlled by adjusting an anodizing time. Next, the resist mask 108 is removed.

Then, a dense anodic oxide film is formed again. That is, the anodization is implemented again by using the ethylene glycol solution containing 3 weight % of tartaric acid as electrolyte. Then, an anodic oxide film 111 having a dense film quality is formed because the electrolyte infiltrates into the porous anodic oxide film 110. This dense anodic oxide film 111 is 1000 angstrom thick. The thickness is controlled by adjusting applied voltage.

Figure 27D:
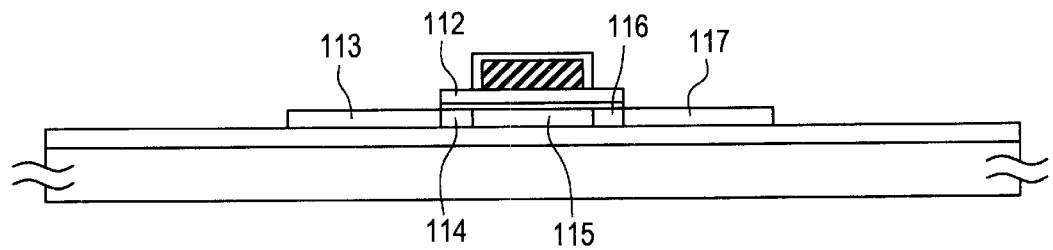

Here, the exposed silicon oxynitride film 106 and the thermal oxide film 102 are etched by utilizing dry etching. Then, the porous anodic oxide film 110 is eliminated by using mixed acid in which acetic acid, nitric acid and phosphoric acid are mixed. Thus, the state shown in FIG. 27D is obtained. After obtaining the state shown in FIG. 27D, impurity ions are injected. Here, P (phosphorus) ions are injected by plasma doping in order to fabricate an N-channel type thin film transistor.

In this step, heavily doped regions 113 and 117 and lightly doped regions 114 and 116 are formed because part of the remaining silicon oxide film 112 functions as a semipermeable mask, thus blocking part of the injected ions. Next, laser light or intense light is irradiated to activate the regions into which the impurity ions have been injected. Laser light is used in the present embodiment. Thus, a source region 113, a channel forming region 115, a drain region 117 and low concentration impurity regions 114 and 116 are formed in a manner of self-alignment.

The one designated by the reference numeral 116 here is the region called the LDD (lightly doped drain). It is noted that when the dense anodic oxide film 111 is formed as thick as 2000 angstrom or more, an offset gate region may be formed on the outside of the channel forming region 115 by its thickness. Although the offset gate region is formed also in the present embodiment, it is not shown in the figures because its size is small, its contribution due to the existence thereof is small and the figures might otherwise become complicated.

Figure 27E:
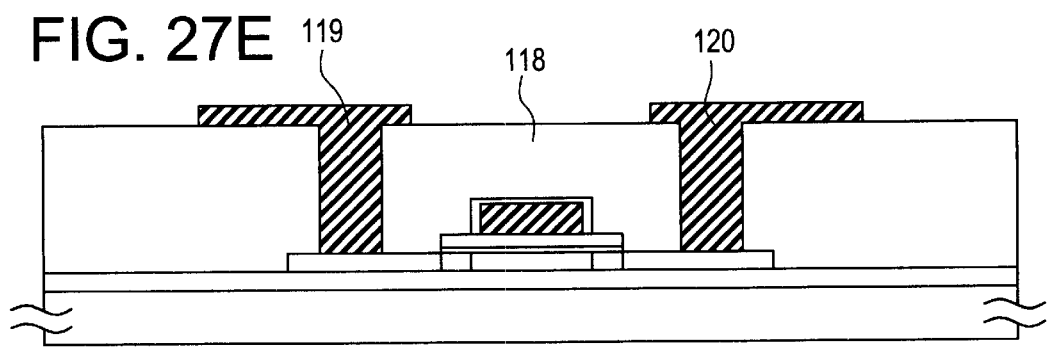

Next, a silicon oxide film or a silicon nitride film or their laminated film is formed as an interlayer insulating film 118. The silicon nitride film is used in the present embodiment. The interlayer insulating film may be constructed by forming a layer made from a resin material on the silicon oxide film or the silicon nitride film. Next, contact holes are created to form a source electrode 119 and a drain electrode 120. Thus, the thin film transistor shown in FIG. 27E is completed.

[23-rd Embodiment]

A 23-rd embodiment is related to a method for forming the gate insulating film 106 in the arrangement shown in the 22-nd embodiment. Thermal oxidation may be used as a method for forming the gate insulating film when a quartz substrate or a glass substrate having a high heat resistance is used as the substrate. The thermal oxidation allows the film quality to be densified and is useful in obtaining a thin film transistor having stable characteristics. That is, because an oxide film formed by the thermal oxidation is dense as an insulating film and movable electric charge existing therein can be reduced, it is one of the most suitable films as a gate insulating film.

In the present embodiment, a heat treatment is implemented in an oxidizing atmosphere at 950° C. in forming the thermal oxide film. At this time, it is effective to mix HCl or the like into the oxidizing atmosphere because, thereby, metal element existing in the active layer may be fixed in the same time with the formation of the thermal oxide film. It is also effective to mix $N_2O$ gas into the oxidizing atmosphere to form a thermal oxide film containing nitrogen component. Here, it is also possible to obtain a silicon oxynitride film by the thermal oxidation if the mixed ratio of $N_2O$ gas is optimized. It is noted that the thermal oxide film 102 needs not be formed in the present embodiment.

[24-th Embodiment]

A 24-th embodiment relates to a case of fabricating a thin film transistor through a process different from that shown in the 22-nd and 23-rd embodiments (FIG. 27). FIGS. 28A through 28E show the fabrication process according to the present embodiment. At first, the crystal silicon film is formed on the glass substrate through the process shown in the sixteenth or seventeenth embodiment. It is then patterned, thus obtaining the state shown in FIG. 28A.

Figure 28A:
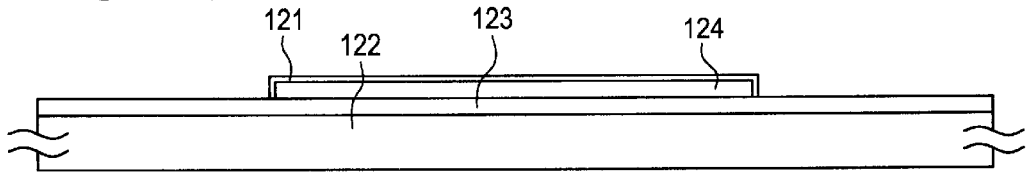
FIGS. 28A through 28E are diagrams showing fabrication steps according to a 24-th embodiment.
Figure 28B:
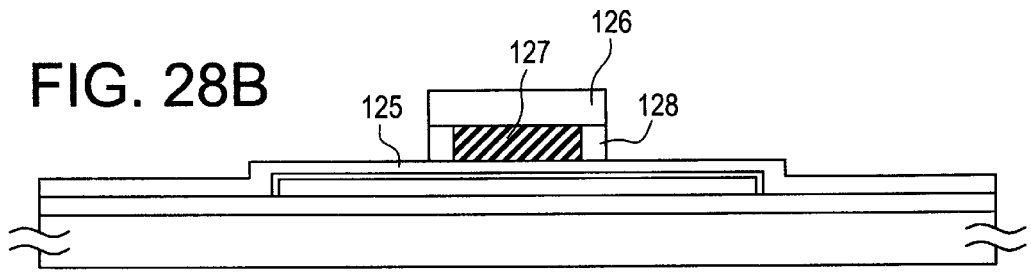
Figure 28C:
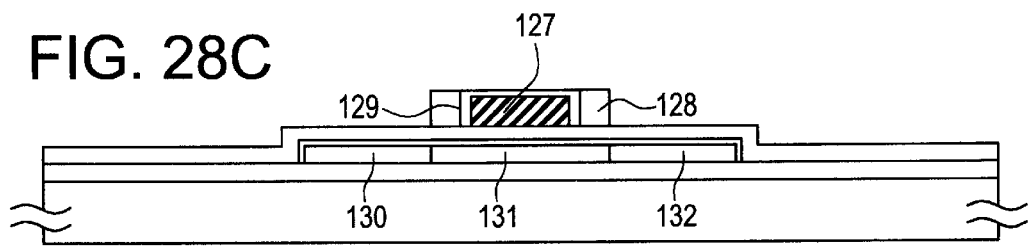

After obtaining the state shown in FIG. 28A, a plasma treatment is implemented within a reduced pressure atmosphere in which oxygen and hydrogen are mixed. In the state shown in FIG. 28A, the reference numeral (122) denotes a glass substrate, (123) an underlying film, (124) an active layer formed of the crystal silicon film and (121) a thermal oxide film formed again after eliminating the thermal oxide film for gettering.

After obtaining the state shown in FIG. 28A, a silicon oxynitride film 125 which composes a gate insulating film is formed in a thickness of 1000 angstrom. While the film may be formed by using plasma CVD using mixed gas of oxygen, silane and $N_2O$ or plasma CVD using mixed gas of TEOS and $N_2O$, the former is used in the present embodiment. The silicon oxynitride film 125 composes the gate insulating film together with the thermal oxide film 121. It is noted that a silicon oxide film may be used beside the silicon oxynitride film.

After forming the silicon oxynitride film 125 which functions as the gate insulating film, an aluminum film not shown which functions as a gate electrode later is formed by sputtering. 0.2 weight % of scandium is included within the aluminum film. After forming the aluminum film, a dense anodic oxide film not shown is formed. The anodic oxide film is formed by using ethylene glycol solution containing 3 weight % of tartaric acid as electrolyte. That is, the anodic oxide film having the dense film quality is formed on the surface of the aluminum film by setting the aluminum film as the anode and platinum as the cathode and by anodizing within this electrolyte.

The thickness of the anodic oxide film not shown having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization. Next, the resist mask 126 is formed and the aluminum film is patterned so as to have a pattern 127.

Here, another anodization is implemented. In this case, 3 weight % of oxalate aqueous solution is used as electrolyte. A porous anodic oxide film 128 is formed by anodizing within this electrolyte by setting the aluminum pattern 127 as the anode. In this step, the anodic oxide film 128 is formed selectively on the sides of the aluminum pattern because the resist mask 126 having the high adhesiveness exists thereabove.

The anodic oxide film may be grown up to several $\mu$m thick. The thickness is 6000 angstrom in the present embodiment. It is noted that the range of growth may be controlled by adjusting an anodizing time. Next, after removing the resist mask 126, a dense anodic oxide film is formed again. That is, the anodization is implemented again by using the ethylene glycol solution containing 3 weight % of tartaric acid as electrolyte. Then, an anodic oxide film 129 having a dense film quality is formed because the electrolyte infiltrates into the porous anodic oxide film 128.

Here, the initial injection of impurity ions is implemented. It is noted that this step may be implemented after removing the resist mask 126. A source region 130 and a drain region 132 are formed by injecting the impurity ions. No impurity ion is injected to a region 131. Then, the porous anodic oxide film 128 is eliminated by using mixed acid in which acetic acid, nitric acid and phosphoric acid are mixed. Thus, the state shown in FIG. 28D is obtained.

Figure 28D:
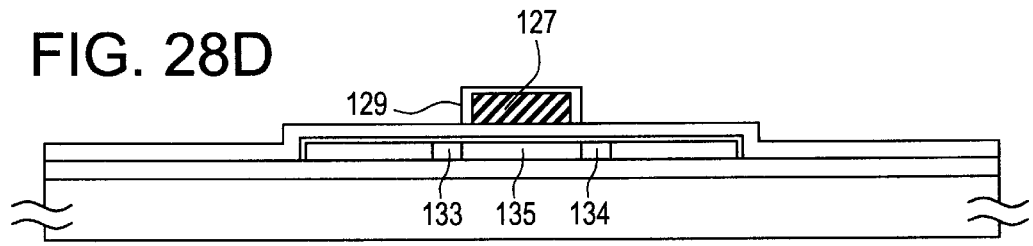

After obtaining the state shown in FIG. 28D, impurity ions are injected again. The impurity ions are injected under the doping condition lighter than that of the first injection. In this step, lightly doped region 133 and 134 are formed and a region 135 turns out to be a channel forming region. Then, intense light is irradiated by using an infrared lamp to activate the regions into which the impurity ions have been injected. It is noted that laser light may be used instead of the intense light. Thus, the source region 130, the channel forming region 135, the drain region 132 and low concentration impurity regions 133 and 134 are formed in a manner of self-alignment.

Figure 28E:
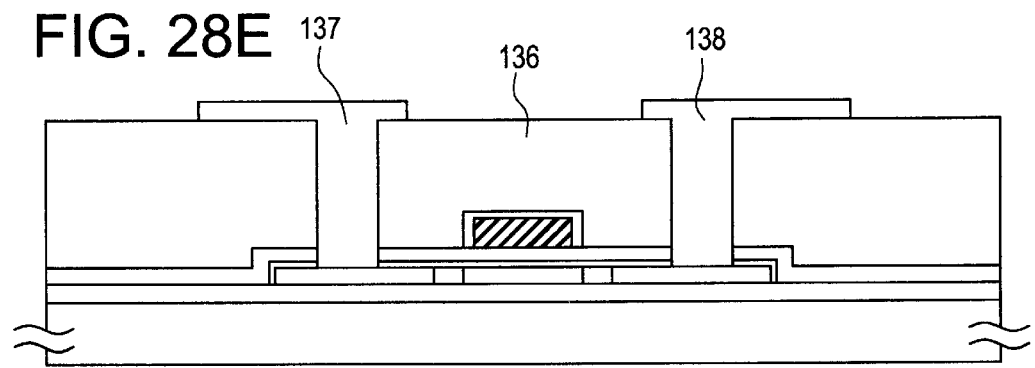

Here, the one designated by the reference numeral 134 is the region called the LDD (lightly doped drain). Next, a silicon oxide film or a silicon nitride film or their laminated film is formed as an interlayer insulating film 136. The silicon nitride film is used in the present embodiment. The interlayer insulating film may be constructed by forming a layer made from a resin material on the silicon oxide film or the silicon nitride film. After that, contact holes are created to form a source electrode 137 and a drain electrode 138. Thus, the thin film transistor shown in FIG. 28E is completed.

[25-th Embodiment]

A 25-th embodiment relates to a case when an N-channel type thin film transistor and a P-channel type thin film transistor are formed in a complementary manner. FIGS. 29A through 29F are diagrams showing a fabrication process according to the present embodiment. The formation shown in the present embodiment may be utilized for various thin film integrated circuits integrated on an insulating surface as well as for peripheral driving circuits of an active matrix type liquid crystal display for example.

Figure 29A:
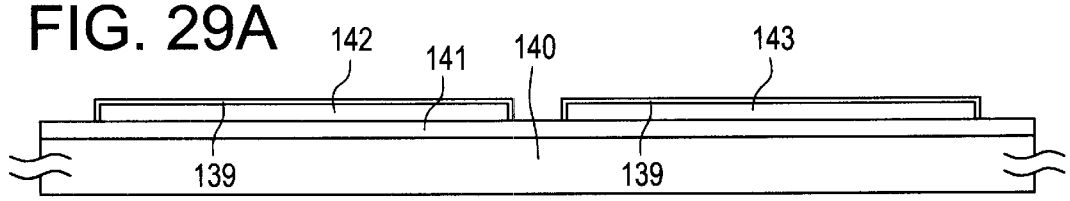
FIGS. 29A through 29F are diagrams showing fabrication steps according to a 25-th embodiment.

At first, a silicon oxide film or a silicon oxynitride film is formed as an underlying film 141 on a glass substrate 140 as shown in FIG. 29A. It is preferable to use the silicon oxynitride film and it is used in the present embodiment. Next, an amorphous silicon film not shown is formed by the plasma CVD or low pressure thermal CVD. The low pressure thermal CVD is adopted in the present embodiment. Then, the amorphous silicon film is transformed into a crystal silicon film by the same method as shown in the sixteenth embodiment.

Next, a plasma treatment is implemented within an atmosphere in which oxygen and hydrogen are mixed. Then, the obtained crystal silicon film is patterned to obtain active layers 142 and 143. Thus, the state shown in FIG. 29A is obtained. It is noted that a heat treatment is implemented at 650° C. for 10 hours within a nitrogen atmosphere containing 3 volume % of HCl in the state shown in FIG. 29A in order to suppress the influence of carriers moving the sides of the active layers.

Because an OFF current characteristic becomes bad if a trap level exists due to the existence of metal element on the sides of the active layers, it is effective to implement the above-mentioned treatment to lower the level on the sides of the active layers. Further, a thermal oxide film 139 and a silicon oxynitride film 144 which compose a gate insulating film are formed. When quartz is used as the substrate here, it is desirable to compose the gate insulating film only by the thermal oxide film formed by using the above-mentioned thermal oxidation.

Next, an aluminum film not shown which composes a gate electrode later is formed in a thickness of 4000 angstrom. Beside the aluminum film, a metal which can be anodized, such as tantalum, may be used. After forming the aluminum film, a very thin and dense anodic oxide film is formed on the surface thereof by the method described before. Next, a resist mask not shown is placed on the aluminum film to pattern the aluminum film. Then, anodization is implemented by setting the obtained aluminum pattern as the anode to form porous anodic oxide films 147 and 148.

Figure 29B:
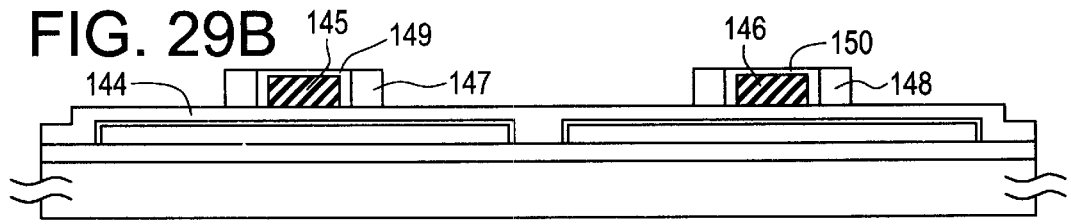

The thickness of the porous anodic oxide films is 5000 angstrom. Then, another anodization is implemented under the condition of forming dense anodic oxide films 149 and 150. The thickness of the dense anodic oxide films 149 and 150 is 800 angstrom. Thus, the state shown in FIG. 29B is obtained. Then, the exposed silicon oxide film 144 and the thermal oxide film 139 are eliminated by dry etching, thus obtaining the state shown in FIG. 29C as a result.

Figure 29C:
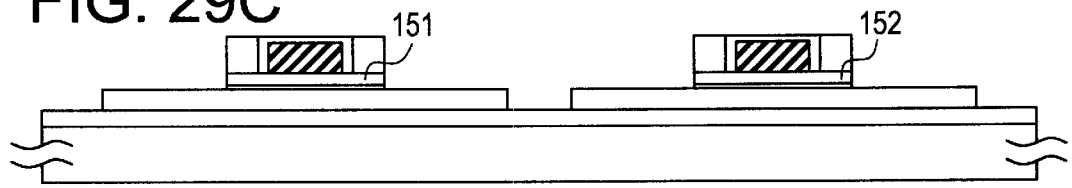
Figure 29D:
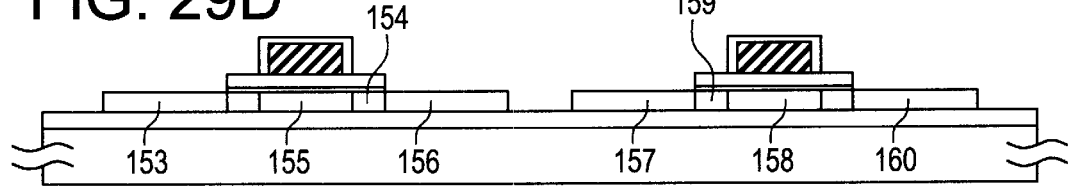

After obtaining the state shown in FIG. 29C, the porous anodic oxide films 147 and 148 are eliminated by using mixed acid in which acetic acid, nitric acid and phosphoric acid are mixed. Thus, the state shown in FIG. 29D is obtained. Here, resist masks are disposed alternately to inject P (phosphorus) ions to the thin film transistor on the left side and B (boron) ions to the thin film transistor on the right side. By injecting those impurity ions, a source region 153 and a drain region 156 to which P ions are doped in high concentration, thus having N-type, are formed in a manner of self-alignment.

Further, a region 154 to which P ions are doped in low concentration, thus having weak N-type, as well as a channel forming region 155 are formed in the same time. The reason why the region 154 having the weak N-type is formed is because the remaining gate insulating film 151 exists. That is, part of P ions transmitting through the gate insulating film 151 is blocked by the gate insulating film 151.

By the same principle, a source region 160 and a drain region 157 having strong P-type are formed in a manner of self-alignment and a low concentration impurity region 159 is formed in the same time. Further, a channel forming region 158 is formed in the same time. It is noted that when the thickness of the dense anodic oxide films 149 and 150 is as thick as 2000 angstrom, an offset gate region may be formed in contact with the channel forming region by that thickness.

Figure 29E:
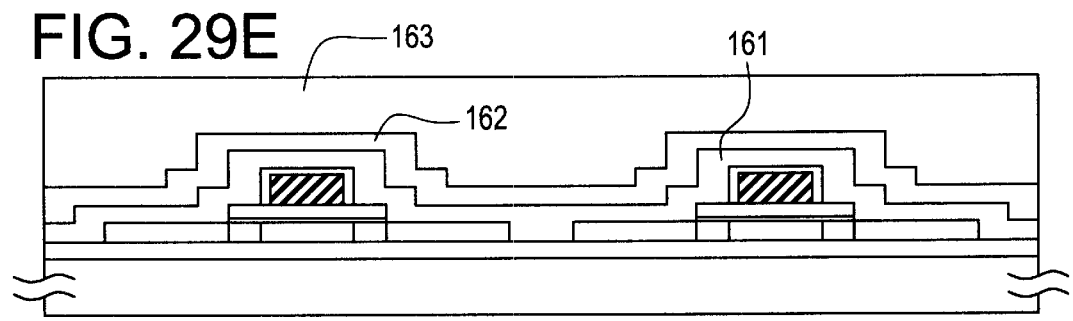
Figure 29F:
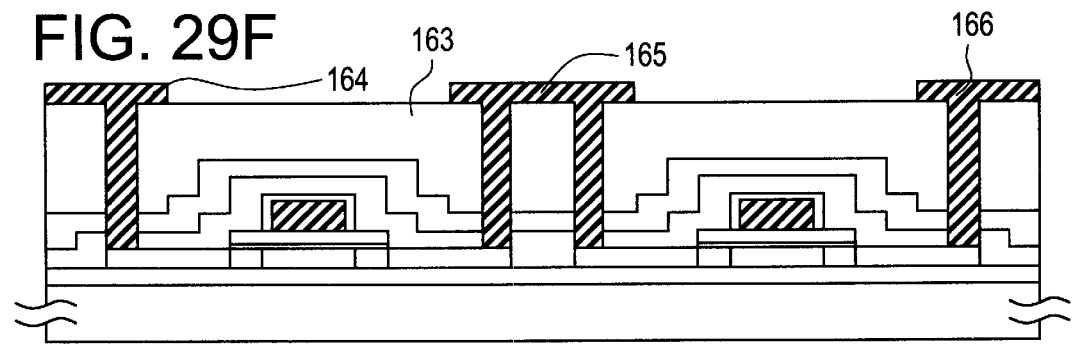

Its existence may be ignored in the case of the present embodiment because the dense anodic oxide films 149 and 150 are so thin as less than 1000 angstrom. Then, laser light is irradiated to anneal the region into which the impurity ions have been injected. Intense light may be used instead of the laser light. Then, a silicon nitride film 161 and a silicon oxide film 162 are formed as interlayer insulating films as shown in FIG. 29E. Their thickness is 1000 angstrom, respectively. It is noted that the silicon oxide film 162 needs not be formed.

Here, the thin film transistor is covered by the silicon nitride film. The reliability of the thin film transistor may be enhanced by arranging as described above because the silicon nitride film is dense and has an excellent interfacial characteristic. Further, an interlayer insulating film 163 made from a resin material is formed by means of spin coating. Here, the thickness of the interlayer insulating film 163 is 1 μm.

Then, contact holes are created to form a source electrode 164 and a drain electrode 165 of the N-channel type thin film transistor on the left side. In the same time, a source electrode 166 and the drain electrode 165 of the thin film transistor on the right side are formed. Here, the electrode 165 is disposed in common. Thus, the thin film transistor circuit having a CMOS structure constructed in a complementary manner may be formed.

In the formation shown in the present embodiment, the thin film transistor is covered by the nitride film as well as the resin material. This formation allows to enhance the durability of the thin film transistor, so that movable ions nor moisture hardly infiltrate. Further, it allows to prevent capacitance from being generated between the thin film transistor and wires when a multi-layered wire is formed.

[26-th Embodiment]

A 26-th embodiment relates to a case of forming a mono-crystal domain or a domain which can be substantially considered as a mono-crystal domain by irradiating laser light to the crystal silicon film obtained in the sixteenth or seventeenth embodiment.

At first, the crystal silicon film is obtained by utilizing the action of nickel element as shown in the sixteenth embodiment. Next, laser light is irradiated to the film to promote crystallization thereof further. KrF excimer laser is used as the laser light here. At this time, the mono-crystal domain or the domain which can be substantially considered as a mono-crystal domain may be formed by using a heat treatment in the temperature range of more than 450° C. and by optimizing the condition for irradiating laser light.

The film whose crystallization has been greatly promoted by such method has a domain which can be considered as a mono-crystal in which an electron spin density measured by ESR is less than $3 \times 10^{17}$ cm$^{-3}$ and the concentration of nickel element as the minimum value measured by SIMS is less than $3 \times 10^{17}$ cm$^{-3}$. Substantially, no grain boundary exists in this domain and high electrical characteristics equivalent to a mono-crystal silicon wafer can be obtained.

Further, the domain which can be considered as a mono-crystal contains hydrogen by less than 5 atom % to $1 \times 10^{15}$ cm$^{-3}$. This value is clarified by the measurement carried out by the SIMS (secondary ion mass spectrometry). By fabricating a thin film transistor by utilizing such mono-crystal or the domain which can be substantially considered as a mono-crystal, a semiconductor device which is equivalent to a MOS type transistor fabricated by using a mono-crystal wafer may be obtained.

[27-th Embodiment]

A 27-th embodiment relates to a case when nickel element is introduced directly to the surface of the underlying film in the process shown in the sixteenth embodiment. In this case, the nickel element is held in contact on the lower surface of the amorphous silicon film. In the present embodiment, acetate nickel aqueous solution is applied after forming the underlying film to introduce the nickel element such that the nickel element (metal element) is held in contact on the surface of the underlying film. Then, a thin film transistor similar to one shown in FIG. 25E is completed by implementing the other process in the same manner with the case of the sixteenth embodiment. Beside the method of using the solution, sputtering, CVD or adsorption may be used as the method for introducing nickel element.

[28-th Embodiment]

In a 28-th embodiment, an arrangement for obtaining a crystal silicon film on a glass substrate by utilizing nickel element will be shown. In the present embodiment, the crystal silicon film having a high crystallinity is obtained by the action of nickel element at first. Then, laser light is irradiated to enhance the crystallinity of the film and to diffuse the nickel element which is concentrated locally within the film, i.e. to extinguish blocks of nickel.

Next, a thermal oxide film containing a halogen elements is formed on the crystal silicon film by thermal oxidation. At this time, the nickel element remaining in the crystal silicon film is gettered to the thermal oxide film by the action of oxygen and halogen element. At this time, because the nickel element is dispersed therein by the irradiation of laser light, the gettering proceeds effectively. Then, the thermal oxide film containing the nickel element in high concentration as a result of the gettering is eliminated. Thereby, the crystal silicon film which has the high crystallinity and in which the concentration of nickel element is low is obtained on the glass substrate.

FIGS. 30A through 30E are diagrams showing the fabrication process according to present embodiment. At first, a silicon oxynitride film 168 is formed as an underlying film in a thickness of 3000 angstrom on the glass substrate 167 of Corning 1737 (distortion point: 667° C.). The silicon oxynitride film is formed by using the plasma CVD using silane, N$_2$O gas and oxygen as original gases in the present embodiment. TEOS gas and N$_2$O gas may be also used as the original gases.

The silicon oxynitride film has a function of suppressing the diffusion of impurities from the glass substrate in the later steps (seeing from the level of fabrication of a semiconductor, the glass substrate contains a large amount of impurities). It is noted that although the silicon nitride film is the most suitable to obtain the function for suppressing the diffusion of the impurities in maximum, the silicon nitride film is not practical because it is peeled off from the glass substrate due to the influence of stress. A silicon oxide film may be also used as the underlying film.

It is also important to increase the hardness of the underlying film 168 as much as possible. It is concluded from the fact that the harder the hardness of the underlying film (i.e. the smaller the etching rate thereof), the higher the reliability is in an endurance test of the thin film transistor obtained in the end. Although the reason thereof is unknown in detail, it is assumed to be caused by the effect of blocking the impurities from the glass substrate in the fabrication process of the thin film transistor.

It is also effective to contain a small amount of halogen element typified by chlorine in the underlying film 168. Thereby, the metal element which promotes crystallization of silicon which exists within the semiconductor layer may be gettered by the halogen element in the later step. It is also effective to add a hydrogen plasma treatment after forming the underlying film. It is also effective to implement a plasma treatment in an atmosphere in which oxygen and hydrogen are mixed. These treatments are effective in eliminating carbon component which is adsorbed on the surface of the underlying film and in enhancing the characteristic of interface with a semiconductor film formed later.

Next, an amorphous silicon film 169, which turns out to be a crystal silicon film later, is formed in a thickness of 500 angstrom by the low pressure thermal CVD. The reason why the low pressure thermal CVD is used is because thereby, the quality of the crystal silicon film obtained later is better, i.e. the film quality is denser in concrete. Beside the low pressure thermal CVD, the plasma CVD or the like may be used. The amorphous silicon film fabricated here is desirable to have $5 \times 10^{17}$ cm$^{-3}$ to $2 \times 101^9$ cm$^{-3}$ of concentration of oxygen within the film. It is because oxygen plays an important role in the later step of gettering the metal element which promotes crystallization of silicon. However, it must be careful here because the crystallization of the amorphous silicon film is hampered if the oxygen concentration is higher than the above-mentioned range of concentration.

The concentration of other impurities such as those of nitrogen and carbon is preferred to be low to the utmost. In concrete, the concentration must be below $2 \times 10^{19}$ cm$^{-3}$. The upper limit of the thickness of the amorphous silicon film is about 2000 angstrom. It is because a thick film is disadvantageous in obtaining the effect of the irradiation of laser light implemented later. That is, the most of laser light irradiated to a silicon film is absorbed by the surface of the film. The thickness of the amorphous silicon film must be thicker than a thickness which is required in the end as described later. The lower limit of the thickness of the amorphous silicon film 169 is practically about 200 angstrom, though it depends on a method for forming the film.

Next, nickel element is introduced to the amorphous silicon film 169 to crystallize it. Here, the nickel element is introduced by applying nickel acetate solution containing 10 ppm (weight conversion) of nickel on the surface of the amorphous silicon film 169. Beside the method of using the above-mentioned solution, sputtering, CVD, plasma treatment or adsorption may be used as the method for introducing the nickel element.

Figure 30A:
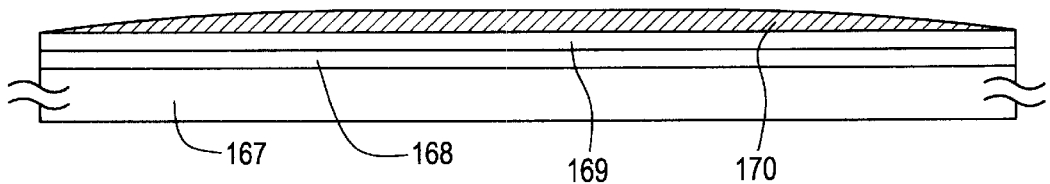
FIGS. 30A through 30E are diagrams showing fabrication steps according to a 28-th embodiment.

Among them, the method of using the solution is useful in that it is simple and that the concentration of the metal element may be readily adjusted. The nickel acetate solution is applied as described above to form a water film (liquid film) 170 of the nickel acetate solution as shown in FIG. 30A. After obtaining this state, extra solution is blown out by using a spin coater not shown. Thus, the nickel element is held in contact on the surface of the amorphous silicon film 169.

It is noted that it is preferable to use nickel sulfate solution, instead of the nickel acetate, if the remained impurities in the later heating process is taken into consideration. It is because the nickel acetate aqueous solution contains carbon and it might be carbonized in the later heating process, thus remaining within the film. An amount of the nickel element to be introduced may be controlled by adjusting the concentration of nickel salt within the solution.

Figure 30B:
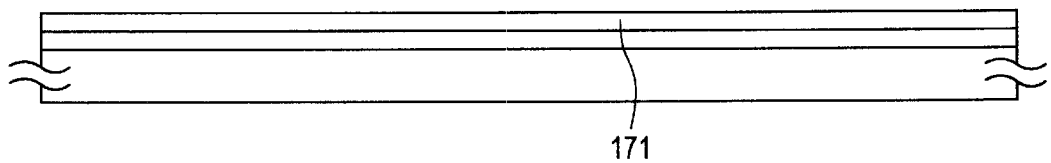

Next, a heat treatment is implemented in the temperature range from 550° C. to 650° C. in the state shown in FIG. 30B to crystallize the amorphous silicon film 169 and to obtain a crystal silicon film 171. This heat treatment is implemented in a reducing atmosphere. The temperature of this heat treatment is preferable to be a temperature below the distortion point of the glass substrate. Because the distortion point of the Corning 1737 glass substrate is 667° C., it is preferable to set the upper limit of the heating temperature here at about 650° C., leaving some margin. Here, the heat treatment is implemented for four hours at 620° C. within a nitrogen atmosphere containing 3 volume % of hydrogen.

The reason why the reducing atmosphere is adopted in the crystallization step in a way of the heat treatment is to prevent oxides from being created in the step of the heat treatment and more concretely, to suppress nickel from reacting with oxygen and NiOx from being created on the surface of the film or within the film. Oxygen couples with nickel and contributes a lot in gettering nickel in the later gettering step.

However, it has been found that if oxygen couples with nickel in the above-mentioned stage of the crystallization, it hampers the crystallization. Accordingly, it is important to suppress the oxides from being created to the utmost in the crystallization step in a way of heating. The concentration of oxygen within the atmosphere for implementing the heat treatment for the crystallization has to be in an order of ppm, or preferably, less than 1 ppm.

Inert gases such as argon, beside nitrogen, or their mixed gas may be used as the gas which occupies the most of the atmosphere for implementing the heat treatment for the crystallization. After the crystallization step by the heat treatment described above, nickel element remains in certain blocks. It has been confirmed by an observation through a TEM (Transmission type Electron Microscope). While the reason why nickel exists in certain blocks has not been clarified yet, it is considered to be related with some crystallization mechanism.

Figure 30C:

Next, laser light is irradiated as shown in FIG. 30C. Here, KrF excimer laser (wavelength: 248 nm) is used. The irradiation is implemented by scanning the laser beam whose shape is linear. The irradiation of the laser light allows the nickel element which has been concentrated locally as a result of the crystallization by means of the above-mentioned heat treatment to be distributed within the film 171 in some degree. That is, it allows to extinguish the blocks of nickel element and to distribute the nickel element.

Figure 30D:
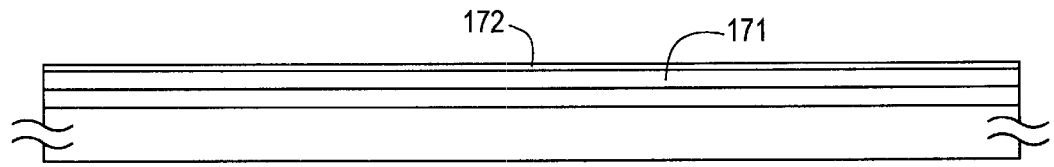

Another heat treatment is implemented in a step in FIG. 30D to form a thermal oxide film for gettering the nickel element. This heat treatment is implemented within an atmosphere containing halogen element. In concrete, this heat treatment is implemented within the oxygen atmosphere containing 5 volume % of HCl. This step is carried out to eliminate the nickel element (or other metal element which promotes crystallization of silicon) which has been introduced intentionally for the crystallization in the initial stage from the crystal silicon film 171.

This heat treatment is implemented at a temperature higher than that of the heat treatment implemented for the crystallization described above. It is an important condition for effectively implementing the gettering of nickel element. It is noted that although this heat treatment may be implemented in the same or less temperature in the heat treatment implemented for the crystallization, it is less effective.

This heat treatment is implemented in the temperature range from 600° C. to 750° C. upon meeting the above-mentioned condition. The effect for gettering nickel element may be obtained remarkably in this step if the temperature is higher than 600° C. In this step, the nickel element which has been distributed by the irradiation of laser light described above is gettered effectively to the oxide film. The upper limit of the heating temperature is limited by the distortion point of the glass substrate to be used. It must be careful not to implement the heat treatment in a temperature above the distortion point of the glass substrate to be used because, otherwise, it is deformed.

It is preferable to mix HCl with a ratio of 0.5% to 10% (volume %) to oxygen. It must be careful not to mix above this concentration because, otherwise, the surface of the film becomes rough with the same or more degree of irregularity with the thickness of the film. A thermal oxide film 172 containing chlorine as shown in FIG. 30D is formed by implementing the heat treatment under such condition. Here, the thermal oxide film 172 is formed in a thickness of 100 angstrom by implementing the heat treatment for 12 hours.

Because the thermal oxide film 172 is formed, the thickness of the crystal silicon film 169 reaches to about 450 angstrom. When the heating temperature is 600° C. to 750° C. in the heat treatment, the treatment time (heating time) is set at 10 hours to 48 hours or typically at 24 hours. This treatment time may be set adequately depending on the thickness of the oxide film to be obtained as a matter of course. In this step, nickel element is gettered out of the silicon film by the action of the halogen element. Here, the nickel element is gettered to the thermal oxide film 172 to be formed by the action of chlorine.

In the gettering, oxygen is also involved. That is, in this gettering, oxygen existing within the crystal silicon film plays an important role. That is, the gettering of nickel element proceeds effectively because the gettering effect caused by chlorine acts on nickel oxide formed when oxygen couples with nickel. If the concentration of oxygen is too much, it becomes the factor of hampering the crystallization of the amorphous silicon film 169 in the crystallization step shown in FIG. 30B as described above. However, the existence thereof plays an important role in the process of gettering nickel as described above. Accordingly, it is important to control the concentration of oxygen existing within the amorphous silicon film, the starting film.

Here, Cl has been selected as the halogen element and the case of using HCl has been shown as a method for introducing it. Beside HCl, one type or a plurality of types of mixed gas selected from HF, HBr, $Cl_2$, $F_2$, $Br_2$ may be used. Beside them, halogen hydride may be used in general. It is preferable to set the content (volume content) of those gases within the atmosphere to 0.25 to 5% if it is HF, 1 to 15% if it is HBr, 0.25 to 5% if it is $Cl_2$, 0.125 to 2°.5% if it is $F_2$ and 0.5 to 10% if it is $Br_2$.

If the concentration is below the above-mentioned range, no significant effect can be obtained. Further, if the concentration exceeds the above-mentioned range, the surface of the crystal silicon film is roughened. Through this step, the concentration of nickel element may be reduced to 1/10 from the initial stage. It means that the nickel element may be reduced to 1/10 as compared to the case when no gettering is conducted by the halogen element. This effect may be obtained in the same manner even when another metal element is used. Because the nickel element is gettered to the oxide film to be formed in the aforementioned step, naturally the nickel concentration within the oxide film becomes high as compared to other regions.

Further, it has been observed that the concentration of nickel element is apt to be high near the interface between the crystal silicon film 171 and the thermal oxide film 172. It is considered to happen because the region where the gettering mainly takes place is on the side of the oxide film near the interface between the crystal silicon film and the oxide film. The gettering proceeding near the interface is considered to be caused by the existence of stress and defects near the interface. Next, the thermal oxide film 172 containing nickel in high concentration is eliminated. While the thermal oxide film 172 may be eliminated by means of dry etching or wet etching using buffer hydrofluoric acid or other hydrofluorite (hydrofluoric) etchant, it is implemented by the wet etching by using the buffer hydrofluoric acid in the present embodiment.

Figure 30E:
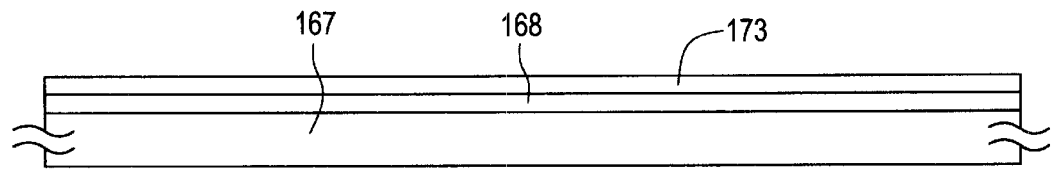

Thus, a crystal silicon film 173 in which the concentration of nickel has been reduced is obtained as shown in FIG. 30E. Because nickel element is contained near the surface of the obtained crystal silicon film 173 relatively in high concentration, it is effective to advance the etching op the above-mentioned oxide film 172 to over-etch, more or less, the surface of the crystal silicon film 173.

It is also effective to irradiate laser light again after eliminating the thermal oxide film 172 to promote the crystallization of the obtained crystal silicon film 173 further. That is, it is effective to irradiate the laser light again after gettering nickel element. KrF excimer laser (wavelength: 248 nm) is used as the laser light to be used in the present embodiment. However, XeCl excimer laser (wavelength: 308 nm) and other types of lasers may be also used. Further, it is possible to arrange so as to irradiate ultraviolet ray or infrared ray, instead of the laser light.

[29-th Embodiment]

A 29-th embodiment relates to a case when Cu is used as the metal element which promotes crystallization of silicon in the arrangement shown in the 28-th embodiment. In this case, while solutions such as cupric acetate $[Cu(CH_3COO)_2]$ and cupric chloride $(CuCl_2\ 2H_2O)$ may be used as the solution for introducing Cu, the former is used in the present embodiment.

[30-th Embodiment]

A 30-th embodiment relates to a case of growing crystal in the form different from that in the 28-th embodiment. That is, the present embodiment relates to a method of growing the crystal in a direction parallel to the substrate, i.e. a method called lateral growth, by utilizing the metal element which promotes crystallization of silicon. FIGS. 31A through 31E show the fabrication process according to the 30-th embodiment.

At first, a silicon oxynitride film is formed as an underlying film 175 in a thickness of 3000 angstrom on the Corning 1737 glass substrate 174. It is noted that a quartz substrate may be used instead of the glass substrate. Next, an amorphous silicon film 176 which is the starting film of a crystal silicon film is formed in a thickness of 600 angstrom by low pressure thermal CVD. The thickness of the amorphous silicon film is preferable to be less than 2000 angstrom as described before. It is noted that plasma CVD may be also used instead of the low pressure thermal CVD.

Next, a silicon oxide film not shown is formed in a thickness of 1500 angstrom and is patterned to form a mask 177. An opening is created on the mask in a region 178. The amorphous silicon film 176 is exposed at the region where the opening 178 is created. The opening 178 has a thin and long rectangular shape in the longitudinal direction from the depth to the front side of the figure. Preferably, the width of the opening 178 is 20 µm or more. The length thereof in the longitudinal direction may be determined arbitrarily.

Then, the nickel acetate aqueous solution containing 10 ppm of nickel element in terms of weight is applied in the same manner with the 28-th embodiment and the extra solution is removed by implementing spin drying by using a spinner not shown. Thus, the solution is held in contact on the exposed surface of the amorphous silicon film 176 as indicated by a dot line 179 in FIG. 31A.

Next, a heat treatment is implemented at 640° C. for four hours in a nitrogen atmosphere containing 3 volume % of hydrogen and in which oxygen is minimized. Then, crystal grows in the direction parallel to the substrate 174 as indicated by the reference numeral 180 in FIG. 31B. This crystal growth advances from the region of the opening 178 to which nickel element has been introduced to the surrounding part. This crystal growth in the direction parallel to the substrate will be referred to as lateral growth throughout the present specification.

It is possible to advance this lateral growth across more than 100 µm under the conditions shown in the present embodiment. Then, a crystal silicon film 181 having the region in which the crystal has thus grown laterally is obtained. It is noted that crystal growth in the vertical direction called vertical growth advances from the surface of the silicon film to the underlying interface in the region where the opening 178 is formed.

Figure 31A:
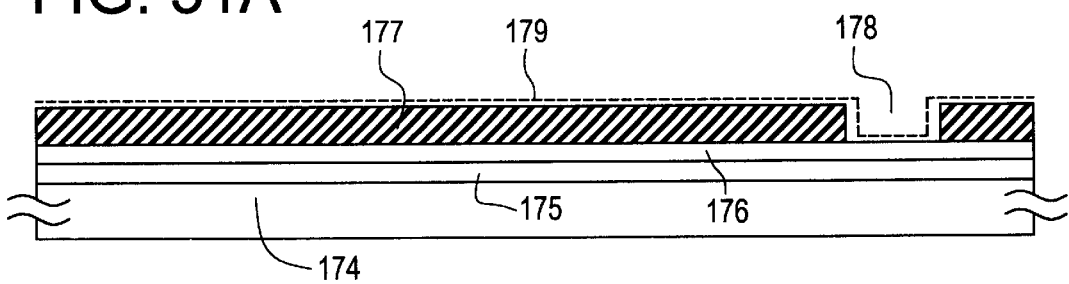
FIGS. 31A through 31E are diagrams showing fabrication steps according to a 30-th embodiment.
Figure 31B:
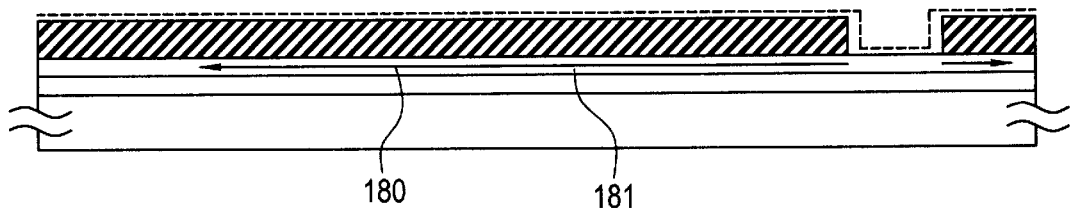
Figure 31C:
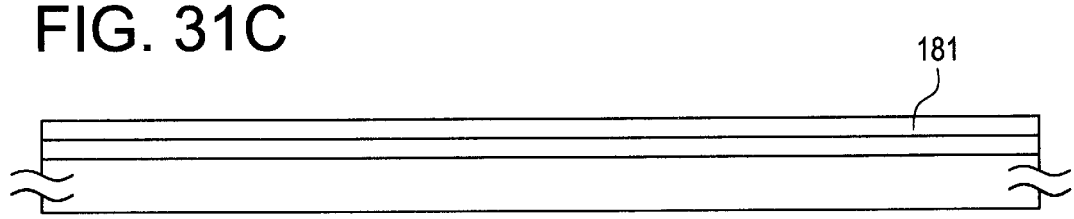
Figure 31D:
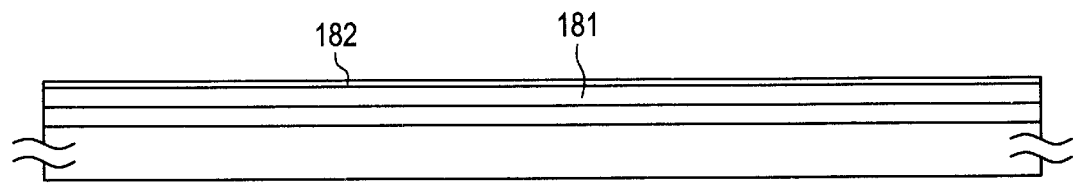

Then, the mask 177 made from the silicon oxide film for selectively introducing nickel element is eliminated. Thus, the state shown in FIG. 31C is obtained. In this state, the vertically grown region, the laterally grown region and a region in which no crystal has grown (having amorphous state) exist within the silicon film 181. In this state, nickel element is unevenly distributed within the film. Specifically, the nickel element exists relatively in high concentration in the region where the opening 178 is created and in the edge portion in the direction of the crystal growth indicated by the reference numeral 180.

After obtaining the state shown in FIG. 31C, laser light is irradiated. Here, KrF excimer laser is irradiated in the same manner with the 28-th embodiment. Thereby, the nickel element unevenly distributed may be diffused, allowing to obtain a state in which gettering may be implemented readily in the later gettering step. After irradiating the laser light, a heat treatment is implemented at 650° C. or 12 hours within an oxygen atmosphere containing 3 volume % of HCl. In this step, an oxide film 182 containing nickel element in high concentration is formed. In the same time, the concentration of nickel element within the silicon film 181 may be reduced relatively.

Here, the thermal oxide film 182 is formed in a thickness of 100 angstrom. The thermal oxide film contains the nickel element gettered by the action of chlorine in high concentration. Further, because the thermal oxide film 182 is formed, the thickness of the crystal silicon film 181 is reduced to about 500 angstrom. Next, the thermal oxide film 182 containing nickel element in high concentration is eliminated.

In the crystal silicon film of this state, the nickel element has a distribution of concentration such that it exists in high concentration toward the surface of the crystal silicon film. This is caused by the fact that the nickel element has been gettered to the thermal oxide film when the thermal oxide film 182 has been formed. Accordingly, it is useful to etch the surface of the crystal silicon film to eliminate the region in which the nickel element exists in high concentration after eliminating the thermal oxide film 182. That is, the crystal silicon film in which the nickel element concentration is reduced further may be obtained by etching the surface of the crystal silicon film in which the nickel element exists in high concentration. However, in this case, the thickness of the silicon film finally obtained needs to be taken into consideration.

Next, patterning is implemented to form a pattern 183 formed of the laterally grown region. The concentration of nickel element which remains within the pattern 183 made from the laterally grown region thus obtained may be reduced further as compared to the case shown in the 28-th embodiment. This is caused by the fact that the concentration of the metal element contained within the laterally grown region is low originally. In concrete, the concentration of nickel element within the pattern 183 made from the laterally grown region may be readily reduced to the order of $10^{17}$ cm$^{-3}$ or less.

When a thin film transistor is formed by utilizing the laterally grown region, a semiconductor device having a higher mobility may be obtained as compared to the case when the vertically grown region as shown in the 28-th embodiment (crystal grows vertically on the whole surface in the case of the 28-th embodiment) is utilized. It is noted that it is useful to implement the etching process further after forming the pattern shown in FIG. 31E to eliminate the nickel element existing on the surface of the pattern.

Next, a thermal oxide film 184 is formed on the pattern 183. The thermal oxide film is formed in a thickness of 200 angstrom by implementing a heat treatment for 12 hours in an oxygen atmosphere at 650° C. It is noted that this thermal oxide film becomes a part of a gate insulating film later in constructing a thin film transistor. When the thin film transistor is fabricated after that, a silicon oxide film is formed by plasma CVD or the like over the thermal oxide film 184 to form the gate insulating film.

[31-st Embodiment]

A 31-st embodiment relates to a case of fabricating a thin film transistor disposed in a pixel region of an active matrix type liquid crystal display or an active matrix type EL display. FIGS. 32A through 32E show the fabrication process according to the present embodiment. At first, the crystal silicon film is formed or the glass substrate through the process shown in the 28-th or 30-th embodiment.

Figure 32A:
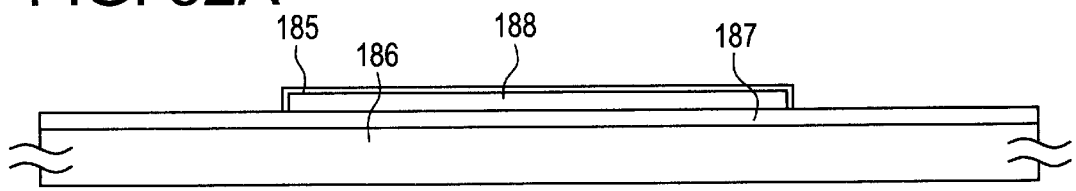
FIGS. 32A through 32E are diagrams showing fabrication steps according to a 31-st embodiment.

While the case of using the crystal silicon film obtained through the process shown in the 28-th embodiment will be described below, the same applies to the case of using the crystal silicon film obtained through the process shown in the 30-th embodiment. The state shown in FIG. 32A is obtained by patterning the crystal silicon film obtained through the process in the 28-th embodiment. In FIG. 32A, the reference numeral (186) denotes a glass substrate, (187) an underlying film, and (188) an active layer formed of the crystal silicon film. After obtaining the state shown in FIG. 32A, a plasma treatment is implemented within a reduced pressure atmosphere in which oxygen and hydrogen are mixed. The plasma is generated by high-frequency discharge.

Organic substances existing on the surface of the exposed active layer 188 may be removed by the plasma treatment. Specifically, the organic substances adsorbing on the surface of the active layer are oxidized by oxygen plasma and the oxidized organic substances are reduced and vaporized by hydrogen plasma. Thus the organic substances existing on the surface of the exposed active layer 188 are removed. The removal of the organic substances is very effective in suppressing fixed charge from existing on the surface of the active layer 188. That is, because the fixed charge caused by the existence of organic substances hampers the operation of the device and renders the characteristics thereof instable, it is very useful to remove it.

After removing the organic substances, thermal oxidation is implemented within an oxygen atmosphere at 640° C. to form a thermal oxide film 185 of 100 angstrom thick. This thermal oxide film has a high interfacial characteristic with a semiconductor layer and composes a part of a gate insulating film later. Thus, the state shown in FIG. 32A is obtained. After that, a silicon oxynitride film 189 which composes the gate insulating film is formed in a thickness of 1000 angstrom. In forming the film, plasma CVD using mixed gas of silane and $N_2O$ and oxygen is used. It is noted that plasma CVD using mixed gas of TEOS and $N_2O$ may be used.

The silicon oxynitride film 189 functions as the gate insulating film together with the thermal oxide film 185. It is also effective to contain halogen element within the silicon oxynitride film. That is, it is possible to prevent the function of the gate insulating film as an insulating film from dropping by the influence of the nickel element (or another metal element which promotes crystallization of silicon) existing within the active layer by fixing the nickel element by the action of the halogen element.

It is significant to use the silicon oxynitride film in that metal element hardly infiltrates to the gate insulating film from its dense film quality. If metal element infiltrates into the gate insulating film, its function as an insulating film drops, thus causing instability and dispersion of characteristics of the thin film transistor. It is noted that a silicon oxide film which is normally used may be also used for the gate insulating film.

After forming the silicon oxynitride film 189 which functions as the gate insulating film, an aluminum film not shown which functions as a gate electrode later is formed by sputtering. 0.2 weight % of scandium is included within the aluminum film to suppress hillock and whisker from being produced in the later process. The hillock and whisker mean that abnormal growth of aluminum occurs by heating, thus forming needle or prickle-like projections.

After forming the aluminum film, a dense anodic oxide film not shown is formed. The anodic oxide film is formed by using ethylene glycol solution containing 3 weight % of tartaric acid as electrolyte. That is, the anodic oxide film having the dense film quality is formed on the surface of the aluminum film by setting the aluminum film as the anode and platinum as the cathode and by anodizing within this electrolyte. The thickness of the anodic oxide film not shown having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization.

Figure 32B:
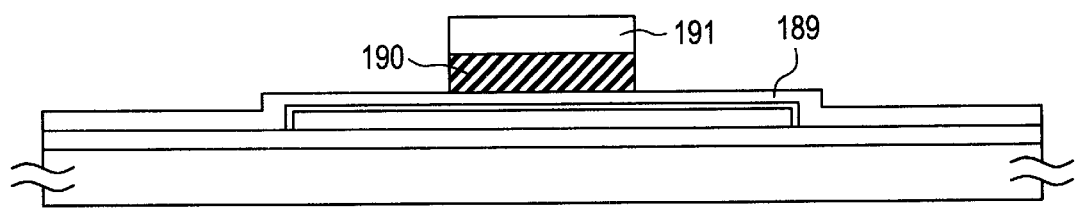
Figure 32C:
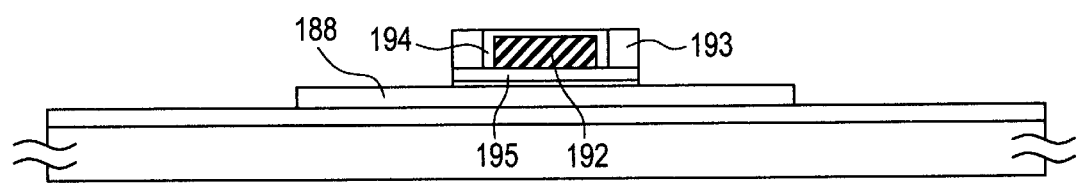

Next, the resist mask 191 is formed and the aluminum film is patterned so as to have a pattern 190. The state shown in FIG. 32B is thus obtained. Here, another anodization is implemented. In this case, 3 weight % of oxalate aqueous solution is used as electrolyte. A porous anodic oxide film 193 is formed by anodizing within this electrolyte by setting the aluminum pattern 190 as the anode.

In this step, the anodic oxide film 193 is formed selectively on the sides of the aluminum pattern because the resist mask 191 having the high adhesiveness exists thereabove.

The anodic oxide film 193 may be grown up to several μm thick. The thickness is 6000 angstrom in the present embodiment. It is noted that the range of growth may be controlled by adjusting an anodizing time.

Next, the resist mask 191 is removed. Then, a dense anodic oxide film is formed again. That is, the anodization is implemented again by using the ethylene glycol solution containing 3 weight % of tartaric acid as electrolyte. Then, an anodic oxide film 194 having a dense film quality is formed because the electrolyte infiltrates into the porous anodic oxide film 193. This dense anodic oxide film 194 is 1000 angstrom thick. The thickness is controlled by adjusting applied voltage.

Figure 32D:
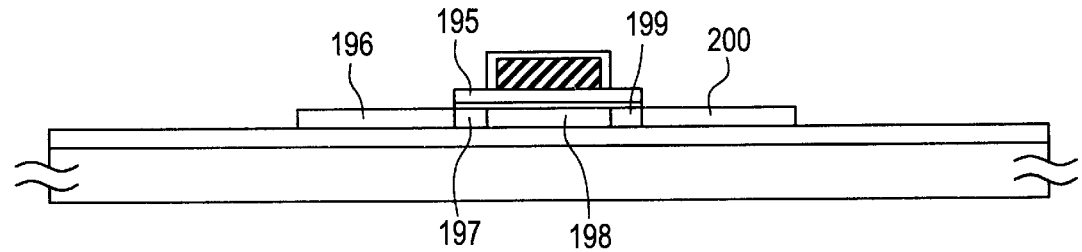

Here, the exposed silicon oxynitride film 189 and the thermal oxide film 185 are etched by utilizing dry etching. Then, the porous anodic oxide film 193 is eliminated by using mixed acid in which acetic acid, nitric acid and Phosphoric acid are mixed. Thus, the state shown in FIG. 32D is obtained. After obtaining the state shown in FIG. 32D, impurity ions are injected.

Here, P (phosphorus) ions are injected by plasma doping in order to fabricate an N-channel type thin film transistor. In this step, heavily doped regions 196 and 200 and lightly doped regions 197 and 199 are formed because part of the remaining silicon oxynitride film 195 functions as a semi-permeable mask, thus blocking part of the injected ions.

Next, laser light or intense light is irradiated to activate the regions into which the impurity ions have been injected. The irradiation is implemented using the intense light in the present embodiment. Thus, a source region 196, a channel forming region 198, a drain region 200 and low concentration impurity regions 197 and 199 are formed in a manner of self-alignment. The one designated by the reference numeral 199 here is the region called the LDD (lightly doped region).

It is noted that when the dense anodic oxide film 194 is formed as thick as 2000 angstrom or more, an offset gate region may be formed on the outside of the channel forming region 198 by its thickness. Although the offset gate region is formed also in the present embodiment, it is not shown in the figures because its size is small, its contribution due to the existence thereof is small and the figures might otherwise become complicated.

Figure 32E:
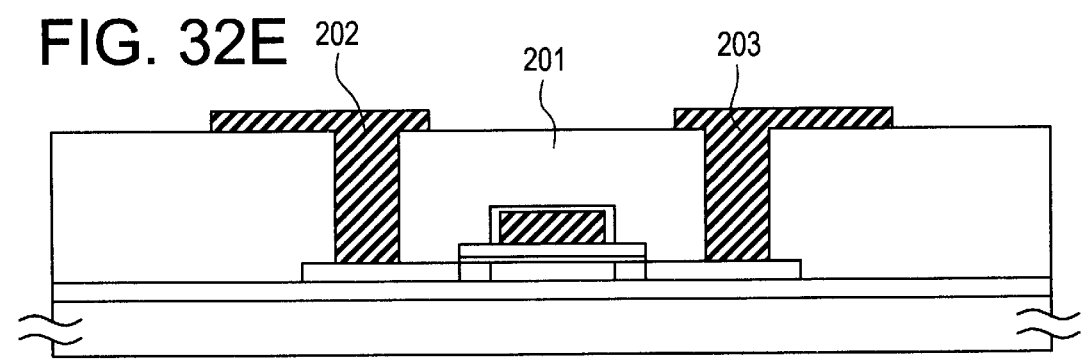

Next, a silicon oxide film or a silicon nitride film or their laminated film is formed as an interlayer insulating film 201. The silicon nitride film is used in the present embodiment. The interlayer insulating film may be constructed by forming a layer made from a resin material on the silicon oxide film or the silicon nitride film. Then, contact holes are created to form a source electrode 202 and a drain electrode 203. Thus, the thin film transistor shown in FIG. 32E is completed.

[32-nd Embodiment]

A 32-nd embodiment is related to a method for forming the gate insulating film 189 in the arrangement shown in the 31-st embodiment (FIG. 32). Thermal oxidation may be used as a method for forming the gate insulating film when a quartz substrate or a glass substrate having a high heat resistance is used as the substrate. The thermal oxidation allows the film quality to be densified and is useful in obtaining a thin film transistor having stable characteristics.

That is, because an oxide film formed by the thermal oxidation is dense as an insulating film and movable electric charge existing therein can be reduced, it is one of the most suitable films as a gate insulating film. In the present embodiment, a heat treatment is implemented in an oxidizing atmosphere at 950° C. A thin film transistor as shown in FIG. 32E is completed by implementing other steps in the same manner as shown in the 31-st embodiment. At this time, it is effective to mix HCl or the like into the oxidizing atmosphere because, thereby, metal element existing in the active layer may be fixed in the same time with the formation of the thermal oxide film. It is also effective to mix $N_2O$ gas into the oxidizing atmosphere to form a thermal oxide film containing nitrogen component. Here, it is also possible to obtain a silicon oxynitride film by the thermal oxidation if the mixed ratio of $N_2O$ gas is optimized. It is noted that the thermal oxide film 185 needs not be formed specifically in the present embodiment.

[33-rd Embodiment]

A 33-rd embodiment relates to a case of fabricating a thin film transistor through a process different from that shown in the 31-st embodiment (FIG. 32). FIGS. 33A through 33E show the fabrication process according to the present embodiment. At first, the crystal silicon film is formed on the glass substrate through the process shown in the 28-th or 30-th embodiment. It is then patterned, thus obtaining the state shown in FIG. 33A. While the following process will be described based on the process shown in the 30-th embodiment, the same applies also to the process shown in the 28-th embodiment.

Figure 33A:
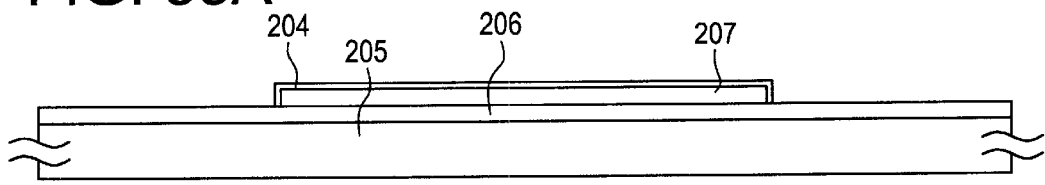
FIGS. 33A through 33E are diagrams showing fabrication steps according to a 33-rd embodiment.
Figure 33B:
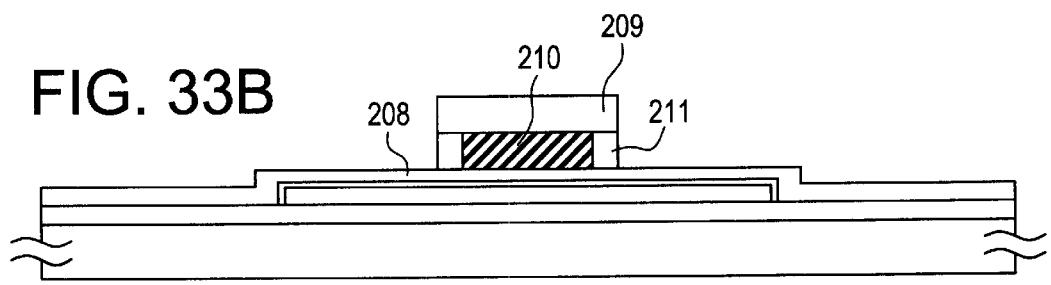
Figure 33C:
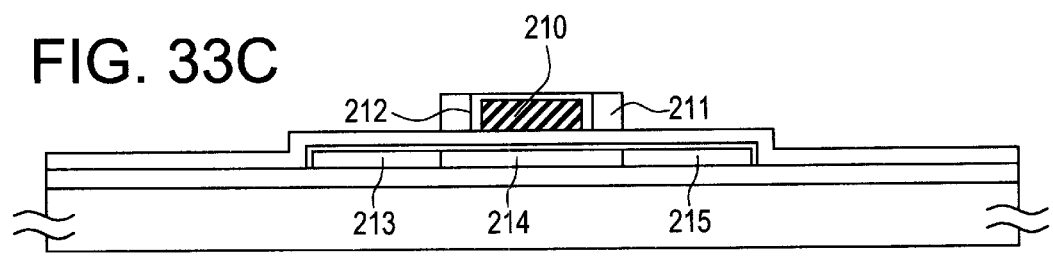

After obtaining the state shown in FIG. 33A, a plasma treatment is implemented within a reduced pressure atmosphere in which oxygen and hydrogen are mixed. In the state shown in FIG. 33A, the reference numeral (205) denotes a glass substrate, (206) an underlying film, (207) an active layer formed of the crystal silicon film and (204) a thermal oxide film formed again after eliminating the thermal oxide film for gettering. After obtaining the state shown in FIG. 33A, a silicon oxynitride film 208 which composes a gate insulating film is formed in a thickness of 1000 angstrom. The film is formed by using plasma CVD using mixed gas of oxygen, silane and $N_2O$. It is noted that plasma CVD using mixed gas of TEOS and $N_2O$ may be also used in forming the film.

The silicon oxynitride film 208 composes the gate insulating film together with the thermal oxide film 204. It is noted that a silicon oxide film may be used beside the silicon oxynitride film. After forming the silicon oxynitride film 208 which functions as the gate insulating film, an aluminum film not shown which functions as a gate electrode later is formed by sputtering. 0.2 weight % of scandium is included within the aluminum film.

After forming the aluminum film, a dense anodic oxide film not shown is formed. The anodic oxide film is formed by using ethylene glycol solution containing 3 weight % of tartaric acid as electrolyte. That is, the anodic oxide film having the dense film quality is formed on the surface of the aluminum film by setting the aluminum film as the anode and platinum as the cathode and by anodizing within this electrolyte. The thickness of the anodic oxide film not shown having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization.

Next, the resist mask 209 is formed and the aluminum film is patterned so as to have a pattern 210. Here, another anodization is implemented. In this case, 3 weight % of oxalate aqueous solution is used as electrolyte. A porous anodic oxide film 211 is formed by anodizing within this electrolyte by setting the aluminum pattern 210 as the anode.

In this step, the anodic oxide film 211 is formed selectively on the sides of the aluminum pattern because the resist mask 209 having the high adhesiveness exists thereabove. The anodic oxide film 211 may be grown up to several μm thick. The thickness is 6000 angstrom in the present embodiment. It is noted that the range of growth may be controlled by adjusting an anodizing time.

Next, after removing the resist mask 209, a dense anodic oxide film is formed again. That is, the anodization is implemented again by using the ethylene glycol solution containing 3 weight % of tartaric acid as electrolyte. Then, an anodic oxide film 212 having a dense film quality is formed because the electrolyte infiltrates into the porous anodic oxide film 211. Here, the initial injection of impurity ions is implemented. This step may be implemented after removing the resist mask 209. A source region 213 and a drain region 215 are formed by injecting the impurity ions. It is noted that no impurity ion is injected to a region 214.

Figure 33D:
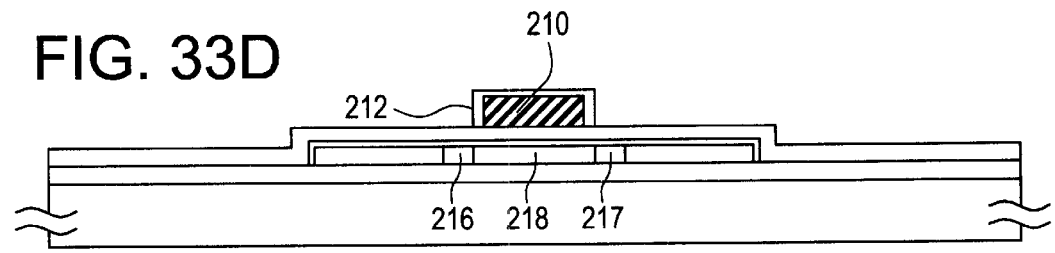

Then, the porous anodic oxide film 211 is eliminated by using mixed acid in which acetic acid, nitric acid and phosphoric acid are mixed. Thus, the state shown in FIG. 33D is obtained. After obtaining the state shown in FIG. 33D, impurity ions are injected again. The impurity ions are injected under the doping condition lighter than that of the first injection. In this step, lightly doped regions 216 and 217 are formed and a region 218 turns out to be a channel forming region.

Then, laser light or intense light is irradiated to activate the regions into which the impurity ions have been injected. The laser light 1s used here. Thus, the source region 213, the channel forming region 218, the drain region 215 and low concentration impurity regions 216 and 217 are formed in a manner of self-alignment. Here, the one designated by the reference numeral 217 is the region called the LDD (lightly doped drain).

Figure 33E:
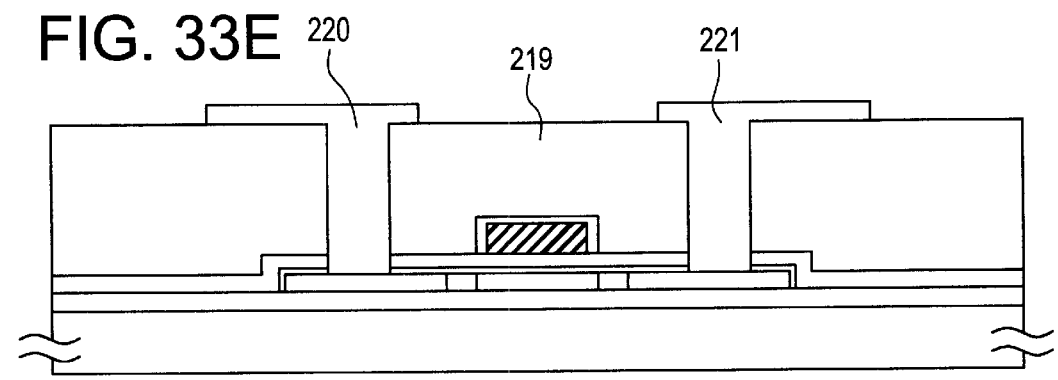

Next, while a silicon oxide film or a silicon nitride film or their laminated film is formed as an interlayer insulating film 219, the laminated film of the silicon oxide film and the silicon nitride film is formed here. The interlayer insulating film may be also constructed by forming a layer made from a resin material on the silicon oxide film or the silicon nitride film. After that, contact holes are created to form a source electrode 220 and a drain electrode 221. Thus, the thin film transistor shown in FIG. 33E is completed.

[34-th Embodiment]

A 34-th embodiment relates to a case when an N-channel type thin film transistor and a P-channel type thin film transistor are formed in a complementary manner. The formation shown in the present embodiment may be utilized for various thin film integrated circuits integrated on an insulating surface as well as for peripheral driving circuits of an active matrix type liquid crystal display for example. FIGS. 34A through 34F are diagrams showing a fabrication process according to the present embodiment.

Figure 34A:
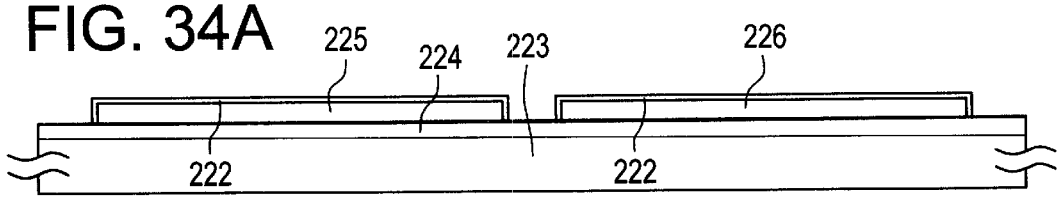
FIGS. 34A through 34F are diagrams showing fabrication steps according to a 34-th embodiment.

At first, a silicon oxide film or a silicon oxynitride film is formed as an underlying film 224 on a glass substrate 223 as shown in FIG. 34A. It is preferable to use the silicon oxynitride film, and it is used in the present embodiment. Next, an amorphous silicon film not shown is formed by the plasma CVD. It may be formed also by low pressure thermal CVD. Then, the amorphous silicon film is transformed into a crystal silicon film by the method shown in the 28-th embodiment.

Next, a plasma treatment is implemented within an atmosphere in which oxygen and hydrogen are mixed. Then, the crystal silicon film thus obtained is patterned to obtain active layers 225 and 226. Thus, the state shown in FIG. 34A is obtained. Further, a heat treatment is implemented at 650° C. for 10 hours within a nitrogen atmosphere containing 3 volume % of HCl in the state shown in FIG. 34A in order to suppress the influence of carriers moving the sides of the active layers.

Because an OFF current characteristic becomes bad if a trap level exists due to the existence of metal element on the sides of the active layers, it is effective to implement the above-mentioned treatment to lower the level on the sides of the active layers. Further, a thermal oxide film 222 and a silicon oxynitride film 227 which compose a gate insulating film are formed. When quartz is used as the substrate here, it is desirable to compose the gate insulating film only by the thermal oxide film formed by using the above-mentioned thermal oxidation.

Next, an aluminum film not shown which composes a gate electrode later is formed in a thickness of 4000 angstrom. Beside the aluminum film, a metal which can be anodized, such as tantalum, may be used. After forming the aluminum film, a very thin and dense anodic oxide film is formed on the surface thereof by the method described before. Next, a resist mask not shown is placed on the aluminum film to pattern the aluminum film.

Figure 34B:
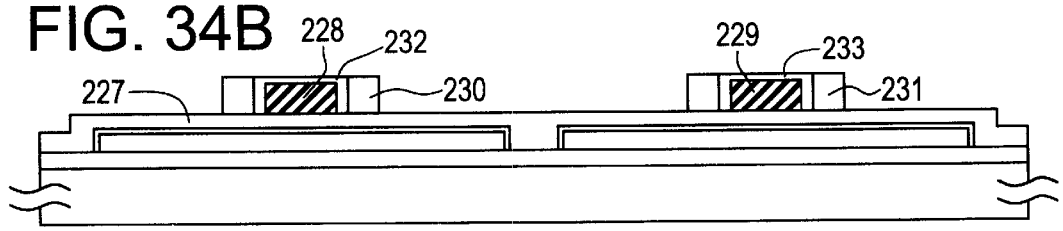

Then, anodization is implemented by setting the obtained aluminum pattern as the anode to form porous anodic oxide films 230 and 231. The thickness of the porous anodic oxide films is 5000 angstrom. Then, another anodization is implemented under the condition of forming dense anodic oxide films 232 and 233. The thickness of the dense anodic oxide films 232 and 233 is 800 angstrom. Thus, the state shown in FIG. 34B is obtained.

Figure 34C:
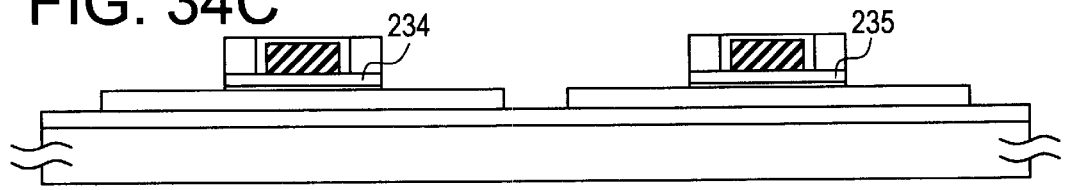
Figure 34D:
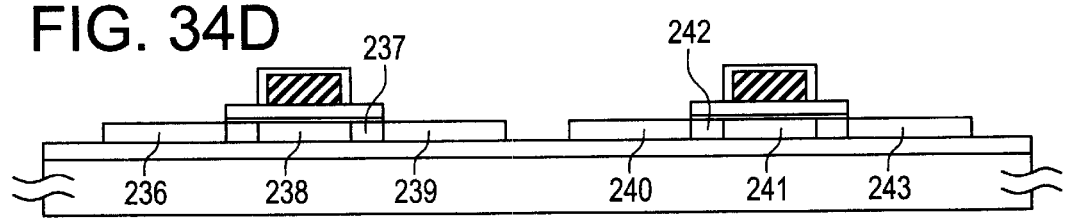

Further, the exposed silicon oxynitride film 227 and the thermal oxide film 222 are eliminated by dry etching, thus obtaining the state shown in FIG. 34C as a result. After obtaining the state shown in FIG. 34C, the porous anodic oxide films 230 and 231 are eliminated by using mixed acid in which acetic acid, nitric acid and phosphoric acid are mixed. Thus, the state shown in FIG. 34D is obtained. Here, resist masks are disposed alternately to inject P (phosphorus) ions to the thin film transistor on the left side and B (boron) ions to the thin film transistor on the right side.

By injecting those impurity ions, a source region 236 and a drain region 239 to which P ions are doped in high concentration, thus having N-type, are formed in a manner of self-alignment. Further, a region 237 to which P ions are doped in low concentration, thus having weak N-type, as well as a channel forming region 238 are formed in the same time. The reason why the region 237 having the weak N-type is formed is because the remaining gate insulating film 234 exists. That is, part of P ions transmitting through the gate insulating film 234 is blocked by the gate insulating film 234.

By the same principle, a source region 243 and a drain region 240 having strong P-type are formed in a manner of self-alignment and a low concentration impurity region 242 is formed in the same time. Further, a channel forming region 241 is formed in the same time. It is noted that when the thickness of the dense anodic oxide films 232 and 233 is as thick as 2000 angstrom, an offset gate region may be formed in contact with the channel forming region by that thickness.

Figure 34E:
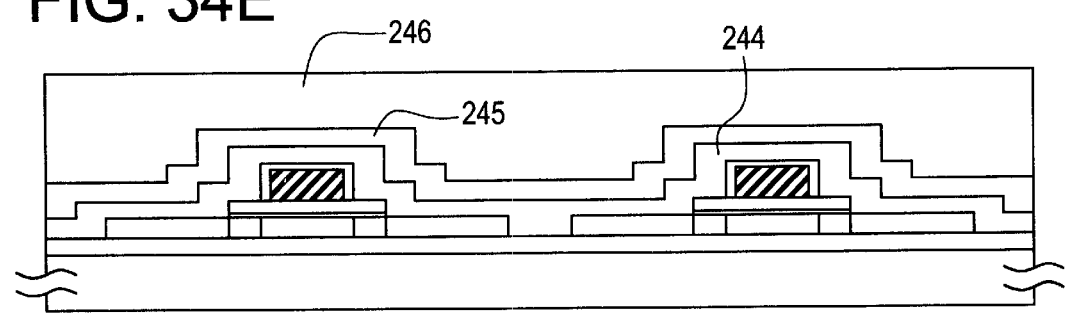
Figure 34F:
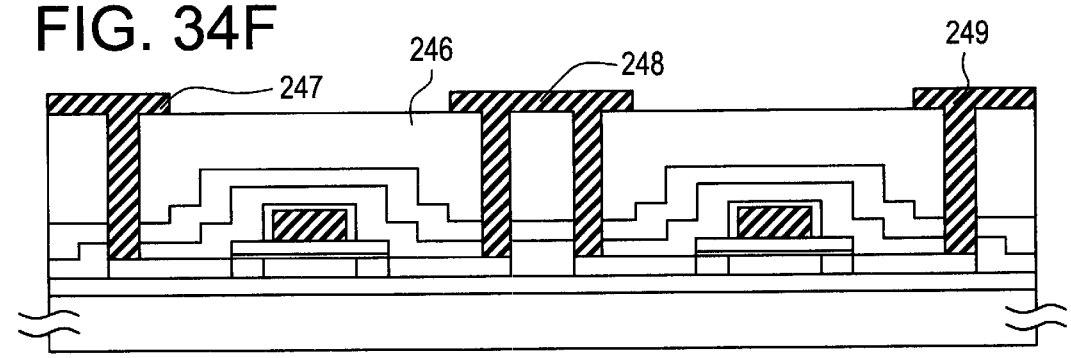

Its existence may be ignored in the case of the present embodiment because the dense anodic oxide films 232 and 233 are so thin as less than 1000 angstrom. Then, laser light is irradiated to anneal the region into which the impurity ions have been injected. Intense light may be also used instead of the laser light. Then, a silicon nitride film 244 and a silicon oxide film 245 are formed as interlayer insulating films as shown in FIG. 34E. Their thickness is 1000 angstrom, respectively. It is noted that the silicon oxide film 245 needs not be formed.

Here, the thin film transistor is covered by the silicon nitride film. The reliability of the thin film transistor may be enhanced by arranging as described above because the silicon nitride film is dense and has an excellent interfacial characteristic. Further, an interlayer insulating film 246 made from a resin material is formed by means of spin coating. Here, the thickness of the interlayer insulating film 246 is 1 μm.

Then contact holes are created to form a source electrode 247 and a drain electrode 248 of the N-channel type thin film transistor on the left side. In the same time, a source electrode 249 and the drain electrode 248 of the thin film transistor on the right side are formed (the electrode 248 is disposed in common) to complete the thin film transistor shown in FIG. 34F. Thus, the thin film transistor circuit having a CMOS structure-constructed in a complementary manner may be formed.

In the formation shown in the present embodiment, the thin film transistor is covered by the nitride film as well as the resin material. This formation allows to enhance the durability of the thin film transistor, so that movable ions nor moisture hardly infiltrate. Further, it allows to prevent capacitance from being generated between the thin film transistor and wires when a multi-layered wire is formed.

[35-th Embodiment]

A 35-th embodiment relates to a case when nickel element is introduced directly to the surface of the underlying film in the process shown in the 28-th embodiment (FIG. 30). In this case, the nickel element is held in contact on the lower surface of the amorphous silicon film. In the present embodiment, the nickel element is introduced after forming the underlying layer to hold the nickel element in contact on the surface of the underlying layer.

In the present embodiment, acetate nickel aqueous solution containing 10 ppm nickel (in terms of weight) is applied to the surface of the underlying film to introduce the nickel element and an amorphous silicon film is formed on the surface. Then, a crystal silicon film 173 in which the concentration of nickel has been reduced is obtained as shown in FIG. 30E by implementing the other processes in the same manner with the case of the 28-th embodiment. Beside the method of using the solution, sputtering, CVD or adsorption may be used as the method for introducing nickel element, i.e. a metal element which promotes crystallization of silicon.

[36-th Embodiment]

Figure 31E:
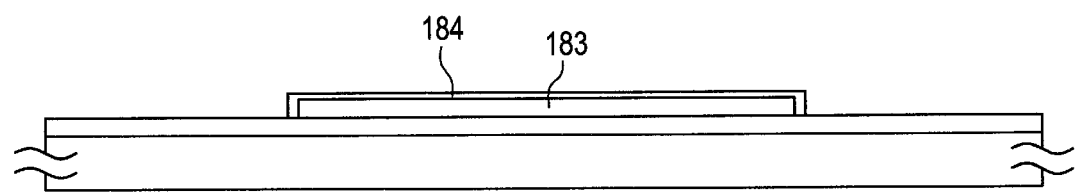

A 36-th embodiment relates to a case of improving the crystallinity of an island pattern formed of a crystal silicon film obtained by irradiating laser light in the state shown in FIG. 31E, the state shown in FIG. 32A or the state shown in FIG. 33A. According to the present embodiment, a predetermined annealing effect can be obtained with relatively low irradiation energy density by irradiating the laser light in the state shown in FIGS. 31E, 32A and 33A. This effect is considered to have been effected because the laser energy is irradiated to a spot of small area, thus enhancing the efficiency of energy utilized in the annealing.

[37-th Embodiment]

A 37-th embodiment relates to a case in which patterning of an active layer of a thin film transistor is devised in order to enhance the effect of annealing by the irradiation of laser light. FIGS. 35A through 35F show a process for fabricating the thin film transistor according to the present embodiment.

At first, a silicon oxide film or silicon oxynitride film 251 is formed as an underlying layer on a Corning 1737 glass substrate 250. Next, an amorphous silicon film is formed in a thickness of 500 angstrom by using the low pressure thermal CVD. It is noted that this amorphous silicon film turns out to be a crystal silicon film 252 through the crystallization process described below.

Figure 35A:
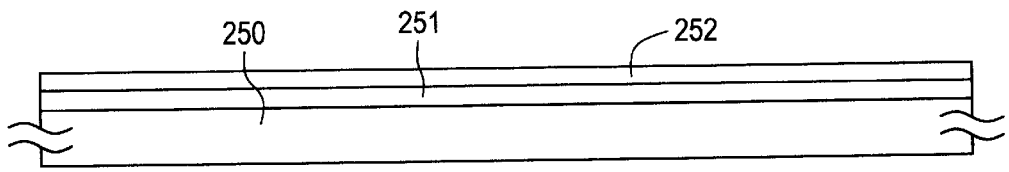
FIGS. 35A through 35F are diagrams showing fabrication steps according to a 37-th embodiment.

Next, the amorphous silicon film is crystallized by the method shown in the 28-th and 29-th embodiments (FIGS. 30 and 31) to obtain the crystal silicon film. Thus, the state shown in FIG. 35A is obtained. After that, the crystal silicon film 252 is formed on the glass substrate in accordance to the process shown in the 28-th and 29-th embodiments. That is, the amorphous silicon film is crystallized by the heat treatment using nickel element to obtain the crystal silicon film 252. The heat treatment is implemented at 62° C. for four hours. The process described below applies to the both crystal silicon films fabricated in accordance to the processes of the 28-th and 29-th embodiments.

After obtaining the crystal silicon film, a pattern 253 for constructing an active layer of a thin film transistor is formed. At this time, the pattern is formed so as to have a profile 254 shown in FIG. 353 in order to suppress the shape of the pattern from being deformed in the later treatment step of irradiating laser light.

Figure 36A:
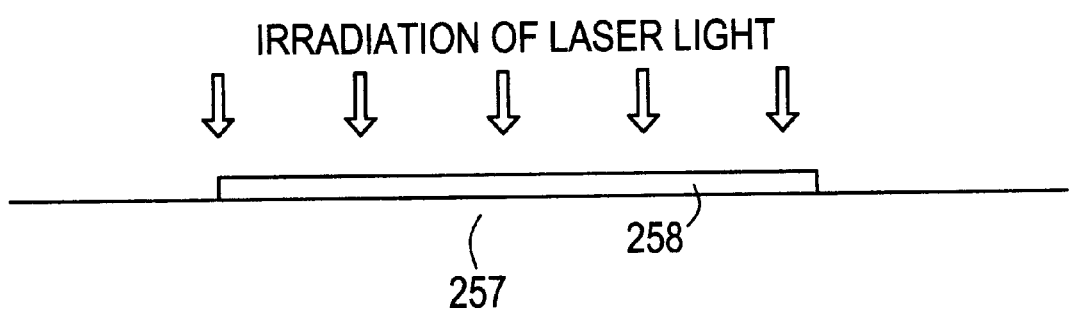
FIGS. 36A and 36B are diagrammatic view for explaining a phenomenon when laser light is irradiated to the surface of the crystal silicon film.
Figure 36B:
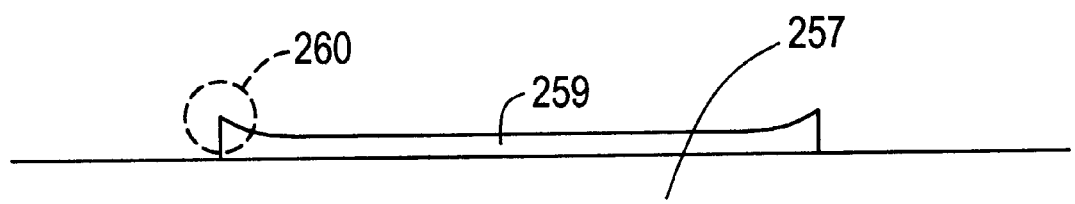

In general, when laser light is irradiated to a pattern 258 made from a normal island-shape silicon film formed on a base 257 as shown in FIG. 36A, a convex portion 260 is formed at the edge of a pattern 259 after the irradiation of the laser light as shown in FIG. 36B. It is considered to happen because energy of the irradiated laser light is concentrated at the edge of the pattern where heat cannot be released.

Figure 35B:
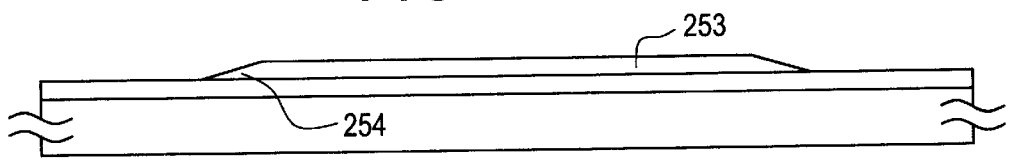

The above-mentioned phenomenon may become a factor of defective wires composing a thin film transistor or of defective operation thereof later. Then, the pattern 235 of the active layer is formed so as to have the profile as shown in FIG. 35B in the formation of the present embodiment. Such formation allows to suppress the pattern of the silicon film from being deformed like the one shown in FIG. 36B when laser light is irradiated.

It is preferable to set an angle of the part designated by the reference numeral 254 from 20° to 50°. It is not preferable to set the angle 254 below 20° because an area occupied by the active layer increases and it becomes difficult to form it. Further, it is not also preferable to set the angle 254 above 50° because the effect or suppressing the shape as shown in FIG. 36B from being formed drops.

Figure 35C:
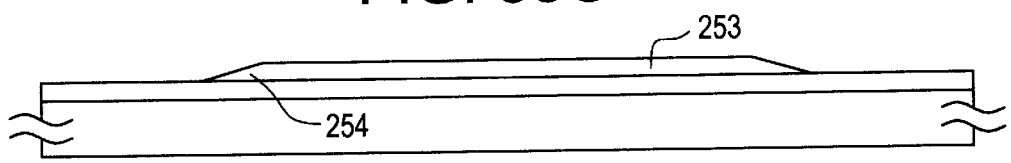

The pattern 253 may be realized by utilizing isotropic dry etching and by controlling the conditions of this dry etching in patterning it. After obtaining the pattern (which turns out to be the active layer later) having the shape 253 in FIG. 35B, laser light is irradiated as shown in FIG. 35C. This step allows to diffuse the nickel element which is locally gathered within the pattern 253 and to promote the crystallization of the pattern.

After finishing to irradiate laser light, a heat treatment is implemented within an oxygen atmosphere containing 3 volume % of HCl to form a thermal oxide film 255. The thermal oxide film is formed in 100 angstrom thick by implementing the heat treatment for 12 hours in the oxygen atmosphere containing HCl at 650° C. The nickel element contained in the pattern 253 is gettered to the thermal oxide film by the action of chlorine. At this time, because the block of the nickel element has been destroyed and diffused through the irradiation of laser light in the previous step, the gettering of the nickel element is effectively performed.

Further, the gettering is performed also from the side of the pattern 253 when the formation as shown in the present embodiment is adopted. This is useful in enhancing the OFF current characteristics and the reliability of the thin film transistor finally completed. It is because the existence of metal element which is typified by nickel element which promotes crystallization of silicon and which exists in the side of the active layer exerts a wide influence over the increase of OFF current and the instability of the characteristics.

Figure 35D:
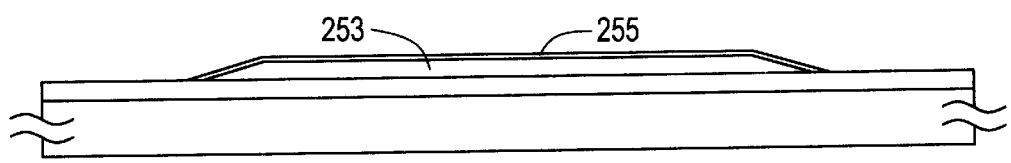
Figure 35E:
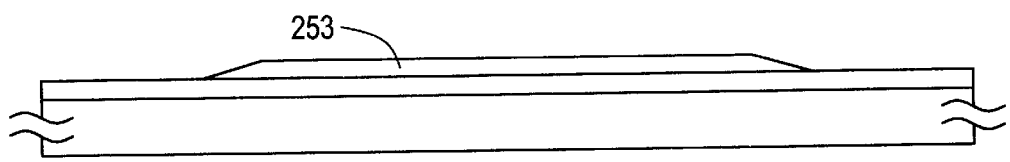
Figure 35F:
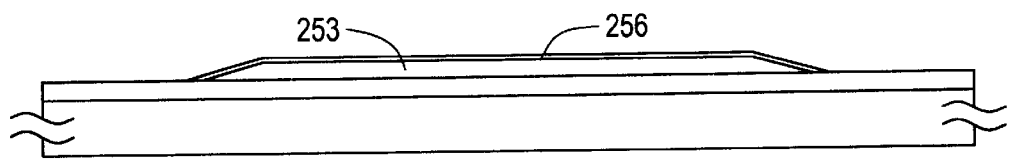

After forming the thermal oxide film 255 for gettering as shown in FIG. 35D, it is eliminated. Thus, the state shown In FIG. 35E is obtained. It is concerned that the silicon oxide film 251 might be etched in the step of eliminating the thermal oxide film 255 when the silicon oxide film is adopted as the underlying layer. However, it does not matter so much when the thickness of the thermal oxide film 255 is as thin as 100 angstrom as shown in the present embodiment.

After obtaining the state shown in FIG. 35E, a new thermal oxide film 256 is formed in a thickness of 100 angstrom by a heat treatment in an atmosphere of 100% oxygen at 650° C. The thermal oxide film 256 is effective in suppressing the surface of the pattern 253 from being roughened when the laser light is irradiated later. The thermal oxide film 256 also forms a part of a gate insulating film later.

Because the thermal oxide film 256 has a very excellent interfacial characteristic with the crystal silicon film, it is useful to utilize it as part of the gate insulating film. The laser light may be irradiated again after forming the thermal oxide film 256. Thus, the crystal silicon film 253 from which the concentration of nickel element has been reduced and which has a high crystallinity may be obtained. Thereafter, the thin film transistor is fabricated by going through the process shown in FIG. 32 or 33.

[38-th Embodiment]

A 38-th embodiment relates to a case devised in applying a heat treatment at a temperature more than a distortion point of a glass substrate. It is preferable to perform the process for gettering the metal element which promotes crystallization of silicon in the present invention at a high temperature as much as possible.

When the Corning 1737 glass substrate (distortion point: 667° C.) is used for instance, the higher gettering effect can be obtained when the temperature in gettering nickel element by forming the thermal oxide film is 700° C. rather than when it is 650° C. However, if the heating temperature for forming the thermal oxide film is set at 700° C. while using the Corning 1737 glass substrate, the glass substrate deforms as a result.

The present embodiment is to solve this problem. That is, according to the arrangement shown in the present embodiment, the glass substrate is placed on a lapping plate which is formed of quartz whose flatness is guaranteed and the heat treatment is implemented in this state. Thereby, the flatness of the softened glass substrate is maintained by the flatness of the lapping plate. It is noted that it is also important to implement cooling also in the state in which the glass substrate is placed on the lapping plate. The adoption of such arrangement allows the heat treatment to be implemented even at a temperature more than the distortion point of the glass substrate.

[39-th Embodiment]

A 39-th embodiment relates to a case of obtaining a crystal silicon film on a glass substrate by utilizing nickel element. In the present embodiment, the crystal silicon film having a high crystallinity is obtained by the action of nickel element at first. Then, laser light is irradiated to enhance the crystallinity of the film and to diffuse the nickel element which is concentrated locally within the film, i.e. to extinguish blocks of nickel.

Next, an oxide film is formed on the crystal silicon film by thermal oxidation. At this time, the nickel element remaining in the crystal silicon film is gettered to the thermal oxide film. At this time, because the nickel element is dispersed therein by the irradiation of laser light, the gettering proceeds effectively. Then, the thermal oxide film containing the nickel element in high concentration as a result of the gettering is eliminated. Thereby, the crystal silicon film in which the concentration of nickel element is low, while having the high crystallinity, is obtained on the glass substrate.

FIGS. 37A through 37E are diagrams showing the fabrication process according to present embodiment. At first, a silicon oxynitride film 262 is formed as an underlying film in a thickness of 3000 angstrom on the glass substrate 261 of Corning 1737 (distortion point: 667° C.). The silicon oxynitride film is formed by using the plasma CVD using silane, $N_2O$ gas and oxygen as original gases in the present embodiment. The plasma CVD using TEOS gas and $N_2O$ gas may be also used instead of that.

The silicon oxynitride film has a function of suppressing the diffusion of impurities from the glass substrate in the later steps (seeing from the level of fabrication of a semiconductor, the glass substrate contains a large amount of impurities). It is noted that although the silicon nitride film is the most suitable to obtain the function for suppressing the diffusion of the impurities in maximum, the silicon nitride film is not practical because it is peeled off from the glass substrate due to the influence of stress. A silicon oxide film may be also used as the underlying film.

It is also important to increase the hardness of the underlying film 262 as much as possible. It is concluded from the fact that the harder the hardness of the underlying film (i.e. the smaller the etching rate thereof), the higher the reliability is in an endurance test of the thin film transistor obtained in the end. The reason thereof is assumed to be caused by the effect of blocking the impurities from the glass substrate in the fabrication process of the thin film transistor.

It is also effective to contain a small amount of halogen element typified by chlorine in the underlying film 262. Thereby, the metal element which promotes crystallization of silicon and exists within the semiconductor layer may be gettered by the halogen element in the later step. It is also effective to add a hydrogen plasma treatment after forming the underlying film. It is also effective to implement a plasma treatment in an atmosphere in which oxygen and hydrogen are mixed. These treatments are effective in eliminating carbon component which is adsorbed on the surface of the underlying film and in enhancing the characteristic of interface with a semiconductor film formed later.

Next, an amorphous silicon film 263, which turns out to be a crystal silicon film later, is formed in a thickness of 500 angstrom by the low pressure thermal CVD. The reason why the low pressure thermal CVD is used is because thereby, the quality of the crystal silicon film obtained later is better, i.e. the film quality is denser in concrete. Beside the low pressure thermal CVD, the plasma CVD or the like may be used.

The amorphous silicon film fabricated here is desirable to have $5 \times 10^{17}$ $cm^{-3}$ to $2 \times 10^{19}$ $cm^{-3}$ of concentration of oxygen within the film. It is because oxygen plays an important role in the later step of gettering the metal element which promotes crystallization of silicon. However, it must be careful here because the crystallization of the amorphous silicon film is hampered if the oxygen concentration is higher than the above-mentioned range of concentration. The concentration of other impurities such as those of nitrogen and carbon is preferred to be low to the utmost. In concrete, the concentration must be below $2 \times 10^{19}$ cm$^{-3}$.

The upper limit of the thickness of the amorphous silicon film is about 2000 angstrom. It is because a thick film is disadvantageous in obtaining the effect of the irradiation of laser light implemented later. That is, the most of laser light irradiated to a silicon film is absorbed by the surface of the film. The lower limit of the thickness of the amorphous silicon film 263 is practically about 200 angstrom, though it depends on a method for forming the film.

Next, nickel element is introduced to the amorphous silicon film 263 to crystallize it. Here, the nickel element is introduced by applying nickel acetate solution containing 10 ppm (weight conversion) of nickel on the surface of the amorphous silicon film 263. Beside the method of using the above-mentioned solution, sputtering, CVD, plasma treatment or adsorption may be used as the method for introducing the nickel element. Among them, the method of using the solution is useful in that it is simple and that the concentration of the metal element may be readily adjusted.

Figure 37A:
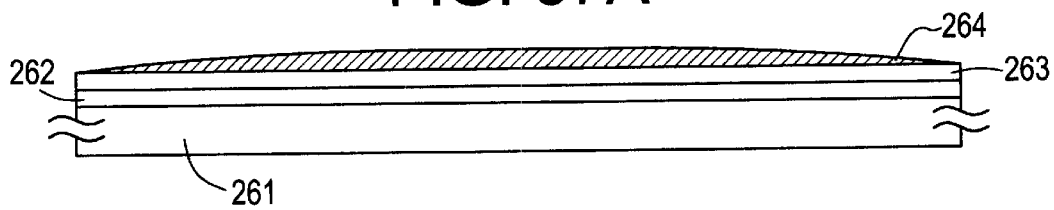
FIGS. 37A through 37E are diagrams showing fabrication steps according to a 39-th embodiment.

The nickel acetate solution is applied as described above to form a water film (liquid film) 264 of the nickel acetate aqueous solution as shown in FIG. 37A. After obtaining this state, extra solution is blown out by using a spin coater not shown. Thus, the nickel element is held in contact on the surface of the amorphous silicon film 263. It is noted that it is preferable to use nickel sulfate solution, Instead of the nickel acetate, if the remained impurities in the later heating process is taken into consideration. It is because the nickel acetate aqueous solution contains carbon and it might be carbonized in the later heating process, thus remaining within the film. An amount of the nickel element to be introduced may be controlled by adjusting the concentration of nickel element within the solution.

Figure 37B:
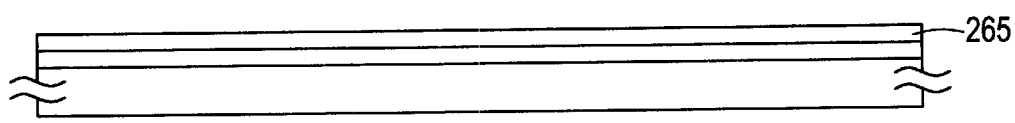

Next, a heat treatment is implemented in the temperature range from 550° C. to 650° C. in the state shown in FIG. 37B to crystallize the amorphous silicon film 263 and to obtain a crystal silicon film 265. This heat treatment is implemented in a reducing atmosphere. The temperature of this heat treatment is preferable to be a temperature below the distortion point of the glass substrate. Because the distortion point of the Corning 1737 glass substrate is 667° C., it is preferable to set the upper limit of the heating temperature here at about 650° C., leaving some margin.

In the present embodiment, the heat treatment is implemented for four hours at 620° C. within a nitrogen atmosphere containing 3 volume % of hydrogen. The reason why the reducing atmosphere is adopted in the crystallization step in a way of the heat treatment is to prevent oxides from being created in the step of the heat treatment and more concretely, to suppress nickel from reacting with oxygen and NiOx from being created on the surface of the film or within the film.

Oxygen couples with nickel and contributes a lot in gettering nickel in the lacer gettering step. However, has been found that if oxygen couples with nickel in tare above-mentioned stage of the crystallization, it hampers the crystallization. Accordingly, it is important to suppress the oxides from being created to the utmost in the crystallization step in a way of heating.

The concentration of oxygen within the atmosphere for implementing the heat treatment for the crystallization has to be in an order of ppm, or preferably, less than 1 ppm. Inert gases such as argon, beside nitrogen, or their mixed gas may be used as the gas which occupies the most of the atmosphere for implementing the heat treatment for the crystallization.

After the crystallization step by the heat treatment described above, nickel element remains in certain blocks. It has been confirmed by an observation through a TEM (Transmission type Electron Microscope). While the reason why nickel exists in certain blocks has not been clarified yet, it is considered to be related with some crystallization mechanism.

Figure 37C:
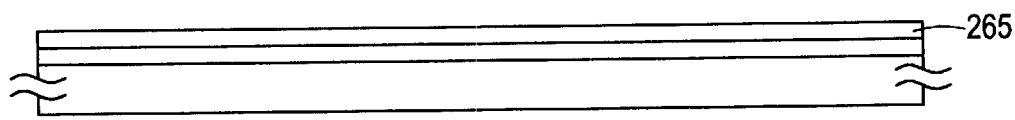

Next, laser light is irradiated as shown in FIG. 37C. Here, KrF excimer laser (wavelength: 248 nm) is used. The irradiation is implemented by scanning the laser beam whose shape is linear. The irradiation of the laser light allows the nickel element which has been concentrated locally as a result of the crystallization by means of the above-mentioned heat treatment to be distributed within the film 265 in some degree. That is, it allows to extinguish the blocks of nickel element and to distribute the nickel element.

Figure 37D:
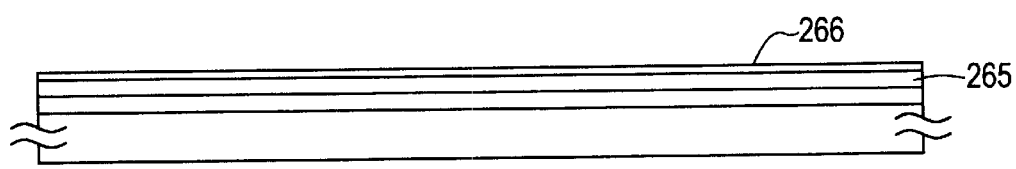

Another heat treatment is implemented in a step in FIG. 37D to form a thermal oxide film for gettering the nickel element. This neat treatment is implemented within an atmosphere of 100% oxygen at 640° C. for 12 hours. As a result of this step, the thermal oxide film is formed in a thickness of 100 angstrom.

This step is carried out to eliminate the nickel element (or other metal element which promotes crystallization of silicon) which has been introduced intentionally for the crystallization in the initial stage from the crystal silicon film 265. This heat treatment is implemented at a temperature higher than that of the heat treatment implemented for the crystallization described above. It is an important condition for effectively implementing the gettering of nickel element. It is noted that although this heat treatment may be implemented in the same or less temperature in the heat treatment implemented for the crystallization, it is less effective.

This heat treatment is implemented in the temperature range from 600° C. to 750° C. upon meeting the above-mentioned condition. The effect for gettering nickel element may be obtained remarkably in this step if the temperature is higher than 600° C. In this step, the nickel element which has been distributed by the irradiation of laser light described above is gettered effectively to the oxide film. The upper limit of the heating temperature is limited by the distortion point of the glass substrate to be used.

It must be careful not to implement the heat treatment in a temperature above the distortion point of the glass substrate to be used because, otherwise, it is deformed. It is noted, in this regard, that the heat treatment may be implemented above the distortion point of the glass substrate to be used by placing the glass substrate on the lapping plate made from quartz for example whose flatness is guaranteed and by implementing the heat treatment in this state as described in the 38-th embodiment.

Because the thermal oxide film 266 is formed, the thickness of the crystal silicon film 263 reaches to about 450 angstrom. When the heating temperature is 600° C. to 750° C. in the heat treatment, the treatment time (heating time) is set at 10 hours to 48 hours or typically at 24 hours. This treatment time may be set adequately depending on the thickness of the oxide film to be obtained as a matter of course. In this gettering, oxygen existing within the crystal silicon film plays an important role. That is, the gettering of nickel element proceeds in a manner of nickel oxide formed when oxygen couples with nickel.

If the concentration of oxygen is too much, it becomes the factor of hampering the crystallization of the amorphous silicon film 263 in the crystallization step shown in FIG. 37B as described above. However, the existence thereof plays an important role in the process of gettering nickel as described above. Accordingly, it is important to control the concentration of oxygen existing within the amorphous silicon film, the starting film. Further, because the nickel element is gettered to the oxide film to be formed in the aforementioned step, naturally the nickel concentration within the oxide film becomes high as compared to other regions.

Further, it has been observed that the concentration of nickel element is apt to be high near the interface between the crystal silicon film 265 and the thermal oxide film 266. It is considered to happen because the region where the gettering mainly takes place is on the side of the oxide film near the interface between the crystal silicon film and the oxide film. The gettering proceeding near the interface is considered to be caused by the existence of stress and defects near the interface.

Figure 37E:
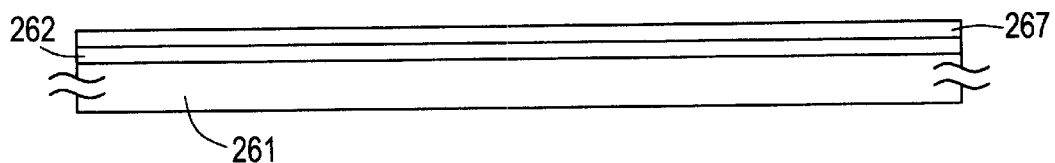

Next, the thermal oxide film 266 containing nickel in high concentration is eliminated. While the thermal oxide film 266 may be eliminated by means of dry etching or wet etching using buffer hydrofluoric acid or other hydrofluorite (hydrofluoric) etchant, it is implemented by the wet etching by using the buffer hydrofluoric acid in the present embodiment. Thus, a crystal silicon film 267 in which the concentration of nickel has been reduced is obtained as shown in FIG. 37E.

Because nickel element is contained near the surface of the obtained crystal silicon film 267 relatively in high concentration, it is effective to advance the etching of the above-mentioned oxide film 266 to over-etch, more or less, the surface of the crystal silicon film 267. It is also effective to irradiate laser light again after eliminating the thermal oxide film 266 to promote the crystallization of the obtained crystal silicon film 267 further. That is, it is effective to irradiate the laser light again after gettering nickel element.

KrF excimer laser (wavelength: 248 nm) is used as the laser light to be used in the present embodiment. However, XeCl excimer laser (wavelength: 308 nm) and other types of lasers may be also used. Further, it is possible to arrange so as to irradiate ultraviolet ray or infrared ray, instead of the laser light.

[40-th Embodiment]

A 40-th embodiment relates to a case when Cu is used as the metal element which promotes crystallization of silicon in the arrangement shown in the 39-th embodiment. In this case, cupric acetate [Cu(CH$_3$ COO)$_2$] and cupric chloride (CuCl$_2$ 2H$_2$O) may be used as the solution for introducing Cu. The latter is used in the present embodiment. A crystal silicon film 267 in which the concentration of copper content has been reduced is obtained as shown in FIG. 37E by implementing other processes in the same manner with the 39-th embodiment.

[41-st Embodiment]

A 41-st embodiment relates to a case of growing crystal in the form different from that in the 39-th embodiment. That is, the present embodiment relates to a method of growing the crystal in a direction parallel to the substrate, i.e. a method called lateral growth, by utilizing the metal element which promotes crystallization of silicon.

FIGS. 38A through 38E show the fabrication process according to the 41-st embodiment. At first, a silicon oxynitride film is formed an underlying film 269 in a thickness of 3000 angstrom on the Corning 1737 glass substrate 268. It is noted that a quartz substrate may be used instead of the glass substrate. Next, an amorphous silicon film 270 which is the starting film of a crystal silicon film is formed in a thickness of 600 angstrom by low pressure thermal CVD. The thickness of the amorphous silicon film is preferable to be less than 2000 angstrom as described before. It is noted that plasma CVD may be also used instead of the low pressure thermal CVD.

Next, a silicon oxide film not shown is formed in a thickness of 1500 angstrom and is patterned to form a mask 271. An opening is created on the mask in a region 272. The amorphous silicon film 270 is exposed at the region where the opening 272 is created. The opening 272 has a thin and long rectangular shape in the longitudinal direction from the depth to the front side of the figure. Preferably, the width of the opening 272 is 20 μm or more. The length thereof in the longitudinal direction may be determined as necessary.

Then, the nickel acetate aqueous solution containing 10 ppm of nickel element in terms of weight is applied in the same manner with the 40-th embodiment and the extra solution is removed by implementing spin drying by using a spinner not shown. Thus, the solution is held in contact on the exposed surface of the amorphous silicon film 270 as indicated by a dot line 273 in DIG. 38A.

Next, a heat treatment is implemented at 640° C. for four hours in a nitrogen atmosphere containing 3 volume % of hydrogen and in which oxygen is minimized. Then, crystal grows in the direction parallel to the substrate 268 as indicated by the reference numeral 274 in FIG. 38B. This crystal growth advances from the region of the opening 272 to which nickel element has been introduced to the surrounding part. This crystal growth in the direction parallel to the substrate will be referred to as lateral growth throughout the present specification.

It is possible to advance this lateral growth across more than 100 μm under the conditions shown in the present embodiment. Then, a silicon film 275 having the region in which the crystal has thus grown laterally is obtained. It is noted that crystal growth in the vertical direction called vertical growth advances from the surface of the silicon film to the underlying interface in the region where the opening 272 is formed.

Figure 38A:
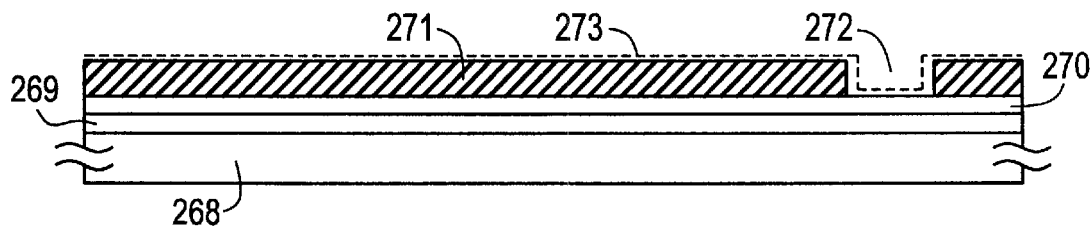
FIGS. 38A through 38E are diagrams showing fabrication steps according to a 41-st embodiment.
Figure 38B:
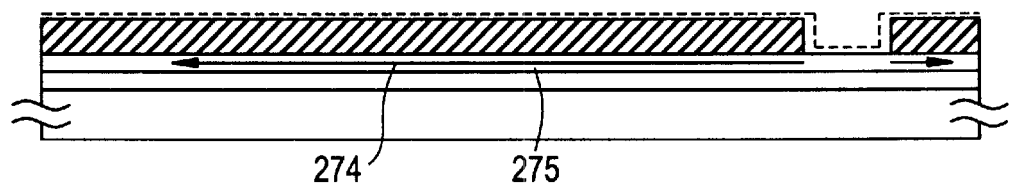
Figure 38C:
Figure 38D:
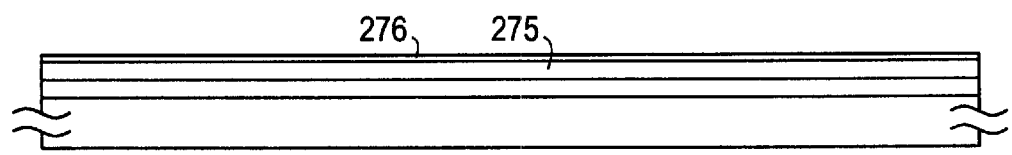

Then, the mask 271 made from the silicon oxide film for selectively introducing nickel element is eliminated. Thus, the state shown in FIG. 38C is obtained. In this state, the vertically grown region, the laterally grown region and a region in which no crystal has grown (having amorphous state) exist within the silicon film 275. In this state, nickel element is unevenly distributed within the film. Specifically, the nickel element exists relatively in high concentration in the region where the opening 272 is created and in the edge portion of the crystal growth indicated by the reference numeral 274.

After obtaining the state shown in FIG. 38C, laser light is irradiated. Here, KrF excimer laser is irradiated in the same manner with the 39-th embodiment to diffuse the nickel element unevenly distributed to create a condition in which gettering may be implemented readily in the later gettering step. After irradiating the laser light, a heat treatment is implemented at 650° C. for 12 hours within an atmosphere of 100% oxygen.

In this step, an oxide film 276 containing nickel element in high concentration is formed. In the same time, the concentration of nickel element within the silicon film 275 may be reduced relatively. Here, the thermal oxide film 276 is formed in a thickness of 100 angstrom. The nickel element gettered when the thermal oxide film has been formed is contained in the thermal oxide film in high concentration.

Further, because the thermal oxide film 276 is formed, the thickness of the crystal silicon film 275 is reduced to about 500 angstrom. Next, the thermal oxide film 276 containing nickel element in high concentration is eliminated. In the crystal silicon film of this state, the nickel element has a distribution of concentration such that it exists in high concentration toward the surface of the crystal silicon film. This is caused by the fact that the nickel element has been gettered to the thermal oxide film when the thermal oxide film 276 has been formed.

Accordingly, it is useful to etch the surface of the crystal silicon film to eliminate the region in which the nickel element exists in high concentration after eliminating the thermal oxide film 276. That is, the crystal silicon film in which the nickel element concentration is reduced further may be obtained by etching the surface of the crystal silicon film in which the nickel element exists in high concentration. However, in this case, the thickness of the silicon film finally obtained needs to be taken into consideration.

Next, patterning is implemented to form a pattern 277 formed of the laterally grown region. The concentration of nickel element which remains within the pattern 277 made from the laterally grown region thus obtained may be reduced further as compared to the case shown in the 39-th embodiment. This is caused by the fact that the concentration of the metal element contained within the laterally grown region is low originally. In concrete, the concentration of nickel element within the pattern 277 made from the laterally grown region may be readily reduced to the order of $10^{17}$ cm$^{-3}$ or less.

When a thin film transistor is formed by utilizing the laterally grown region, a semiconductor device having a higher mobility may be obtained as compared to the case when the vertically grown region as shown in the 39-th embodiment (crystal grows vertically on the whole surface in the case of the 39-th embodiment) is utilized. It is noted that it is useful to implement the etching process further after forming the pattern shown in FIG. 38E to eliminate the nickel element existing on the surface of the pattern.

Next, a thermal oxide film 278 is formed after forming the pattern 277 as described above. This thermal oxide film 278 is formed in a thickness of 100 angstrom by implementing a heat treatment for 12 hours in an oxygen atmosphere at 650° C. This thermal oxide film becomes a part of a gate insulating film later in constructing a thin film transistor. When the thin film transistor is fabricated after that, a silicon oxide film is formed by plasma CVD or the like over the thermal oxide film 278 to form the gate insulating film together with the thermal oxide film 278.

[42-nd Embodiment]

A 42-nd embodiment relates to a case of fabricating a thin film transistor disposed in a pixel region of an active matrix type liquid crystal display or an active matrix type EL display. FIGS. 39A through 39E show the fabrication process according to the present embodiment.

Figure 39A:
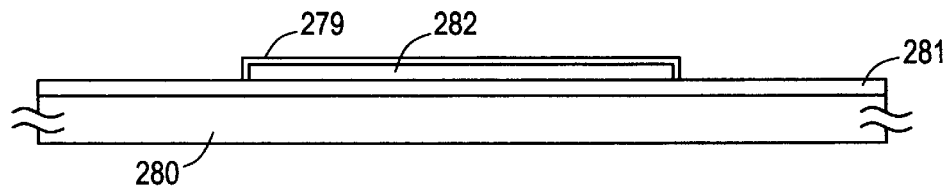
FIGS. 39A through 39E are diagrams showing fabrication steps according to a 42-nd embodiment.

At first, the crystal silicon film is formed on the glass substrate through the process shown in the 39-th or 41-st embodiment. When the crystal silicon film is obtained through the arrangement shown in the 39-th embodiment, it is patterned and the state shown in FIG. 39A is obtained. In FIG. 39A, the reference numeral (280) denotes a glass substrate, (281) an underlying film, and (282) an active layer formed of the crystal silicon film. After obtaining the state shown in FIG. 39A, a plasma treatment is implemented within a reduced pressure atmosphere in which oxygen and hydrogen are mixed. The plasma is generated by high-frequency discharge.

Organic substances existing on the surface of the exposed active layer 282 may be removed by the plasma treatment. Specifically, the organic substances adsorbing on the surface of the active layer are oxidized by oxygen plasma and the oxidized organic substances are reduced and vaporized by hydrogen plasma. Thus she organic substances existing on the surface of the exposed active layer 282 are removed. The removal of the organic substances is very effective in suppressing fixed charge from existing on the surface of the active layer 282. That is, because the fixed charge caused by the existence of organic substances hampers the operation of the device and renders the characteristics thereof instable, it is very useful to remove it.

After removing the organic substances, thermal oxidation is implemented within an oxygen atmosphere at 640° C. to form a thermal oxide film 279 of 100 angstrom thick. This thermal oxide film has a high interfacial characteristic with a semiconductor layer and composes a part of a gate insulating film later. Thus, the state shown in FIG. 39A is obtained. After that, a silicon oxynitride film 283 which composes the gate insulating film is formed in a thickness of 1000 angstrom. While the film may be formed by using the plasma CVD using mixed gas of silane and $N_2O$ and oxygen or the plasma CVD using mixed gas of TEOS and $N_2O$, the former is used in the present embodiment.

The silicon oxynitride film 283 functions as the gate insulating film together with the thermal oxide film 279. It is also effective to contain halogen element within the silicon oxynitride film. That is, it is possible to prevent the function of the gate insulating film as an insulating film from dropping by the influence of the nickel element (or another metal element which promotes crystallization of silicon) existing within the active layer by fixing the nickel element by the action of the halogen element.

It is significant to use the silicon oxynitride film as the insulating film in that metal element hardly infiltrates to the gate insulating film from its dense film quality. If metal element infiltrates into the gate insulating film, its function as an insulating film drops, thus causing instability and dispersion of characteristics of the thin film transistor. It is noted that a silicon oxide film which is normally used may be also used for the gate insulating film.

After forming the silicon oxynitride film 283 which functions as the gate insulating film, an aluminum film (not shown. It turns out to be a pattern 284 after patterning described later) which functions as a gate electrode later is formed by sputtering. 0.2 weight % of scandium is included within the aluminum film to suppress hillock and whisker from being produced in the later process. The hillock and whisker mean that abnormal growth of aluminum occurs by heating, thus forming needle or prickle-like projections.

After forming the aluminum film, a dense anodic oxide film not shown is formed. The anodic oxide film is formed by using ethylene glycol solution containing 3 weight % of tartaric acid as electrolyte. That is, the anodic oxide film having the dense film quality is formed on the surface of the aluminum film by setting the aluminum film as the anode and platinum as the cathode and by anodizing within this electrolyte. The thickness of the anodic oxide film not shown having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization.

Figure 39B:
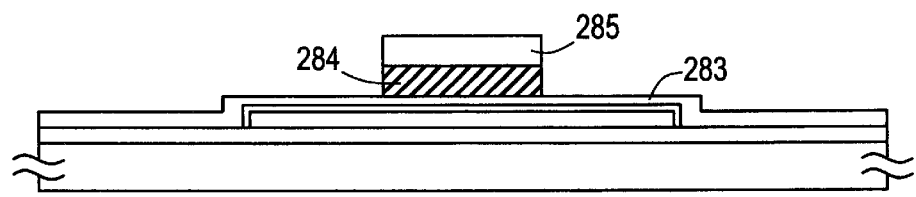
Figure 39C:
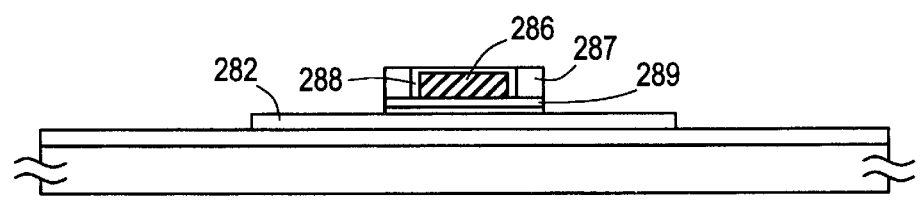

Next, the resist mask 285 is formed and the aluminum film is patterned so as to have a pattern 284. The state shown in FIG. 39B is thus obtained. Here, another anodization is implemented. In this case, 3 weight % of oxalate aqueous solution is used as electrolyte. A porous anodic oxide film 287 is formed by anodizing within this electrolyte by setting the aluminum pattern 284 as the anode.

In this step, the anodic oxide film 287 is formed selectively on the sides of the aluminum pattern 284 because the resist mask 285 having the high adhesiveness exists thereabove. The anodic oxide film may be grown up to several μm thick. The thickness is 6000 angstrom in the present embodiment. It is noted that the range of growth may be controlled by adjusting an anodizing time.

Next, the resist mask 285 is removed. Then, a dense anodic oxide film is formed again. That is, the anodization is implemented again by using the ethylene glycol solution containing 3 weight % of tartaric acid as electrolyte. Then, an anodic oxide film 288 having a dense film quality is formed because the electrolyte infiltrates into the porous anodic oxide film 287. This dense anodic oxide film 288 is 1000 angstrom thick. The thickness is controlled by adjusting applied voltage.

Figure 39D:
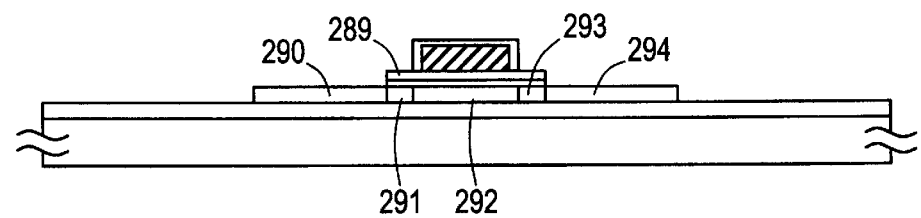

Here, the exposed silicon oxynitride film 283 and the thermal oxide film 279 are etched by utilizing dry etching. Then, the porous anodic oxide film 287 is eliminated by using mixed acid in which acetic acid, nitric acid and phosphoric acid are mixed. Thus, the state shown in FIG. 39D is obtained. After obtaining the state shown in FIG. 39D, impurity ions are injected. Here, P (phosphorus) ions are injected by plasma doping in order to fabricate an N-channel type thin film transistor. In this step, heavily doped regions 290 and 294 and lightly doped regions 291 and 293 are formed because part of the remaining silicon oxide film 289 functions as a semi-permeable mask, thus blocking part of the injected ions.

Next, laser light or intense light is irradiated to activate the regions into which the impurity ions have been injected. The irradiation is implemented by using an infrared lamp here. Thus, a source region 290, a channel forming region 292, a drain region 294 and low concentration impurity regions 291 and 293 are formed in a manner of self-alignment. The one designated by the reference numeral 293 here is the region called the LDD (lightly doped drain).

It is noted that when the dense anodic oxide film 288 is formed so thick to be more than 2000 angstrom, an offset gate region may be formed on the outside of the channel forming region 292 by its thickness. Although the offset gate region is formed also in the present embodiment, it is not shown in the figures because its size is small, its contribution due to the existence thereof is small and the figures might otherwise become complicated.

Figure 39E:
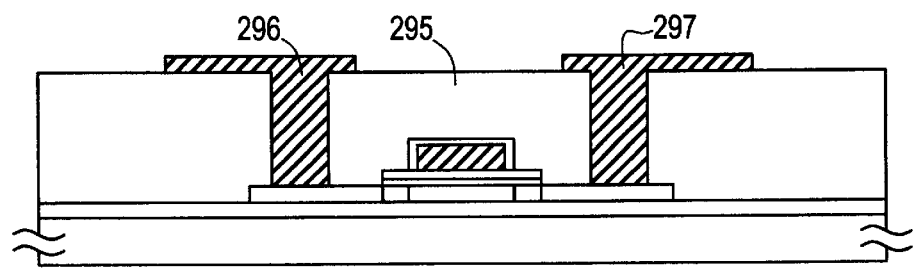

Next, a silicon oxide film or a silicon nitride film or their laminated film is formed as an interlayer insulating film 295. The silicon nitride film is used in the present embodiment. The interlayer insulating film 295 may be constructed by forming a layer made from a resin material on the silicon oxide film or the silicon nitride film. Then, contact holes are created to form a source electrode 296 and a drain electrode 297. Thus, the thin film transistor shown in FIG. 39E is completed.

[43-rd Embodiment]

A 43-rd embodiment is related to a method for forming the gate insulating film 283 in the arrangement shown in the 42-nd embodiment. Thermal oxidation may be used as a method for forming the gate insulating film when a quartz substrate or a glass substrate having a high heat resistance is used as the substrate. In the present embodiment, the thermal oxidation is used to form the gate insulating film 283 and the thin film transistor having the structure shown in FIG. 39E is obtained by implementing the other process in the same manner with the 42-nd embodiment.

The thermal oxidation allows the film quality to be densified and hence, is useful in obtaining a thin film transistor having stable characteristics. That is, because an oxide film formed by the thermal oxidation is dense as an insulating film and movable electric charge existing therein can be reduced, it is one of the most suitable films as a gate insulating film.

[44-th Embodiment]

A 44-th embodiment relates to a case of fabricating a thin film transistor through a process different from that shown in FIG. 39. FIGS. 40A through 40E show the fabrication process according to the present embodiment. At first, the crystal silicon film is formed on the glass substrate through the process shown in the 39-th embodiment (FIG. 37) or in the 41-st embodiment (FIG. 38). It is then patterned, thus obtaining the state shown in FIG. 40A.

Figure 40A:
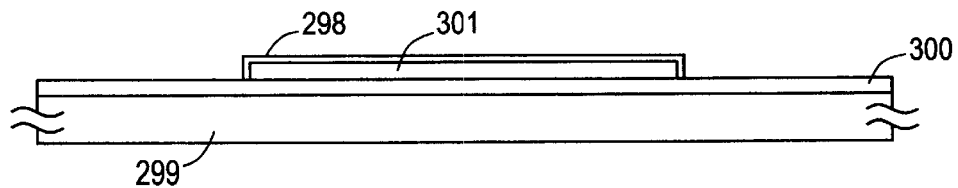
FIGS. 40A through 40E are diagrams showing fabrication steps according to a 44-th embodiment.
Figure 40B:
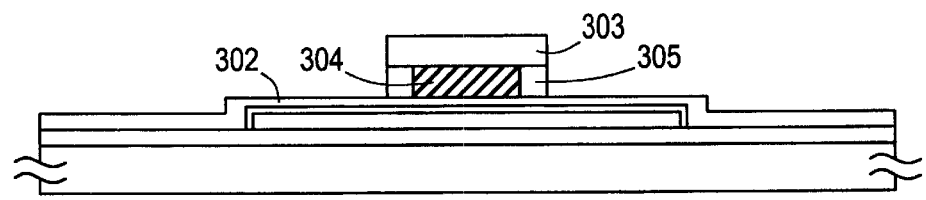
Figure 40C:
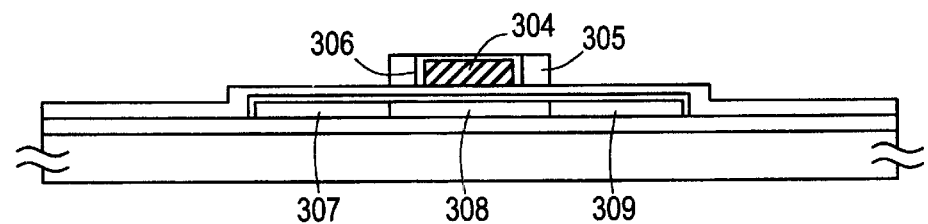

After obtaining the state shown in FIG. 40A, treatment is implemented within the reduced pressure atmosphere in which oxygen and hydrogen are mixed. In the state shown in FIG. 40A, the reference numeral (299) denotes a glass substrate, (300) an underlying film, (301) an active layer formed of the crystal silicon film and (298) a thermal oxide film formed again after eliminating the thermal oxide film for gettering. After obtaining the state shown in FIG. 40A, a silicon oxynitride film 302 which composes a gate insulating film is formed in a thickness of 1000 angstrom. While the film may be formed by using the plasma CVD using mixed gas of oxygen, silane and $N_2O$ or the plasma CVD using mixed gas of TEOS and $N_2O$, the former is used here.

The silicon oxynitride film 302 composes the gaze insulating film together with the thermal oxide film 298. It is noted that a silicon oxide film may be used beside the silicon oxynitride film. After forming the silicon oxynitride film 302 which functions as the gate insulating film, an aluminum film (not shown. It turns out to be a pattern 304 after patterning described later) which functions as a gate electrode later is formed by sputtering. 0.2 weight % of scandium is included within the aluminum film.

After forming the aluminum film, a dense anodic oxide film not shown is formed. The anodic oxide film is formed by using ethylene glycol solution containing 3 weight % of tartaric acid as electrolyte. That is, the anodic oxide film having the dense film quality is formed on the surface of the aluminum film by setting the aluminum film as the anode and platinum as the cathode and by anodizing within this electrolyte. The thickness of the anodic oxide film not shown having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization.

Next, the resist mask 303 is formed and the aluminum film is patterned so as to have the pattern 304. Here, another anodization is implemented. In this case, 3 weight % of oxalate aqueous solution is used as electrolyte. A porous anodic oxide film 305 is formed by anodizing within this electrolyte by setting the aluminum pattern 304 as the anode.

In this step, the anodic oxide film 305 is formed selectively on the sides of the aluminum pattern because the resist mask 303 having the high adhesiveness exists thereabove. The anodic oxide film 305 may be grown up to several μm thick. The thickness is 6000 angstrom in the present embodiment. It is noted that the range of growth may be controlled by adjusting an anodizing time.

Next, after removing the resist mask 303, a dense anodic oxide film is formed again. That is, the anodization is implemented again by using the ethylene glycol solution containing 3 weight % of tartaric acid as electrolyte. Then, an anodic oxide film 306 having a dense film quality is formed because the electrolyte infiltrates into the porous anodic oxide film 305. Here, the initial injection of impurity ions is implemented. This step may be implemented after removing the resist mask 303. A source region 307 and a drain region 309 are formed by injecting the impurity ions. It is noted that no impurity ion is injected to a region 308 at this time.

Figure 40D:
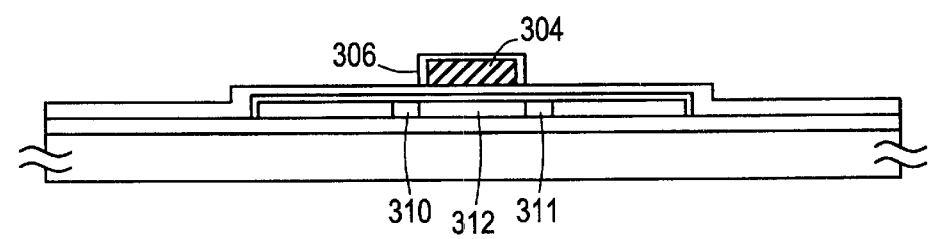

Next, the porous anodic oxide film 305 is eliminated by using mixed acid in which acetic acid, nitric acid and phosphoric acid are mixed. Thus, the state shown in FIG. 40D is obtained. After obtaining the state shown in FIG. 40D, impurity ions are injected again. The impurity ions are injected under the doping condition lighter than that of the first injection. In this step, lightly doped regions 310 and 311 are formed and a region 312 turns out to be a channel forming region.

Then, laser light or intense light is irradiated to activate the regions into which the impurity ions have been injected. The laser light is used here. Thus, the source region 307, the channel forming region 312, the drain region 309 and low concentration impurity regions 310 and 311 are formed in a manner of self-alignment. Here, the one designated by the reference numeral 311 is the region called the LDD (lightly doped drain).

Figure 40E:
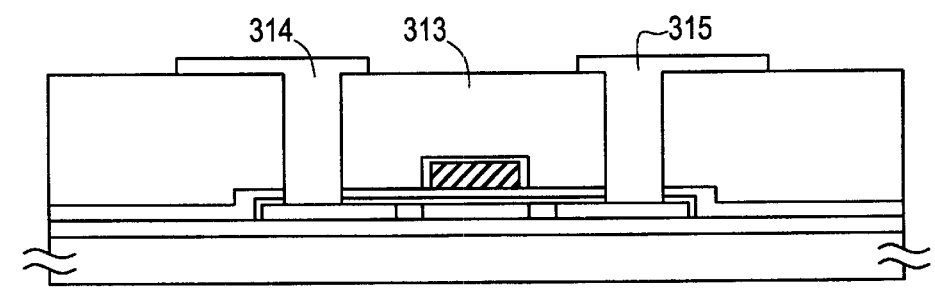

Next, while a silicon oxide film or a silicon nitride film or their laminated film is formed as an interlayer insulating film 313, the laminated film of the silicon oxide film and the silicon nitride film is formed here. The interlayer insulating film may be also constructed by forming a layer made from a resin material on the silicon oxide film or the silicon nitride film. After that, contact holes are created to form a source electrode 314 and a drain electrode 315. Thus, the thin film transistor shown in FIG. 40E is completed.

[45-th Embodiment]

A 45-th embodiment relates to a case when an N-channel type thin film transistor and a P-channel type thin film transistor are formed in a complementary manner. FIGS. 41A through 41F are diagrams showing a fabrication process according to the present embodiment. The formation shown in the present embodiment may be utilized for various thin film integrated circuits integrated on an insulating surface as well as for peripheral driving circuits of an active matrix type liquid crystal display for example.

Figure 41A:
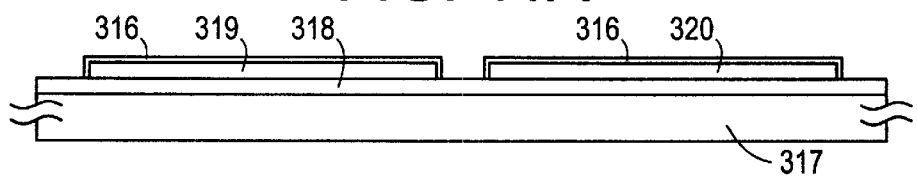
FIGS. 41A through 41F are diagrams showing fabrication steps according to a 45-th embodiment.

At first, a silicon oxide film or a silicon oxynitride film is formed as an underlying film 318 on a glass substrate 317 as shown in FIG. 41A. It is preferable to use the silicon oxynitride film, and it is used in the present embodiment. Next, while an amorphous silicon film not shown is formed by the plasma CVD or the low pressure thermal CVD, the latter is used here. Then, the amorphous silicon film is transformed into a crystal silicon film by the method shown in the 39-th embodiment.

Next, a plasma treatment is implemented within an atmosphere in which oxygen and hydrogen are mixed and the crystal silicon film thus obtained is patterned to obtain active layers 319 and 320. Thus, the state shown in FIG. 41A is obtained. Further, a neat treatment is implemented at 650° C. for 10 hours within a nitrogen atmosphere containing 3 volume % of HCl in the state shown in FIG. 41A in order to suppress the influence of carriers moving the sides of the active layers.

Because an OFF current characteristic becomes bad if a trap level exists due to the existence of metal element on the sides of the active layers, it is useful to implement the above-mentioned treatment to lower the density of the level on the sides of the active layers. Next, a thermal oxide film 316 and a silicon oxynitride film 321 which compose a gate insulating film are formed when quartz is used as the substrate here, it is desirable to compose the gate insulating film only by the thermal oxide film formed by using the above-mentioned thermal oxidation.

Next, an aluminum film (not shown. It turns out to be a pattern after patterning thereof described later) which composes a gate electrode later is formed in a thickness of 4000 angstrom. Beside the aluminum film, a metal which can be anodized, such as tantalum, may be used. After forming the aluminum film, a very thin and dense anodic oxide film is formed on the surface thereof by the method described before.

Figure 41B:
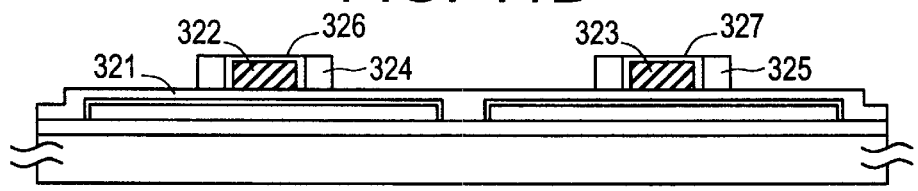

Next, a resist mask not shown is placed on the aluminum film to pattern the aluminum film. Then, anodization is implemented by setting the obtained aluminum pattern as the anode to form porous anodic oxide films 324 and 325. The thickness of the porous anodic oxide films is 5000 angstrom. Then, another anodization is implemented under the condition of forming dense anodic oxide films 326 and 327. The thickness of the dense anodic oxide films 326 and 327 is 800 angstrom. Thus, the state shown in FIG. 41B is obtained. Next, the exposed silicon oxynitride film 321 and the thermal oxide film 316 are eliminated by dry etching, thus obtaining the state shown in FIG. 41C as a result.

Figure 41C:
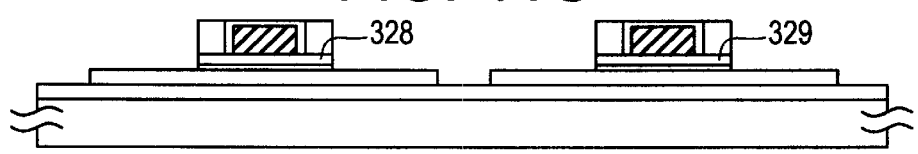
Figure 41D:
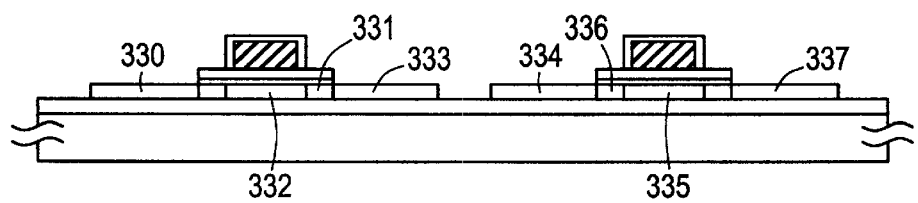

After obtaining the state shown in FIG. 41C, the porous anodic oxide films 324 and 325 are eliminated by using mixed acid in which acetic acid, nitric acid and phosphoric acid are mixed. Thus, the state shown in FIG. 41D is obtained. Here, resist masks are disposed alternately to inject P (phosphorus) ions to the thin film transistor on the left side and B (boron) ions to the thin film transistor on the right side. By injecting those impurity ions, a source region 330 and a drain region 333 to which P ions are doped in high concentration, thus having N-type, are formed in a manner of self-alignment.

Further, a region 331 to which P ions are doped in low concentration, thus having weak N-type, as well as a channel forming region 332 are formed in the same time. The reason why the region 331 having the weak N-type is formed is because the remaining gate insulating film 328 exists. That is, part of P ions transmitting through the gate insulating film 328 is blocked by the gate insulating film 328.

By the same principle, a source region 337 and a drain region 334 having strong P-type are formed in a manner of self-alignment and a low concentration impurity region 336 is formed if she same time. Further, a channel forming region 335 is formed in the same time. It is noted that when the thickness of the dense anodic oxide films 326 and 327 is as thick as 2000 angstrom, an offset gate region may be formed in contact with the channel forming region by that thickness.

Figure 41E:
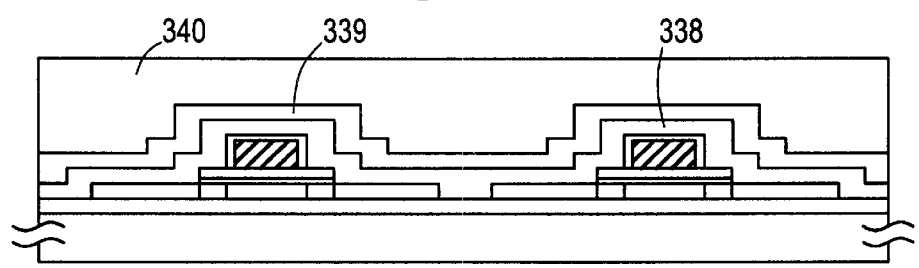
Figure 41F:
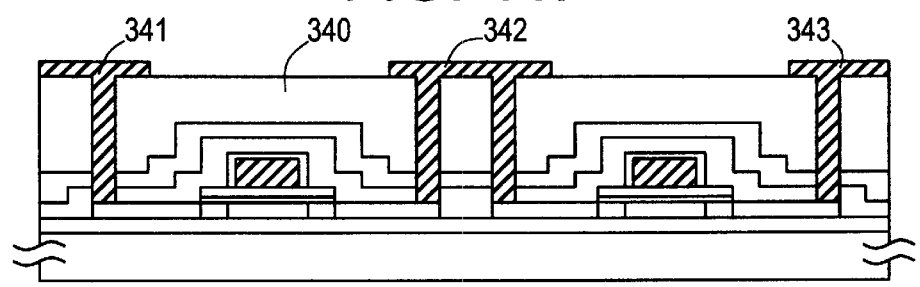

Its existence may be ignored in the case of the present embodiment because the dense anodic oxide films 326 and 327 are so thin as less than 1000 angstrom. Then, laser light is irradiated to anneal the region into which the impurity ions have been injected. Intense light may be also irradiated instead of the laser light. Then, a silicon nitride film 338 and a silicon oxide film 339 are formed as interlayer insulating films as shown in FIG. 41E. Their thickness is 1000 angstrom, respectively. It is noted that the silicon oxide film 339 needs not be formed in this case.

Here, the thin film transistor is covered by the silicon nitride film. The reliability of the thin film transistor may be enhanced by arranging as described above because the silicon nitride film is dense and has an excellent interfacial characteristic. Further, an interlayer insulating film 340 made from a resin material is formed by means of spin coating. Here, the thickness of the interlayer insulating film 340 is 1 μm.

Then, contact holes are created to form a source electrode 341 and a drain electrode 342 of the N-channel type thin film transistor on the left side. In the same time, a source electrode 343 and the drain electrode 342 of the thin film transistor on the right side are formed. The electrode 342 is disposed in common to the both of them. Thus, the thin film transistor circuit having a CMOS structure constructed in a complementary manner may be formed.

In the formation shown in the present embodiment, the thin film transistor is covered by the nitride film as well as the resin material. This formation allows to enhance the durability of the thin film transistor, so that movable ions nor moisture hardly infiltrate. Further, it allows to prevent capacitance from being generated between the thin film transistor and wires when a multi-layered wire is formed.

[46-th Embodiment]

A 46-th embodiment relates to a case when nickel element is introduced directly to the surface of the underlying film in the process shown in the 39-th embodiment. In this case, the nickel element is held in contact on the lower surface of the amorphous silicon film. In the present embodiment, the nickel element is introduced by using acetate nickel aqueous solution after forming the underlying layer to hold the nickel element in contact on the surface of the underlying layer.

Then, a crystal silicon film 267 in which the concentration of nickel has been reduced is obtained as shown in FIG. 37E by implementing the other processes in the same manner with the case of the 39-th embodiment. Beside the method of using the solution, sputtering, CVD or adsorption may be used as the method for introducing nickel element. Further, the crystal silicon film in which the concentration of metal element has been reduced can be obtained even when the metal element which promotes crystallization of silicon is used, beside nickel.

[47-th Embodiment]

Figure 38E:
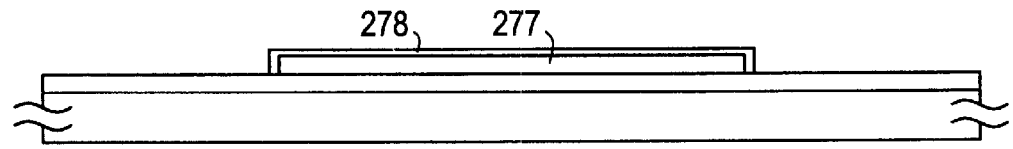

A 47-th embodiment relates to a case of improving the crystallinity of an island pattern formed of a crystal silicon film obtained by irradiating laser light in the state shown in FIG. 38E, the state shown in FIG. 39A or the state shown in FIG. 40A. A predetermined annealing effect can be obtained with relatively low irradiation energy density by irradiating the laser light in the state shown in FIGS. 38E, 39A and 40A. This effect is considered to have been effected because the laser energy is irradiated to a spot of small area, thus enhancing the efficiency of energy utilized in the annealing.

[48-th Embodiment]

A 48-th embodiment relates to a case in which patterning of an active layer of a thin film transistor is devised in order to enhance the effect of annealing by the irradiation of laser light. FIGS. 42A through 42F show a process for fabricating the thin film transistor according to the present embodiment. At first, a silicon oxide film or silicon oxynitride film is formed as an underlying layer on a Corning 1737 glass substrate 344.

Next, an amorphous silicon film not shown is formed in a thickness of 500 angstrom by using the low pressure thermal CVD. This amorphous silicon film turns out to be a crystal silicon film 346 through the crystallization process described below. Next, the amorphous silicon film not shown is crystallized by the method shown in the 39-th or 41-st embodiments (FIGS. 37 or 38) to obtain the crystal silicon film.

Figure 42A:
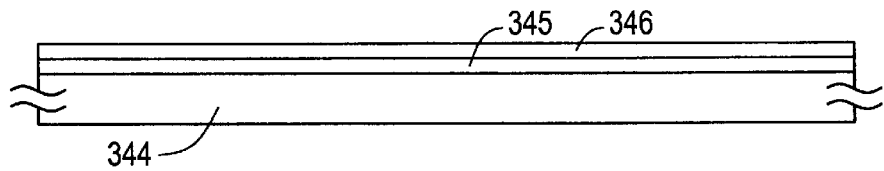
FIGS. 42A through 42F are diagrams showing fabrication steps according to a 48-th embodiment.

Thus, the state shown in FIG. 42A is obtained. The following description will be made centering on the case of the 39-th embodiment, and the same applies to the case of the 41-st embodiment. After obtaining the state shown in FIG. 42A, the crystal silicon film 346 is formed on the glass substrate in accordance to the fabrication process shown in the 39-th embodiment. That is, the amorphous silicon film is crystallized by the heat treatment using nickel element to obtain the crystal silicon film 346. The heat treatment is implemented at 620° C. for four hours.

After obtaining the crystal silicon film, a pattern for constructing an active layer of a thin film transistor is formed. At this time, the pattern is formed so as to have a profile 347 shown in FIG. 42B in order to suppress the shape of the pattern from being deformed in the later treatment step of irradiating laser light.

When laser light is irradiated to a pattern 258 made from a normal island-shape silicon film formed on a base 257 as shown in FIG. 36A, a convex portion 260 is formed at the edge of a pattern 259 after the irradiation of the laser light as shown in FIG. 36B. It is considered to happen because energy of the irradiated laser light is concentrated at the edge of the pattern where heat cannot be released.

Figure 42B:
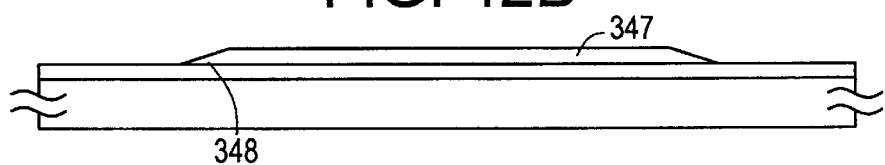

The convex portion 260 formed by the above-mentioned phenomenon may become a factor of defective wires composing a thin film transistor or of defective operation thereof later. Then, the pattern 347 of the active layer is formed so as to have the profile as shown in FIG. 42B in the formation of the present embodiment. Such formation allows to suppress the pattern of the silicon film from being deformed like the one shown in FIG. 36B when laser light is irradiated. The pattern 347 may be realized by utilizing isotropic dry etching and by controlling conditions of the dry etching in patterning it.

It is preferable to set an angle of the part designated by the reference numeral 348 from 20° to 50°. It is not preferable to set the angle 348 below 20° because an area occupied by the active layer increases and it becomes difficult to form it. Further, it is hot also preferable to set the angle 348 above 50° because the effect for suppressing the shape as shown in FIG. 36B from being formed drops.

Figure 42C:
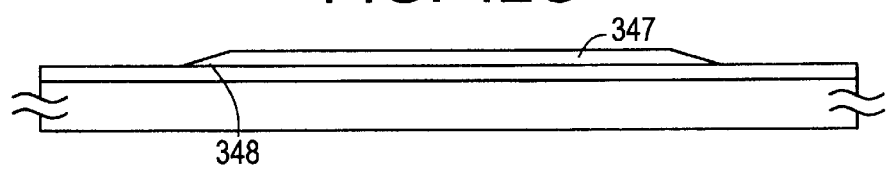

After obtaining the pattern (which turns out to be the active layer later) having the shape 347 in FIG. 42B, laser light is irradiated as shown in FIG. 42C. This step allows to diffuse the nickel element which is locally gathered within the pattern 347 and to promote the crystallization of the pattern. After finishing to irradiate laser light, a heat treatment is implemented within an oxygen atmosphere to form a thermal oxide film 349. The thermal oxide film is formed in 100 angstrom thick by implementing the heat treatment for 12 hours in the atmosphere of 100% oxygen at 650° C.

The nickel element contained in the pattern 347 is gettered to the thermal oxide film 349 by the action of oxygen. At this time, because the block of the nickel element has been destroyed through the irradiation of laser light in the previous step, the gettering of the nickel element is effectively performed. It is noted that the gettering of nickel element may be performed more effectively halogen is contained in the atmosphere for the heat treatment.

Further, the gettering is performed also from the side of the pattern 347 when the formation as shown in the present embodiment is adopted. This is useful in enhancing the OFF current characteristics and the reliability of the thin film transistor finally completed. It is because the existence of nickel element (or other metal element which promotes crystallization of silicon) existing in the side of the active layer exerts a wide influence over the increase of OFF current and the instability of the characteristics.

Figure 42D:
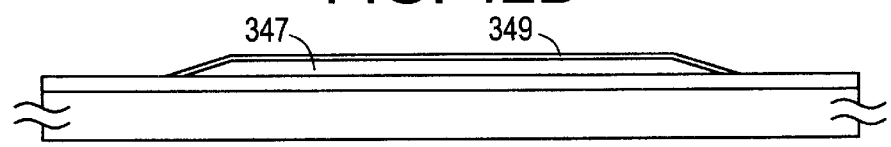
Figure 42E:
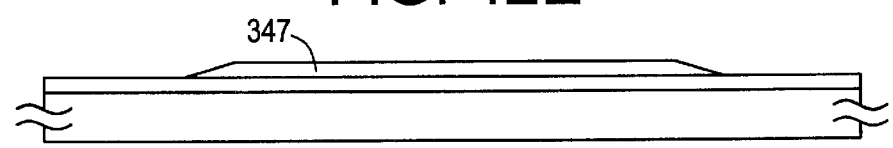
Figure 42F:
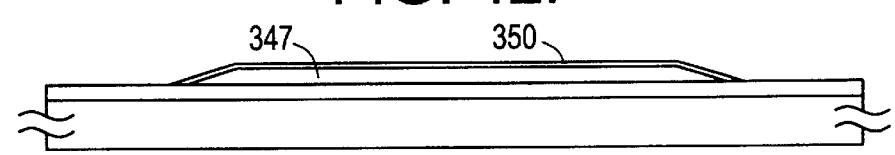

After forming the thermal oxide film 349 for gettering as shown in FIG. 42D, it is eliminated. Thus, the state shown in FIG. 42E is obtained. It is concerned that the silicon oxide film 345 might be etched in the step of eliminating the thermal oxide film 349 when the silicon oxide film is adopted as the underlying layer 345. However, it does not matter so much when the thickness of the thermal oxide film 349 is as thin as 100 angstrom as shown in the present embodiment.

After obtaining the state shown in FIG. 42E, a new thermal oxide film 350 is formed in a thickness of 100 angstrom by a heat treatment in an atmosphere so 100% oxygen at 650° C. for four hours. The thermal oxide film 350 is effective in suppressing the surface of the pattern 347 from being roughened when the laser light is irradiated later. It also forms a part of a gate insulating film later.

Because the thermal oxide film 350 has a very excellent interfacial characteristic with the crystal silicon film, it is useful to utilize it as part of the gate insulating film. The laser light may be irradiated again after forming the thermal oxide film 350. Thus, the crystal silicon film 347 in which the concentration of nickel element has been reduced and which has a high crystallinity may be obtained. Thereafter, the thin film transistor is fabricated by going through the process shown in FIGS. 39 through 41.

[49-th Embodiment]

A 49-th embodiment relates to a case devised in applying a heat treatment at a temperature more than a distortion point of a glass substrate. It is preferable to perform the process for gettering the metal element which promotes crystallization of silicon in the present invention at a high temperature as much as possible.

When the Corning 1737 glass substrate (distortion point: 667° C.) is used for instance, the higher gettering effect can be obtained when the temperature in gettering nickel element by forming the thermal oxide film is 700° C. rather than when it is 650° C. However, if the heating temperature for forming the thermal oxide film is set at 700° C. while using the Corning 1737 glass substrate, the glass substrate deforms as a result.

The present embodiment is to solve this problem. That is, according to the arrangement shown in the present embodiment, the glass substrate is placed on a lapping plate which is formed of quartz whose flatness is guaranteed and the heat treatment is implemented in this state. Thereby, the flatness of the softened glass substrate is maintained as well by the flatness of the lapping plate. It is also important to implement cooling also in the state in which the glass substrate is placed on the lapping plate. The adoption of such arrangement allows the heat treatment to be implemented even if it is in the temperatures more than the distortion point of the glass substrate.

[50-th Embodiment]

A 50-th embodiment relates to a case of obtaining a crystal silicon film on a quartz substrate by utilizing nickel element. In the present embodiment, an amorphous silicon film formed on the quartz substrate is transformed into the crystal silicon film having a high crystallinity by the action of nickel element at first.

Next, a thermal oxide film is formed on the crystal silicon film by implementing a heat treatment within an oxidizing atmosphere to which HCl is added. At this time, the nickel element remaining in the crystal silicon film is gettered to the obtained thermal oxide film by the action of chlorine (Cl). Then, the thermal oxide film containing the nickel element in high concentration as a result of the gettering is eliminated. Thereby, the crystal silicon film in which the concentration of nickel element is low, while having the high crystallinity is obtained.

FIGS. 43A through 43E are diagrams showing the fabrication process according to present embodiment. At first, a silicon oxynitride film 352 is formed as an underlying film in a thickness of 5000 angstrom on the quartz substrate 351. It is preferable to form the underlying layer 352 to be about 5000 angstrom or more to render it to have a function of relaxing a difference of thermal expansion ratio between the quartz substrate 351 and a silicon film to be formed later. The silicon oxynitride film is formed by using the plasma CVD using silane, $N_2O$ gas and oxygen as original gases. The plasma CVD using TEOS gas and $N_2O$ gas may be also used instead of that. It is effective to contain a small amount of halogen element typified by chlorine in the underlying film 352. Thereby, the metal element which promotes crystallization of silicon and exists within the semiconductor layer may be gettered by the halogen element in the later step.

It is also effective to add a hydrogen plasma treatment after forming the underlying film. It is also effective to implement a plasma treatment in an atmosphere in which oxygen and hydrogen are mixed. These treatments are effective in eliminating carbon component which is adsorbed on the surface of the underlying film and in enhancing the characteristic of interface with a semiconductor film formed later. Next, an amorphous silicon film 353, which turns out to be a crystal silicon film later, is formed in a thickness of 1500 angstrom by the low pressure thermal CVD. The reason why the low pressure thermal CVD is used is because thereby, the quality of the crystal silicon film obtained later is better, i.e. the film quality is denser in concrete. Beside the low pressure thermal CVD, the plasma CVD may be used.

The amorphous silicon film fabricated here is desirable to have $5\times10^{17}$ $cm^{-3}$ to $2\times10^{19}$ $cm^{-3}$ of concentration of oxygen within the film. It is because oxygen plays an important role in the later step of gettering the metal element which promotes crystallization of silicon. However, it must be careful here because the crystallization of the amorphous silicon film is hampered if the oxygen concentration is higher than the above-mentioned range of concentration. The concentration of other impurities such as those of nitrogen and carbon is preferred to be low to the utmost. In concrete, the concentration must be below $2\times10^{19}$ $cm^{-3}$.

The thickness of the amorphous silicon film may be selected from a range from about 1000 to 5000 angstrom. Next, nickel element is introduced to the amorphous silicon film 353 to crystallize it. Here, the nickel element is ppm (weight conversion) of nickel on the surface of the amorphous silicon film 353. Beside the method of using the above-mentioned solution, sputtering, CVD, plasma treatment or adsorption may be used as the method for introducing the nickel element. Among them, the method of using the solution is useful in that it is simple and that the concentration of the metal element may be readily adjusted.

Figure 43A:
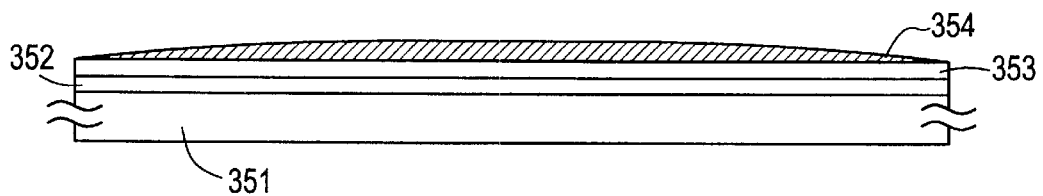
FIGS. 43A through 43E are diagrams showing fabrication steps according to a 50-th embodiment.

The nickel acetate solution is applied as described above to form a water film 354 of the nickel acetate solution as shown in FIG. 43A. After obtaining this state, extra solution is blown out by using a spin coater not shown. Thus, the nickel element is held in contact on the surface of the amorphous silicon film 353.

It is noted that it is preferable to use nickel sulfate solution for example, instead of the nickel acetate, if tire remained impurities in the later heating process is taken into consideration. It is because the nickel acetate aqueous solution contains carbon and it might be carbonized in the later heating process, thus remaining within the film. An amount of the nickel element to be introduced may be controlled by adjusting the concentration of nickel salt within the solution.

Next, a heat treatment is implemented in the temperature range from 750° C. to 1100° C. in the state shown in FIG.

43B to crystallize the amorphous silicon film 353 and to obtain a crystal silicon film 355. Here, the heat treatment is implemented within a nitrogen atmosphere (reducing atmosphere) containing 2 volume % of hydrogen at 900° C. for four hours. The reason why the reducing atmosphere is adopted in the crystallization step in a way of the heat treatment is to prevent oxides from being created in the step of the heat treatment and more concretely, to suppress nickel from reacting with oxygen and NiOx from being created on the surface of the film or within the film.

Oxygen couples with nickel and contributes a lot in gettering nickel in the later gettering step. However, it has been found that if oxygen couples with nickel in the above-mentioned stage of the crystallization, it hampers the crystallization. Accordingly, it is important to suppress the oxides from being created to the utmost in the crystallization step in a way of heating.

The concentration of oxygen within the atmosphere or implementing the heat treatment for the crystallization has to be in an order of ppm, or preferably, less than 1 ppm. Inert gases such as argon, beside nitrogen, or their mixed gas may be used as the gas which occupies the most of the atmosphere for implementing the heat treatment for the crystallization. After obtaining the crystal silicon film 355, it is Patterned to form an island region 356 which turns out to be an active layer of a thin film transistor later.

Figure 43B:
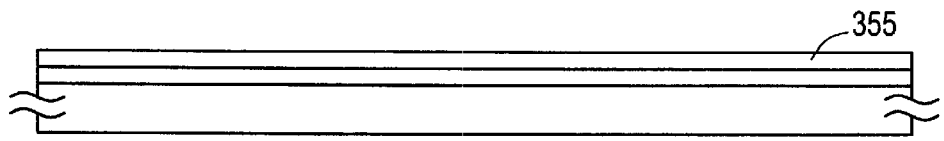
Figure 43C:
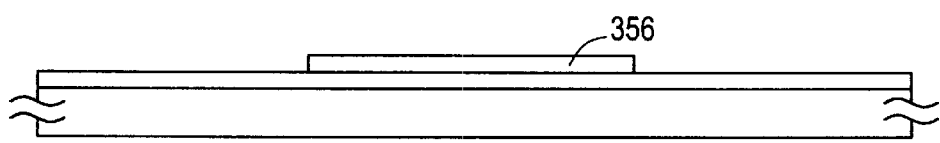
Figure 43D:
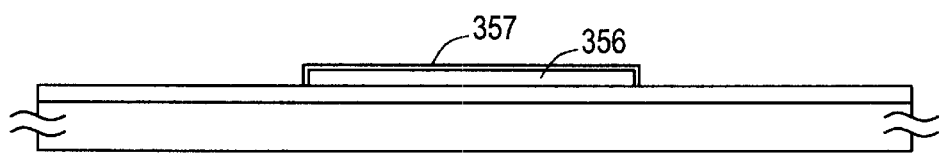

Next, another heat treatment is implemented in a step in FIG. 43D to form a thermal oxide film for gettering the nickel element. This heat treatment is implemented within a nitrogen atmosphere containing 5 volume % of oxygen and 3 volume % of HCl to oxygen at 950° C. for one and half hours. As a result of this step, the thermal oxide film 357 is formed in a thickness of 200 angstrom.

This step is carried out to eliminate the nickel element which has been introduced intentionally for the crystallization in the initial stage from the crystal silicon film 356 formed in the island pattern. This heat treatment is implemented at a temperature higher than that of the heat treatment implemented for the crystallization described above. It is an important condition for effectively implementing the gettering of nickel element. It is noted that although this heat treatment may be implemented in the same or less temperature in the heat treatment implemented for the crystallization, it is less effective. It is noted that the same applies also to the case when another metal element which promotes the crystallization of silicon is used.

Because the thermal oxide film 357 is formed, the thickness of the crystal silicon film 356 formed into the island pattern is reduced to about 450 angstrom. In the gettering, oxygen existing within the crystal silicon film plays an important role. That is, the gettering of nickel element proceeds in a manner in which chlorine acts on nickel oxide formed when oxygen couples with nickel.

If the concentration of oxygen is too much, it becomes the factor of hampering the crystallization of the amorphous silicon film 353 in the crystallization step shown in FIG. 43B as described above. However, the existence thereof plays an important role in the process of gettering nickel as described above. Accordingly, it is important to control the concentration of oxygen existing within the amorphous silicon film, the starting film. Because the nickel element is gettered to the oxide film to be formed in the aforementioned step, naturally the nickel concentration within the oxide film becomes high as compared to other regions.

Further, it has been observed that the concentration of nickel element is apt to be high near the interface between the crystal silicon film 356 and the thermal oxide film 357. It is considered to happen because the region where the gettering mainly takes place is on the side of the oxide film near the interface between the crystal silicon film and the oxide film. The gettering proceeding near the interface is considered to be caused by the existence of stress and defects near the interface.

In the present embodiment, the case of using chlorine (Cl) as the halogen element has been shown and the case of using HCl has been shown as a method for introducing it. However, beside HCl, one type or a plurality of types of mixed gas selected from HF, HBr, $Cl_2$, $F_2$, $Br_2$ may be used. Beside them, halogen hydride may be used in general. It is preferable to set the content (volume content) of those gases within the atmosphere to 0.25 to 5% if it is HF, 1 to 15% if it is HBr, 0.25 to 5% if it is $Cl_2$, 0.125 to 2.5% if it is $F_2$ and 0.5 to 10% if it is $Br_2$.

If the concentration is below the above-mentioned range, no significant effect can be obtained. Further, if the concentration exceeds the above-mentioned range, the surface of the crystal silicon film is roughened. Then, after forming the thermal oxide film by the heat treatment in the oxidizing atmosphere containing the halogen element, it is eliminated. While the thermal oxide film 357 may be eliminated by means of dry etching or wet etching using buffer hydrofluoric acid or other hydrofluorite (hydrofluoric) etchant, it is implemented by the wet etching by using the buffer hydrofluoric acid in the present embodiment.

Figure 43E:
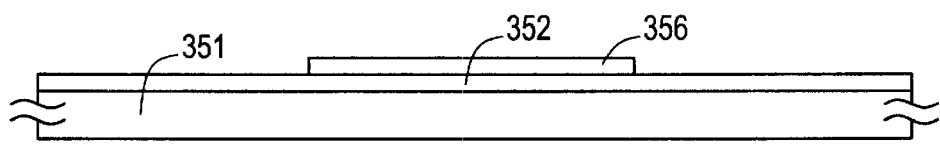

Thus, the island pattern 356 formed of the crystal silicon film in which the concentration of nickel has been reduced is obtained as shown in FIG. 43E. Because nickel element is contained relatively in high concentration near the surface of the obtained crystal silicon film 356, it is effective to advance the etching of the above-mentioned oxide film 357 to over-etch, more or less, the surface of the crystal silicon film 356.

It is also effective to irradiate laser light or intense light after eliminating the thermal oxide film 357 to promote the crystallization of the obtained crystal silicon film 356 further. That is, it is effective to irradiate the laser light or intense light after gettering nickel element. KrF excimer laser (wavelength: 248 nm), XeCl excimer laser (wavelength: 308 nm) and other types of excimer lasers may be used as the laser light to be used. Further, it is possible to irradiate ultraviolet ray or infrared ray, i.e. the intense light.

Further, it is effective to form a thermal oxide film not shown by implementing another heat treatment after obtaining the state shown in FIG. 43E. This thermal oxide film functions as part of a gate insulating film or as the gate insulating film when a thin film transistor is constructed later. The thermal oxide film has an excellent interfacial characteristic with the active layer made from the crystal silicon film, so that it is most suitable as what composes the gate insulating film.

[51-st Embodiment]

A 51-st embodiment relates to a case when Cu is used as the metal element which promotes crystallization of silicon in the arrangement shown in the 50-th embodiment. In this case, cupric acetate [$Cu(CH_3 COO)_2$] and cupric chloride ($CuCl_2$ $2H_2O$) may be used as the solution for introducing Cu. The former is used in the present embodiment. The state shown in FIG. 43E is obtained by implementing other processes in the same manner with the 50-th embodiment.

[52-nd Embodiment]

A 52-nd embodiment relates to a case of growing crystal in the form different from that in the 50-th embodiment. That is, the present embodiment relates to a method of growing the crystal in a direction parallel to the substrate, i.e. a method called lateral growth, by utilizing the metal element which promotes crystallization of silicon.

FIGS. 44A through 44E show the fabrication process according to the present embodiment. At first, a silicon oxynitride film is formed as an underlying film 359 in a thickness of 3000 angstrom on a quartz substrate 358. Next, an amorphous silicon film 360 which is the starting film of a crystal silicon film is formed in a thickness of 2000 angstrom by low pressure thermal CVD. It is noted that plasma CVD may be also used instead of the low pressure thermal CVD.

Next, a silicon oxide film not shown is formed in a thickness of 1500 angstrom and is patterned to form a mask 361. An opening is created on the mask in a region 362. The amorphous silicon film 360 is exposed at the region where the opening 362 is created. The opening 362 has a thin and long rectangular shape in the longitudinal direction from the depth to the front side of the figure. Preferably, the width of the opening 362 is 20 μm or more. The length thereof in the longitudinal direction may be determined as necessary.

Then, the nickel acetate aqueous solution containing 10 ppm of nickel element in terms of weight is applied to the mask 361 and the opening 362 and the extra solution is removed by implementing spin drying by using a spinner not shown. Thus, the solution is held in contact on the exposed surface of the amorphous silicon film 360 as indicated by a dot line 363 in FIG. 44A.

Next, a heat treatment is implemented at 800° C. for four hours in a nitrogen atmosphere containing 3 volume % of hydrogen and in which oxygen is minimized. Then, crystal grows in the direction parallel to the substrate 358 as indicated by the reference numeral 364 in FIG. 44B. This crystal growth advances from the region of the opening 362 to which nickel element has been introduced to the surrounding part. This crystal growth in the direction parallel to the substrate will be referred to as lateral growth throughout the present specification.

It is possible to advance this lateral growth across more than 100 μm under the conditions shown in the present embodiment. Then, a silicon film having the region in which the crystal has thus grown laterally is obtained. It is noted that crystal growth in the vertical direction called vertical growth advances from the surface of the silicon film to the underlying interface in the region where the opening 362 is formed.

Then, the mask 361 made from the silicon oxide film for selectively introducing nickel element is eliminated. Further, the silicon film is patterned to form an island pattern 366 made from the crystal silicon film in which the crystal has grown in the direction parallel to the substrate (i.e. the crystal has grown laterally) as shown in FIG. 44C.

Figure 44A:
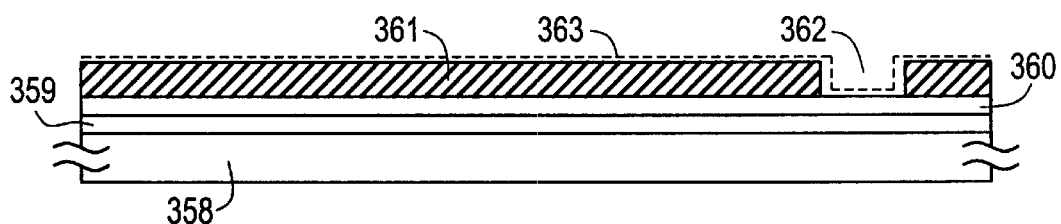
FIGS. 44A through 44E are diagrams showing fabrication steps according to a 52-nd embodiment.
Figure 44B:
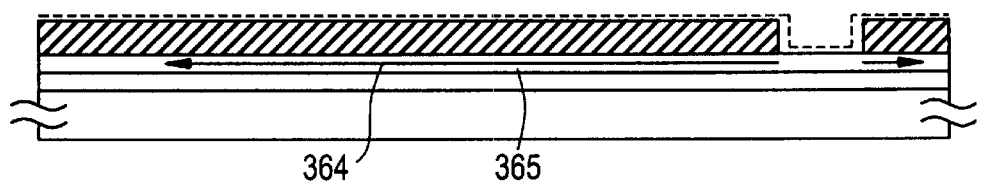
Figure 44C:
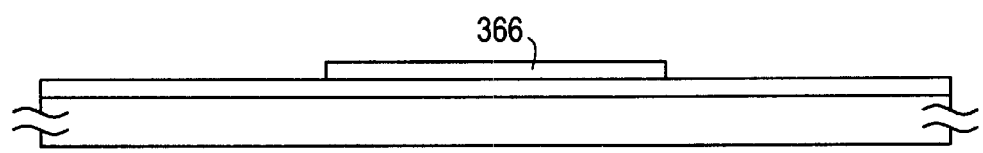
Figure 44D:

After obtaining the state shown in FIG. 44C, a heat treatment is implemented at 950° C. for one and half hours within a nitrogen atmosphere containing 10% of oxygen and 3 volume % of HCl to oxygen. FIG. 44D shows this state. In this step, an oxide film 367 containing nickel element in high concentration is formed and thereby, the concentration of nickel element within the silicon film 366 is reduced relatively.

Figure 44E:
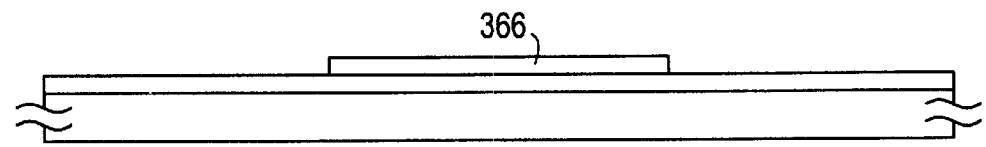

Here, the thermal oxide film 367 is formed in a thickness of 200 angstrom. The thermal oxide film contains the nickel element gettered when it has been formed in high concentration. Further, because the thermal oxide film 367 is formed, the thickness of the crystal silicon film 366 is reduced to about 500 angstrom. Next, the thermal oxide film 367 containing the nickel element in high concentration is eliminated. Thus, the state shown in FIG. 44E is obtained.

In the active layer (the crystal silicon film formed into the island shape) 366 of this state, the nickel element has a distribution of concentration such that it exists in high concentration toward the surface of the crystal silicon film. This is caused by the fact that the nickel element has been gettered to the thermal oxide film 367 when the thermal oxide film has been formed. Accordingly, it is useful to etch the surface of the crystal silicon film further after eliminating the thermal oxide film 367 to eliminate the region in which the nickel element exists in high concentration.

The concentration of nickel element which remains within the pattern 366 made from the laterally grown region thus obtained may be reduced further as compared to the case shown in the 50-th embodiment. This is caused by the fact that the concentration of the metal element contained within the laterally grown region is low originally. Thus, the concentration of nickel element within the pattern 366 made from the laterally grown region may be readily reduced to the order of $10^{17}$ cm$^{-3}$ or less.

When a thin film transistor is formed by utilizing the laterally grown region of the present embodiment, a semiconductor device having a higher mobility may be obtained as compared to the case when the vertically grown region as shown in the 50-th embodiment (crystal grows vertically on the whole surface in the case of the 50-th embodiment) is utilized. After obtaining the state shown in FIG. 44E, a thermal oxide film (not shown) is formed on the surface of the active layer 366. This thermal oxide film is formed in a thickness of 500 angstrom by implementing a heat treatment for 30 minutes in an oxygen atmosphere at 950° C.

The thermal oxide film may be formed in a desirable or predetermined thickness by controlling the heating time, the heating temperature and the concentration of oxygen within the atmosphere. When the thin film transistor is fabricated after that, a silicon oxide film is formed over the thermal oxide film by plasma CVD or the like to form a gate insulating film together with the thermal oxide film. Or, the thermal oxide film may be formed in a desirable or predetermined thickness to use it as the gaze insulating film as it is.

[53-rd Embodiment]

A 53-rd embodiment relates to a case of fabricating a thin film transistor disposed in a pixel region of an active matrix type liquid crystal display or an active matrix type EL display. FIGS. 45A through 45E show the fabrication process according to the present embodiment.

At first, an island-shaped semiconductor layer (made from the crystal silicon film) patterned into the shape of the active layer is formed on the glass substrate through the process shown in the 50-th or 52-nd embodiment. The process which follows is implemented in the same manner with the both of the embodiments. Next, a thermal oxide film is formed in a thickness of 200 angstrom on the surface thereof by thermal oxidation. In the state shown in FIG. 45A, the reference numeral (369) denotes a glass substrate, (370) an underlying film, and (371) an active layer formed of the crystal silicon film.

It is noted that before the thermal oxide film 368 is formed, a plasma treatment is implemented in the reduced pressure atmosphere in which oxygen and hydrogen are mixed. The plasma is generated by high-frequency discharge. Organic substances existing on the surface of the exposed active layer 371 may be removed by the plasma treatment. Specifically, the organic substances adsorbing on the surface of the active layer are oxidized by oxygen plasma and the oxidized organic substances are reduced and vaporized by hydrogen plasma.

Thus the organic substances existing on the surface of the exposed active layer 371 are removed. The removal of the organic substances is very effective in suppressing fixed charge from existing on the surface of the active layer 371. That is, because the fixed charge caused by the existence of organic substances hampers the operation of the device and renders the characteristics thereof instable, it is very useful to remove it.

Figure 45A:
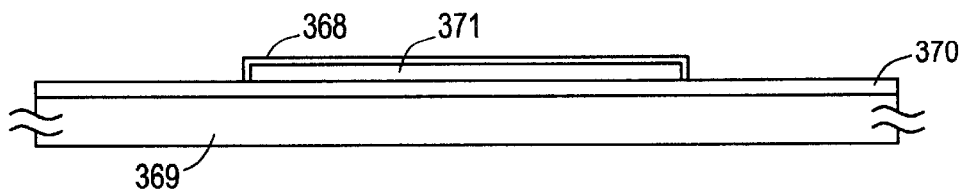
FIGS. 45A through 45E are diagrams showing fabrication steps according to a 53-rd embodiment.

After obtaining the state shown in FIG. 45A, a silicon oxynitride film 372 which composes a gate insulating film is formed in a thickness of 1000 angstrom. While the film may be formed by using the plasma CVD using mixed gas of silane and $N_2O$ and oxygen or the plasma CVD using mixed gas of TEOS and $N_2O$, the latter is used in the present embodiment. The silicon oxynitride film 372 functions as the gate insulating film together with the thermal oxide film 368.

When a metal element infiltrates into the gate insulating film, its function as an insulating film drops, thus causing instability and dispersion of the characteristics of the thin film transistor. However, it is effective to contain halogen element within the silicon oxynitride film. That is, it is possible to prevent the function of the gate insulating film as an insulating film from dropping by the influence of the nickel element (or another metal element which promotes crystallization of silicon) existing within the active layer by fixing the nickel element by the action of the halogen element. It is significant to use the silicon oxynitride film as the insulating film in that metal element hardly infiltrates to the gate insulating film from its dense film quality. It is nosed that a silicon oxide film which is normally used may be also used for the gate insulating film.

After forming the silicon oxynitride film 372 which functions as the gate insulating film, an aluminum film not shown which functions as a gate electrode later is formed by sputtering. 0.2 weight % of scandium is contained within the aluminum film to suppress hillock and whisker from being produced in the later process. The hillock and whisker mean that abnormal growth of aluminum occurs by implementing the heating, thus forming needle or prickle-like projections.

After forming the aluminum film, a dense anodic oxide film not shown is formed. The anodic oxide film is formed by using ethylene glycol solution containing 3 weight % of tartaric acid as electrolyte. That is, the anodic oxide film having the dense film quality is formed on the surface of the aluminum film by setting the aluminum film as the anode and platinum as the cathode and by anodizing within this electrolyte. The thickness of the anodic oxide film not shown having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization.

Figure 45B:
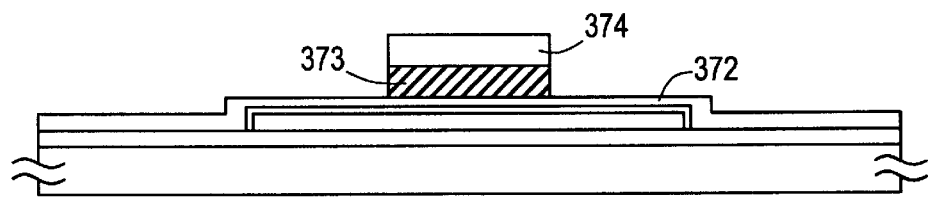
Figure 45C:
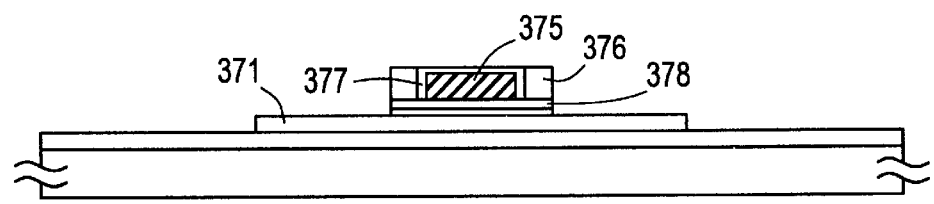

Next, the resist mask 374 is formed and the aluminum film is patterned so as to have a pattern 373. The state shown in FIG. 45B is thus obtained. Here, another anodization is implemented. In this case, 3 weight % of oxalate aqueous solution is used as electrolyte. A porous anodic oxide film 376 is formed by anodizing within this electrolyte by setting the aluminum pattern 373 as the anode.

In this step, the anodic oxide film 376 is formed selectively on the sides of the aluminum pattern because the resist mask 374 having the high adhesiveness exists thereabove. The anodic oxide film may be grown up to several $\mu$m thick. The thickness is 6000 angstrom in the present embodiment. It is noted that the range of growth may be controlled by adjusting an anodizing time.

Next, the resist mask 306 is removed. Then, a dense anodic oxide film is formed again. That is, the anodization is implemented again by using the aforementioned ethylene glycol solution containing 3 weight % of tartaric acid as electrolyte. Then, an anodic oxide film 377 having a dense film quality is formed because the electrolyte infiltrates into the porous anodic oxide film 376.

This dense anodic oxide film 377 is 1000 angstrom chick. The thickness is controlled by adjusting applied voltage. Here, the exposed silicon oxynitride film 372 and the thermal oxide film 368 are etched by utilizing dry etching. Then, the porous anodic oxide film 376 is eliminated by using mixed acid in which acetic acid, nitric acid and phosphoric acid are mixed. Thus, the state shown in FIG. 45D is obtained.

Figure 45D:
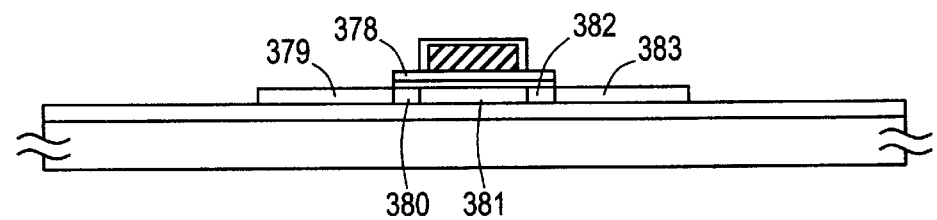

After obtaining the state shown in FIG. 45D, impurity ions are injected. Here, P (phosphorus) ions are injected by plasma doping in order to fabricate an N-channel type thin film transistor. In this step, heavily doped regions 379 and 383 and lightly doped regions 380 and 382 are formed because part of the remaining silicon oxynitride film 378 functions as a semi-permeable mask, thus blocking part of the injected ions.

Next, ultraviolet rays are irradiated to activate the regions into which the impurity ions have been injected. The irradiation is implemented by using infrared rays or laser light here. Thus, a source region 379, a channel forming region 381, a drain region 383 and low concentration impurity regions 380 and 382 are formed in a manner of self-alignment. The one designated by the reference numeral 382 here is the region called the LDD (lightly doped drain).

Is noted that when the dense anodic oxide film 377 is formed as thick as 2000 angstrom or more, an offset gate region may be formed on the outside of the channel forming region 381 by its thickness. Although the offset gate region is formed also in the present embodiment, it is not shown in the figures because its size is small, its contribution due to the existence thereof is small and the figures might otherwise become complicated.

Figure 45E:
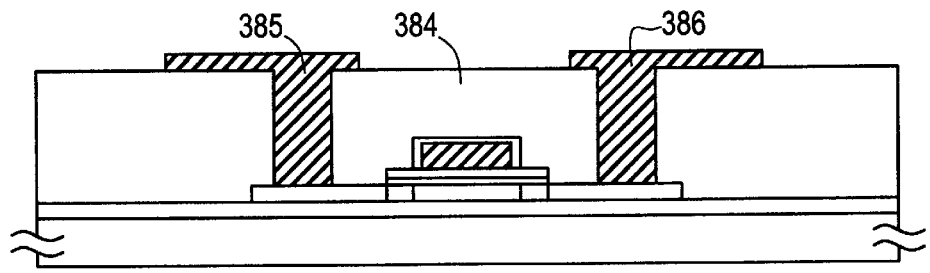

Next, a silicon oxide film or a silicon nitride film or their laminated film is formed as an interlayer insulating film 384. The silicon oxide film is formed here. The interlayer insulating film may be constructed by forming a layer made from a resin material on the silicon oxide film or the silicon nitride film. Then, contact holes are created to form a source electrode 385 and a drain electrode 386. Thus, the thin film transistor shown in FIG. 45E is completed.

[54-th Embodiment]

A 54-th embodiment relates to a case of fabricating a thin film transistor through a process different from that shown in FIG. 45. FIGS. 46A through 46E show the fabrication process according to the present embodiment. At first, the crystal silicon film is formed on the glass substrate through the process shown in the 50-th or 52-nd embodiment. The process which follows is common to the both embodiments. It is then patterned and a plasma treatment is implemented within the reduced pressure atmosphere in which oxygen and hydrogen are mixed.

Figure 46A:
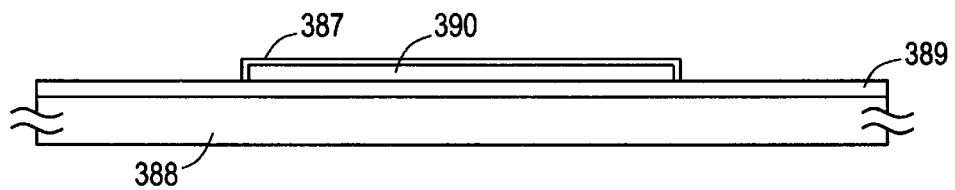
FIGS. 46A through 46E are diagrams showing fabrication steps according to a 54-th embodiment.
Figure 46B:
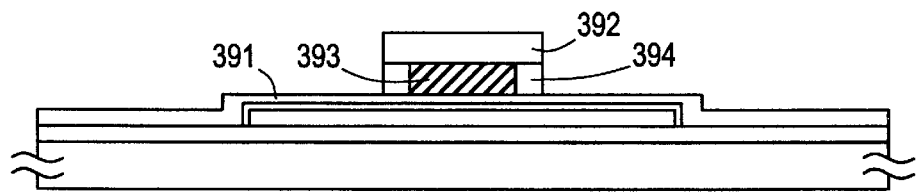
Figure 46C:
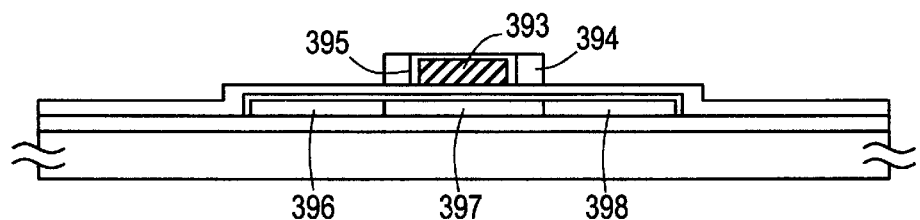

Then, a thermal oxide film 387 is formed in a thickness of 200 angstrom, thus obtaining the state shown in FIG. 46A. The thermal oxide film 387 is formed by implementing a heat treatment for 30 minutes within an oxygen atmosphere at 950° C. In the state shown in FIG. 46A, the reference numeral (388) denotes a glass substrate, (389) an underlying film, (390) an active layer formed of the crystal silicon film. The thermal oxide film 387 is the film formed again after eliminating the thermal oxide film for gettering.

After obtaining the state shown in FIG. 46A, a silicon oxynitride film 391 which composes a gate insulating film is formed in a thickness of 1000 angstrom. The film is formed by using the plasma CVD using mixed gas of oxygen, silane and $N_2O$. It is also possible to use the plasma CVD using mixed gas of TEOS and $N_2O$ instead of that.

After forming the silicon oxynitride film 391 which functions as the gate insulating film, an aluminum film not shown which functions as a gate electrode later is formed by sputtering. 0.2 weight % of scandium is contained within the aluminum film. After forming the aluminum film, a dense anodic oxide film not shown is formed. The anodic oxide film is formed by using ethylene glycol solution containing 3 weight % of tartaric acid as electrolyte. That is, the anodic oxide film having the dense film quality is formed on the surface of the aluminum film by setting the aluminum film as the anode and platinum as the cathode and by anodizing within this electrolyte.

The thickness of the anodic oxide film not shown having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization. Next, the resist mask 392 is formed and the aluminum film is patterned so as to have the pattern 393.

Here, another anodization is implemented. In this case, 3 weight % of oxalate aqueous solution is used as electrolyte. A porous anodic oxide film 394 is formed by anodizing within this electrolyte by setting the aluminum pattern 393 as the anode. In this step, the anodic oxide film 394 is formed selectively on the sides of the aluminum pattern because the resist mask 392 having the high adhesiveness exists thereabove.

The anodic oxide film may be grown up to several $\mu m$ thick. The thickness is 6000 angstrom in the present embodiment. It is noted that the range of growth may be controlled by adjusting an anodizing time. Next, after removing the resist mask 392, a dense anodic oxide film is formed again. That is, the anodization is implemented again by using the ethylene glycol solution containing 3 weight % of tartaric acid as electrolyte. Then, an anodic oxide film 395 having a dense film quality is formed because the electrolyte infiltrates into the porous anodic oxide film 394.

Figure 46D:
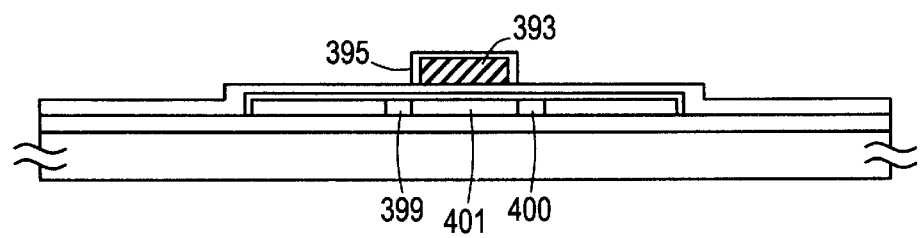

Next, the initial injection of impurity ions is implemented. A source region 396 and a drain region 398 are formed by injecting the impurity ions. It is noted that no impurity ion is injected to a region 397 at this time. Next, the porous anodic oxide film 394 is eliminated by using mixed acid in which acetic acid, nitric acid and phosphoric acid are mixed. Thus, the state shown in FIG. 46D is obtained. After obtaining the state shown in FIG. 46D, impurity ions are injected again. The impurity ions are injected under the doping condition lighter than that of the first injection.

In this step, lightly doped regions 399 and 400 are formed and a region 401 turns out to be a channel forming region. Then, laser light or intense light is irradiated to activate the regions into which the impurity ions have been injected. The laser light is used here. Thus, the source region 396, the channel forming region 401, the drain region 398 and low concentration impurity regions 399 and 400 are formed in a manner of self-alignment. Here, the one designated by the reference numeral 400 is the region called the LDD (lightly doped drain).

Figure 46E:
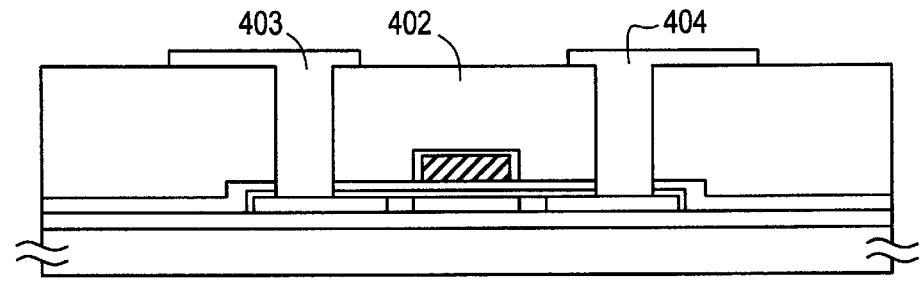

Next, while a silicon oxide film or a silicon nitride film or their laminated film is formed as an interlayer insulating film 402, the silicon nitride film is formed here. The interlayer insulating film may be also constructed by forming a layer made from a resin material on the silicon oxide film or the silicon nitride film. After that, contact holes are created to form a source electrode 403 and a drain electrode 404. Thus, the thin film transistor shown in FIG. 46E is completed.

[55-th Embodiment]

A 55-th embodiment relates to a case when an N-channel type thin film transistor and a P-channel type thin film transistor are formed in a complementary manner. The formation shown in the present embodiment may be utilized for various thin film integrated circuits integrated on an insulating surface as well as for peripheral driving circuits of an active matrix type liquid crystal display for example. FIGS. 47A through 47F are diagrams showing a fabrication process according to the present embodiment.

Figure 47A:
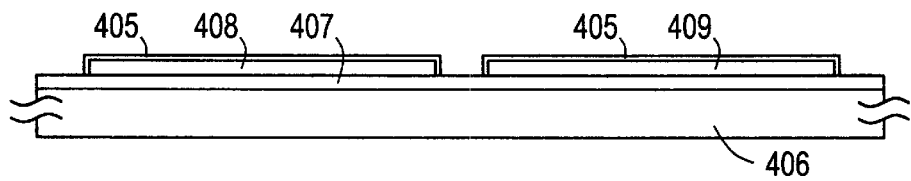
FIGS. 47A through 47F are diagrams showing fabrication steps according to a 55-th embodiment.

At first, a silicon oxide film or a silicon oxynitride film is formed as an underlying film 407 on a glass substrate 406 as shown in FIG. 47A. It is preferable to use the silicon oxynitride film, and it is used in the present embodiment. Next, an amorphous silicon film not shown is formed by the plasma CVD. The low pressure thermal CVD may be also used instead of that. Then, the amorphous silicon film is transformed into a crystal silicon film by the method shown in the 50-th embodiment.

Next, a plasma treatment is implemented within an atmosphere in which oxygen and hydrogen are mixed and the crystal silicon film thus obtained is patterned to obtain active layers 408 and 409. Thus, the state shown in FIG. 47A is obtained. It is noted that a heat treatment is implemented at 650° C. for 10 hours within a nitrogen atmosphere containing 3 volume % of HCl in the state shown in FIG. 47A in order to suppress the influence of carriers moving the sides of the active layers.

Because an OFF current characteristic becomes bad if a trap level exists due to the existence of metal element on the sides of the active layers, it is useful to implement the above-mentioned treatment to lower the density of the level on the sides of the active layers. Next, a thermal oxide film 405 and a silicon oxynitride film 410 which compose a gate insulating film are formed. When quartz is used as the substrate here, it is desirable to compose the gate insulating film only by the thermal oxide film formed by using the above-mentioned thermal oxidation.

Next, an aluminum film not shown which composes a gate electrode later is formed in a thickness of 4000 angstrom. Beside the aluminum film, a metal which can be anodized, such as tantalum, may be used. After forming the aluminum film, a very thin and dense anodic oxide film is formed on the surface thereof by the method described before. Next, a resist mask not shown is placed on the aluminum film to pattern the aluminum film. Then, anodization is implemented by setting the obtained aluminum pattern as the anode to form porous anodic oxide films 413 and 414. The thickness of the porous anodic oxide films is 5000 angstrom.

Figure 47B:
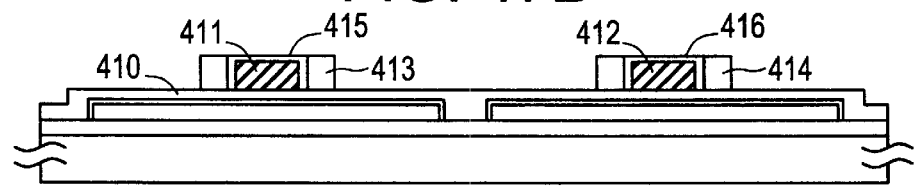
Figure 47C:
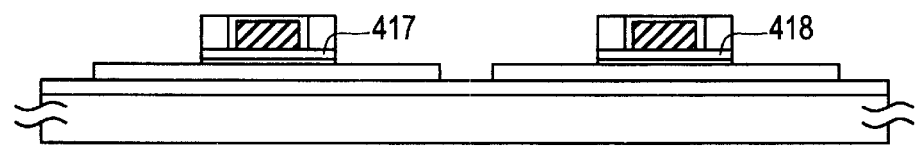
Figure 47D:
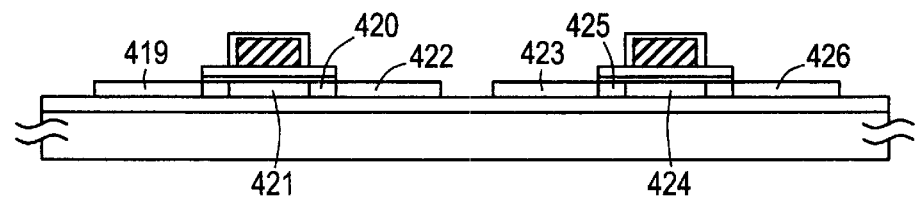

Then, another anodization is implemented under the condition of forming dense anodic oxide films 415 and 416. The thickness of the dense anodic oxide films 415 and 416 is 600 angstrom. Thus, the state shown in FIG. 47B is obtained. Further, the exposed silicon oxynitride film 410 and the thermal oxide film 405 are eliminated by dry etching, thus obtaining the state shown in FIG. 47C as a result. After obtaining the state shown in FIG. 47C, the porous anodic oxide films 413 and 414 are eliminated by using mixed acid in which acetic acid, nitric acid and phosphoric acid are mixed. Thus, the state shown in FIG. 47D is obtained.

Here, resist masks are disposed alternately to inject P (phosphorus) ions to the thin film transistor on the left side and B (boron) ions to the thin film transistor on the right side. By injecting those impurity ions, a source region 419 and a drain region 422 to which P ions are doped in high concentration, thus having N-type, are formed in a manner of self-alignment. Further, a region 420 to which P ions are doped in low concentration, thus having weak N-type, as well as a channel forming region 421 are formed in the same time.

The reason why the region 420 having the weak N-type is formed is because the remaining gate insulating film 417 exists. That is, part of P ions transmitting through the gate insulating film 417 is blocked by the gate insulating film 417. By the same principle, a source region 426 and a drain region 423 having strong P-type are formed in a manner of self-alignment and a low concentration impurity region 425 is formed in the same time. Further, a channel forming region 424 is formed in the same time.

It is noted that when the thickness of the dense anodic oxide films 415 and 416 is as thick as 2000 angstrom, an offset gate region may be formed in contact with the channel forming region by that thickness. Its existence may be ignored in the case of the present embodiment because the dense anodic oxide films 415 and 416 are so thin as less than 1000 angstrom. Then, laser light is irradiated to anneal the region into which the impurity ions have been injected. Intense light may be also irradiated instead of the laser light.

Figure 47E:
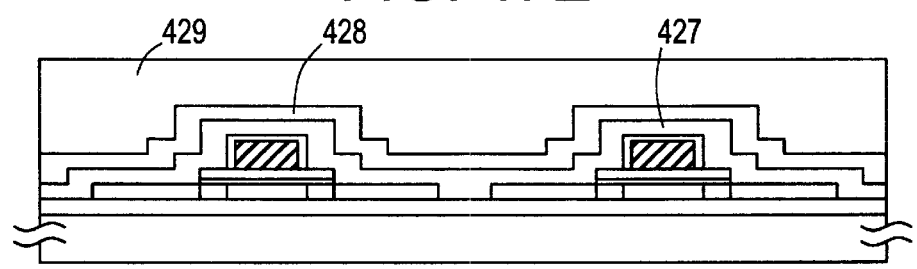

Then, a silicon nitride film 427 and a silicon oxide film 428 are formed as interlayer insulating films as shown in FIG. 47E. Their thickness is 1000 angstrom, respectively. It is noted that the silicon oxide film 428 needs not be formed in this case. Thus, the thin film transistor is covered by the silicon nitride film. The reliability of the thin film transistor may be enhanced by arranging as described above because the silicon nitride film is dense and has an excellent interfacial characteristic.

Figure 47F:
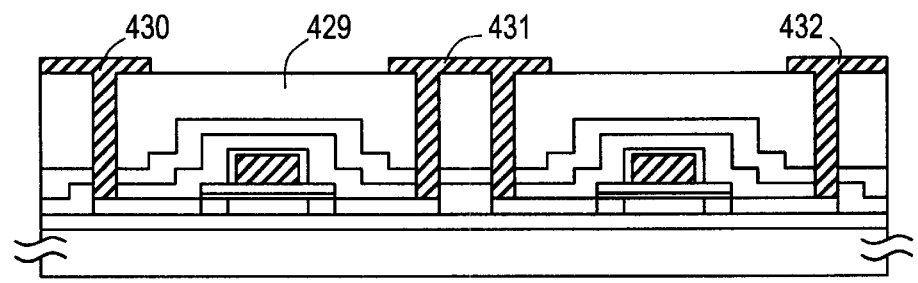

Further, an interlayer insulating film 429 made from a resin material is formed by means of spin coating. Here, the thickness of the interlayer insulating film 429 is 1 $\mu$m. Then, contact holes are created to form a source electrode 430 and a drain electrode 431 of the N-channel type thin film transistor on the left side. In the same time, a source electrode 432 and the drain electrode 431 of the thin film transistor on the right side are formed. The electrode 431 is disposed in common to the both of them. Thus, the thin film transistor circuit in which the N-channel type thin film transistor and the P-channel type thin film transistor are constructed in a complementary manner as shown in FIG. 47F is completed.

As described above, the thin film transistor having the CMOS structure constructed in the complementary manner may be formed. In the formation shown in the present embodiment, the chin film transistor may be covered by the nitride film as well as the resin material. This formation allows to enhance the durability of the thin film transistor, so that movable ions nor moisture hardly infiltrate. Further, it allows to prevent capacitance from being generated between the thin film transistor and wires when a multi-layered wire is formed.

[56-th Embodiment]

A 56-th embodiment relates to a case when nickel element is introduced directly to the surface of the underlying film in the process shown in the 50-th embodiment. In this case, the nickel element is held in contact on the lower surface of the amorphous silicon film. In this case, the nickel element is introduced after forming the underlying layer to hold the nickel element (metal element) in contact on the surface of the underlying layer.

According to the present embodiment, aqueous solution of nickel acetate is applied on the surface of the underlying film to introduce nickel element directly to it and the other processes are implemented in the same manner with the case of the 50-th embodiment to obtain an island shape pattern 356 formed of a crystal silicon film in which the concentration of nickel has been reduced as shown in FIG. 43E. Beside the method of using the solution, sputtering, CVD or adsorption may be used as the method for introducing nickel element.

[57-th Embodiment]

A 57-th embodiment relates to a case of improving the crystallinity of an island pattern formed of an obtained crystal silicon film by irradiating laser light in the state shown in FIG. 43E, the state shown in FIG. 44E, the state shown in FIG. 47A or the state shown in FIG. 46A.

A predetermined annealing effect can be obtained with relatively low irradiation energy density by irradiating the laser light in the state shown in FIGS. 43E, 44E, 45A and 46A as compared to the case of implementing annealing to the whole film before the patterning. This effect is considered to have been effected because the laser energy is irradiated to a spot of small area, thus enhancing the efficiency of energy utilized in the annealing.

[58-th Embodiment]

A 58-th embodiment relates to a case of obtaining a crystal silicon film on a glass substrate by utilizing nickel element. In the present embodiment, the crystal silicon film having a high crystallinity is obtained by the action of nickel element at first. Then, laser light is irradiated to enhance the crystallinity of the film and to diffuse the nickel element which is concentrated locally within the film, i.e. to reduce or to extinguish blocks of nickel.

Next, an oxide film containing F (fluorine) is formed on the crystal silicon film by thermal oxidation. At this time, the nickel element remaining in the crystal silicon film is gettered to the thermal oxide film by the action of F element. At this time, because the nickel element is dispersed therein by the irradiation of laser light, the gettering proceeds effectively. Then, the thermal oxide film containing the nickel element in high concentration as a result of the gettering is eliminated. Thereby, the crystal silicon film in which the concentration of nickel element is low, while having the high crystallinity, is obtained on the glass substrate.

The fabrication process of the present embodiment will be explained with reference to FIGS. 48A through 48E. At first, a silicon oxide film 434 is formed as an underlying film in a thickness of 3000 angstrom on the glass substrate 433 of Corning 1737 (distortion point: 667° C.). This film is formed by using sputtering. The silicon oxide film 434 has a function of suppressing the diffusion of impurities from the glass substrate in the later steps. It also has a function of relaxing stress acting the glass substrate and a silicon film to be formed later.

It is also effective to contain a small amount of halogen element in the underlying film 434. Thereby, the metal element which promotes crystallization of silicon which exists within the semiconductor layer may be gettered to the underlying film by the halogen element in the later step. It is also effective to add a hydrogen plasma treatment after forming the underlying film. Because it is effective in eliminating carbon component which exists on the surface of the underlying film and in suppressing a level of fixed charge from existing on the interface with the silicon film to be formed later. It is also effective to implement a plasma treatment in an atmosphere in which oxygen and hydrogen are mixed.

Next, an amorphous silicon film 435, which turns out to be a crystal silicon film later, is formed in a thickness of 500 angstrom by the low pressure thermal CVD. The reason why the low pressure thermal CVD is used is because thereby, the quality of the crystal silicon film obtained later is better, i.e. the film quality is denser in concrete. Beside the low pressure thermal CVD, the plasma CVD may be used. The amorphous silicon film fabricated here is desirable to have $5\times10^{17}$ cm$^{-3}$ to $2\times10^{19}$ cm$^{-3}$ of oxygen concentration within the film.

It is because oxygen plays an important role in the later step of gettering the metal element which promotes crystallization of silicon (in the step of gettering nickel in case of the present embodiment). However, it must be careful here because the crystallization of the amorphous silicon film is hampered if the oxygen concentration is higher than the above-mentioned range of concentration. When the oxygen concentration is lower than the above-mentioned concentration range on the other hand, it contributes less to the action for gettering the metal element. The concentration of other impurities such as those of nitrogen and carbon is preferred to be low to the utmost. In concrete, their concentration is preferable to be below $2\times10^{19}$ cm$^{-3}$.

The upper limit of the thickness of this amorphous silicon film is about 2000 angstrom. It is because a thick film is disadvantageous in obtaining the effect of the irradiation of laser light implemented later. That is, the most of laser light irradiated to the silicon film is absorbed by the surface of the film. The lower limit of the thickness of the amorphous silicon film 435 is practically about 200 angstrom, though it depends on a method for forming the film. If the thickness is below that, there will be a problem in the uniformity of the film.

Next, metal element is introduced to the amorphous silicon film 435 to crystallize it. Here, the nickel element is used as the metal element which promotes crystallization of silicon. Here, a method of using solution is utilized as a method for introducing nickel element. Here, the nickel element is introduced by applying nickel acetate solution containing 10 ppm (weight conversion) of nickel on the surface of the amorphous silicon film 435. Beside the method of using the above-mentioned solution, sputtering, CVD, plasma treatment or adsorption may be used as the method for introducing the nickel element. Among them, the method of using the solution is useful in that it is simple and that the concentration of the metal element may be readily adjusted.

Figure 48A:
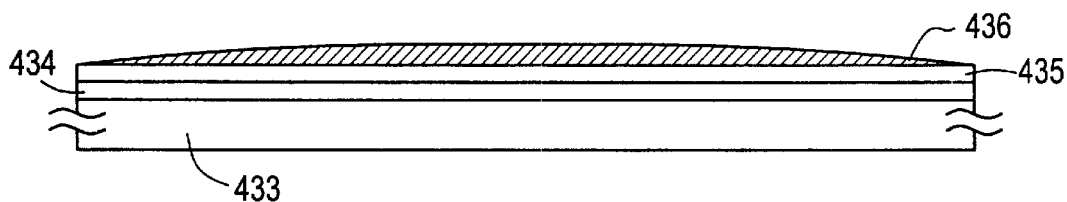
FIGS. 48A through 48E are diagrams showing fabrication steps according to a 58-th embodiment.

The nickel acetate solution is applied as described above to form a water film 436 of the nickel acetate aqueous solution as shown in FIG. 48A. After obtaining this state, extra solution is blown out by using a spinner not shown. Thus, the nickel element is held in contact on the surface of the amorphous silicon film 435. An amount of the nickel element to be introduced to the amorphous silicon film 435 may be controlled also by adjusting the time for holding the water film 436 or the condition for removing it by means of the spinner.

It is noted that it is preferable to use nickel sulfate solution, instead of the nickel acetate, if the remained impurities in the later heating process is taken into consideration. It is because the nickel acetate aqueous solution contains carbon and it might be carbonized in the later heating process, thus remaining within the film.

Figure 48B:
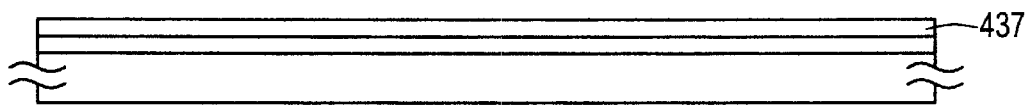

Next, a heat treatment is implemented within a nitrogen atmosphere containing 3 volume % of hydrogen at the temperature 640° C. in the state shown in FIG. 48B to crystallize the amorphous silicon film 435 and to obtain a crystal silicon film 437. The heating time is four hours. While the heat treatment may be implemented in the temperature range of 500 to 700° C., it is preferable to be a temperature below the distortion point of the glass substrate. Because the distortion point of the Corning 1737 glass substrate used in the present embodiment is 667° C., it is preferable to set the upper limit of the heating temperature here at about 650° C., leaving some margin.

The reason why the reducing atmosphere is adopted in the crystallization step in a way of the heat treatment is to prevent oxides from being created in the step of the heat treatment and more concretely, to suppress nickel from reacting with oxygen and NiOx from being created on the surface of the film or within the film. Oxygen couples with nickel and contributes a lot in gettering nickel in the later gettering step. However, it has been found that if oxygen couples with nickel in the above-mentioned stage of the crystallization, it hampers the crystallization. Accordingly, it is important to suppress the oxides from being created to the utmost in the crystallization step in a way of heating.

The concentration of oxygen within the atmosphere for implementing the heat treatment for the crystallization has to be in the order of ppm, or preferably, less than 1 ppm. Inert gases such as argon, beside nitrogen, or their mixed gas may be used as the gas which occupies the most of the atmosphere for implementing the heat treatment for the crystallization. After the crystallization step by the heat treatment described above, nickel element remains in certain blocks. It has been confirmed by an observation through a TEM (Transmission type Electron Microscope). While the reason why nickel exists in certain blocks has not been clarified yet, it is considered to be related with some crystallization mechanism.

Figure 48C:

Next, laser light is irradiated as shown in FIG. 48C. Here, KrF excimer laser (wavelength: 248 nm) is used here. The irradiation is implemented by scanning the laser beam whose shape is linear. The irradiation of the laser light allows the nickel element which has been concentrated locally as a result of the crystallization by means of the above-mentioned heat treatment to be distributed within the film 437 in some degree. That is, it allows to extinguish or reduce the blocks of nickel element and to distribute the nickel element. For the laser light described above, other types of excimer laser such as XeCl excimer laser (wavelength: 308 nm) may be used. Further, beside laser light, it is possible to arrange so as to irradiate ultraviolet rays or infrared rays for example.

Figure 48D:
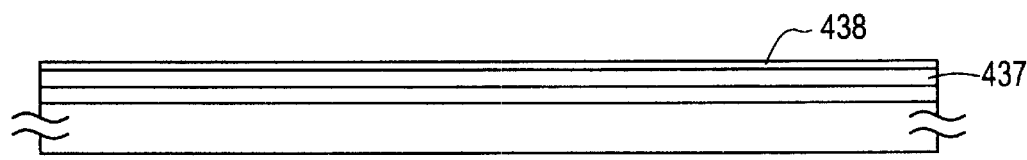

Next, another heat treatment is implemented in a step in FIG. 48D to form a thermal oxide film for gettering the nickel element. This heat treatment is implemented within an oxygen atmosphere containing 3 volume % of hydrogen and 100 ppm of ClF$_3$ at 640° C. As a result of this step, the thermal oxide film is formed in a thickness of 200 angstrom.

This step is carried out to eliminate the nickel element which has been introduced intentionally for the crystallization in the initial stage from the crystal silicon film 437. This heat treatment is implemented in the temperature range of 500 to 700° C. when a normal glass substrate is used as the substrate. The upper limit of the heating temperature is limited by the distortion point of the glass substrate to be used and it must be careful not to implement the heat treatment in temperatures above the distortion point of the glass substrate because otherwise the substrate deforms.

In this step, because the nickel element which has been distributed by the irradiation of laser light described above is gettered to the oxide film 438 to be formed, naturally the nickel concentration within the oxide film 438 becomes high as compared to other regions. Further, it has been observed that the concentration of nickel element is apt to be high near the interface between the crystal silicon film 437 and the thermal oxide film 438. It is considered to happen because the region where the gettering mainly takes place is on the side of the oxide film near the interface between the crystal silicon film and the oxide film.

The gettering proceeding near the interface is considered to be caused by the existence of stress and defects near the interface. It is also observed that the concentration of fluorine and chlorine is higher near the interface between the silicon film 437 and the thermal oxide film 438. The crystal silicon film thus obtained contains the metal element which promotes the crystallization of silicon in concentration of $1 \times 10^{16}$ cm$^{-3}$ to $5 \times 10^{18}$ cm$^{-3}$, fluorine atoms in concentration of $1 \times 10^{15}$ cm$^{-3}$ to $1 \times 10^{20}$ cm$^{-3}$, and hydrogen atoms in concentration of $1 \times 10^{17}$ cm$^{-3}$ to $1 \times 10^{21}$ cm$^{-3}$.

Figure 48E:
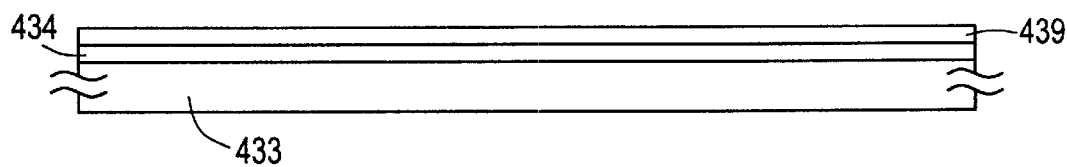

Then, after finishing to form the thermal oxide film 438 containing nickel in high concentration and shown in FIG. 43D, it is eliminated. While the thermal oxide film 438 may be eliminated by means of dry etching or wet etching using buffer hydrofluoric acid or other hydrofluorite (hydrofluoric) etchant, it is implemented by using the buffer hydrofluoric acid in the present embodiment. Thus, a crystal silicon film 439 in which the concentration of nickel has been reduced is obtained as shown in FIG. 48E.

Because nickel element is contained near the surface of the obtained crystal silicon film 439 relatively in high concentration, it is effective to advance the etching of the above-mentioned oxide film 438 to over-etch, more or less, the surface of the crystal silicon film 439. It is also effective to irradiate laser light again after eliminating the thermal oxide film 438 to promote the crystallization of the obtained crystal silicon film 439 further.

[59-th Embodiment]

A 59-th embodiment relates to a case when Cu is used as the metal element which promotes crystallization of silicon in the arrangement shown in the 58-th embodiment. In this case, while cupric acetate [Cu(CH$_3$ COO)$_2$] and cupric chloride (CUCl$_2$ 2H$_2$O) may be used as the solution for introducing Cu, cupric chloride (CuCl$_2$ 2H$_2$O) is used here. The other processes are implemented in the same manner with the 58-th embodiment.

[60-th Embodiment]

A 60-th embodiment relates to a case of growing crystal in the form different from that in the 58-th embodiment. That is, the present embodiment relates to a method of growing the crystal in a direction parallel to the substrate, i.e. a method called lateral growth, by utilizing the metal element which promotes crystallization of silicon.

FIGS. 49A through 49E show the fabrication process according to the present embodiment.

At first, a silicon oxynitride film is formed as an underlying film 441 in a thickness of 3000 angstrom on a quartz substrate 440. Next, an amorphous silicon film 442 which is the starting film of a crystal silicon film is formed in a thickness of 600 angstrom by low pressure thermal CVD. The thickness of this amorphous silicon film is preferable to be less than 2000 angstrom as described before. Other substrates such as a quartz substrate may be used as the above-mentioned substrate.

Next, a silicon oxide film not shown is formed in a thickness of 1500 angstrom and is patterned to form a mask 443. An opening is created on the mask in a region 444. The amorphous silicon film 442 is exposed at the region where the opening 444 is created. The opening 444 has a thin and long rectangular shape in the longitudinal direction from the depth to the front side of the figure. Preferably, the width of the opening 444 is 20 μm or more. The length thereof in the longitudinal direction may be determined as necessary.

Then, the nickel acetate aqueous solution containing 10 ppm of nickel element in terms of weight is applied and the extra solution is removed by implementing spin drying by using a spinner. Thus, the solution is held in contact on the exposed surface of the amorphous silicon film 442 as indicated by a dot line 445 in FIG. 49A.

Next, a heat treatment is implemented at 640° C. for four hours in a nitrogen atmosphere containing 3 volume % of hydrogen and in which oxygen is minimized. Then, crystal grows in the direction parallel to the substrate 440 as indicated by the reference numeral 446 in FIG. 49B. This crystal growth advances from the region of the opening 444 to which nickel element has been introduced to the surrounding part. This crystal growth in the direction parallel to the substrate will be referred to as lateral growth throughout the present specification.

it is possible to advance this lateral growth across more than 100 μm under the conditions shown in the present embodiment. Then, a silicon film 447 having the region in which the crystal has thus grown laterally is obtained. It is noted that crystal growth in the vertical direction called vertical growth advances from the surface of the silicon film to the underlying interface in the region where the opening 444 is formed. Then, the mask 443 made from the silicon oxide film for selectively introducing nickel element is eliminated. In this state, the vertically grown region, the laterally grown region and the region where no crystal has grown (thus having an amorphous state) exist within the silicon film 447.

It this state, nickel element is unevenly distributed within the film. In particular, the nickel element exists relatively in high concentration at the region where the opening 444 is created and the edge portion of the crystal growth indicated by the reference numeral 446. Next, after obtaining the state shown in FIG. 49C, laser light is irradiated in the same manner with the 58-th embodiment by using the KrF excimer laser. This step allows to distribute the unevenly distributed nickel element and to create the circumstance in which the gettering can be readily implemented in the later gettering step.

After irradiating the laser light, a heat treatment is implemented at 650° C. within an atmosphere containing 3 volume % of hydrogen and 100 ppm of NF$_3$. In this step, an oxide film 443 containing the nickel element in high concentration is formed in a thickness of 200 angstrom and thereby, the concentration of the nickel element within the silicon film 447 is reduced relatively in the same time. Then, after forming the thermal oxide film 448 containing the nickel element in high concentration, it is eliminated.

It is useful to etch the surface of the crystal silicon film further after eliminating the thermal oxide film 448. Then, patterning is implemented to create a pattern 449 made from the laterally grown region. The concentration of nickel element which remains within the pattern 449 made from the laterally grown region thus obtained may be reduced further as compared to the case shown in the 58-th embodiment.

This is caused by the fact that the concentration of the metal element contained within the laterally grown region is low originally. In concrete, the concentration of nickel element within the pattern 449 made from the laterally grown region may be readily reduced to the order of $10^{17}$ cm$^{-3}$ or less. It is also useful to implement the etching processes further after forming the pattern shown in FIG. 49E to eliminate the nickel element existing on the surface of the pattern.

Then, a thermal oxide film 450 is formed on the pattern 449 thus formed. The thermal oxide film is formed in a thickness of 200 angstrom by implementing a heat treatment for 12 hours in an oxygen atmosphere at 650° C. It is also effective to contain fluorine within the atmosphere in forming the thermal oxide film 450. Thereby, the nickel element may be fixed and unpaired bonding hands (dangling bonds) on the surface of the silicon film may be neutralized. That is, the interfacial characteristics between the active layer and the gate insulating film may be improved.

Chlorine may be used instead of fluorine. It is noted that the thermal oxide film becomes a part of the gate insulating film later when a thin film transistor is formed. When the thin film transistor is fabricated after that, the gate insulating film is formed by forming a silicon oxide film covering the thermal oxide film 456 by means of plasma CVD or the like.

[61-st Embodiment]

A 61-st embodiment relates to a case of fabricating a thin film transistor disposed in a pixel region of an active matrix type liquid crystal display or an active matrix type EL display.

Figure 50A:
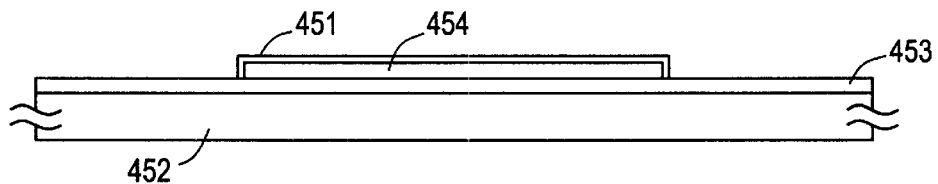
FIGS. 50A through 50E are diagrams showing fabrication steps according to a 62-nd embodiment.

FIGS. 50A through 50E show the fabrication process according to the present embodiment. At first, the crystal silicon film is formed on the glass substrate through the process shown in the 58-th or 60-th embodiment. When the crystal silicon film is obtained through the arrangement shown in the 58-th embodiment, it is patterned and the state shown in FIG. 50A is obtained after going through the steps shown in FIG. 48. The process which follows is common to the both embodiments.

In the state shown in FIG. 50A, the reference numeral (452) denotes a glass substrate, (453) an underlying film, (454) an active layer formed of the crystal silicon film. After obtaining the state shown in FIG. 50A, a plasma treatment is implemented in the reduced pressure atmosphere in which oxygen and hydrogen are mixed. The plasma is generated by high-frequency discharge. Organic substances existing on the surface of the exposed active layer 454 may be removed by the plasma treatment. Specifically, the organic substances adsorbing on the surface of the active layer are oxidized by oxygen plasma and the oxidized organic substances are reduced and vaporized by hydrogen plasma. Thus the organic substances existing on the surface of the exposed active layer 454 are removed.

The removal of the organic substances is very effective in suppressing fixed charge from existing on the surface of the active layer 454. That is, because the fixed charge caused by the existence of organic substances hampers the operation of the device and renders the characteristics thereof instable, it is very useful to remove it. After removing the organic substances, a thermal oxidation is implemented within an oxygen atmosphere at 640° C. to form a thermal oxide film of 100 angstrom thick. This thermal oxide film has a high interfacial characteristic with a semiconductor layer and composes a part of a gate insulating film later. Thus, the state shown in FIG. 50A is obtained.

After obtaining the state shown in FIG. 50A, a silicon oxide film 455 which composes the gate insulating film is formed in a thickness of 1000 angstrom. The film is formed by using the plasma CVD. The silicon oxide film 455 functions as the gate insulating film together with the thermal oxide film 451. It is effective to contain halogen element within the silicon oxide film 455. In this case, it is possible to prevent the function of the gate insulating film as an insulating film from dropping by the influence of the nickel element (or another metal element which promotes crystallization of silicon) existing within the active layer by fixing the nickel element by the action of the halogen element.

After forming the silicon oxide film 455 which functions as the gate insulating film, an aluminum film not shown which functions as a gate electrode later is formed by sputtering. 0.2 weight % of scandium is contained within the aluminum film to suppress hillock and whisker from being produced in the later process. The hillock and whisker mean that abnormal growth of aluminum occurs by implementing the heating, thus forming needle or prickle-like projections.

After forming the aluminum film, a dense anodic oxide film not shown is formed. The anodic oxide film is formed by using ethylene glycol solution containing 3 weight % of tartaric acid as electrolyte. That is, the anodic oxide film having the dense film quality is formed on the surface of the aluminum film by setting the aluminum film as the anode and platinum as the cathode and by anodizing within this electrolyte. The thickness of the anodic oxide film not shown having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization.

Figure 50B:
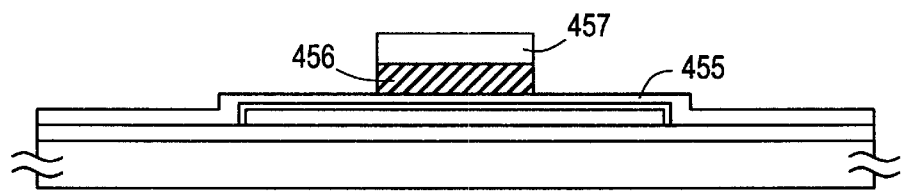
Figure 50C:
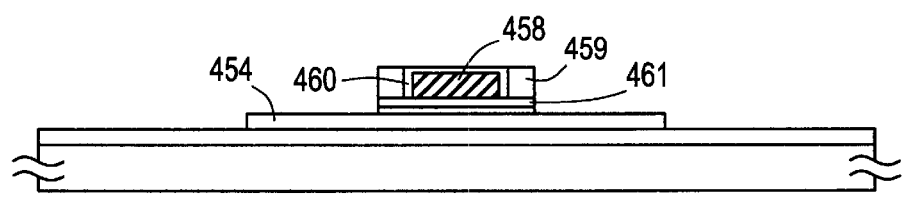

Next, the resist mask 457 is formed and the aluminum film is patterned so as to have a pattern 456. The state shown in FIG. 50B is thus obtained. Here, another anodization is implemented. In this case, 3 weight % or oxalate aqueous solution is used as electrolyte. A porous anodic oxide film 459 is formed by anodizing within this electrolyte by setting the aluminum pattern 456 as the anode.

In this step, the anodic oxide film 459 is formed selectively on the sides of the aluminum pattern because the resist mask 457 having the high adhesiveness exists thereabove. The anodic oxide film 459 may be grown up to several $\mu$m thick. The thickness is 6000 angstrom here. It is noted that the range of growth may be controlled by adjusting an anodizing time.

Next, after removing the resist mask 457, a dense anodic oxide film is formed again. That is, the anodization is implemented again by using the aforementioned ethylene glycol solution containing 3 weight % of tartaric acid as electrolyte. Then, an anodic oxide film 460 having a dense film quality is formed because the electrolyte infiltrates into the porous anodic oxide film 459.

This dense anodic oxide film 460 is 1000 angstrom thick. The thickness is controlled by adjusting applied voltage. Then, the exposed silicon oxide film 455 and the thermal oxide film 451 are etched by utilizing dry etching. Then, the porous anodic oxide film 459 is eliminated by using mixed acid in which acetic acid, nitric acid and phosphoric acid are mixed. Thus, the state shown in FIG. 50D is obtained.

Figure 50D:
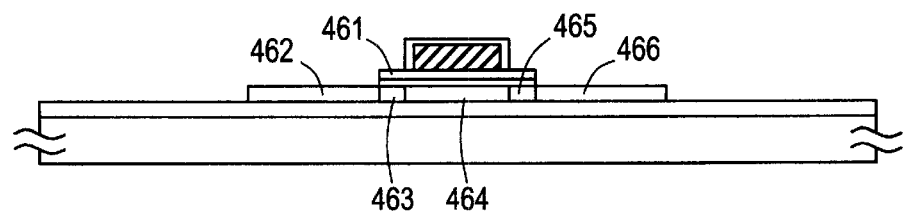

After obtaining the state shown in FIG. 50D, impurity ions are injected. Here, P (phosphorus) ions are injected by plasma doping in order to fabricate an N-channel type thin film transistor. In this step, heavily doped regions 462 and 466 and lightly doped regions 463 and 465 are formed because part of the remaining silicon oxide film 461 functions as a semi-permeable mask, thus blocking part of the injected ions.

Next, laser light is irradiated to activate the regions into which the impurity ions have been injected. Intense light may be applied instead of the laser light. Thus, a source region 462, a channel forming region 464, a drain region 466 and low concentration impurity regions 463 and 465 are formed in a manner of self-alignment. The one designated by the reference numeral 465 here is the region called the LDD (lightly doped drain).

It is noted that when the dense anodic oxide film 460 is formed as thick as 2000 angstrom or more, an offset gate region may be formed on the outside of the channel forming region 464 by its thickness. Although the offset gaze region is formed also in the present embodiment, it is not shown in the figures because its size is small, its contribution due to the existence thereof is small and the figures might otherwise become complicated. It is noted that it must be careful in forming the anodic oxide film having the dense film quality as thick as 2000 angstrom or more because it requires more than 200 V of applied voltage.

Figure 50E:
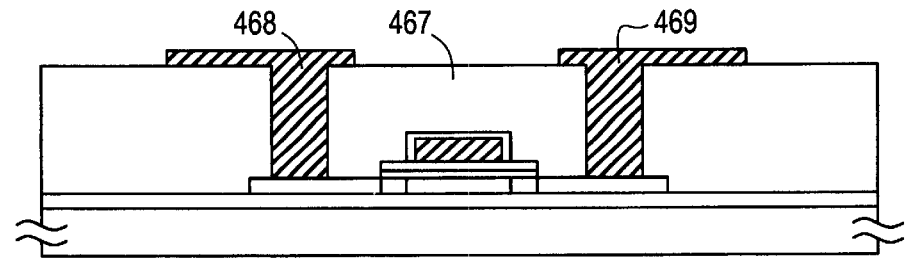

Next, a silicon oxide film or a silicon nitride film or their laminated film is formed as an interlayer insulating film 467. Their laminated film is formed here. The interlayer insulating film may be constructed by forming a layer made from a resin material on the silicon oxide film or the silicon nitride film. Then, contact holes are created to form a source electrode 468 and a drain electrode 469 Thus, the thin film transistor shown in FIG. 50E is obtained.

[62-nd Embodiment]

A 62-nd embodiment relates to a case of fabricating a thin film transistor through a process different from that shown in FIG. 50 (the 61-st embodiment). FIGS. 51A through 51E show the fabrication process according to the present embodiment. At first, the crystal silicon film is formed on the glass substrate through the process shown in the 58-th or 60-th embodiment. It is then patterned to obtained the state shown in FIG. 51A. The process which follows is common to the both embodiments.

After obtaining the state shown in FIG. 51, a plasma treatment is implemented within the reduced pressure atmosphere in which oxygen and hydrogen are mixed. In the state shown in FIG. 51A, the reference numeral (471) denotes a glass substrate, (472) an underlying film made from a silicon oxide film, (473) an active layer formed of the crystal silicon film. The thermal oxide film 470 is the film formed again after eliminating the thermal oxide film for gettering. Then, a silicon oxide film 474 which composes a gate insulating film is formed in a thickness of 1000 angstrom by using the plasma CVD as shown in FIG. 51B.

The silicon oxide film 474 composes the gate insulating film together with the thermal oxide film 470. Next, an aluminum film not shown which functions as a gate electrode later is formed by sputtering. 0.2 weight % of scandium is contained within the aluminum film. After forming the aluminum film, a dense anodic oxide film not shown is formed. The anodic oxide film is formed by using ethylene glycol solution containing 3 weight % of tartaric acid as electrolyte.

The thickness of the anodic oxide film not shown having the dense film quality is around 100 angstrom. This anodic oxide film plays a role of enhancing the adhesiveness with a resist mask to be formed later. It is noted that the thickness of the anodic oxide film may be controlled by adjusting voltage applied during the anodization. Next, the resist mask 475 is formed and the aluminum film is patterned so as to have the pattern 476.

Here, another anodization is implemented. In this case, 3 weight % of oxalate aqueous solution is used as electrolyte. A porous anodic oxide film 477 is formed by anodizing within this electrolyte by setting the aluminum pattern 476 as the anode. In this step, the anodic oxide film 477 is formed selectively on the sides of the aluminum pattern because the resist mask 475 having the high adhesiveness exists thereabove.

The anodic oxide film may be grown up to several $\mu$m thick. The thickness is 6000 angstrom here. It is noted that the range of growth may be controlled by adjusting an anodizing time. Next, after removing the resist mask 475, a dense anodic oxide film is formed again. That is, the anodization is implemented again by using the ethylene glycol solution containing 3 weight % of tartaric acid as electrolyte. Then, an anodic oxide film 478 having a dense film quality is formed because the electrolyte infiltrates into the porous anodic oxide film 477.

Here, the initial injection of impurity ions is implemented. Here, P (phosphorus) ions are injected in order to fabricate an N-channel type thin film transistor. It is noted that B (boron) ions are injected when a P-channel type thin film transistor is to be fabricated. A source region 479 and a drain region 481 are formed by injecting the impurity ions. It is noted that no impurity ion is injected to a region 480 at this time. Next, the porous anodic oxide film 477 is eliminated by using mixed acid in which acetic acid, nitric acid and phosphoric acid are mixed. Thus, the state shown in FIG. 51D is obtained.

Figure 51A:
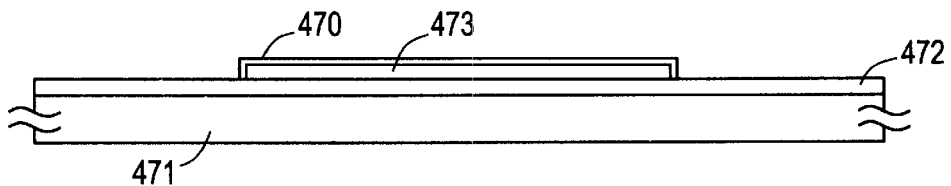
FIGS. 51A through 51E are diagrams showing fabrication steps according to a 63-rd embodiment.
Figure 51B:
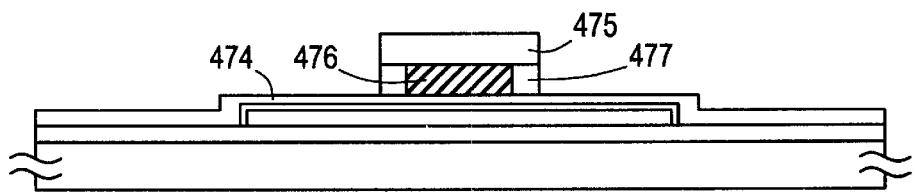
Figure 51C:
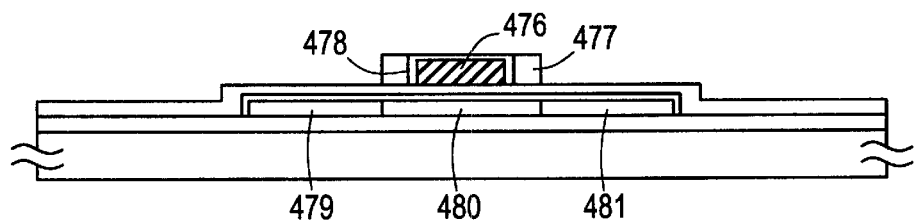
Figure 51D:
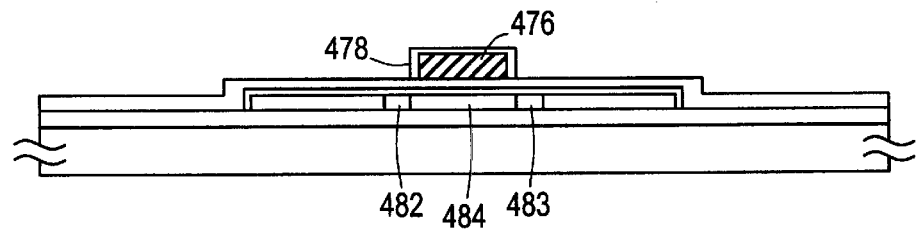

After obtaining the state shown in FIG. 51D, impurity ions are injected again. The impurity ions are injected under the doping condition (lower dosage) lighter than that of the first injection. In this step, lightly doped regions 482 and 483 are formed and a region 484 turns out to be a channel forming region.

Then, laser light is irradiated to activate the regions into which the impurity ions have been injected. Instead of the laser light, infrared rays or ultraviolet rays may be also irradiated. Thus, the source region 479, the channel forming region 484, the drain region 481 and low concentration impurity regions 482 and 483 are formed in a manner of self-alignment. Here, the one designated by the reference numeral 483 is the region called the LDD (lightly doped drain).

Figure 51E:
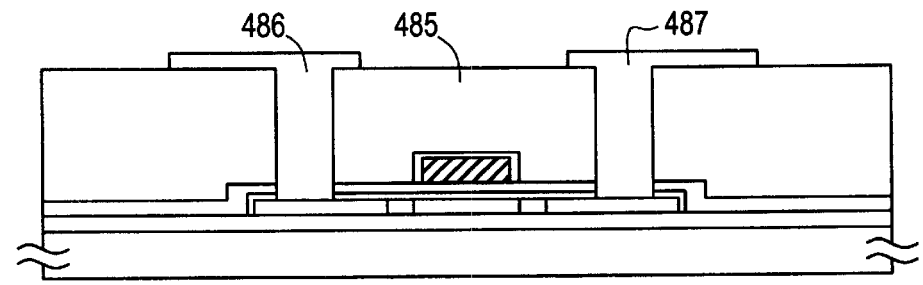

Next, while a silicon oxide film or a silicon nitride film or their laminated film is formed as an interlayer insulating film 485, it is formed by using the silicon oxide film here. The interlayer insulating film may be also constructed by forming a layer made from a resin material on the silicon oxide film or the silicon nitride film. After that, contact holes are created to form a source electrode 486 and a drain electrode 487. Finally, a heat treatment (hydrogenation heat treatment) is implemented for one hour within a hydrogen atmosphere at 350° C. In this step, defects and unpaired bonding hands (dangling bonds) may be neutralized. Thus, the thin film transistor shown in FIG. 51E is obtained.

[63-rd Embodiment]

A 63-rd embodiment relates to a case when an N-channel type thin film transistor and a P-channel type thin film transistor are formed in a complementary manner. The formation shown in the present embodiment may be utilized for various thin film integrated circuits integrated on an insulating surface as well as for peripheral driving circuits of an active matrix type liquid crystal display for example. FIGS. 52A through 52F are diagrams showing a fabrication process according to the present embodiment.

Figure 52A:
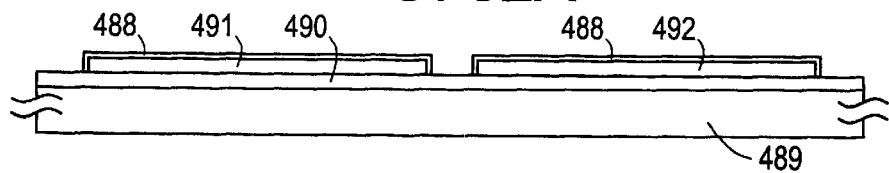
FIGS. 52A through 52F are diagrams showing fabrication steps according to a 66-th embodiment.

At first, a silicon oxide film is formed as an underlying film 490 on a glass substrate 489 as shown in FIG. 52A. It is also possible to use a silicon nitride film instead of the silicon oxide film. Next, an amorphous silicon film not shown is formed by the plasma CVD or the low pressure thermal CVD. The former is used here. Then, the amorphous silicon film is transformed into a crystal silicon film by the method shown in the 58-th embodiment. Next, a plasma treatment is implemented within an atmosphere in which oxygen and hydrogen are mixed and the crystal silicon film thus obtained is patterned to obtain active layers 491 and 492. After forming the active layers 491 and 492, a thermal oxide film 488 is formed. The thickness of the thermal oxide film 488 is around 100 angstrom. Thus, the state shown in FIG. 52A is obtained.

Next, a silicon oxide film which compose a gate insulating film 493 is formed. Next, an aluminum film not shown is formed in a thickness of 4000 angstrom. Beside the aluminum film, a metal which can be anodized, such as tantalum, may be used. After forming the aluminum film, a very thin and dense anodic oxide film is formed on the surface thereof by the method described before.

Next, a resist mask not shown is placed on the aluminum film to pattern the aluminum film. Then, anodization is implemented by setting the obtained aluminum pattern as the anode to form porous anodic oxide films 496 and 497. The thickness of the porous anodic oxide films is 5000 angstrom. Then, another anodization is implemented under the condition of forming dense anodic oxide films 498 and 499.

Figure 52B:
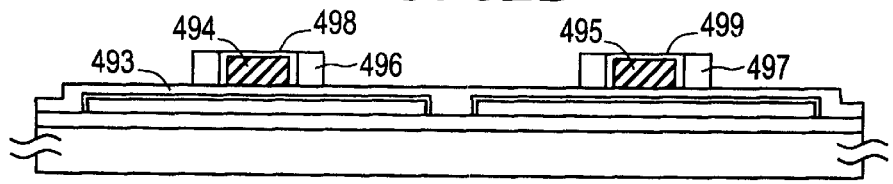
Figure 52C:
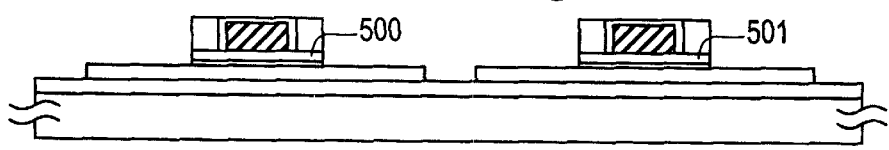
Figure 52D:
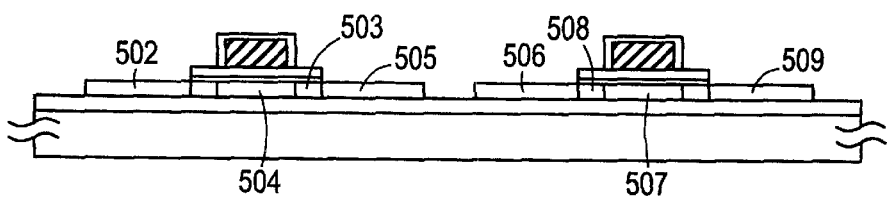

The thickness of the dense anodic oxide films 498 and 499 is 800 angstrom. Thus, the state shown in FIG. 52B is obtained. Further, the exposed silicon oxide film 493 and the thermal oxide film 488 are eliminated by dry etching, thus obtaining the state shown in FIG. 52C as a result. After obtaining the state shown in FIG. 52C, the porous anodic oxide films 496 and 497 are eliminated by using mixed acid in which acetic acid, nitric acid and phosphoric acid are mixed. Thus, the state shown in FIG. 52D is obtained.

Here, resist masks are disposed alternately to inject P (phosphorus) ions to the thin film transistor on the left side and B (boron) ions to the thin film transistor on the right side. By injecting those impurity ions, a source region 502 and a drain region 505 to which P ions are doped in high concentration, thus having N-type, are formed in a manner of self-alignment. Further, a region 503 to which P ions are doped in low concentration, thus having weak N-type, as well as a channel forming region 504 are formed in the same time.

The reason why the region 503 having the weak N-type is formed is because the remaining gate insulating film 500 exists. That is, part of P ions transmitting through the gate insulating film 500 is blocked by the gate insulating film 500. By the same principle, a source region 509 and a drain region 506 having strong P-type are formed in a manner of self-alignment and a low concentration impurity region 508 is formed in the same time. Further, a channel forming region 507 is formed in the same time.

It is noted that when the thickness of the dense anodic oxide films 498 and 499 is as thick as 2000 angstrom, an offset gate region may be formed in contact with the channel forming region by that thickness. Its existence may be ignored in the case of the present embodiment because the dense anodic oxide films 498 and 499 are so thin as less than 1000 angstrom.

Figure 52E:
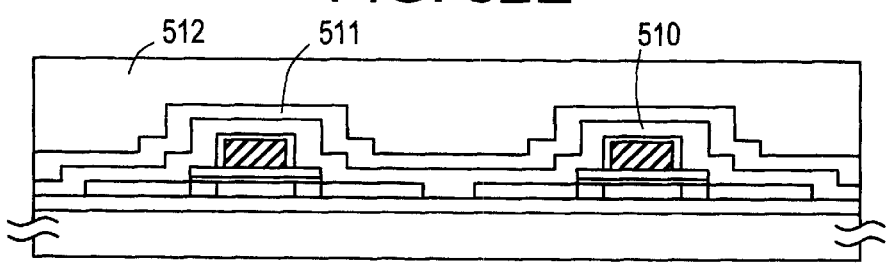

Then, laser light is irradiated to anneal the region into which the impurity ions have been injected. Intense light such as ultraviolet rays may be also irradiated instead of the laser light. Then, a silicon nitride film 510 and a silicon oxide film 511 are formed as interlayer insulating films as shown in FIG. 52E. Their thickness is 1000 angstrom, respectively. It is noted that the silicon oxide film 511 needs not be always formed. Thus, the thin film transistor is covered by the silicon nitride film. The reliability of the thin film transistor may be enhanced by arranging as described above because the silicon nitride film is dense and has an excellent interfacial characteristic.

Further, an interlayer insulating film 512 made from a resin material is formed by means of spin coating. Here, the thickness of the interlayer insulating film 512 is 1 $\mu$m. Then, contact holes are created to form a source electrode 513 and a drain electrode 514 of the N-channel type thin film transistor on the left side. In the same time, a source electrode 515 and the drain electrode 514 of the thin film transistor on the right side are formed. The electrode 514 is disposed in common to the both of them.

Figure 52F:
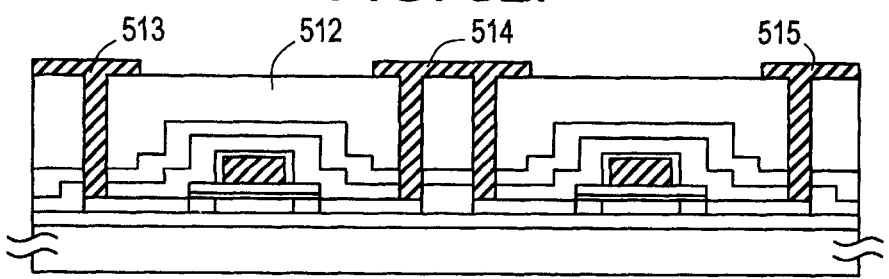

Thus, the thin film transistor circuit having the CMOS structure constructed in the complementary manner as shown in FIG. 52F is completed. In the formation shown in the present embodiment, the thin film transistor may be covered by the nitride film as well as the resin material. This formation allows to enhance the durability of the thin film transistor, so that movable ions nor moisture hardly infiltrate. Further, it allows to prevent capacitance from being generated between the thin film transistor and wires when a multi-layered wire is formed.

[64-th Embodiment]

A 64-th embodiment relates to a case when nickel element is introduced directly to the surface of the underlying film in the process shown in the 58-th embodiment. In this case, the nickel element is held in contact on the lower surface of the amorphous silicon film. In this case, the nickel element is introduced after forming the underlying layer to hold the nickel element (metal element) in contact on the surface of the underlying layer.

According to the present embodiment, aqueous solution of nickel acetate is applied on the surface of the underlying film and the other processes are implemented in the same manner with the case or the 58-th embodiment, thus obtaining the state shown in FIG. 48E. Beside the method of using the solution, sputtering, CVD or adsorption may be used as the method for introducing nickel element.

[65-th Embodiment]

Figure 49A:
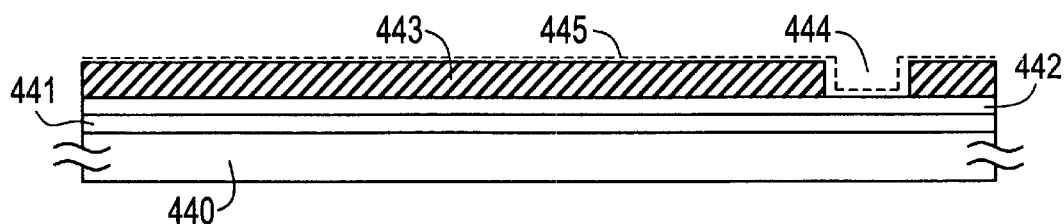
FIGS. 49A through 49E are diagrams showing fabrication steps according to a 60-th embodiment.
Figure 49B:
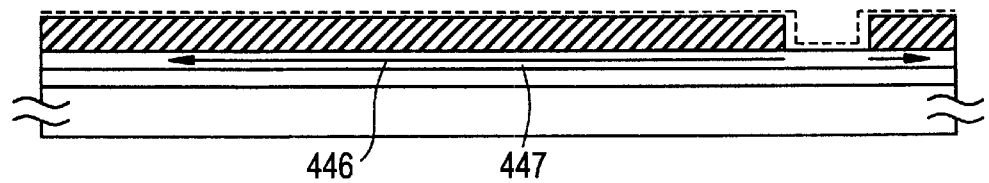
Figure 49C:
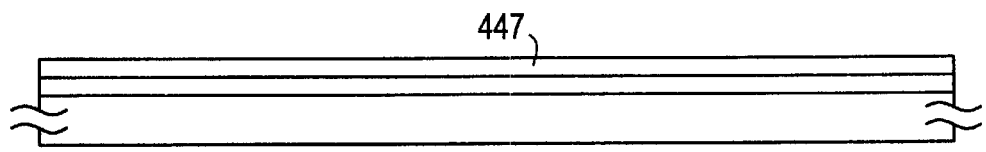
Figure 49D:
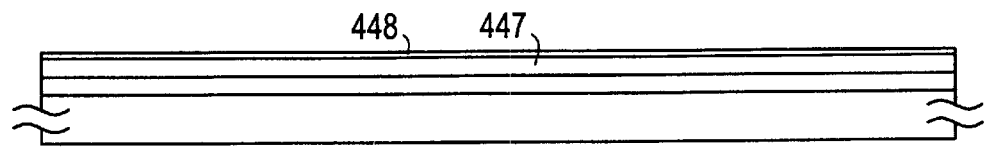
Figure 49E:
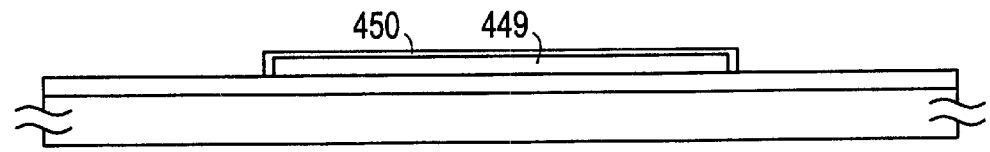

A 65-th embodiment relates to a case of improving the crystallinity of an island pattern formed of a crystal silicon film obtained in the previous step by irradiating laser light in the state shown in FIG. 49E, the state shown in FIG. 50A or the state shown in FIG. 51A. A predetermined annealing effect can be obtained with relatively low irradiation energy density by irradiating the laser light in the state shown in FIGS. 49E, 50A and 51A. This effect is considered to nave been effected because the laser energy is irradiated to a spot of small area, thus enhancing the efficiency of energy utilized in the annealing.

[66-th Embodiment]

A 66-th embodiment relates to a case of fabricating a bottom-gate type thin film transistor. FIGS. 53A through 53F shows the process for fabricating the thin film transistor of the present embodiment. At first, a silicon oxide film 517 is formed as an underlying film on a glass substrate 516.

Figure 53A:
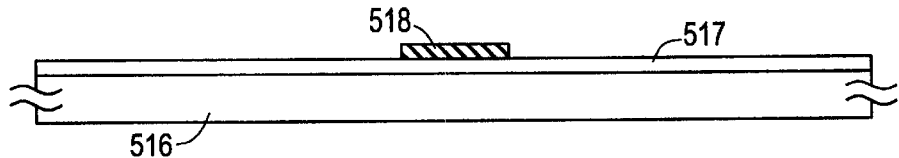
FIGS. 53A through 53F are diagrams showing fabrication steps according to a 67-th embodiment.
Figure 53B:
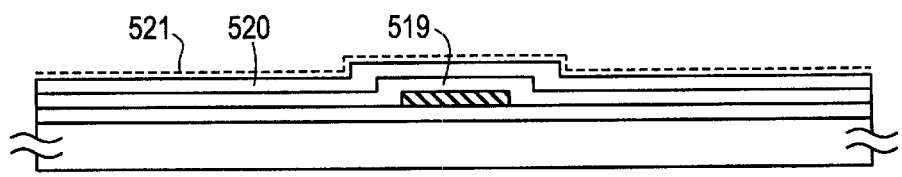
Figure 53C:
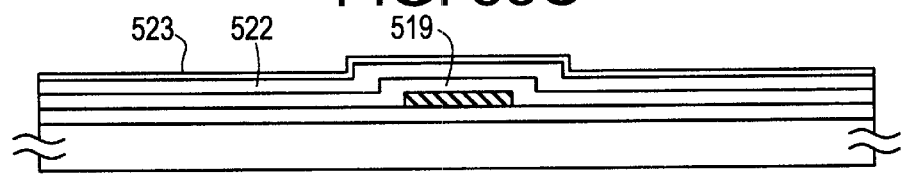

Next, while a gate electrode 518 is formed by using an adequate metallic material or metallic silicide material, aluminum is used here. After forming the gate electrode 518, a silicon oxide film 519 which functions as a gate insulating film is formed. Further, an amorphous silicon film 520 is formed by means of plasma CVD. Next, nickel acetate aqueous solution is applied as shown in FIG. 53B to hold nickel element in contact on the surface of the amorphous silicon film 520 as a liquid film 521 of the nickel acetate solution.

Next, a heat treatment is implemented within an nitrogen atmosphere containing 3 volume % of hydrogen at 650° C. to crystallize the amorphous silicon film 520 and to obtain a crystal silicon film 522. A heat treatment is implemented to the crystal silicon film within an oxygen atmosphere containing 5 volume % of HCl and 100 ppm (volume) of $NF_3$ at 650° C. After obtaining the state shown in FIG. 53C by forming a thermal oxide film 523 as the result of the heat treatment, it is removed.

Figure 53D:
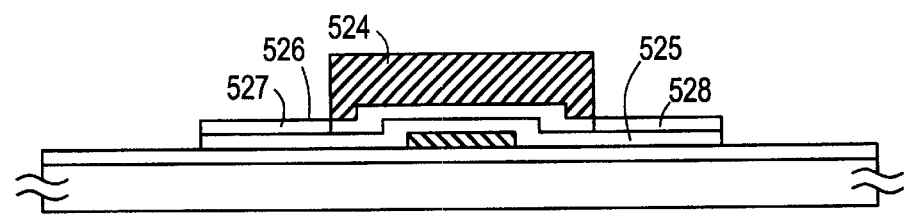
Figure 53E:
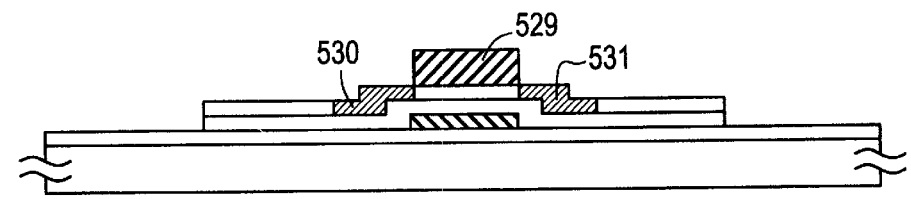
Figure 53F:
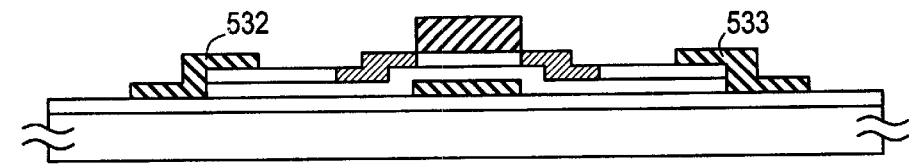

Next, the crystal silicon film 522 and the silicon oxide film 519 are patterned to form the gate insulating film 525 and an active layer 526 of the thin film transistor. Further, a resist mask 524 is placed as shown in FIG. 53D. In the state shown in FIG. 53D, impurity ions are injected to form a source and drain regions. Here, P (phosphorus) ions are injected in order to fabricate a N-channel type thin film transistor. In this step, the source region 527 and the drain region 528 are formed.

After that, isotropic ashing is implemented to cause the resist mask 524 to recede as a whole. That is, as indicated by the reference numeral 529 in FIG. 53E, the size of the resist mask 524 is reduced as a whole. Thus, the receded resist mask 529 is obtained. Next, P ions are injected again in the state shown in FIG. 53E.

This step is implemented with less dosage than the dosage of P ions in the step in FIG. 53D. Thus, low concentration impurity regions 530 and 531 are formed. Next, metallic electrodes 532 and 533 are formed. Here, the electrode 532 is the source electrode and the electrode 533 as the drain electrode. Thus, the bottom-gate type thin film transistor is completed.

[Mode as Premise of 67-th Embodiment]

Figure 54A:
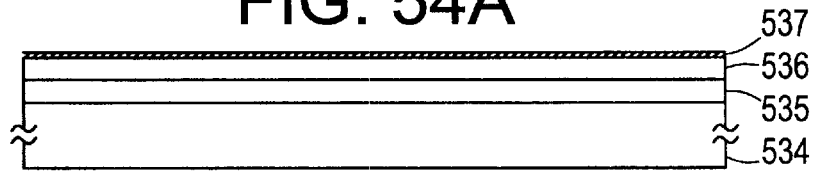
FIGS. 54A through 54E are diagrams showing fabrication steps according to the 67-th embodiment.
Figure 54B:
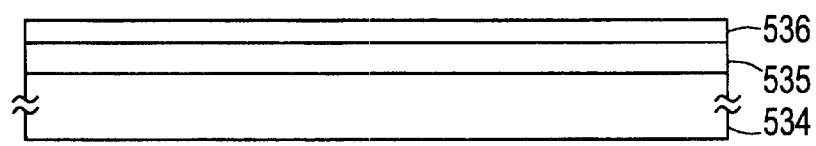
Figure 54C:
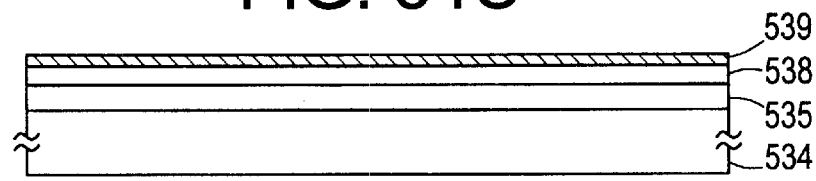
Figure 54D:
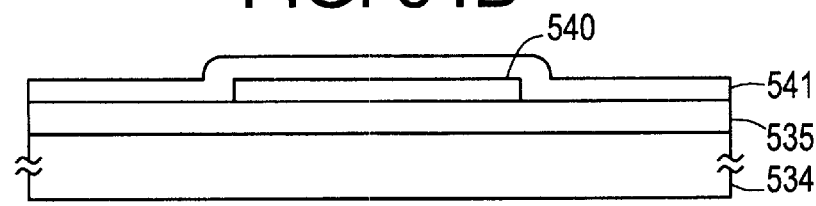
Figure 54E:
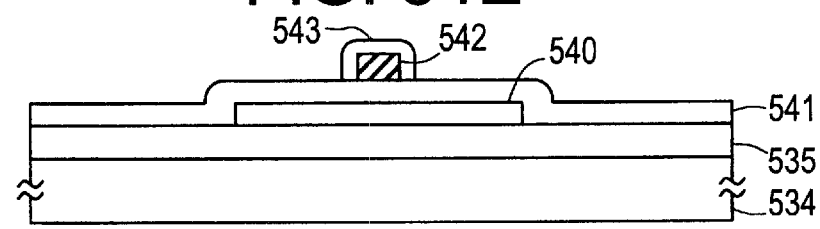
Figure 55A:
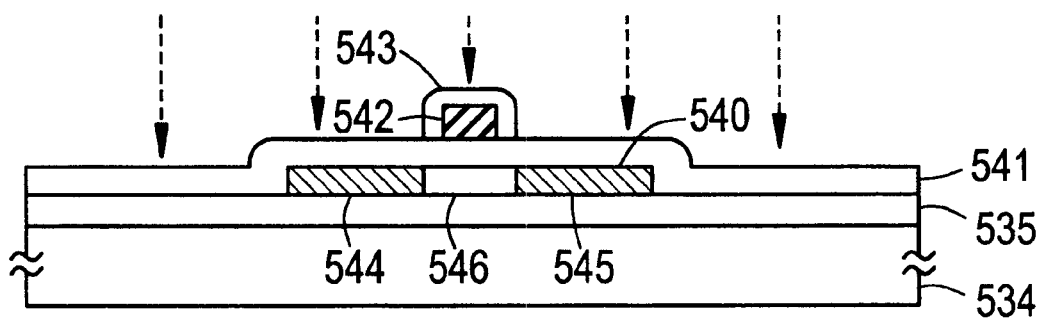
FIGS. 55A and 55B are diagrams showing fabrication steps according to a 68-th embodiment.
Figure 55B:
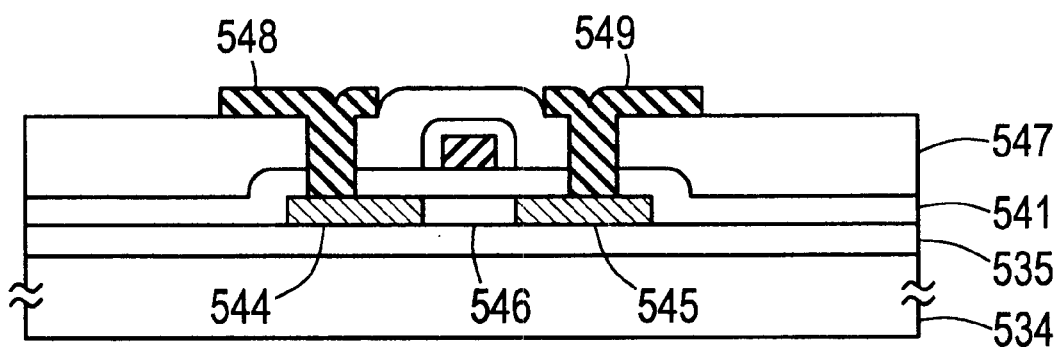

FIGS. 54A through 54E as well as FIGS. 55A and 55B are diagrams for explaining the fabrication processes of a thin film transistor (TFT) or are diagrams for explaining the fabrication processes of a TFT in a 67-th embodiment. Then, a concrete mode of the invention which is a premise of the 67-th embodiment will be explained at first based on FIGS. 54 through 55.

As shown in FIG. 54A, an underlying film 535, an amorphous silicon film 536 are laminated sequentially on a glass substrate 534 and Ni layer 537 is formed on the surface of the amorphous silicon film 536. When a heat treatment is implemented in this state, the amorphous silicon film 536 is crystallized and a crystal silicon film 538 is formed as shown in FIG. 54B. Although the step for forming the nickel layer 537 is not essential in the present mode, nickel allows the heating temperature in the crystallization step to be lowered and the heating time to be shortened because it functions as a catalyst for lowering thermal energy required for the crystallization.

While Fe, Co, Ru, Rh, Pd, Os, Ir, Pt, Cu and Au may be used as such a catalytic element, beside nickel (Ni), the catalytic effect of nickel is most remarkable. It is noted that the crystal silicon film may be formed by using known technologies or the like without using nickel element. Further, laser light may be irradiated as the crystallization step instead of the heat treatment. Further, it is possible to implement light annealing by means of laser light or infrared rays or thermal annealing after forming the crystal silicon film.

FIG. 54C shows a thermal oxidation step. That is, with the formation of Si—O coupling, non-coupled Si is also generated. This excessive Si diffuses within the crystal silicon film 538 from the interface between the thermal oxide film 539 and the crystal silicon film 538 and couples with dangling bond of Si existing in the grain boundary, thus passivating the defects at the grain boundary of the crystal silicon film 538. Thereby, the mobility of the TFT composed of the crystal silicon film 538 may be improved.

Further, Si which passivates the defects allows to eliminate the hydrogen plasma treatment because it will not readily desorb from the crystal silicon film 538 like H in the following fabrication process involved in heating. For example, concerning to a N-channel TFT fabricated in accordance to the inventive method for fabricating a semiconductor device, the mobility after the hydrogen plasma treatment increases only 10 to 20% as compared to that before the hydrogen plasma treatment. It indicates that the defects of the crystal silicon film 538 has been fully passivated in the thermal oxidation step and that Si which passivates the defects is not desorbed during the fabrication step.

Taking into consideration that the object of the thermal oxidation step in the present invention is to supply Si for passivating the defects of the grain boundary of the crystal silicon film and that the crystal silicon film 538 composes the active layer of the TFT, the thermal oxide film 539 may be formed in a thickness of about 200 to 500 angstrom without considering the film quality such as pressure resistance. Further, it is intended to fabricate the TFT on the glass substrate in the present invention, the thermal oxidation step has to be implemented under the condition in which the distortion or deformation of the substrate caused by heat is permissible. For example, the upper limit of the heating temperature may be set by the criterion of thee distortion point of the glass substrate.

In the present invention, the thermal oxidation step is implemented in an oxidizing atmosphere in which fluorine compound is added. In concrete, the thermal oxidation is implemented within an atmosphere in which $NF_3$ gas or the like is added to oxygen gas. The thermal oxide film may be grown to several hundreds angstrom by heating for several to 10 and several hours at temperatures below the distortion point of the glass substrate by adequately controlling the concentration of $NF_3$ gas.

Although the growth of the thermal oxide film is accelerated by adding gas which supplies Cl radicals like Cl to the oxidizing atmosphere, beside the gas which supplies fluorine radicals like the $NF_3$ gas, it is not suitable because it takes time if the thermal oxide film is to be formed in a thickness of several hundreds angstrom by heating in temperatures below the distortion point of the glass substrate, e.g. in the temperature range of around 600 to 500° C. The thermal oxide film may be formed in a thickness of around 200 angstrom by heating for four hours at 600° C. within the oxidizing atmosphere in which 450 ppm of $NF_3$ gas is added to oxygen gas.

Further, because the fluorine radicals are supplied concentrating to a convex portion on the surface of the crystal silicon film 538 in the thermal oxidation step, thermal oxidation of the convex portion proceeds most and that of a concave portion is suppressed. Further, because the thermal oxide film 539 has fluorine in high concentration and stress is relaxed, the thermal oxide film 539 is formed in a uniform thickness on the surface of the crystal silicon film 538 such that the convex portion is rounded.

Because the heating temperature and heating time need to be determined in the thermal oxidation step such that the distortion and deformation of the substrate fall within the permissible range, the concentration of fluorine compound within the thermal oxidation atmosphere may increase. As a result, the thermal oxide film 539 may contain a large amount of fluorine, thus forming Si—F bond as a result. However, because the thermal oxide film 539 is formed as a film grown to supply Si which passivates the defects at the grain boundary of the crystal silicon film and as a film to be eliminated later, it is not required to have the high function and high reliability like the gate insulating film and the instability like Si—F bond existing within the thermal oxide film 539 or its pressure resistance does not matter.

FIG. 54D shows the active layer 540 and the gate insulating film 541 formed by patterning the crystal silicon film 538 after eliminating the thermal oxide film 539. Although it is possible to adopt the thermal oxidation to form the gate insulating film 541, the film quality of the thermal oxide film obtained by the thermal oxidation in a low temperature which causes the deformation of the glass substance in a permissible degree is not good. Due to that, in the present mode, the gate insulating film is formed by deposition such as the plasma CVD or sputtering in order to stably obtain the gate insulating film having the predetermined characteristics.

Because the surface of the active layer 540 (the crystal silicon film 538) is flattened by going through the thermal oxidation step in the present mode, the gate insulating film may be formed with a good coating capability even if it is formed by the deposition. Thereby, the interfacial level between the gate insulating film and the active layer may be lowered.

While the crystal silicon film obtained by irradiating laser light has an excellent crystallinity, a ridge having a sharp projection is formed on the surface thereof. For instance, when laser annealing is implemented after heating an amorphous silicon film of about 700 angstrom to crystallize it, a ridge having about 100 to 300 angstrom of height is formed on the surface thereof.

Then, the difference of height on the surface of the crystal silicon film may be reduced to about several tens angstrom by forming a thermal oxide film of about 500 angstrom thick by implementing thermal oxidation for 12 hours within an atmosphere in which about 450 ppm of $NF_3$ gas is added to oxygen gas. Accordingly, the insulating film may be deposited by CVD favorably also on the surface of the crystal silicon film crystallized by laser light.

FIG. 55A shows a step for doping impurity ions. A gate electrode 542 functions as a mask and a source region 544, a drain region 545 and a channel region 546 are formed in a manner of self-alignment. Further, an interlayer insulating film 547, electrodes 548 and 549 are formed as shown in FIG. 55B, thus completing the TFT.

[67-th Embodiment]

A 67-th embodiment relates to a case of fabricating a TFT using the silicon film crystallized by utilizing the catalytic action of the metal element which promotes crystallization of silicon. FIGS. 54 through 55 are diagrams for explaining steps for fabricating the TFT according to the present embodiment, or section views showing each step. Nickel is used as the metal element in the present embodiment.

As shown in FIG. 54A, a silicon oxide film is formed as an underlying film 535 on a glass substrate 534 (Corning 1737, distortion point: 667° C.) by means of plasma CVD or low pressure CVD. Next, a substantially intrinsic (I type) amorphous silicon film 536 is formed by the plasma CVD or low pressure CVD in a thickness of 700 to 1000 angstrom. Here, the low pressure CVD is used for forming the both films. The thickness of the amorphous silicon film 536 is 700 angstrom.

UV (ultraviolet) rays are irradiated to the surface of the amorphous silicon film 536 within an oxidizing atmosphere to form an oxide film not shown in a thickness of several 20s angstrom. After that, solution containing nickel element is applied on the surface of the oxide film. The oxide film is formed to improve wetting of the surface of the amorphous silicon film 536 to suppress the solution from being repelled. In the present embodiment, nickel acetate aqueous solution containing 55 ppm of nickel is used as the solution containing nickel element.

In the present embodiment, the nickel acetate solution is applied by a spinner and is then dried to form a nicker layer 537. Although the nickel layer 537 may not be formed as a complete film, nickel element is held in contact on the surface of the amorphous silicon film 536 via the oxide film not shown in this state. It is noted that while the solution in which nickel salt is diluted may be used, preferably a solution containing nickel in concentration of about 1 to 100 ppm may be used.

Here, it is difficult to obtain the effect of promoting the crystallization if the nickel concentration within the amorphous silicon film is less than $1 \times 10^{16}$ atoms/cm$^{-3}$. When the nickel concentration is above $5 \times 10^{19}$ atoms/cm$^{-3}$, the characteristics as a semiconductor of the silicon film thus obtained is lose and the characteristic as a metal appears. Therefore, conditions such as the concentration of nickel within the nickel acetate solution, a number of times of application and an applied amount are set in advance so that the average nickel concentration within the silicon film finally obtained falls in the range of $1 \times 10^{16}$ atoms/cm$^3$ to $5 \times 10^{19}$ atoms/cm$^3$. It is noted that the concentration of nickel may be measured by SIMS (secondary ion mass spectrometry).

In the state in which the nickel element is held on the surface of the amorphous silicon film 536 as shown in FIG. 54A, a heat treatment is implemented within a nitrogen atmosphere to crystallize the amorphous silicon film 536 and to form a crystal silicon film 538 as shown in FIG. 54B. While it is necessary to heat at a temperature more than 450° C. in order to crystallize silicon, it is desirable to heat at a temperature more than 550° C. because it takes several tens hours to crystalize the amorphous silicon film in the temperature range of 450 to 500° C. It is noted that the heating temperature must be within the range in which the deformation or contraction of the glass substrate caused by heating is permissible in all the steps, not only the crystallization step shown in FIG. 54B.

The reference of the upper limit of the heating temperature may be set at the distortion point of he substrate. Because the glass substrate 534 whose distortion point is 667° C. is used in the present embodiment, the heat treatment is implemented at 620° C. for four hours. Thereby, nickel heads from the surface of the amorphous silicon film 536 to the interface with the underlying film 535 and diffuses in a direction at almost right angles with the face of the glass substrate 534. Then, along that, crystal growth of silicon proceeds, thus forming the crystal silicon film 538. This crystal growth advances unorderly in a direction vertical to the glass substrate 534. Such growth process will be referred to as a vertical growth here.

It is noted that the crystallinity of the crystal silicon film 538 may be improved further by implementing light annealing by means of laser light, infrared rays or ultraviolet rays, or heat annealing as necessary after the crystallization step. The light annealing and the heat annealing may be used in combination. However, when the laser annealing is implemented, the thickness of the amorphous silicon film 536, i.e. the starting film of the crystal silicon film 538, is set below 1000 angstrom, or preferably 700 to 800 angstrom, in order to effectively supply thermal energy to the crystal silicon film 538.

Next, a thermal oxide film 539 is formed in a thickness of 200 to 500 angstrom on the surface of the crystal silicon film 538 by heating in an oxygen atmosphere containing fluorine atoms. In the present embodiment, the thermal oxide film 539 is formed in a thickness of about 200 angstrom by heating for four hours at 600° C. within the atmosphere in which 400 ppm of $Nf_3$ is added to oxygen gas.

As a result, the thickness of the crystal silicon film 538 which has been about 700 angstrom before the formation or the thermal oxide film 539 is reduced to about 600 angstrom. Because the crystal silicon film 538 composes the active layer of the TFT in the end, the thickness of the amorphous silicon film 536 has to be determined taking the thickness of the thermal oxide film 539 into consideration so that the active layer having the required thickness can be obtained.

As the thermal oxide film 539 is formed on the surface of the crystal silicon film 538, non-coupled Si is also generated. This excessive Si diffuses within the crystal silicon film 538 from the interface between the thermal oxide film 539 and the crystal silicon film 538 and couples with dangling bond of Si existing in the grain boundary, thus reducing the density of defects at the grain boundary of the crystal silicon film 538. Further, because Si which passivates the defects will not readily desorb from the crystal silicon film 538 like H in the following fabrication process utilizing heating, the crystal silicon film 538 is suitable as a material of a semiconductor device such as a TFT.

Further, because the oxidation rate of the convex and concave portions is different, the convex portion on the surface of the crystal silicon film 538 is rounded and is flattened. It is noted that because the ridges are formed on the surface of the crystal silicon film 538 when it is irradiated by laser light, the conditions of the thermal oxidation process such as the thickness of the thermal oxide film 539 and the concentration of $NF_3$ gas are set taking the thickness of the crystal silicon film 538 after the thermal oxidation process into consideration so that the ridges can be flattened or removed as much as possible.

Next, the thermal oxide film 539 is eliminated by etching as shown in FIG. 54D. In etching the film, etching solution or etching gas having high etching rate for silicon oxide and silicon is used. While buffer hydrofluoric acid or other hydrofluoric etchants may be preferably used as the etchant, the thermal oxide film 539 is eliminated by means of wet etching using the buffer hydrofluoric acid in the present embodiment.

Next, the crystal silicon film 538 is patterned into an island shape to form an active layer 540 of the TFT. Then, a silicon oxide film is formed as a gate insulating film 541 in a thickness of 1000 angstrom by means of plasma CVD. Because the surface of the active layer 540 has been flattened in the thermal oxidation process, the gate insulating film 541 may be deposited with a favorable coating capability. After that, an aluminum film containing a trace amount of scandium not shown is formed in a thickness of 6000 angstrom on the surface of the gate insulating film 541 by means of electron beam deposition and is patterned as shown in FIG. 54E to form a gate electrode 542.

Then, an oxide layer 543 is formed by implementing anodization within electrolyte by setting the gate electrode 542 at the anode. In this case, the anodic oxide layer 543 having a dense structure is formed in a thickness of 2000 angstrom by using the ethylene glycol solution containing 3 weight % of tartaric acid as the electrolyte, by setting the gate electrode 542 at the anode and platinum at the cathode and by applying voltage. The thickness of the anodic oxide 543 may be controlled by adjusting the application time of the voltage.

Next, as shown in FIG. 55A, impurity ions which give one conductive type to the active layer 540 are injected by means of ion injection or plasma ion injection in order to form a source region 544 and a drain region 545. Here, P (phosphorus) ions are injected to the active layer 540 by using phosphine diluted to 1 to 10 volume % by $H_2$ gas in order to fabricate an N-channel type thin film transistor. On the other hand, B (boron) ions are injected when a P-channel type thin film transistor is to be fabricated by using diborane diluted similarly to 1 to 10%. In the present embodiment, P and B ions are injected by means of the ion injection to fabricate the N-channel and P-channel type TFTs, respectively.

When the impurity ions are injected to the active layer 540, the gate electrode 542 and the anodic oxide 543 around thereof function as a mask, thus defining the regions into which the impurity ions have been injected as the source region 544 and the drain region 545 and defining the region into which no impurity ion has been injected as a channel 546. It is noted that the doping conditions such as the dosage and the acceleration voltage are controlled so that the concentration of the impurity ions in the source region 544 and the drain region 545 turns out to be in the range of $3 \times 10^{19}$ to $1 \times 10^{21}$ atoms/cm$^3$. Further, after the doping, laser light is irradiated to activate the impurity ions injected to the source region 544 and the drain region 545.

Next, a silicon oxide film is formed by mean of plasma CVD in a thickness of 7000 angstrom as indicated as an interlayer insulating film 547 in FIG. 55B. Then, contact holes are created to form electrodes 548 and 549 which are connected with the source region 544 and the drain region 545, respectively, by materials mainly composed of aluminum.

Finally, a hydrogen plasma treatment is implemented at 300° C., thus completing the thin film transistor shown in FTG. 55B. It is noted that the main purpose of this hydrogen plasma treatment is not to passivate the defects of the active layer 540 but to passivate the interface between the active layer 540 and the electrodes 548 and 549 made from aluminum.

There is no big change in the field effect mobility of an the P-channel type TFT fabricated in accordance to the fabrication process of the present embodiment before and after the implementation of the hydrogen plasma treatment. This is construed that it does not mean that the thermal oxidation step shown in FIG. 54C has no passivation effect, but that it means that the passivation of the defects at the grain boundary of the active layer 540 is not the best means in improving the field effect mobility in the P-channel type TFT, as it is supposed from the fact that the field effect mobility of the P-channel type TFT is not remarkably improved by the passivation only by way of the hydrogen plasma treatment.

On the other hand, in the N-channel type TFT fabricated in accordance to the fabrication process of the present embodiment, while the field effect mobility has been 200 cm$^2 \cdot$V$^{-1} \cdot$s$^{-1}$ before the implementation of the hydrogen plasma treatment, the field effect mobility increases only by about 10 to 20% after the implementation. This fact indicates that although a N-channel type TFT has not been practical unless it is treated by hydrogen plasma in the past, a practical N-channel type TFT may be fabricated only by implementing the thermal oxidation by adding $NF_3$ like the present embodiment.

That is, it indicates that not so many defects at the grain boundary of the active layer 540 have been passivated by hydrogen in the hydrogen plasma treatment, but many of the defects at the grain boundary are passivated in the thermal oxidation step shown in FIG. 54C. Accordingly, the most of the defects passivated by the hydrogen plasma treatment of the present embodiment is those generated after the thermal oxidation step, i.e. mainly those generated in forming the electrodes 548 and 549. Further, the defects at the grain boundary of the active layer 540 have been passivated by Si in the present embodiment. Because Si does not desorb readily from the active layer due to the thermal influence like H, the present invention allows the TFT having the excellent heat resistance and the high reliability to be formed.

[68-th Embodiment]

A 68-th embodiment relates to a case of fabricating a TFT using the silicon film crystallized by utilizing the catalytic action of the metal element which promotes crystallization of silicon. FIGS. 56 through 57 are diagrams for explaining steps for fabricating the TFT according to the present embodiment, or section views showing each step. Nickel is used as the metal element in the present embodiment.

Figure 56A:
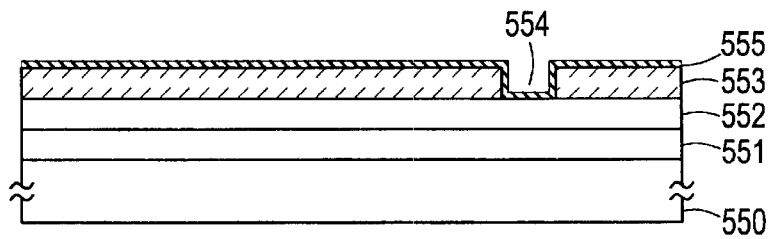
FIGS. 56A through 56E are diagrams showing fabrication steps according to the 68-th embodiment.

As shown in FIG. 56A, a silicon oxide film is formed as an underlying film 551 on a glass substrate 550 (Corning 1737, distortion point: 667° C.) in a thickness of 3000 angstrom by means of plasma CVD or low pressure CVD. The plasma CVD is used here. Next, a substantially intrinsic amorphous silicon film 552 is formed by the plasma CVD or low pressure CVD in a thickness of 700 to 1000 angstrom. Here, the thickness of the amorphous silicon film 552 is set at 1000 angstrom.

UV (ultraviolet) rays are then irradiated to the surface of the amorphous silicon film 552 within an oxidizing atmosphere to form an oxide film not shown in a thickness of several tens angstrom. The oxide film is formed to improve wetting of the surface of the amorphous silicon film 552 to suppress the solution from being repelled. After that, the solution containing nickel element is applied on the surface of the oxide film. In the present embodiment, nickel acetate aqueous solution containing 55 ppm of nickel is used as the solution containing nickel element.

Then, a mask film 553 having an opening 554 formed of a silicon oxide film of 1500 angstrom thick is formed. The opening 554 has a shape of slit in the longitudinal direction in the direction vertical to the drawing. Preferably, the opening 554 has a width of 20 μm or more. Meanwhile, the size in the longitudinal direction is determined adequately corresponding to the size of the substrate.

Next, the nickel acetate solution containing 55 ppm of nickel element is applied by a spinner and is then dried to form a nickel layer 555. Although the nickel layer 555 may not be formed as a complete film, nickel element is held in contact on the surface of the amorphous silicon film 552 via the oxide film not shown at the opening 554 of the mask film 553 in this state. It is noted that while the solution in which nickel salt is diluted may be used, preferably a solution containing nickel in concentration of about 1 to 100 ppm may be used.

Then, a heat treatment is implemented for four hours at 620° C. to crystallize the amorphous silicon film 552 and to form a crystal silicon film 556. Because the crystal grows in the amorphous silicon film 552 from the surface of the region 557 exposed at the opening 554 of the mask film 553 to the underlying film 551, so that the crystal grows in the region 557 vertically.

Figure 56B:
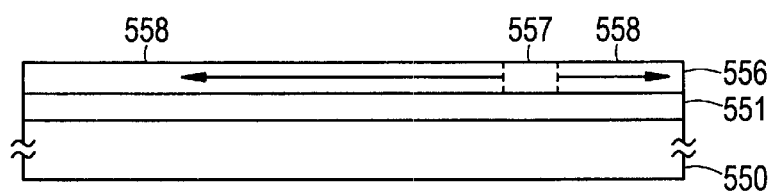
Figure 56C:
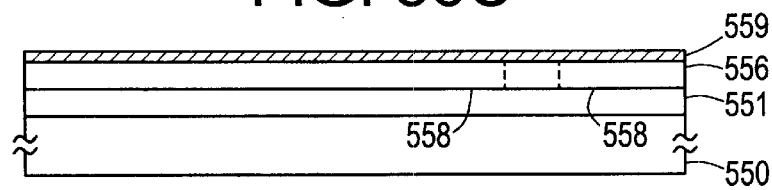

On the other hand, in the region 558, the crystal grows in parallel with the face of the substrate 550 as indicated by arrows in FIG. 56B starting from the vertically grown region 557. The crystallization process in which the crystal grows in one direction as such will be referred to as lateral growth. Accordingly, the region 558 of the crystal silicon film 556 is the laterally grown region.

After that, the mask film 553 made from the silicon oxide film is removed. Next, a thermal oxide film 559 is formed in a thickness of 200 to 500 angstrom on the surface of the crystal silicon film 556 by heating in an oxygen atmosphere containing fluorine atoms. It is noted that the crystallinity of the crystal silicon film 556 may be improved further by implementing light annealing by means of laser light or infrared rays, or heat annealing, as necessary after the crystallization step. The light annealing and the heat annealing may be used in combination.

The thermal oxide film 559 is formed in a thickness or about 500 angstrom by heating for 12 hours at 600° C. within the atmosphere in which 450 ppm of NF$_3$ is added to oxygen gas. As a result, the thickness of the crystal silicon film 556 which has been about 1000 angstrom before the formation of the thermal oxidation is reduced to about 750 angstrom.

As the thermal oxide film 559 is formed on the surface of the crystal silicon film 556, non-coupled Si is also generated. The Si atoms couple with dangling bond of Si at the grain boundary, thus passivating the defects of the crystal silicon film 556. The density of the defects at the grain boundary of the crystal silicon film 556 may be fully reduced by forming the silicon oxide film 559 in a thickness of about 500 angstrom with respect to the crystal silicon film 556 having the thickness of 1000 angstrom.

Figure 56D:
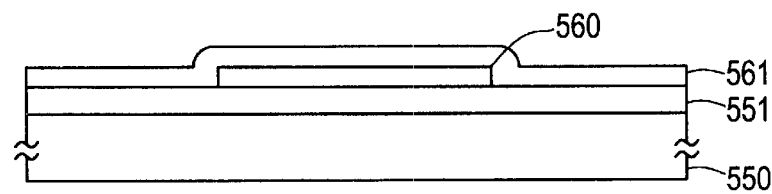

Next, the thermal oxide film 559 is eliminated by etching as shown in FIG. 56D. In etching the film, etching solution or etching gas having a high etching rate for silicon oxide and silicon is used. In the present embodiment, the thermal oxide film 559 is eliminated by means of wet etching using the buffer hydrofluoric acid.

Figure 56E:
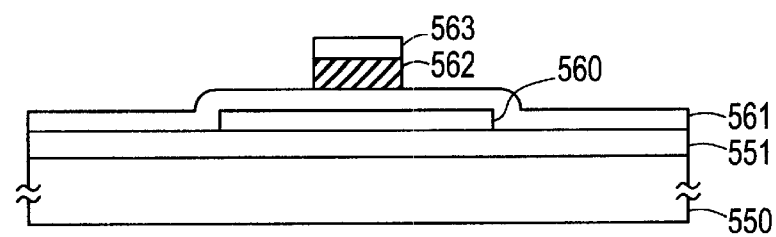

Next, the crystal silicon film 556 is patterned into an island shape to form an active layer 560 of the TFT as shown in FIG. 56E. In this case, preferably, the active layer 560 is composed of only the laterally grown region 558. Then, a silicon oxide film 561 which composes a gate insulating film is formed on the surface of the active layer 560 by means of plasma CVD or low pressure CVD. The low pressure CVD is used here.

Further, an aluminum film which composes a gate electrode 562 is formed on the surface of the silicon oxide film 561 in a thickness of 5000 angstrom by sputtering. Containing a small amount of scandium before hand allows to suppress hillock or whisker from being produced in the later heating step. 0.2 weight % of scandium is contained here.

Then, after anodizing the surface of the aluminum film to form a very thin and dense anodic oxide not shown, a resist mask 563 is formed on the surface of the aluminum film. In this case, because the dense anodic oxide not shown is formed on the surface of the aluminum film, the mask 563 may be formed in close adhesion. Next, the aluminum film is etched by using the resist mask 563 to form a gate electrode 562 as shown in FIG. 56E.

Figure 57A:
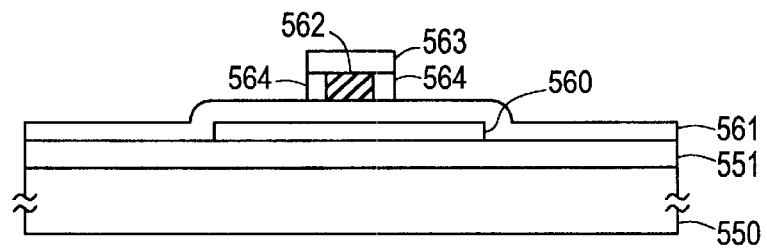
FIGS. 57A through 57E are diagrams showing fabrication steps according to a 69-th embodiment.
Figure 57B:
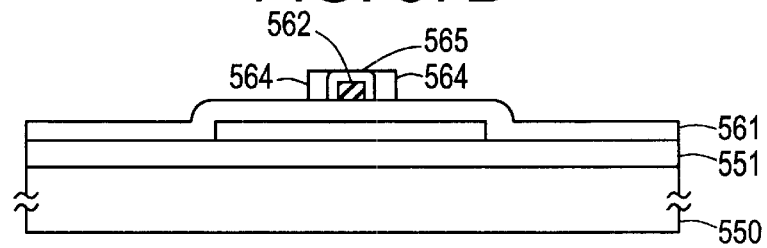

Then, the gate electrode 562 is anodized while leaving the resist mask 563 as shown in FIG. 57A to form a porous anodic oxide 564 in a thickness of 4000 angstrom. At this time, because the resist mask 563 is adhering on the surface of the gate electrode 562, the porous anodic oxide 564 is formed only on the sides of the gate electrode 562.

Next, the gate electrode 562 is anodized again within the electrolyte after peeling off the resist mask 563 to form a dense anodic oxide 565 in a thickness of 1000 angstrom. The anodic oxides 564 and 565 described above may be formed differently by changing the electrolytes to be used. When the porous anodic oxide 564 is to be formed, acidic solution containing 3 to 20 weight % of citric acid, oxalic acid, chromic acid or sulfuric acid may be used. Here, acidic aqueous solution containing 5 weight % of oxalic acid is used.

When the dense anodic oxide 565 is to be formed on the other hand, electrolyte in which ethylene glycol solution containing 3 to 10 weight % of tartaric acid, boric acid or nitric acid is prepared so as to have pH of about 7 may be used. Here, the ethylene glycol solution containing 5 weight % of tartaric acid and which is prepared so as to have pH=7 is used.

Figure 57C:
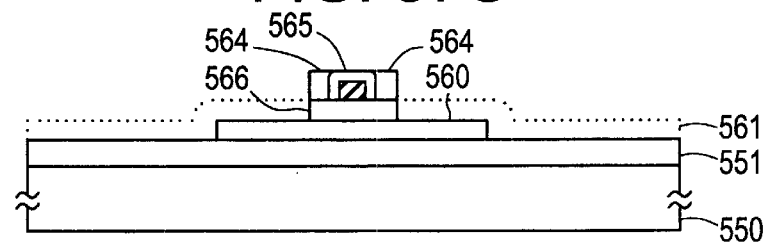
Figure 57D:
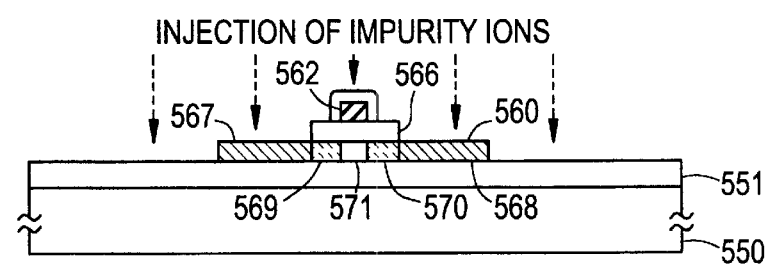

Next, as shown in FIG. 57C, the silicon oxide film 561 is etched by using the gate electrode 562 and the porous anodic oxide 564 around it and the dense anodic oxide 565 as a mask to form a gate insulating film 566. Next, as shown in FIG. 57D, impurities which give a conductive type to the active layer 560 are injected by using the gate electrode 562, the dense anodic oxide 565 and the gate insulating film 566 as a mask by means of ion doping after eliminating the porous anodic oxide 564.

In the present embodiment, P (phosphorus) ions are injected by using phosphine as the doping gas to fabricate the N-channel TFT. It is noted that the doping conditions such as the dosage and the acceleration voltage are controlled so that the gate insulating film 564 functions as a semi-permeable mask during the doping. As a result of the above-mentioned doping, phosphorus ions are injected in high concentration to the region not covered by the gate insulating film 566, thus forming a source region 567 and a drain region 568.

Further, P ions are injected in low concentration to the region covered only by the gate insulating film 566, thus forming low concentration impurity regions 569 and 570. Because no impurity is injected to the region right below the gate electrode 562, a channel 571 is formed. After the doping, thermal annealing, laser annealing or the like is implemented to activate the doped P ions. Here, the thermal annealing is applied.

Because the low concentration impurity regions 569 and 570 function as high resistant regions, they contribute in she reduction of OFF current. The low concentration impurity region 570 is called specifically as the LDD. Further, because an offset structure in which the impurity region is shifted from the end face of the gate electrode 562 may be allowed, the OFF current may be reduced further.

Figure 57E:
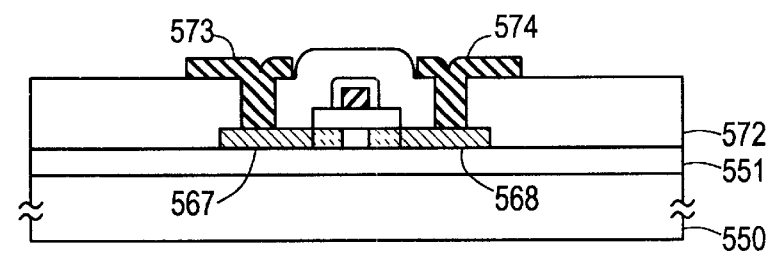

Next, a silicon oxide film is formed by mean of plasma CVD in a thickness of 5000 angstrom as indicated as an interlayer insulating film 572 as shown in FIG. 57E. It is noted that beside the mono-layer of the silicon oxide film, a mono-layer of a silicon nitride film or a laminated film of the silicon oxide film and the silicon nitride film may be formed as the interlayer insulator 572.

Next, the interlayer insulator 572 made from the silicon oxide film is etched by etching and contact holes are created respectively at the source region 567 and the drain region 568. Then, an aluminum film is formed in a thickness of 4000 angstrom by means of sputtering and is patterned to form electrodes 573 and 574 at the contact holes at the source region 567 and the drain region 568.

Finally, a heat treatment is implemented at 300° C. in a hydrogen atmosphere. It is noted that the main purpose of this hydrogen plasma treatment is not to passivate the defects of the active layer 560 but to passivate the interface between the active layer 560 and the electrodes 573 and 574 made from aluminum. Through the above process, the thin film transistor having the LDD structure is fabricated.

In the N-channel type TFT fabricated in accordance to the fabrication process of the present embodiment, the field effect mobility after the implementation of the hydrogen plasma treatment increases only by about 10 to 20% as compared to that before the implementation of the hydrogen plasma treatment. This fact indicates that although a N-channel type TFT has not been practical unless it is treated by hydrogen plasma in the past, the defects at the grain boundary of the active layer 560 has been effectively passivated by only implementing the thermal oxidation by adding $NF_3$ like the step shown in FIG. 56C.

[69-th Embodiment]

A 69-th embodiment relates to a case of fabricating a CMOS type TFT in which a N-channel type TFT and a P-channel type TFT are combined in a complementary manner. FIGS. 58 through 59 are diagrams for explaining steps for fabricating the TFT according to the present embodiment.

Figure 58A:
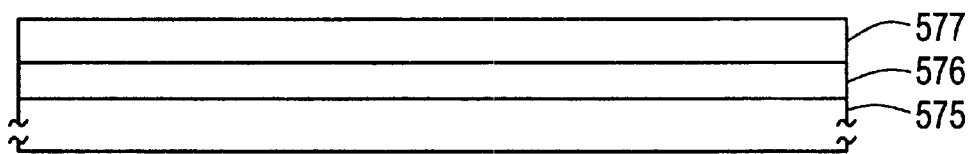
FIGS. 58A through 58D are diagrams showing fabrication steps according to the 69-th embodiment.

As shown in FIG. 58A, a silicon oxide film is formed as an underlying film 576 on a glass substrate 575 (Corning 1737) in a thickness of 2000 angstrom. Next, a substantially intrinsic amorphous silicon film is formed by the plasma CVD or low pressure CVD in a thickness of 700 to 1000 angstrom. Then, a crystal silicon film 577 is formed by the method shown in the 67-th embodiment. It is noted that the amorphous silicon film may be crystallized by using adequate methods such as heat treatment or irradiation or laser. The process which follows is the same even in those cases.

Figure 58B:
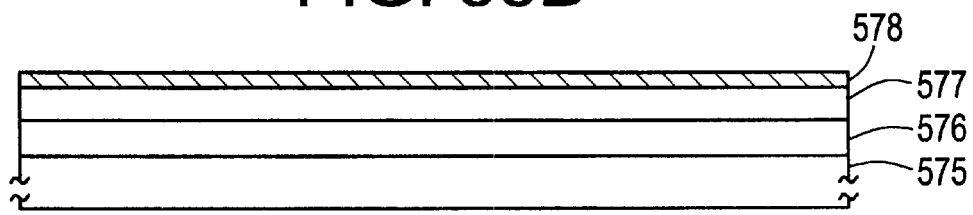
Figure 58C:
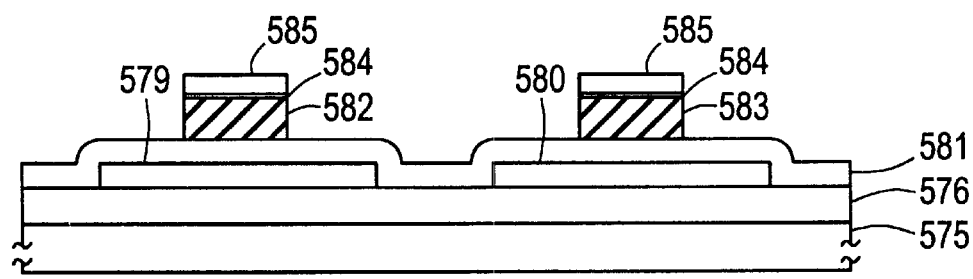
Figure 58D:
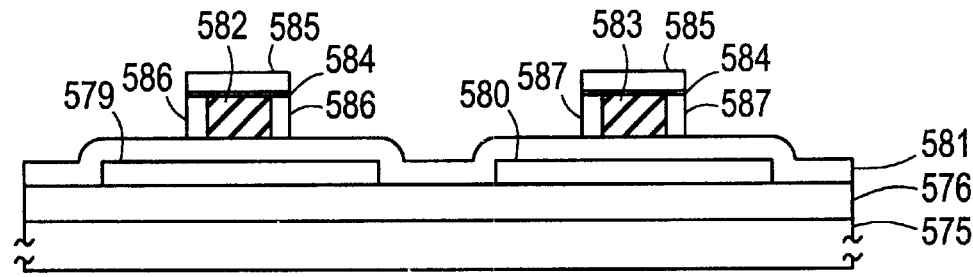

A thermal oxide film 578 is formed in a thickness of 200 angstrom as shown in FIG. 58B by implementing thermal oxidation for 2 hours within an oxygen atmosphere containing 400 ppm of $NF_3$ at 600° C. to passivate the defects at the grain boundary of the crystal silicon film 577 by Si. As a result, the crystal silicon film 577 turns out to be a suitable semiconductor material for TFTs and the like.

Next, after eliminating the thermal oxide film 578 by using etchant made from buffer hydrofluoric acid, the crystal silicon film 577 is patterned into a shape of island to form active layers 579 and 580, respectively. Further, a silicon oxide film 581 which composes a gate insulating film is deposited in a thickness of 1500 angstrom by means of plasma CVD. It is noted that the active layer 579 composes the N-channel type TFT and the active layer 580 composes the P-channel type TFT.

Then, an aluminum film which composes gate electrodes 582 and 583 is formed in a thickness of 4000 angstrom by sputtering. 0.2 weight % of scandium is contained in the aluminum film before hand to suppress hillock or whisker from being produced. Then, the aluminum film is anodized within the electrolyte to form a dense anodic oxide of about 100 angstrom on the surface of the film. Then, a photoresist mask 585 is formed on the surface of the anodic oxide film to pattern the aluminum film and to form the gate electrodes 582 and 583, respectively.

Further, while attaching the photoresist mask 585, the gate electrodes 582 and 583 are anodized again to form anodic oxides 586 and 587 As the electrolyte, acidic solution containing 3 to 20 weight % of citric acid, oxalic acid, chromic acid or sulfuric acid may be used. Aqueous solution containing 4 weight % of oxalic acid is used in the present embodiment.

In the state in which the photoresist mask 585 and the anodic oxide film 584 exist on the surface of the gate electrodes 582 and 583, porous anodic oxides 586 and 587 are formed only on the sides of the gate electrodes 582 and 583. The range of growth of the porous anodic oxides 586 and 587 may be controlled by adjusting the treatment time of the anodization. This range of growth determines the length of the low concentration impurity region (LDD region). In the present embodiment, the porous anodic oxides 586 and 587 are grown in length of 7000 angstrom.

Next, after removing the photoresist mask 585, the gate electrodes 582 and 583 are anodized again to form dense and rigid anodic oxide films 588 and 589. In the present embodiment, ethylene glycol solution containing 3 weight % of tartaric acid is neutralized by aqueous ammonia to pH 6.9 to use as its electrolyte.

Next, P (phosphorus) ions are injected to the island active layers 579 and 580 by means or ion doping by using the gate electrodes 582 and 583 as well as the porous anodic oxides 586 and 587 as a mask. As doping gas, phosphine which has been diluted by hydrogen to 1 to 10 volume % is used. While the doping is implemented with acceleration voltage in the range of 60 to 90 kV and the dosage in the range of $1\times10^{-4}$ to $8\times10^{-5}$ atoms/cm$^2$, the acceleration voltage is set at 80 kV and the dosage is set at $1\times10^{15}$ atoms/cm$^2$ in the present embodiment.

At this time, although P (phosphorus) ions do not transmit through the porous anodic oxides 586 and 587, they transmit through the gate insulating film 581 and are injected to island silicon 579 and 580. As a result, N-type impurity regions 590 through 593 are formed respectively as shown in EIG. 59E.

Figure 59A:
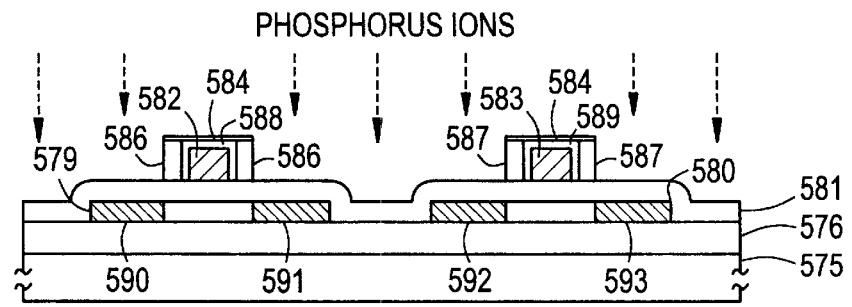
FIGS. 59A through 59D are diagrams showing fabrication steps according to the 69-th embodiment.
Figure 59B:
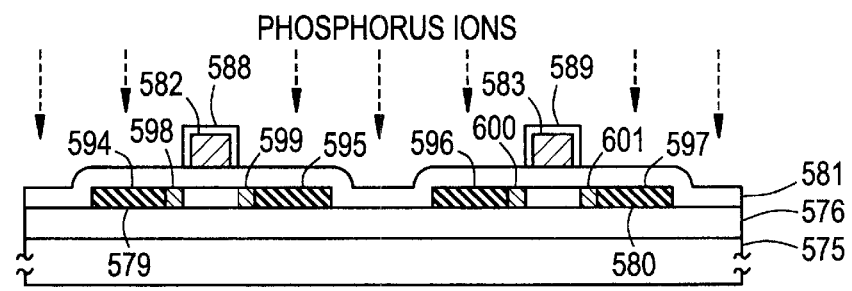
Figure 59C:
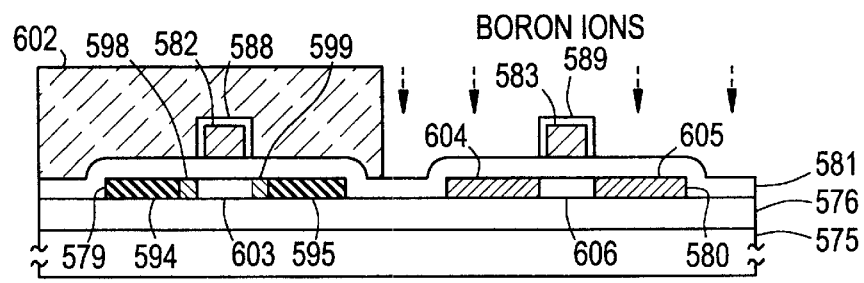
Figure 59D:
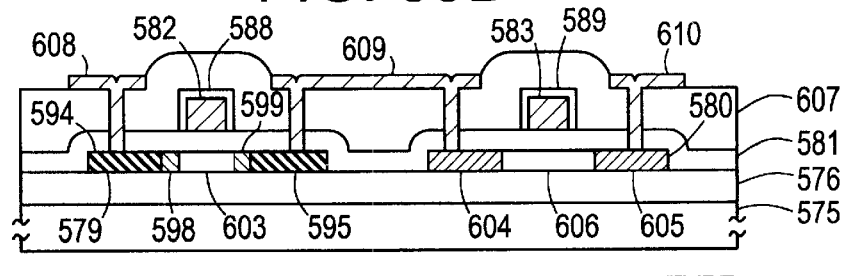

Next, after eliminating the dense anodic oxide film 584 by buffer hydrofluoric acid, the porous anodic oxides 586 and 587 are eliminated by mixed acid in which phosphoric acid, acetic acid and nitric acid are mixed as shown in FIGS. 59E and 59F. Because the porous anodic oxides 586 and 587 may be readily eliminated, the dense and rigid anodic oxides 588 and 589 will not be etched.

Next, P (phosphorus) ions are doped again. The doping is implemented with acceleration voltage in the range of 60 to 90 kV and the dosage in the range of $1\times10^{12}$ to $1\times10^{14}$ atoms/cm$^2$. The acceleration voltage is set at 80 kV and the dosage at $1\times10^{14}$ atoms/cm$^2$ in the present embodiment. At this time, although P (phosphorus) ions do not transmit through the gate electrodes 582 and 583, they transmit through the gate insulating film 581 and are injected to the active layers 579 and 580. Accordingly, the region into which phosphorus ions have been injected twice turn out to be N-type high concentration impurity regions 594 through 597 and the regions into which phosphorus ions have been injected once turn out to be N-type low concentration impurity regions 598 through 601.

Then, as shown in FIG. 59G, while the region which turns out to be the N-channel TFT is covered by polyimide or heat resistant resist 602, the polyimide is used here. After that, boron ions are doped in order to invert the conductive type of the active layer 580 from the N-type to the P-type. Diborane which has been diluted to about 1 to 10 volume % by hydrogen is used as the doping gas and the acceleration voltage is set at 80 kV and the dosage of boron is set ac $2\times10^{15}$ atoms/cm$^2$.

Because no boron is injected to the region covered by the polyimide 602, it remains to be the N type. Accordingly, the high concentration impurity regions 594 and 595 correspond to the source and drain regions of the N-channel type TFT, respectively, in the active layer 579 and because no phosphorus nor boron ion is injected to the region 603 right below the gate electrode 582, it remains to be intrinsic and corresponds to the channel of the TFT.

Because a large amount of boron is injected in the doping of boron ions, no low concentration impurity region (LDD region) is formed and only the P-type high concentration impurity regions 604 and 605 are formed. The high concentration impurity regions 604 and 605 correspond to the source and drain regions of the P-channel type TFT, respectively. Further, because no phosphorus and boron ion is injected to the region 606 right below the gate electrode 583, it remains to be intrinsic and corresponds to the channel.

Next, the resist 602 is removed and a silicon oxide film of 1 μm thick is formed as an interlayer insulating film 607 by means of plasma CVD as shown in FIG. 59H. Contact holes are then formed and electrodes, wirings 608 to 610 for the source and drain regions are formed by multi-layered film of titanium and aluminum to the contact holes. Finally, a heat treatment is implemented for 2 hours within a hydrogen atmosphere at 350° C. The CMOS thin film transistor is completed going through such process.

Because the CMOS structure in which the N-type TFT and the P-type TFT are combined complementarily is formed in the present embodiment, electric power may be lowered in driving the TFTs. Further, because it is arranged so as to dispose the low concentration impurity region 599 between the channel 603 and the drain domain 595 of the N-channel type TFT, it allows to prevent a high electric field from being generated between the channel 603 and the drain 595.

It is noted that the conditions of the thermal oxidation step in which NF$_3$ is added are not confined to what have been described in the above-mentioned embodiments 67 through 69. The concentration of NF$_3$ within the oxygen atmosphere and the like may be determined such that the thermal oxide film grows in a thickness of several hundreds angstrom by heating for several hours at temperatures below the distortion point of the glass substrate so that the distortion or deformation of the substrate, on which the TFT is formed, caused by the thermal oxidation step falls within the permissible range. Further, such step may be implemented in the condition of higher temperature when a high heat resistant substrate such as a quartz substrate is used.

Further, because the Corning 1737 glass whose distortion point is 667° C. is used as the glass substrate in the embodiments 67 through 69, the heating temperature in the thermal oxidation step is set at 600° C. However, if a glass whose distortion point is 593° C. is used for example, the heating temperature in the thermal oxidation step may be preferably around 500 to 550° C.

[Examples of Industrial Applicability]

Figure 60A:
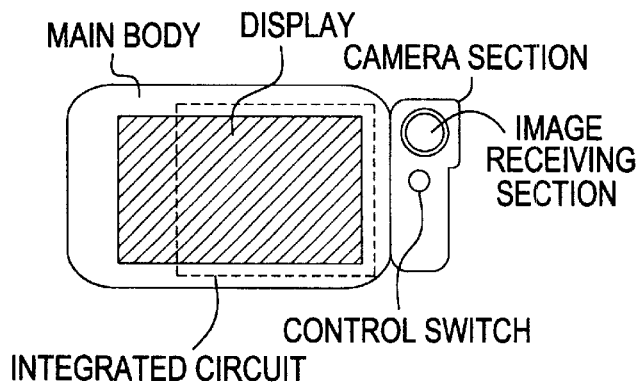
FIGS. 60A through 60F are drawings showing several examples among various applied examples of the semiconductor device of the present invention.
Figure 60B:
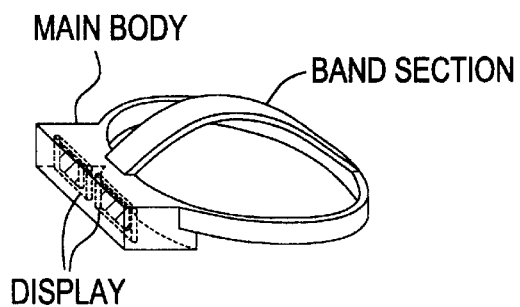
Figure 60C:
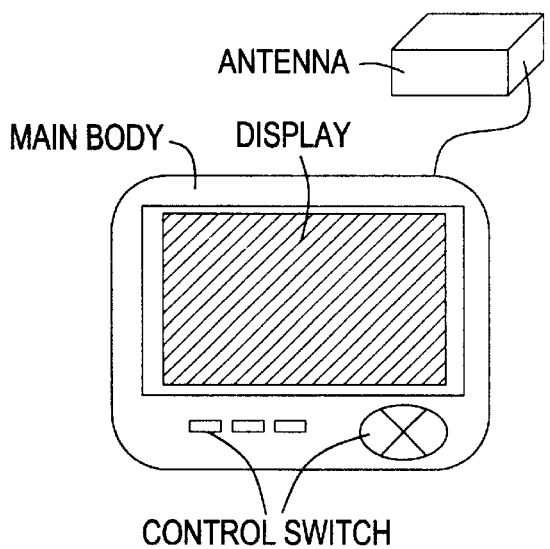
Figure 60D:
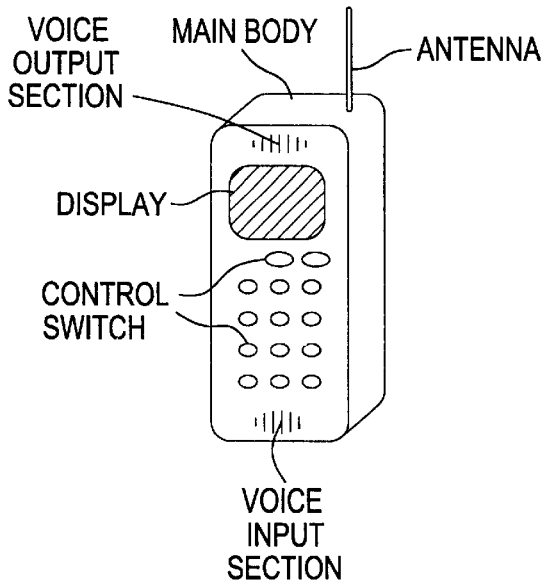
Figure 60E:
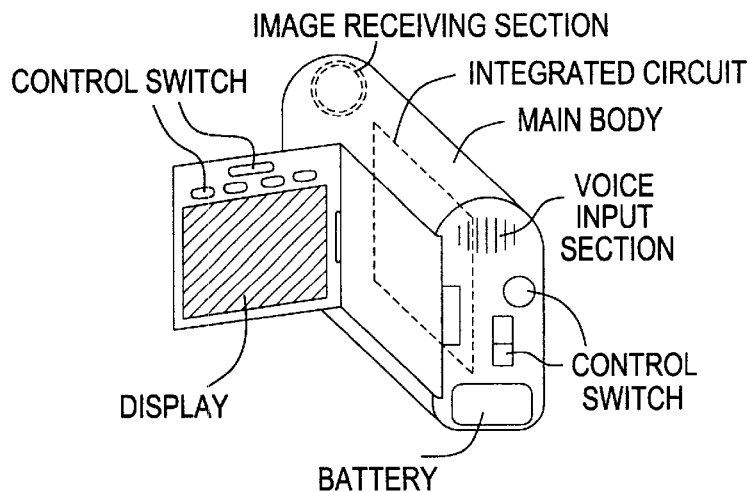
Figure 60F:
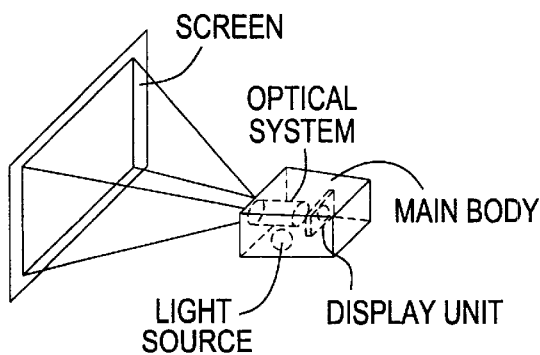

The inventive semiconductor device may be used as a display or the like of various electric equipments. FIGS. 60 through 61 illustrate some of them. FIG. 60A shows a portable information terminal unit, FIG. 61B shows a HMD (Head Mounting Display) used for an endoscope or for training in driver's school, FIG. 60C shows a car navigator, FIG. 61D shows a portable telephone, FIG. 61E shows a video camera, and FIG. 61F shows a projector. The uses of the inventive semiconductor device are not confined to those described above.

As described above, according to the present invention, the metal element existing within the crystal silicon film obtained by utilizing the metal element which promote crystallization of silicon may be eliminated or its concentration may be reduced. Further, the utilization of it allows a thin film semiconductor device having the higher reliability and excellent performance to be obtained.

Further, in the method for fabricating a semiconductor device according to the present invention, the thermal oxide film may be grown up to several hundreds angstrom of thickness by heating for several hours to ten and several hours at a temperature below the distortion point of the glass substrate by arranging so as to grow the thermal oxide film within an oxidizing atmosphere containing fluorine compound. Still more, because extra Si is generated by growing the thermal oxide film and the defects at the grain boundary of the crystal silicon film may be passivated by Si, the hydrogen plasma treatment may be eliminated.

Further, because the surface of the crystal silicon film may be flattened by the thermal oxidation process and because the gate insulating film composed of a deposited film may be formed with a favorable coating capability even if a step of obtaining the crystal silicon film through the irradiation of laser light is adopted, the interfacial level between the gate insulating film and the active layer may be lowered. Because the crystal silicon film is irradiated by laser light and excels in the crystallinity, the mobility of the semiconductor device may be improved.

Accordingly, an insulated gate type semiconductor device such as a TFT having the high mobility and high reliability may be fabricated on the substrate, such as a glass substrate, on which it is difficult to implement a treatment in high temperatures such as around 1000° C. for example.

While preferred embodiments have been described, variations thereto will occur to those skilled in the art within the scope of the present inventive concepts which are delineated by the following claims.

What is claimed is:

1. A method for fabricating a semiconductor device, comprising:
   intentionally introducing a metal element which promotes crystallization of silicon to an amorphous semiconductor film comprising silicon and crystallizing said amorphous semiconductor film by a first heat treatment to obtain a crystal semiconductor film comprising silicon;
   eliminating or reducing said metal element existing within said crystal semiconductor film by implementing a second heat treatment within an oxidizing atmosphere;
   eliminating a thermal oxide film formed in the previous eliminating or reducing step; and
   forming another thermal oxide film on the surface of a region from which said thermal oxide film formed in said eliminating or reducing step has been eliminated by implementing another thermal oxidation.

2. The method of claim 1, wherein the crystal within said crystal semiconductor film which has been crystallized from said amorphous semiconductor film includes crystal lattices that lie continuously in a row.

3. The method of claim 1, wherein the crystal within said crystal semiconductor film which has been crystallized from said amorphous semiconductor film is thin cylindrical crystal or thin flat cylindrical crystal.

4. The method of claim 1, wherein the crystal within said crystal semiconductor film which has been crystallized from said amorphous semiconductor film is thin cylindrical crystal or thin flat cylindrical crystal which has grown in parallel or almost in parallel leaving a space therebetween.

5. The method of claim 1, wherein one or a plurality of elements selected from Fe, Co, Ni, Ru, Rh, Pd, Os, Ir, Pt, Cu and Au is used as the metal element which promotes the crystallization of silicon.

6. The method of claim 1, wherein the temperature of the second heat treatment is higher than that of the first heat treatment.

7. The method of claim 1, wherein annealing is carried out in a plasma atmosphere containing oxygen and hydrogen after eliminating said thermal oxide film.

8. The method of claim 1, wherein the concentration of oxygen contained in said amorphous semiconductor film is $5 \times 10^{17}$ cm$^{-3}$ to $2 \times 10^{19}$ cm$^{-3}$.

9. The method of claim 1, wherein laser light or intense light is irradiated to said crystal semiconductor film after obtaining said crystal semiconductor film by crystallizing said amorphous semiconductor film by means of the first heat treatment.

10. A method for fabricating a semiconductor device, comprising:
    intentionally introducing a metal element which promotes crystallization of silicon to an amorphous semiconductor film comprising silicon and crystallizing said amorphous semiconductor film by a first heat treatment to obtain a crystal semiconductor film comprising silicon;
    eliminating or reducing said metal element existing within said crystal semiconductor film by implementing a second heat treatment within an oxidizing atmosphere to form a thermal oxide film on the surface of said crystal semiconductor film and by causing said thermal oxide film to getter said metal element;
    eliminating said thermal oxide film formed in the previous eliminating or reducing step; and
    forming another thermal oxide film on the surface of a region from which said thermal oxide film formed in said eliminating or reducing step has been eliminated by implementing another thermal oxidation.

11. The method of claim 10, wherein the crystal within said crystal semiconductor film which has been crystallized from said amorphous semiconductor film includes crystal lattices that lie continuously in a row.

12. The method of claim 10, wherein the crystal within said crystal semiconductor film which has been crystallized from said amorphous semiconductor film is thin cylindrical crystal or thin flat cylindrical crystal.

13. The method of claim 10, wherein the crystal within said crystal semiconductor film which has been crystallized from said amorphous semiconductor film is thin cylindrical crystal or thin flat cylindrical crystal which has grown in parallel or almost in parallel leaving a space therebetween.

14. The method of claim 10, wherein one or a plurality of elements selected from Fe, Co, Ni, Ru, Rh, Pd, Os, Ir, Pt, Cu and Au is used as the metal element which promotes the crystallization of silicon.

15. The method of claim 10, wherein the temperature of the second heat treatment is higher than that of the first heat treatment.

16. The method of claim 10, wherein annealing is carried out in a plasma atmosphere containing oxygen and hydrogen after eliminating said thermal oxide film.

17. The method of claim 10, wherein the concentration of oxygen contained in said amorphous semiconductor film is $5 \times 10^{17}$ cm$^{-3}$ to $2 \times 10^{19}$ cm$^{-3}$.

18. The method of claim 10, wherein laser light or intense light is irradiated to said crystal semiconductor film after obtaining said crystal semiconductor film by crystallizing said amorphous semiconductor film by means of the first heat treatment.

19. A method for fabricating a semiconductor device, comprising:
    intentionally introducing a metal element which promotes crystallization of silicon to an amorphous semiconductor film comprising silicon and crystallizing said amorphous semiconductor film by a first heat treatment to obtain a crystal semiconductor film comprising silicon;
    eliminating or reducing said metal element existing within said crystal semiconductor film by implementing a second heat treatment within an oxidizing atmosphere containing a halogen element;
    eliminating a thermal oxide film formed in the previous eliminating or reducing step; and
    forming another thermal oxide film on the surface of a region from which said thermal oxide film formed in said eliminating or reducing step has been eliminated by implementing another thermal oxidation.

20. The method of claim 19, wherein the crystal within said crystal semiconductor film which has been crystallized from said amorphous semiconductor film includes crystal lattices that lie continuously in a row.

21. The method of claim 19, wherein the crystal within said crystal semiconductor film which has been crystallized from said amorphous semiconductor film is thin cylindrical crystal or thin flat cylindrical crystal.

22. The method of claim 19, wherein the crystal within said crystal semiconductor film which has been crystallized from said amorphous semiconductor film is thin cylindrical crystal or thin flat cylindrical crystal which have grown in parallel or almost in parallel leaving a space therebetween.

23. The method of claim 19, wherein one or a plurality of elements selected from Fe, Co, Ni, Ru, Rh, Pd, Os, Ir, Pt, Cu and Au is used as the metal element which promotes the crystallization of silicon.

24. The metal of claim 19, wherein said oxidizing atmosphere containing the halogen element is what one or a plurality of gases selected from HCl, HF, HBr, $Cl_2$, $F_2$ or $Br_2$ is added into the $O_2$ atmosphere.

25. The method of claim 19, wherein said oxidizing atmosphere containing the halogen element is what one or a plurality of gases selected from HCl, HF, HBr, $Cl_2$, $F_2$ or $Br_2$ is added into the atmosphere containing $O_2$.

26. The method of claim 19, wherein oxygen and a gas of hydride of the halogen element are added into said oxidizing atmosphere containing the halogen element.

27. The method of claim 19, wherein the temperature of the second heat treatment is higher than that of the first heat treatment.

28. The method of claim 19, wherein the temperature of the second heat treatment is in the range of 700° C. to 1100° C.

29. The method of claim 19, wherein annealing is carried out in a plasma atmosphere containing oxygen and hydrogen after eliminating said thermal oxide film.

30. The method of claim 19, wherein the concentration of oxygen contained in said amorphous semiconductor film is $5\times10^{17}$ $cm^{-3}$ to $2\times10^{19}$ $cm^{-3}$.

31. The method of claim 19, wherein laser light or intense light is irradiated to said crystal semiconductor film after obtaining said crystal semiconductor film by crystallizing said amorphous semiconductor film by means of the first heat treatment.

32. A method for fabricating a semiconductor device, comprising:
intentionally introducing a metal element which promotes crystallization of silicon to an amorphous semiconductor film comprising silicon and crystallizing said amorphous semiconductor film by a first heat treatment to obtain a crystal semiconductor film comprising silicon;
eliminating or reducing said metal element existing within said crystal semiconductor film by implementing a second heat treatment within an oxidizing atmosphere containing a halogen element to form a thermal oxide film on the surface of said crystal semiconductor film and by causing said thermal oxide film to getter said metal element;
eliminating said thermal oxide film formed in the previous eliminating or reducing step; and
forming another thermal oxide film on the surface of a region from which said thermal oxide film formed in said eliminating or reducing step has been eliminated by implementing another thermal oxidation.

33. The method of claim 32, wherein the crystal within said crystal semiconductor film which has been crystallized from said amorphous semiconductor film includes crystal lattices that lie continuously in a row.

34. The method of claim 32, wherein the crystal within said crystal semiconductor film which has been crystallized from said amorphous semiconductor film is thin cylindrical crystal or thin flat cylindrical crystal.

35. The method of claim 32, wherein the crystal within said crystal semiconductor film which has been crystallized from said amorphous semiconductor film is thin cylindrical crystal or thin flat cylindrical crystal which have grown in parallel or almost in parallel leaving a space therebetween.

36. The method of claim 32, wherein one or a plurality of elements selected from Fe, Co, Ni, Ru, Rh, Pd, Os, Ir, Pt, Cu and Au is used as the metal element which promotes the crystallization of silicon.

37. The method of claim 32, wherein said oxidizing atmosphere containing the halogen element is what one or a plurality of gases selected from HCl, HF, HBr, $Cl_2$, $F_2$ or $Br_2$ is added into the $O_2$ atmosphere.

38. The method of claim 32, wherein said oxidizing atmosphere containing the halogen element is what one or a plurality of gases selected from HCl, HF, HBr, $Cl_2$, $F_2$ or $Br_2$ is added into the atmosphere containing $O_2$.

39. The method of claim 32, wherein oxygen and a gas of hydride of the halogen element are added into said oxidizing atmosphere containing the halogen element.

40. The method of claim 32, wherein the temperature of the second heat treatment is higher than that of the first heat treatment.

41. The method of claim 32, wherein the temperature of the second heat treatment is in the range of 700° C. to 1100° C.

42. The method of claim 32, wherein annealing is carried out in a plasma atmosphere containing oxygen and hydrogen after eliminating said thermal oxide film.

43. The method of claim 32, wherein the concentration of oxygen contained in said amorphous semiconductor film is $5\times10^{17}$ $cm^{-3}$ to $2\times10^{19}$ $cm^{-3}$.

44. The method of claim 32, wherein laser light or intense light is irradiated to said crystal semiconductor film after obtaining said crystal semiconductor film by crystallizing said amorphous semiconductor film by means of the first heat treatment.

45. The method of claim 1 wherein the semiconductor device is incorporated into at least one selected from the group consisting of a portable information terminal unit, a head mounting display, a car navigator, a portable telephone, a video camera and a projector.

46. The method of claim 10 wherein the semiconductor device is incorporated into at least one selected from the group consisting of a portable information terminal unit, a head mounting display, a car navigator, a portable telephone, a video camera and a projector.

47. The method of claim 19 wherein the semiconductor device is incorporated into at least one selected from the group consisting of a portable information terminal unit, a head mounting display, a car navigator, a portable telephone, a video camera and a projector.

48. The method of claim 32 wherein the semiconductor device is incorporated into at least one selected from the group consisting of a portable information terminal unit, a head mounting display, a car navigator, a portable telephone, a video camera and a projector.

\* \* \* \* \*